(12) United States Patent
Oh et al.

(10) Patent No.: US 12,201,008 B2
(45) Date of Patent: Jan. 14, 2025

(54) LIGHT EMITTING DEVICE

(71) Applicant: Samsung Display Co., Ltd., Yongin-si (KR)

(72) Inventors: Chanseok Oh, Seoul (KR); Mun-Ki Sim, Seoul (KR); Seran Kim, Suwon-si (KR); Jang Yeol Baek, Yongin-si (KR); Minjung Jung, Hongcheon-gun (KR)

(73) Assignee: Samsung Display Co., Ltd., Yongin-si (KR)

(*) Notice: Subject to any disclaimer, the term of this patent is extended or adjusted under 35 U.S.C. 154(b) by 626 days.

(21) Appl. No.: 17/451,303

(22) Filed: Oct. 18, 2021

(65) Prior Publication Data

US 2022/0149279 A1  May 12, 2022

(30) Foreign Application Priority Data

Nov. 11, 2020 (KR) .................. 10-2020-0150280

(51) Int. Cl.
*H01L 51/50* (2006.01)
*C07F 5/02* (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
None
See application file for complete search history.

(56) References Cited

U.S. PATENT DOCUMENTS

2019/0058124 A1  2/2019  Hatakeyama et al.
2019/0115538 A1  4/2019  Lim et al.
(Continued)

FOREIGN PATENT DOCUMENTS

CN         110079304 A    8/2019
KR    10-2016-0119683 A   10/2016
(Continued)

OTHER PUBLICATIONS

Pershin, Anton et al. "Highly emissive excitons with reduced exchange energy in thermally activated delayed fluorescent molecules," Nature Communications, vol. 10, Article No. 597, pp. 1-5 (2019).

*Primary Examiner* — Gregory D Clark
(74) *Attorney, Agent, or Firm* — Lewis Roca Rothgerber Christie LLP

(57) ABSTRACT

Provided is a light emitting device including: a first electrode; a second electrode facing the first electrode; and a plurality of organic layers between the first electrode and the second electrode, wherein at least one organic layer selected from among the plurality of organic layers includes a condensed polycyclic compound represented by Formula 1, and the first electrode and the second electrode each independently include at least one selected from among Ag, Mg, Cu, Al, Pt, Pd, Au, Ni, Nd, Ir, Cr, Li, Ca, LiF/Ca, LiF/Al, Mo, Ti, In, Sn, Zn, Yb, W, a compound of two or more thereof, a mixture of two or more thereof, and an oxide thereof.

(Continued)

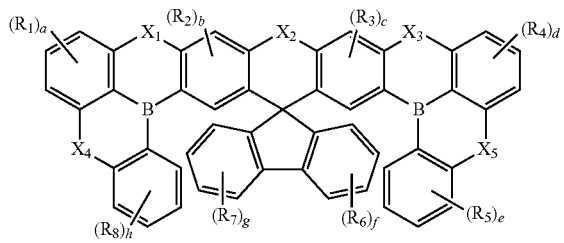

Formula 1

20 Claims, 6 Drawing Sheets

(51) Int. Cl.
*C09K 11/06* (2006.01)
*H10K 85/30* (2023.01)
*H10K 50/11* (2023.01)
*H10K 101/10* (2023.01)

(52) U.S. Cl.
CPC ...... *C09K 2211/1018* (2013.01); *H10K 50/11* (2023.02); *H10K 2101/10* (2023.02)

(56) References Cited

U.S. PATENT DOCUMENTS

| | | | |
|---|---|---|---|
| 2020/0066997 | A1 | 2/2020 | Huang et al. |
| 2020/0190115 | A1 | 6/2020 | Hatakeyama et al. |

FOREIGN PATENT DOCUMENTS

| | | |
|---|---|---|
| KR | 10-2018-0108604 A | 10/2018 |
| KR | 10-2018-0112721 A | 10/2018 |
| KR | 10-1955647 B1 | 3/2019 |
| KR | 10-2020-006965 A | 1/2020 |
| WO | WO 2018/212169 A1 | 11/2018 |

LIGHT EMITTING DEVICE

CROSS-REFERENCE TO RELATED APPLICATION

This application claims priority to and the benefit of Korean Patent Application No. 10-2020-0150280, filed on Nov. 11, 2020, in the Korean Intellectual Property Office, the entire contents of which are hereby incorporated by reference.

BACKGROUND

1. Field

Embodiments of the present disclosure herein relate to a light emitting device, and, for example, to a light emitting device including a condensed polycyclic compound used as a luminescent material.

2. Description of Related Art

Recently, the development of an organic electroluminescence display as an image display apparatus is being actively conducted. Unlike liquid crystal display apparatuses and the like, the organic electroluminescence display is a so-called self-luminescent display apparatus in which holes and electrons injected from a first electrode and a second electrode recombine in an emission layer, and thus a luminescent material including an organic compound in the emission layer emits light to implement display.

In the application of a light emitting device to a display apparatus, there is a demand for a light emitting device having low driving voltage, high luminous efficiency, and a long service life, and development of materials for a light emitting device capable of stably attaining such characteristics is being substantially continuously investigated.

In recent years, particularly in order to implement a highly efficient a light emitting device, technologies pertaining to phosphorescence emission using triplet state energy or delayed fluorescence using triplet-triplet annihilation (TTA) in which singlet excitons are generated by collision of triplet excitons are being developed.

SUMMARY

Embodiments of the present disclosure provide a light emitting device having high efficiency.

An embodiment of the present disclosure provides a light emitting device including: a first electrode; a second electrode facing the first electrode; and a plurality of organic layers between the first electrode and the second electrode, wherein at least one organic layer selected from among the plurality of organic layers includes a condensed polycyclic compound represented by Formula 1, and the first electrode and the second electrode each independently include at least one selected from among Ag, Mg, Cu, Al, Pt, Pd, Au, Ni, Nd, Ir, Cr, Li, Ca, LiF/Ca, LiF/Al, Mo, Ti, In, Sn, Zn, Yb, W, a compound of two or more thereof, a mixture of two or more thereof, and an oxide thereof.

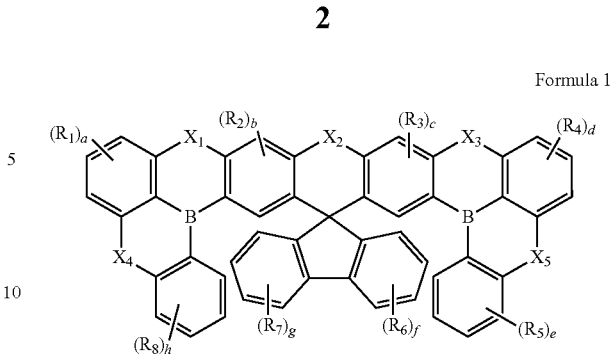

Formula 1

In Formula 1, $X_1$ to $X_5$ are each independently $NR_9$, O, S, or Se, $R_1$ to $R_9$ are each independently a hydrogen atom, a deuterium atom, a halogen atom, a cyano group, a substituted or unsubstituted silyl group, a substituted or unsubstituted alkyl group having 1 to 30 carbon atoms, a substituted or unsubstituted amine group, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, a is an integer of 0 to 3, b and c are each independently an integer of 0 to 2, d is an integer of 0 to 3, and e, f, g, and h are each independently an integer of 0 to 4.

In an embodiment, the plurality of organic layers may include a hole transport region, an emission layer, and an electron transport region, and the emission layer may include the condensed polycyclic compound.

In an embodiment, the emission layer may emit thermally activated delayed fluorescence.

In an embodiment, the emission layer may emit light having a center wavelength of about 420 nm to about 470 nm.

In an embodiment, the emission layer may include a host and a dopant, and the dopant may include the condensed polycyclic compound.

In an embodiment, the lowest triplet excitation energy level ($T_1$ energy level) of the condensed polycyclic compound may be about 2.60 eV or more.

In an embodiment, each of $R_2$ and $R_3$ may be a hydrogen atom.

In an embodiment, each of $R_6$ and $R_7$ may be a hydrogen atom.

In an embodiment, each of $R_5$ and $R_8$ may be a hydrogen atom.

In an embodiment, at least one selected from $R_1$ and $R_4$ may be a substituted or unsubstituted aryl group having 6 to 30 ring-forming carbon atoms.

In an embodiment, at least one selected from $R_1$ and $R_4$ may be a substituted or unsubstituted alkyl group having 1 to 30 carbon atoms.

In an embodiment, the condensed polycyclic represented by Formula 1 may be represented by Formula 1-1a or Formula 1-1b:

Formula 1-1a

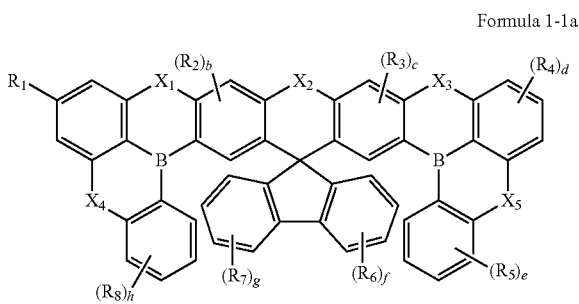

Formula 1-1b

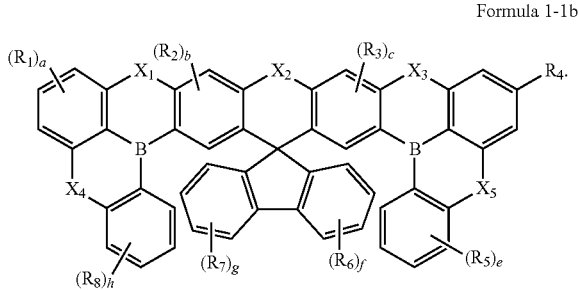

In Formula 1-1a and Formula 1-1b, $X_1$ to $X_5$, $R_1$ to $R_8$, and a to h are the same as defined in Formula 1.

In an embodiment, the condensed polycyclic compound represented by Formula 1 may be represented by any one selected from among Formulae 1-2a to 1-2d:

Formula 1-2a

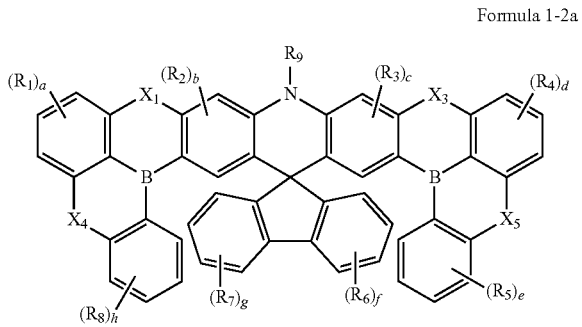

Formula 1-2b

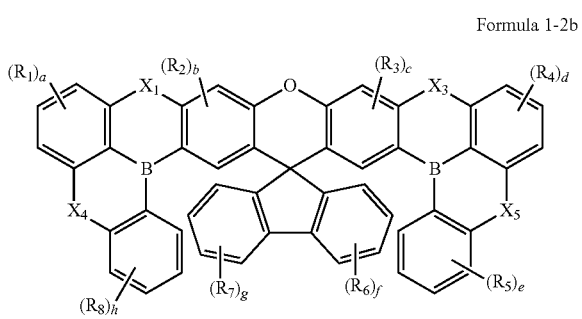

Formula 1-2c

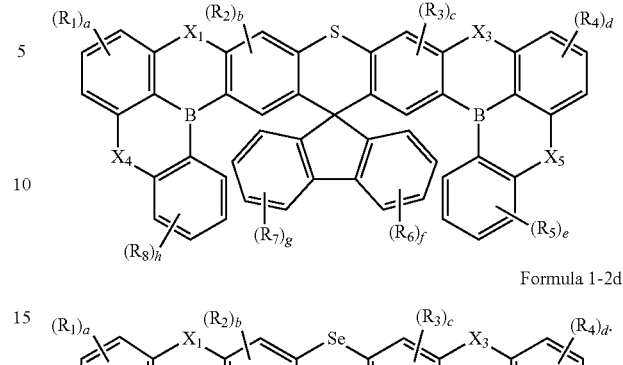

Formula 1-2d

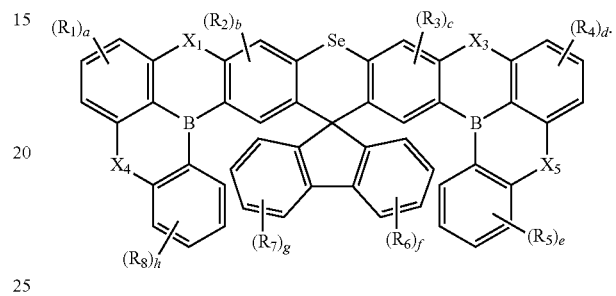

In Formula 1-2a to Formula 1-2d, $X_1$, $X_3$ to $X_5$, $R_1$ to $R_9$, and a to h are the same as defined in Formula 1.

BRIEF DESCRIPTION OF THE FIGURES

The accompanying drawings are included to provide a further understanding of the subject matter of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
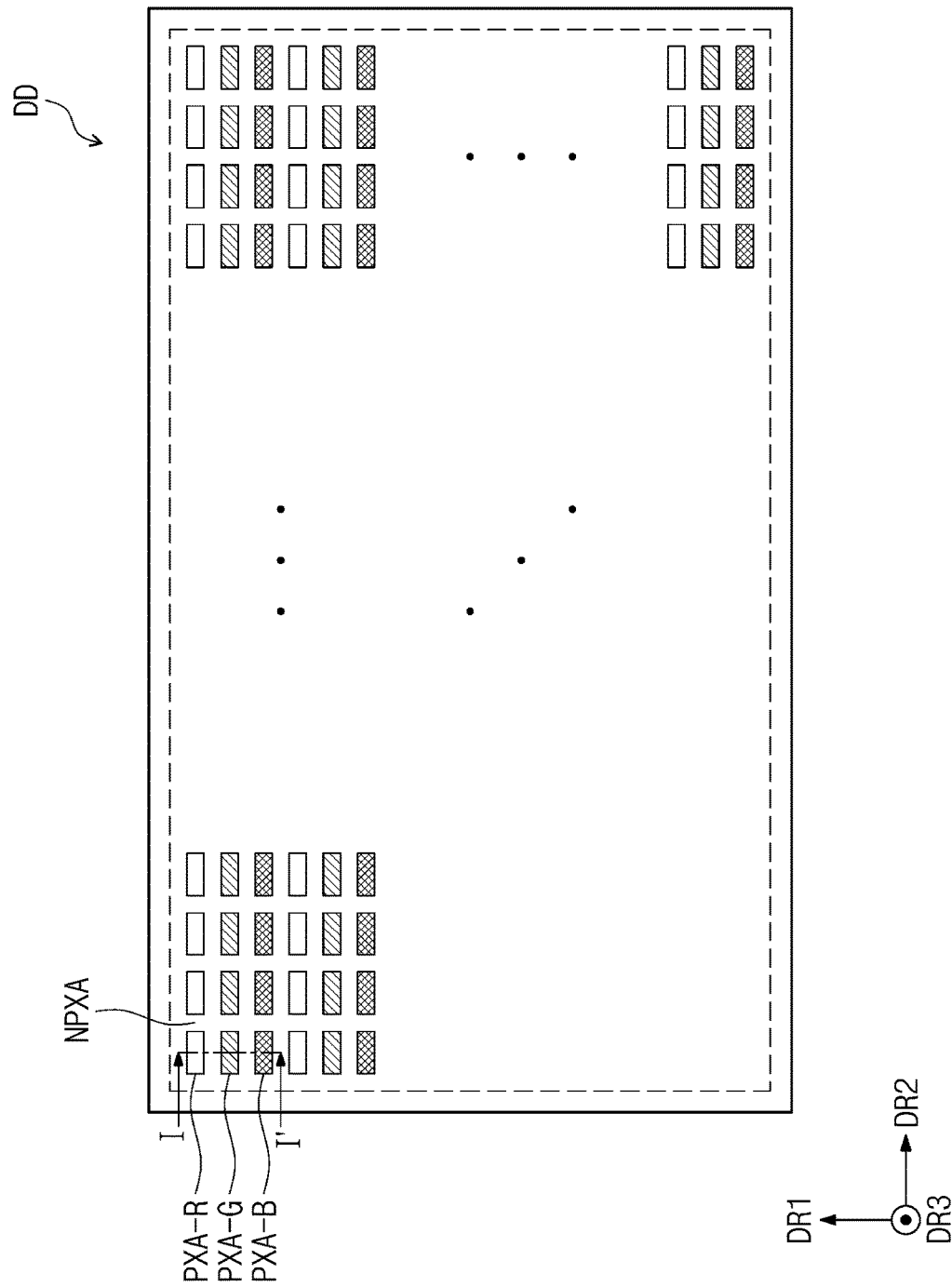
FIG. 1 is a plan view of a display apparatus according to an embodiment of the present disclosure.

The subject matter of the present disclosure may be modified in many alternate forms, and thus example embodiments will be illustrated in the drawings and described. It should be understood, however, that it is not intended to limit the present disclosure to the particular forms disclosed, but rather, is intended to cover all modifications, equivalents, and alternatives falling within the spirit and scope of the present disclosure.

When explaining each of the drawings, like reference numbers are used to refer to like elements. In the accompanying drawings, the dimensions of each structure may be exaggeratingly illustrated for clarity of the present disclosure. It will be understood that, although the terms "first," "second," etc. may be used herein to describe various elements, these elements should not be limited by these terms. These terms are only used to distinguish one element from another. For example, a first element may be referred to as a second element, and, similarly, the second element may be referred to as the first element, without departing from the scope of the present disclosure. The terms of a singular form may include plural forms unless the context clearly indicates otherwise.

The term "and/or" includes all combinations of one or more of which associated configurations may define.

In the present specification, it will be understood that the meaning of "comprise" or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combination thereof.

In the present specification, when a layer, a film, a region, or a plate is referred to as being "above" or "in an upper portion" another layer, film, region, or plate, it can be not only directly on the layer, film, region, or plate, but intervening layers, films, regions, or plates may also be present. Additionally, when a layer, a film, a region, or a plate is referred to as being "below," "in a lower portion of" another layer, film, region, or plate, it can be not only directly under the layer, film, region, or plate, but intervening layers, films, regions, or plates may also be present. In addition, it will be understood that when a layer, a film, a region, or a plate is referred to as being "on" another layer, film, region, or plate, it can be not only on the layer, film, region, or plate, but also under the layer, film, region, or plate.

In the specification, the term "substituted or unsubstituted" may mean being substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents described above may be substituted or unsubstituted. For example, a biphenyl group may be interpreted as an aryl group or a phenyl group substituted with a phenyl group.

In the specification, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The rings formed by being bonded to an adjacent group may be monocyclic or polycyclic. In addition, the rings formed by being bonded to each other may be connected to another ring to form a spiro structure.

In the specification, the term "adjacent group" may mean a substituent substituted for an atom which is directly bonded to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In addition, two methyl groups in 4,5-dimethylphenanthrene may be interpreted as "adjacent groups" to each other.

In the specification, examples of the halogen atom may include a fluorine atom, a chlorine atom, a bromine atom, and/or an iodine atom.

In the specification, the alkyl group may be a linear, branched or cyclic type (e.g., a linear alkyl group, a branched alkyl group, or a cyclic alkyl group). The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the present disclosure is not limited thereto.

The term "hydrocarbon ring group," as used herein, means any functional group or substituent derived from an aliphatic hydrocarbon ring. The hydrocarbon ring group may be a saturated hydrocarbon ring group having 5 to 20 ring-forming carbon atoms.

The term "aryl group," as used herein, means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the present disclosure is not limited thereto.

In the specification, the fluorenyl group may be substituted, and two substituents may be bonded to each other to form a spiro structure. Examples of cases where the fluorenyl group is substituted are as follows. However, the present disclosure is not limited thereto.

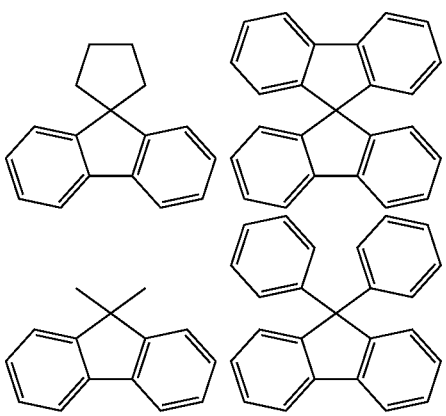

In the specification, the term "heterocyclic group" refers to any functional group or substituent derived a ring including at least one of B, O, N, P, Si, S or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the specification, the heterocyclic group may include at least one of B, O, N, P, Si, S or Se as a heteroatom. If the heterocyclic group includes two or more heteroatoms, the two or more heteroatoms may be the same or different. The heterocyclic group may be a monocyclic heterocyclic group or a polycyclic heterocyclic group and has the concept including a heteroaryl group. The number of ring-forming carbon atoms in the heterocyclic group may be 2 to 30, 2 to 20, or 2 to 10.

In the specification, the aliphatic heterocyclic group may include one or more among B, O, N, P, Si, S and Se as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but the present disclosure is not limited thereto.

In the specification, the heteroaryl group may include at least one of B, O, N, P, Si, S, or Se as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the present disclosure is not limited thereto.

In the specification, the above description with respect to the aryl group may be applied to an arylene group except that the arylene group is a divalent group. The explanation on the aforementioned heteroaryl group may be applied to a heteroarylene group except that the heteroarylene group is a divalent group.

In the specification, the term "silyl group" includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, the present disclosure is not limited thereto.

The term "oxy group," as used herein, may mean that an oxygen atom is bonded to the alkyl group or the aryl group as defined above. The oxy group may include an alkoxy group and an aryl oxy group. The alkoxy group may be a linear chain, a branched chain, or a ring chain (e.g., a linear alkoxy group, a branched alkoxy group, or a ring-containing alkoxy group). The number of carbon atoms in the alkoxy group is not specifically limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., without limitation.

The term "boron group," as used herein, may mean that a boron atom is bonded to the alkyl group or the aryl group as defined above. The boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., but the present disclosure is not limited thereto.

In the specification, the alkenyl group may be linear or branched (e.g., may be a linear alkenyl group or a branched alkenyl group). The number of carbon atoms in the alkenyl group is not specifically limited, but is 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but the present disclosure is not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but the present disclosure is not limited thereto.

In the specification, the alkyl group among an alkylthio group, an alkyl sulfoxy group, an alkyl aryl group, an alkyl boron group, an alkyl silyl group and an alkyl amine group is the same as the examples of the alkyl group described above.

In the specification, the aryl group among an aryloxy group, an arylthio group, an aryl sulfoxy group, an aryl boron group, an aryl silyl group, and an aryl amine group is the same as the examples of the aryl group described above.

A direct linkage herein may mean a single bond (e.g., a single covalent bond).

As used herein, "—*" means a position to be connected.

Hereinafter, embodiments of the present disclosure will be described with reference to the accompanying drawings.

Figure 2:
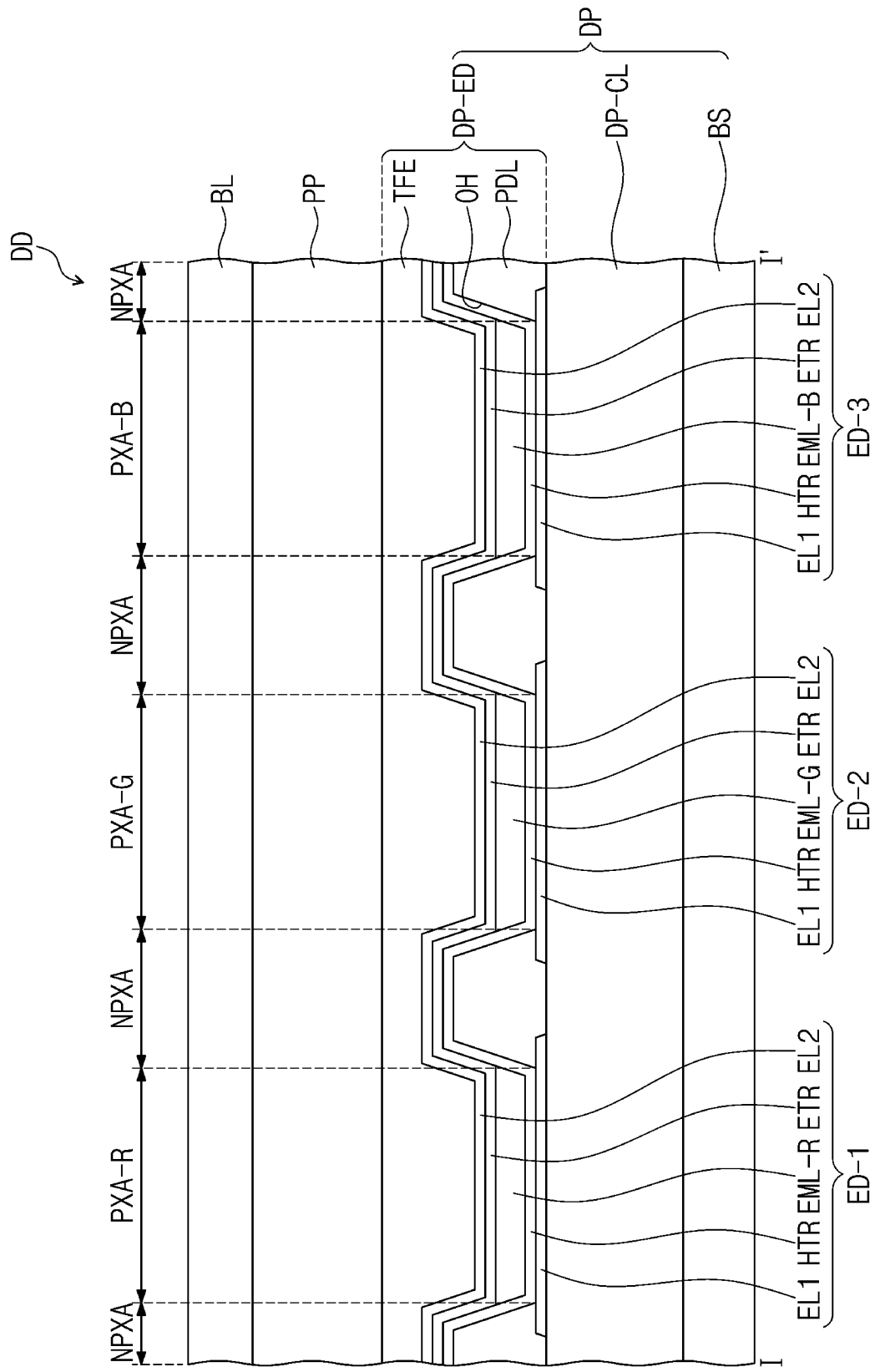
FIG. 2 is a cross-sectional view of a display apparatus according to an embodiment of the present disclosure.

FIG. 1 is a plan view illustrating an embodiment of a display apparatus DD. FIG. 2 is a cross-sectional view of the display apparatus DD of the embodiment. FIG. 2 is a cross-sectional view illustrating a part taken along line I-I' of FIG. 1.

The display apparatus DD may include a display panel DP and an optical layer PP on the display panel DP. The display panel DP includes a plurality of light emitting devices ED-1, ED-2, and ED-3, and thus, the display apparatus DD may include the plurality of light emitting devices ED-1, ED-2, and ED-3. The optical layer PP may be on the display panel DP and control reflected light in the display panel DP due to external light. The optical layer PP may include, for example, a polarization layer and/or a color filter layer. Unlike the views illustrated in the drawings, the optical layer PP may be omitted from the display apparatus DD of an embodiment.

A base substrate BL may be on the optical layer PP. The base substrate BL may be a member which provides a base surface on which the optical layer PP is located. The base substrate BL may be a glass substrate, a metal substrate, a plastic substrate, etc. However, the present disclosure is not limited thereto, and the base substrate BL may be an inorganic layer, an organic layer, or a composite material layer including an inorganic material and an organic material. In addition, unlike as shown in the drawings, in an embodiment, the base substrate BL may be omitted.

The display apparatus DD according to an embodiment may further include a filling layer. The filling layer may be between a display device layer DP-ED and the base substrate BL. The filling layer may be an organic material layer. The filling layer may include at least one selected from an acrylic-based resin, a silicone-based resin, and an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 between portions of the pixel defining film PDL, and an encapsulation layer TFE on the light emitting devices ED-1, ED-2, and ED-3.

The base layer BS may be a member which provides a base surface on which the display device layer DP-ED is located. The base layer BS may be a glass substrate, a metal substrate, a plastic substrate, etc. However, the present disclosure is not limited thereto, and the base layer BS may be an inorganic layer, an organic layer, or a composite material layer including an inorganic material and an organic material.

In an embodiment, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be further described herein below. Each of the light emitting devices ED-1, ED-2 and ED-3 may include a first electrode EL1, a hole transport region HTR, a respective one of emission layers EML-R, EML-G and EML-B, an electron transport region ETR, and a second electrode EL2.

FIG. 2 illustrates an embodiment in which the emission layers EML-R, EML-G, and EML-B of the light emitting devices ED-1, ED-2, and ED-3, respectively, in the openings OH defined in the pixel defining film PDL, and the hole transport region HTR, the electron transport region ETR, and the second electrode EL2 are provided as a common layer in the entire light emitting devices ED-1, ED-2, and ED-3. However, the present disclosure is not limited thereto, and unlike the feature illustrated in FIG. 2, the hole transport region HTR and the electron transport region ETR in an embodiment may be provided by being patterned inside the opening hole OH defined in the pixel defining film PDL. For example, the hole transport region HTR, the respective ones of the emission layers EML-R, EML-G, and EML-B, and the electron transport region ETR of the light emitting devices ED-1, ED-2, and ED-3 in an embodiment may be provided by being patterned by an inkjet printing method.

The encapsulation layer TFE may seal the light emitting devices ED-1, ED-2 and ED-3. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances such as dust particles. The encapsulation-inorganic film may include silicon nitride, silicon oxynitride, silicon oxide, titanium oxide, aluminum oxide, and/or the like, but the present disclosure is not particularly limited thereto. The encapsulation-organic film may include an acrylic-based compound, an epoxy-based compound, and/or the like. The encapsulation-organic film may include a photopolymerizable organic material, but the present disclosure is not particularly limited thereto.

The encapsulation layer TFE may be on the second electrode EL2 and may fill the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B each may be a region which emits light generated from the light emitting devices ED-1, ED-2 and ED-3, respectively. The light emitting regions PXA-R, PXA-G, and PXA-B may be spaced apart from each other in a plane.

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In one or more embodiments, each of the light emitting regions PXA-R, PXA-G, and PXA-B may correspond to a pixel. The pixel defining film PDL may separate the light emitting devices ED-1, ED-2, and ED-3. The respective ones of the emission layers EML-R, EML-G and EML-B of the light emitting devices ED-1, ED-2 and ED-3 may be in openings OH defined by the pixel defining film PDL and separated from each other.

The light emitting regions PXA-R, PXA-G and PXA-B may be divided into a plurality of groups according to the color of light generated from the plurality of light emitting devices ED-1, ED-2 and ED-3. In the display apparatus DD of an embodiment shown in FIGS. 1 and 2, three light emitting regions PXA-R, PXA-G, and PXA-B which emit red light, green light, and blue light, respectively are illustrated as examples. For example, the display apparatus DD of an embodiment may include the red light emitting region PXA-R, the green light emitting region PXA-G, and the blue light emitting region PXA-B which are different.

In the display apparatus DD according to an embodiment, the plurality of light emitting devices ED-1, ED-2 and ED-3 may emit light in different wavelength regions. For example, in an embodiment, the display apparatus DD may include a first light emitting device ED-1 that emits red light, a second light emitting device ED-2 that emits green light, and a third light emitting device ED-3 that emits blue light. In one or more embodiments, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, the present disclosure is not limited thereto, and the first to the third light emitting devices ED-1, ED-2, and ED-3 may emit light in the same wavelength range or at least one light emitting device may emit light in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the plurality of red light emitting regions PXA-R, the plurality of green light emitting regions PXA-G, and the plurality of blue light emitting regions PXA-B each may be arranged along the second direction DR2. In addition, the red light emitting region PXA-R, the green light emitting region PXA-G, and the blue light emitting region PXA-B may be alternately arranged in this order along the first direction DR1.

FIGS. 1 and 2 illustrate that all the light emitting regions PXA-R, PXA-G, and PXA-B have similar areas, but the present disclosure is not limited thereto, and the light emitting regions PXA-R, PXA-G, and PXA-B may have different areas from each other according to a wavelength range of the emitted light. In this case, the areas of the light emitting regions PXA-R, PXA-G, and PXA-B may mean areas when viewed in a plane defined by the first direction DR1 and the second direction DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of a display quality required in the display apparatus DD. For example, the arrangement form of the light emitting regions PXA-R, PXA-G, and PXA-B may be a PENTILE® arrangement structure (e.g., an RGBG matrix, RGBG structure, or RGBG matrix structure) or a diamond arrangement form. PENTILE® is a duly registered trademark of Samsung Display Co., Ltd.

In addition, the areas of the light emitting regions PXA-R, PXA-G, and PXA-B may be different from each other. For example, in an embodiment, the area of the green light emitting region PXA-G may be smaller than that of the blue light emitting region PXA-B, but the present disclosure is not limited thereto.

Hereinafter, FIGS. 3 to 6 are cross-sectional views schematically illustrating light emitting devices according to an embodiment. Each of the light emitting devices ED according to embodiments may include a first electrode EL1, a hole transport region HTR, an emission layer EML, an electron transport region ETR, and a second electrode EL2 that are sequentially stacked.

Figure 3:
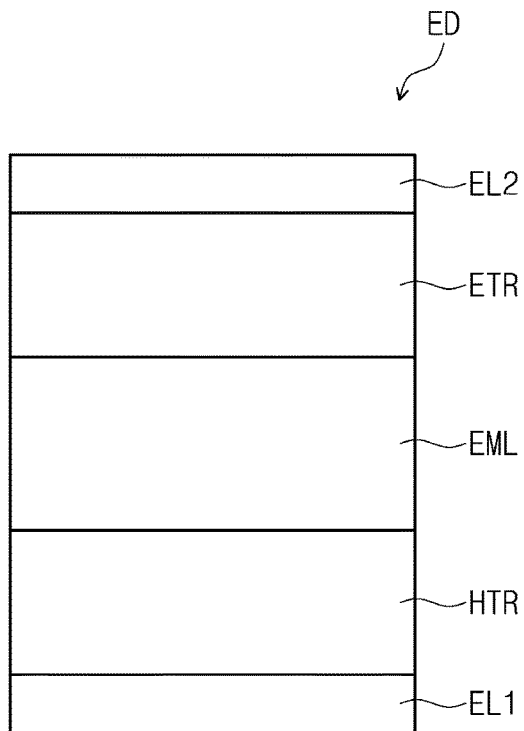
FIGS. 3, 4, 5, and 6 are schematic cross-sectional views of display apparatuses according to embodiments of the present disclosure.
Figure 4:
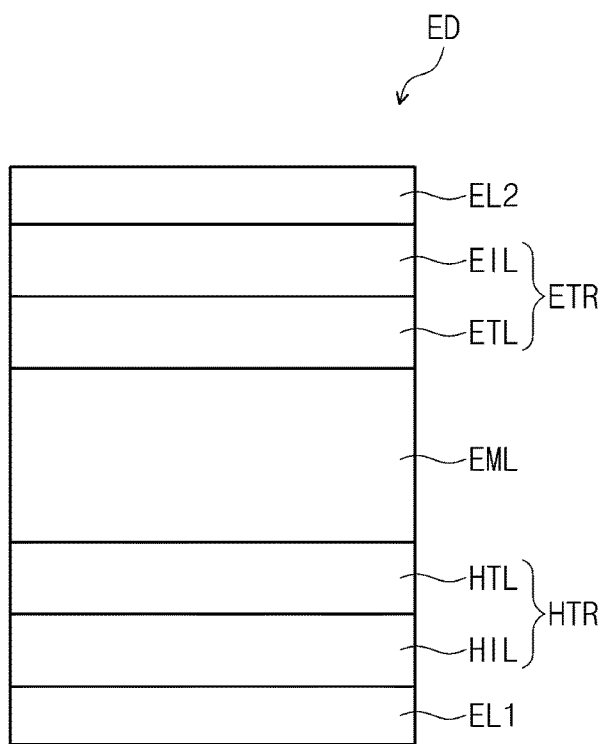
Figure 5:
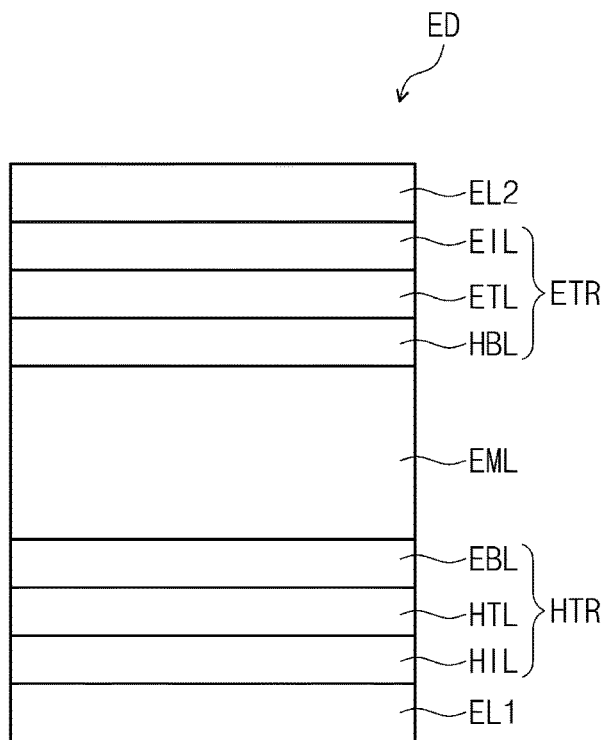
Figure 6:
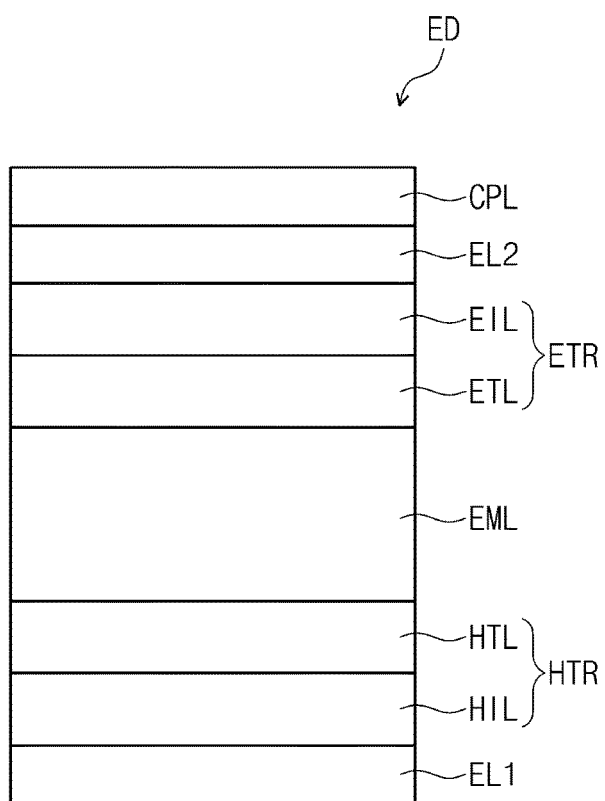

Compared to FIG. 3, FIG. 4 illustrates a cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting device ED of an embodiment including a capping layer CPL on a second electrode EL2.

The first electrode EL1 has conductivity (e.g., electrical conductivity). The first electrode EL1 may be formed of a metal material, a metal alloy, and/or a conductive compound (e.g., an electrically conductive compound). The first electrode EL1 may be an anode or a cathode. However, the present disclosure is not limited thereto. In addition, the first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, In, Sn, Zn, Yb, W, a compound thereof, or a mixture thereof (e.g., a mixture of Ag and Mg). In one or more embodiments, the first electrode EL1 may have a multilayer structure including a reflective film or a transflective film formed of the above-described materials, and a transparent conductive film formed of ITO, IZO, ZnO, ITZO, etc. For example, the first electrode EU may have a three-layer structure of ITO/Ag/ITO, but the present disclosure is not limited thereto. In addition, the present disclosure is not limited thereto, and the first electrode EL1 may include the above-described metal materials, combinations of at least two metal materials of the above-described metal materials, oxides of the above-described metal materials, and/or the like. The thickness of the first electrode EU may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission-auxiliary layer, or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, and may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but the present disclosure is not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

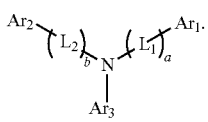

Formula H-1

In Formula H-1 above, $L_1$ and $L_2$ may be each independently a direct linkage (e.g., a single covalent bond), a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. In one or more embodiments, when a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 above may be a monoamine compound. In one or more embodiments, the compound represented by Formula H-1 above may be a diamine compound in which at least one among $Ar_1$ to $Ar_3$ includes the amine group as a substituent. In addition, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one selected from among the compounds of Compound Group H below. However, the compounds listed in Compound Group H below are examples, and the compounds represented by Formula H-1 are not limited to those represented by Compound Group H below:

Compound Group H

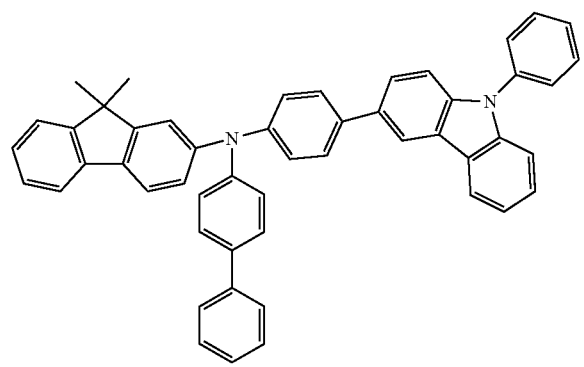

H-1-1

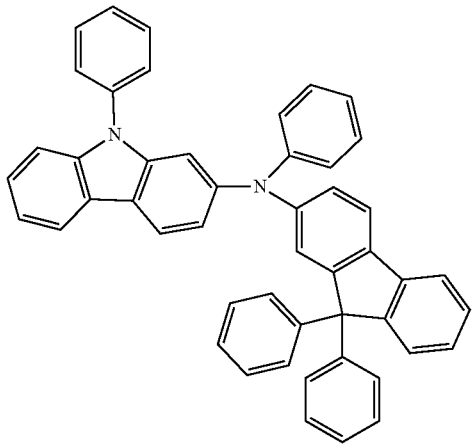

H-1-2

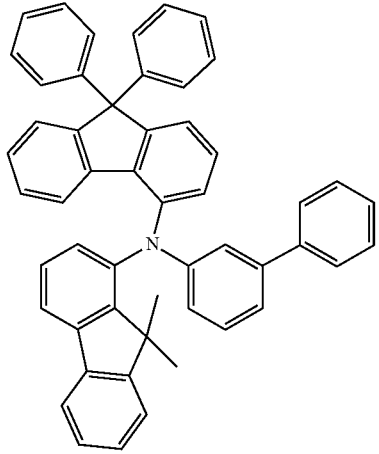

H-1-3

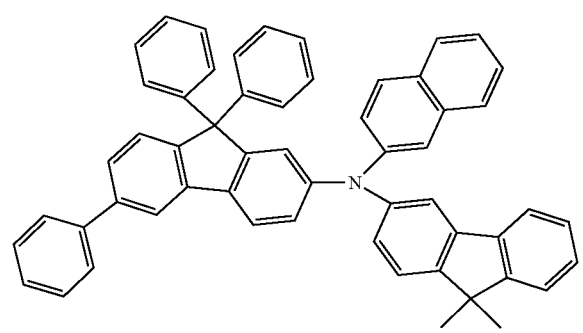

H-1-4

H-1-5
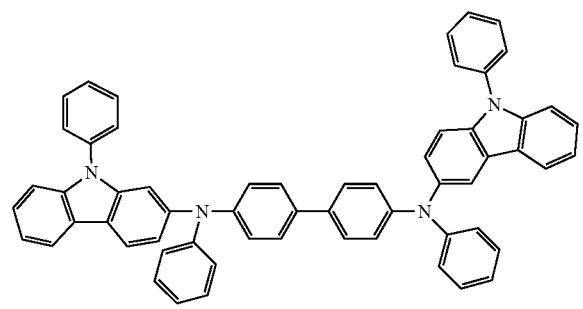
H-1-6
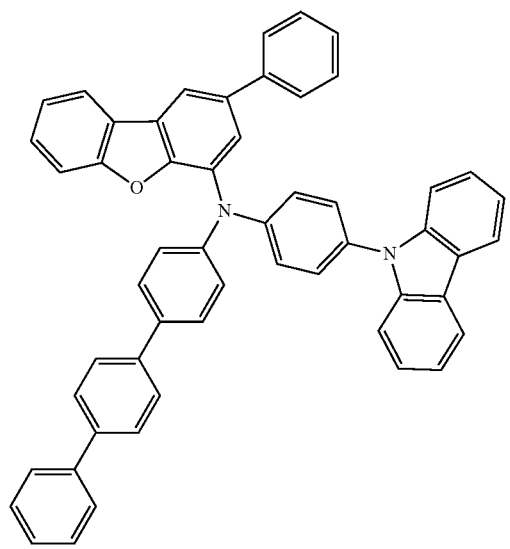
H-1-7
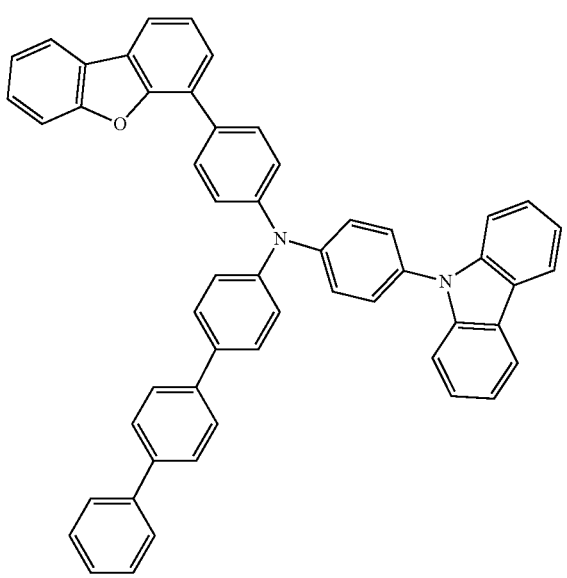
H-1-8
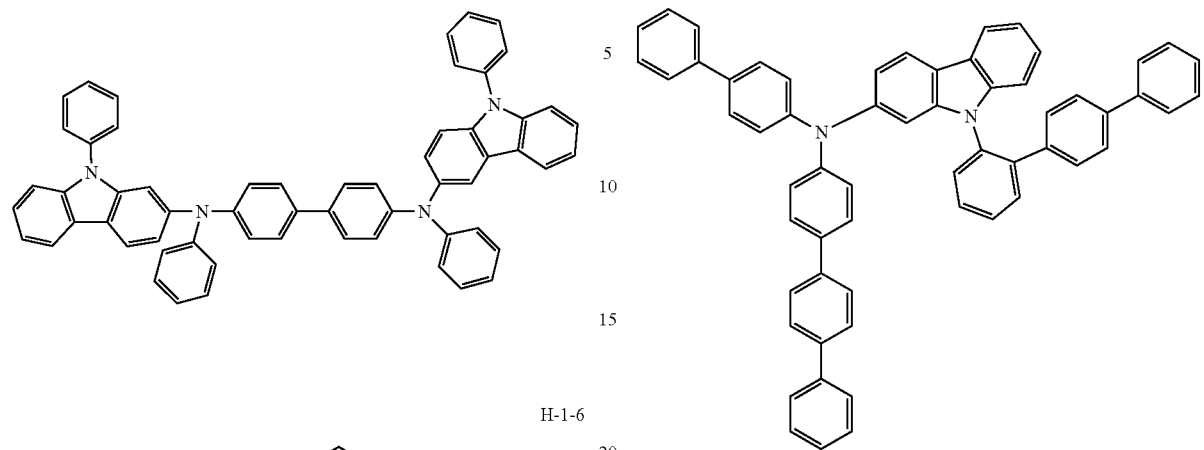
H-1-9
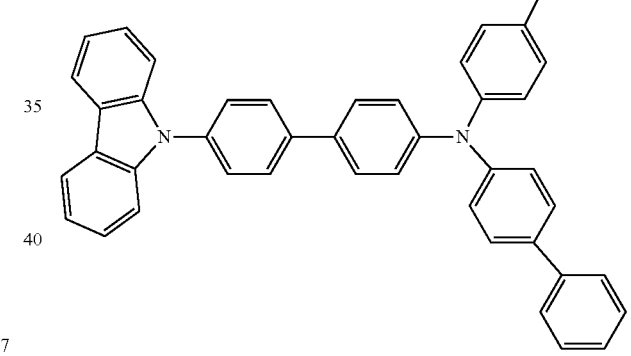
H-1-10
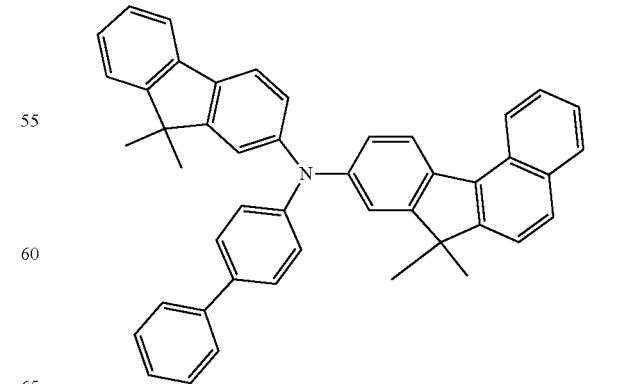

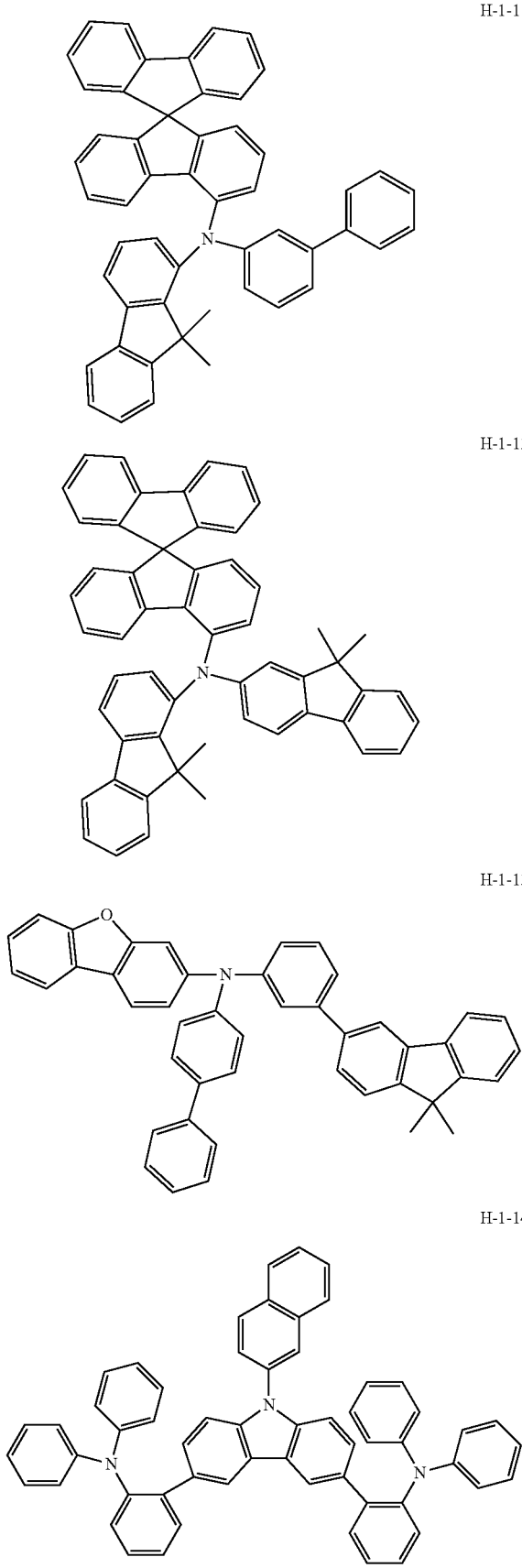
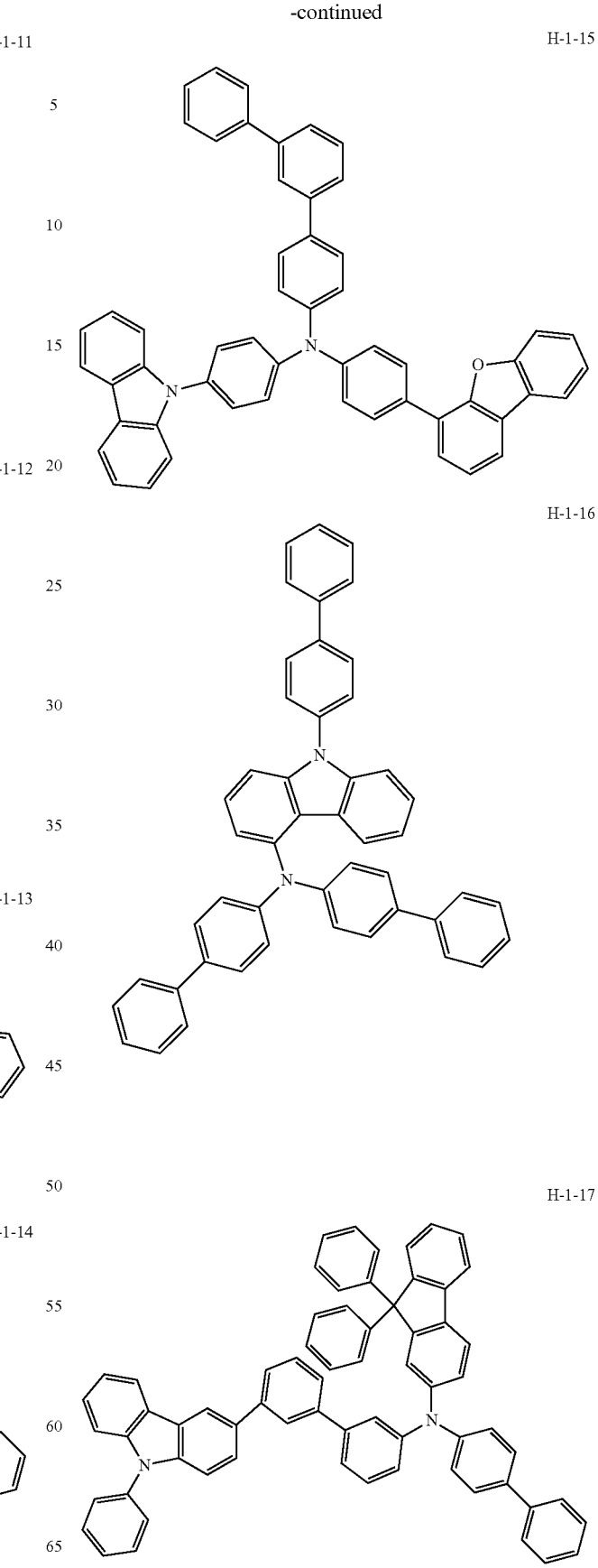

-continued

H-1-18

H-1-19

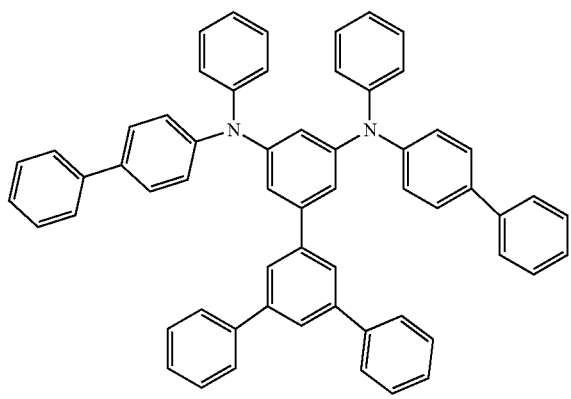

The hole transport region HTR may include a phthalocyanine compound such as copper phthalocyanine; N¹,N¹'-([1,1'-biphenyl]-4,4'-diyl)bis(N¹-phenyl-N⁴,N⁴-di-m-tolylbenzene-1,4-diamine) (DNTPD), 4,4',4''-[tris(3-methylphenyl)phenylamino] triphenylamine (m-MTDATA), 4,4',4''-tris(N,N-diphenylamino)triphenylamine (TDATA), 4,4',4''-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include carbazole derivatives such as N-phenyl carbazole and/or polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4''-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis (N-carbazolyl)benzene (mCP), etc.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-Abenzene (mDCP), etc.

The hole transport region HTR may include the above-described compound of the hole transport region in at least one selected from a hole injection layer HIL, a hole transport layer HTL, and an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport characteristic may be achieved without a substantial increase in a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may include at least one selected from a halogenated metal compound, a quinone derivative, a metal oxide, and a cyano group-containing compound, but the present disclosure is not limited thereto. For example, the p-dopant may include metal halides such as CuI and/or RbI, quinone derivatives such as tetracyanoquinodimethane (TCNQ) and/or 2,3,5,6-tetrafluoro-7,7',8,8'-tetracyanoquinodimethane (F4-TCNQ), metal oxides such as tungsten oxide and/or molybdenum oxide, dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile, etc., but the present disclosure is not limited thereto.

As described above, the hole transport region HTR may further include at least one selected from the buffer layer and the electron blocking layer EBL in addition to the hole injection layer HIL and the hole transport layer HTL. The buffer layer may compensate a resonance distance according to the wavelength of light emitted from the emission layer EML and may thus increase light emission efficiency. Materials which may be included in the hole transport region HTR may be used as materials to be included in the buffer layer. The electron blocking layer EBL is a layer that serves to prevent or reduce injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML in the light emitting device ED of an embodiment may include a condensed polycyclic compound represented by Formula 1 of an embodiment.

Formula 1

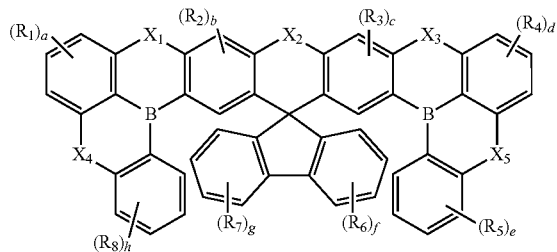

In Formula 1, $X_1$ to $X_5$ are each independently $NR_9$, O, S, or Se.

$R_1$ to $R_9$ may be each independently a hydrogen atom, a deuterium atom, a halogen atom, a cyano group, a substituted or unsubstituted silyl group, a substituted or unsubstituted alkyl group having 1 to 30 carbon atoms, a substituted or unsubstituted amine group, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. For example, $R_1$ may be a substituted or unsubstituted amine group. In one or more embodiments, $R_1$ may be a substituted or unsubstituted diphenyl amine group.

For example, each of $R_2$ and $R_3$ may be a hydrogen atom.

For example, $R_4$ may be a substituted or unsubstituted alkyl group having 1 to 30 carbon atoms. In one or more embodiments, $R_4$ may be an unsubstituted t-butyl group.

For example, each of $R_5$ to $R_8$ may be a hydrogen atom.

For example, $R_9$ may be a substituted or unsubstituted aryl group having 6 to 30 ring-forming carbon atoms. In one or more embodiments, $R_9$ may be a substituted or unsubstituted phenyl group. For example, $R_9$ may be an unsubstituted phenyl group, or a phenyl group substituted with a phenyl group. In one or more embodiments, when any one selected from among $X_1$ to $X_3$ is represented by $NR_9$, $R_9$ may be an unsubstituted phenyl group, or an unsubstituted terphenyl group. For example, $R_9$ may be represented by

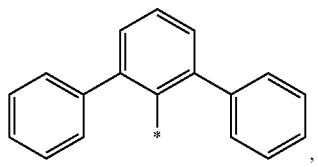 [SMILES: *c1c(-c2ccccc2)cccc1-c1ccccc1]

, which includes three phenyl group bonded together.

In one or more embodiments, when $X_4$ and $X_5$ is represented by $NR_9$, $R_9$ may be an unsubstituted phenyl group, or an unsubstituted biphenyl group. For example, $R_9$ may be represented by

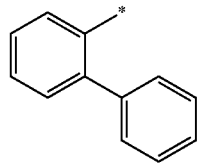

.

However, the present disclosure is not limited thereto.

a is an integer of 0 to 3. For example, a may be 1.

b and c are each independently an integer of 0 to 2. For example, each of b and c may be 0. In an embodiment, when b is 0, the condensed polycyclic compound may have the same structure as the case where $R_2$ is a hydrogen atom. In an embodiment, when c is 0, the condensed polycyclic compound may have the same structure as the case where $R_3$ is a hydrogen atom.

d is an integer of 0 to 3. For example, a may be 1.

e, f, g, and h are each independently an integer of 0 to 4. For example, each of e to h may be 0. Like b, when each of e to h is 0, the condensed polycyclic compound may have the same structure as the case where each of $R_5$ to $R_8$ is a hydrogen atom.

The condensed polycyclic compound of an embodiment may be formed by connecting two condensed polycyclic compounds, each of which contains a boron atom, by a spiro structure. For example, with respect to embodiments of the condensed polycyclic compound of the present disclosure, a hexagonal ring containing an $X_2$ atom and a fluorenyl group may form a spiro structure, and at the spiro structure, heteroatoms including a boron atom and a plurality of rings may be condensed (e.g., combined together with each other).

In an embodiment, the condensed polycyclic represented by Formula 1 may be represented by Formula 1-1a or Formula 1-1b:

Formula 1-1a

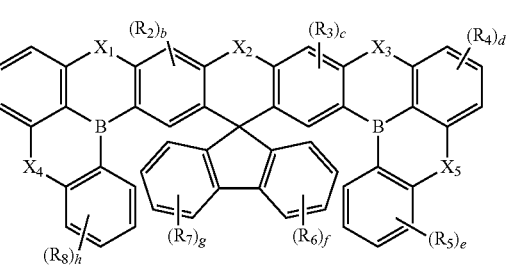

Formula 1-1b

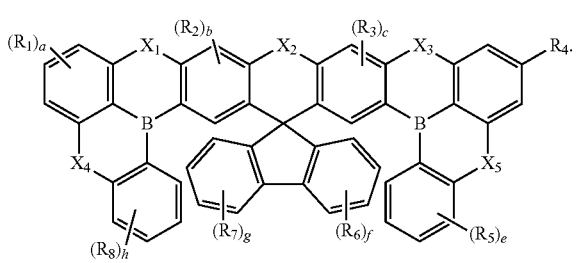

Formula 1-1a is the specified case where a is 1 in Formula 1. For example, in an embodiment, $R_1$ may be substituted at a para-position with respect to the boron atom substituted at the benzene ring at which $R_1$ is substituted.

Formula 1-1 b is the specified case where d is 1 in Formula 1. For example, in an embodiment, $R_4$ may be substituted at a para-position with respect to the boron atom substituted at the benzene ring at which $R_4$ is substituted.

In Formula 1-1a and Formula 1-1b, $X_1$ to $X_5$, $R_1$ to $R_8$, and a to h are the same as defined in Formula 1.

In the condensed polycyclic compound of an embodiment, at least one selected from $R_1$ and $R_4$ is substituted at a para-position with respect to the boron atom, and thus multiple resonance effects of the molecule and electron mobility may increase.

In an embodiment, the condensed polycyclic compound represented by Formula 1 may be represented by any one selected from among Formulae 1-2a to 1-2d:

Formula 1-2a

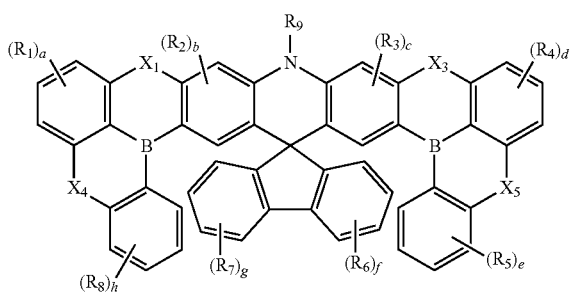

Formula 1-2b

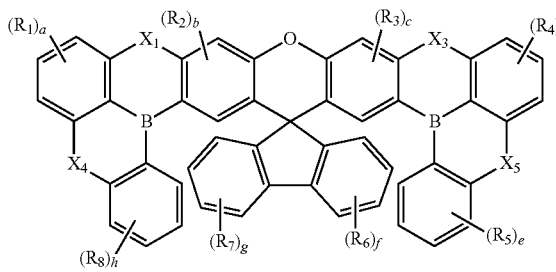

Formula 1-2c

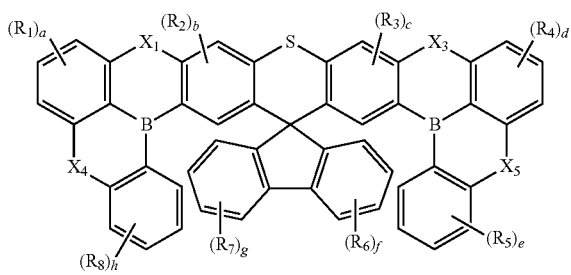

Formula 1-2d

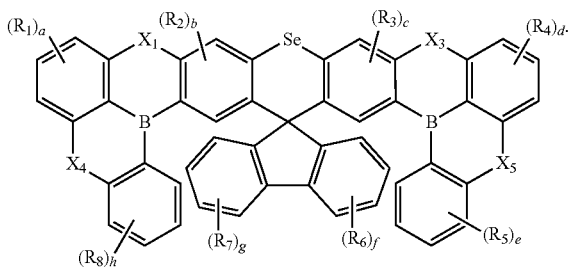

Formula 1-2a to Formula 1-2d are the cases where $X_2$ is specified in Formula 1.

In Formula 1-2a and Formula 1-2d, $X_1$, $X_3$ to $X_5$, $R_1$ to $R_9$, and a to h are the same as defined in Formula 1.

The condensed polycyclic compound according to an embodiment of the present disclosure may have improved overlap level of the Highest Occupied Molecular Orbital (HOMO) and the Lowest Unoccupied Molecular Orbital (LUMO) in the spiro structure as compared to the case where $X_2$ is a carbon atom because a heteroatom such as $NR_9$, O, S, or Se is positioned at the position of $X_2$ in the spiro structure.

In addition, the condensed polycyclic compound of an embodiment includes the spiro structure, and thus the conjugation in the molecule may be expanded, thereby reducing an $\Delta E_{ST}$ value of the condensed polycyclic compound.

Thus, with respect to embodiments of the condensed polycyclic compound of the present disclosure, a bond dissociation energy and multiple resonance characteristics may increase, and thus the stability of the molecule may increase. When the condensed polycyclic compound of the present disclosure is applied to any one selected from among the plurality of organic layers in the light emitting device ED, the interaction with adjacent molecules is reduced, and thus the luminous efficiency of the device may be improved.

In an embodiment, the condensed polycyclic compound represented by Formula 1 may be represented by Formula 1-3:

Formula 1-3

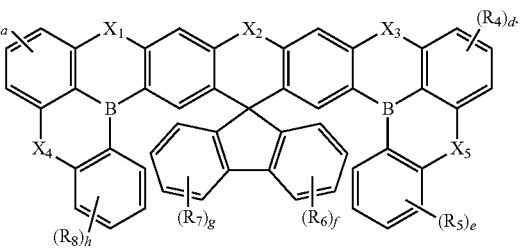

Formula 1-3 is the case where $R_2$ and $R_3$ are specified in Formula 1. In an embodiment, each of $R_2$ and $R_3$ may be a hydrogen atom. Formula 1-3 may be the same structure as the case where each of b and c is 0 in Formula 1.

$X_1$ to $X_5$, $R_1$, $R_4$ to $R_8$, a, and d to h are the same as defined in Formula 1.

In an embodiment, the condensed polycyclic compound represented by Formula 1 may be represented by Formula 1-4:

Formula 1-4

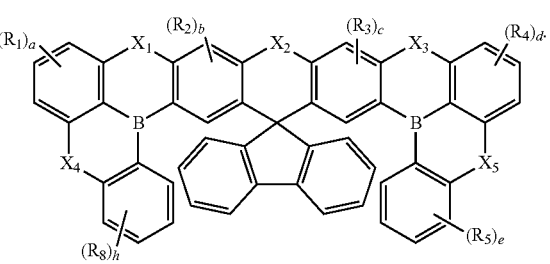

Formula 1-4 is the case where $R_6$ and $R_7$ are specified in Formula 1. In an embodiment, each of $R_6$ and $R_7$ may be a hydrogen atom. Formula 1-4 may be the same structure as the case where each of f and g is 0 in Formula 1.

In an embodiment, the condensed polycyclic compound represented by Formula 1 may be represented by Formula 1-5:

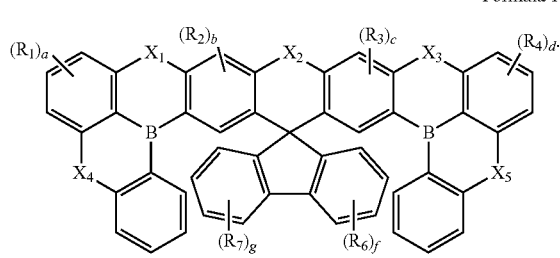

Formula 1-5

Formula 1-5 is the case where $R_5$ and $R_8$ are specified in Formula 1. In an embodiment, each of $R_5$ and $R_8$ may be a hydrogen atom. Formula 1-5 may be the same structure as the case where each of e and h is 0 in Formula 1.

In an embodiment, the condensed polycyclic compound represented by Formula 1 may be represented by Formula 1-6:

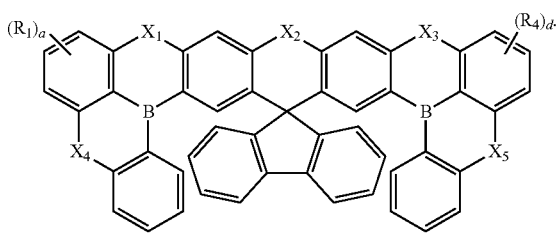

Formula 1-6

Formula 1-6 is the case where $R_2$, $R_3$, and $R_5$ to $R_8$ are specified in Formula 1. In an embodiment, each of $R_2$, $R_3$, and $R_5$ to $R_8$ may be a hydrogen atom. Formula 1-6 may be the same structure as the case where each of b, c, and e to h is 0 in Formula 1.

$X_1$ to $X_5$, $R_1$, $R_4$, a, and d are the same as defined in Formula 1.

In an embodiment, the condensed polycyclic compound represented by Formula 1 may include any one selected from among the compounds represented by Compound Group 1:

Compound Group 1

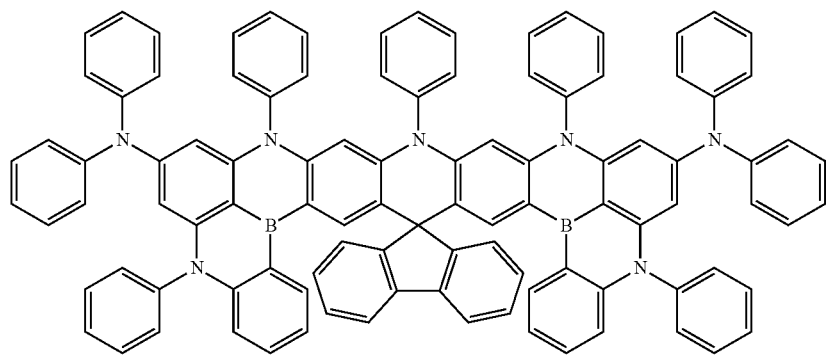

1

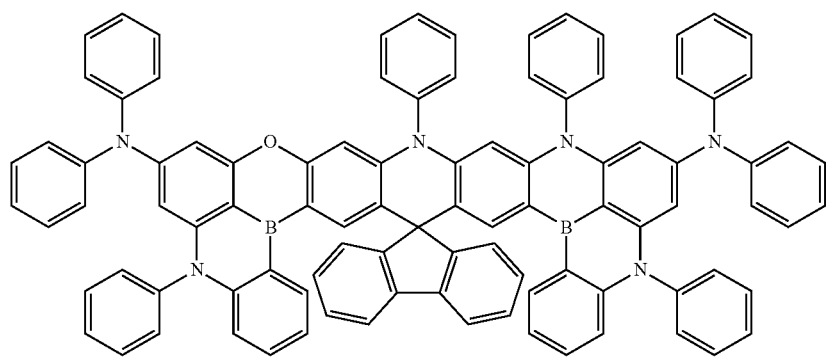

2

-continued
3
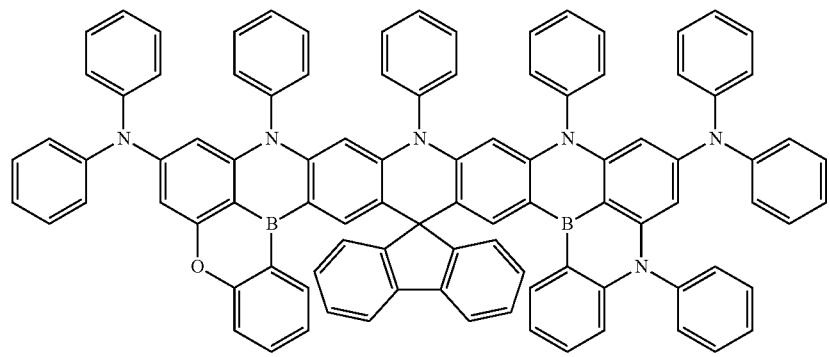
4
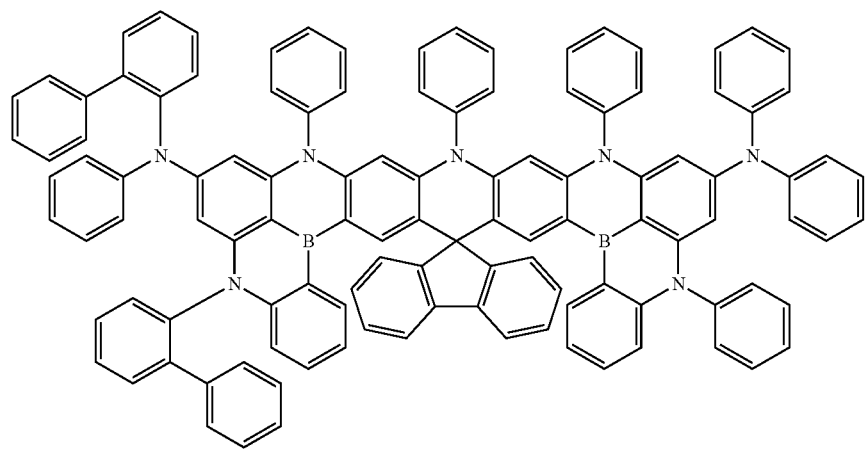
5
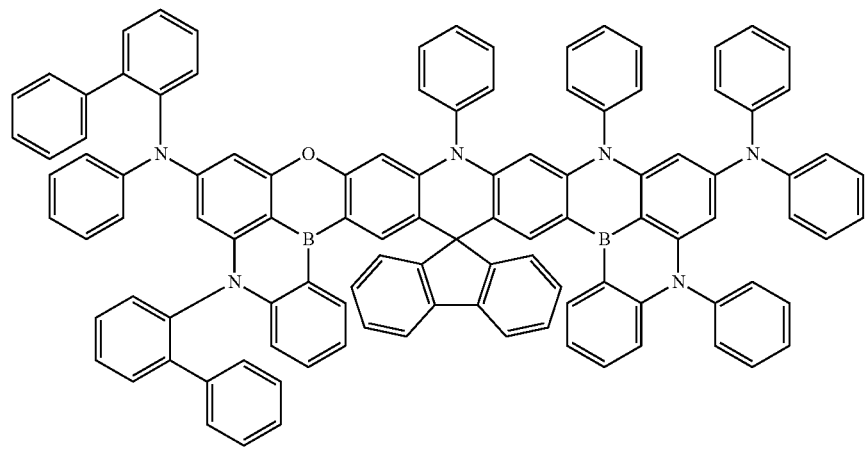
6
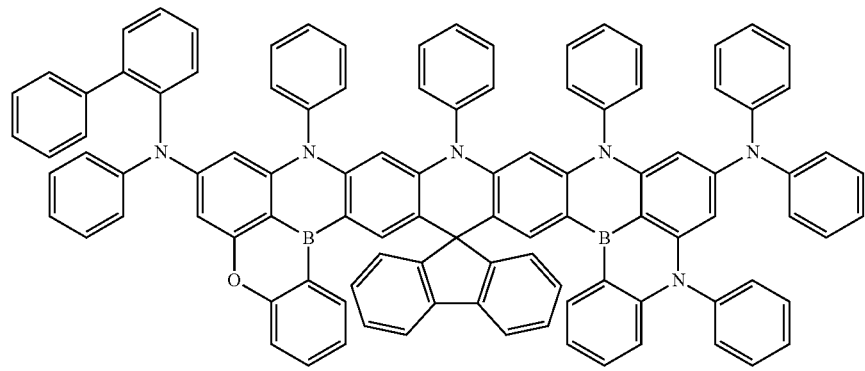

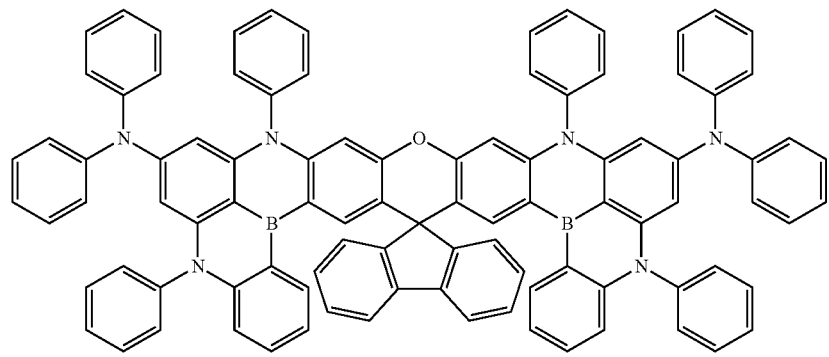
7
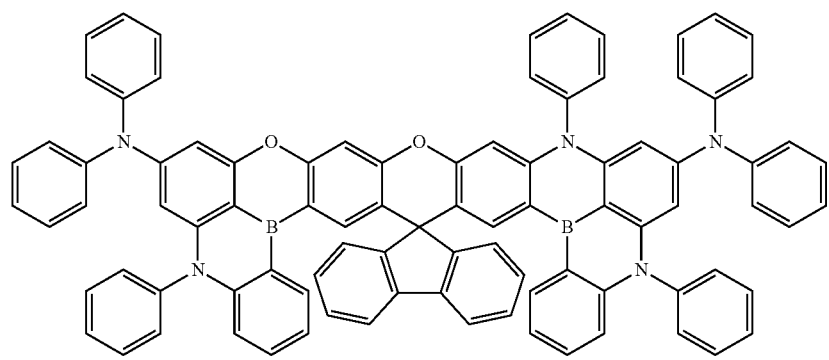
8
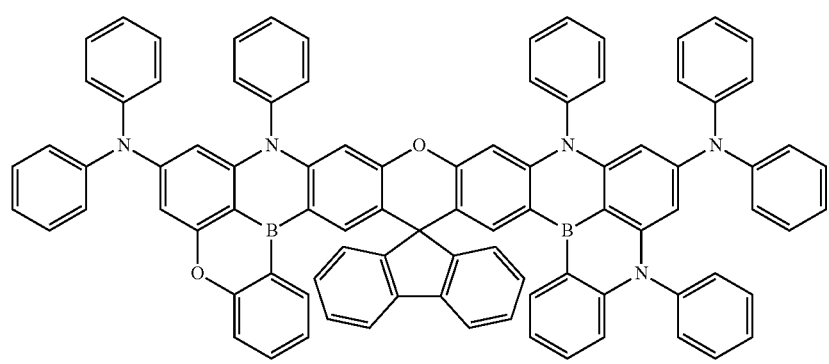
9
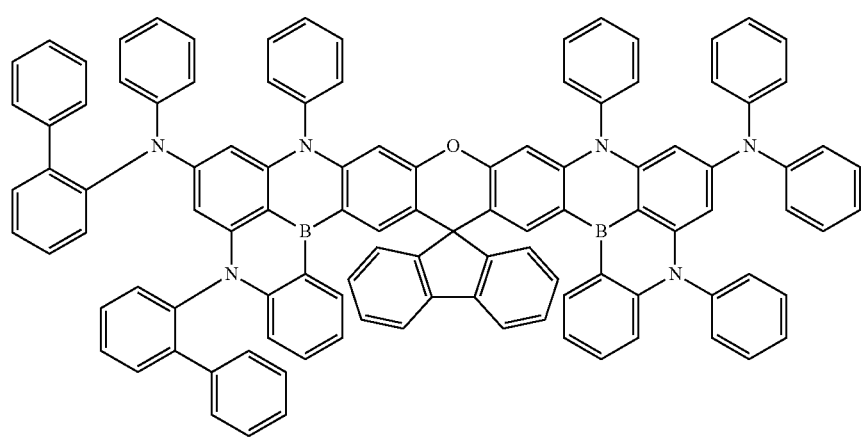
10

-continued
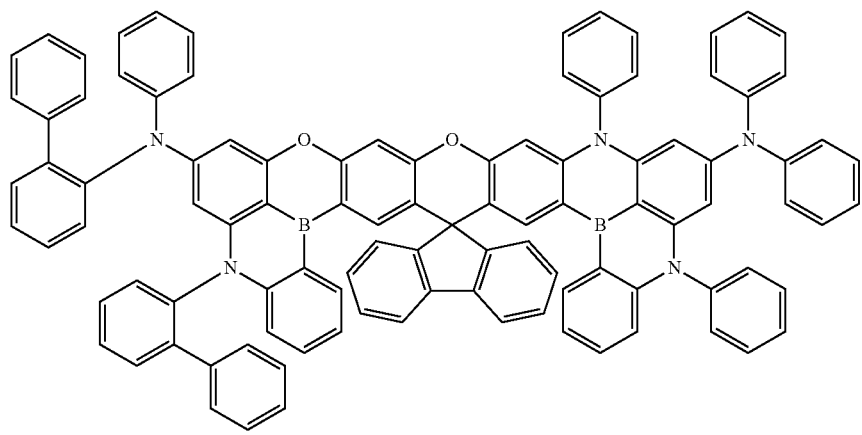
11
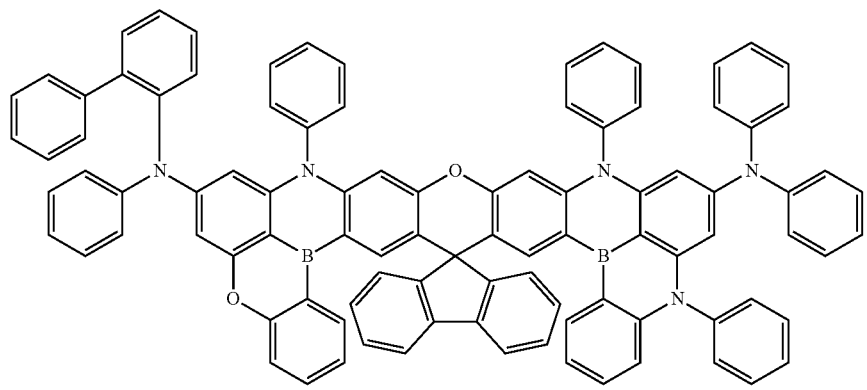
12
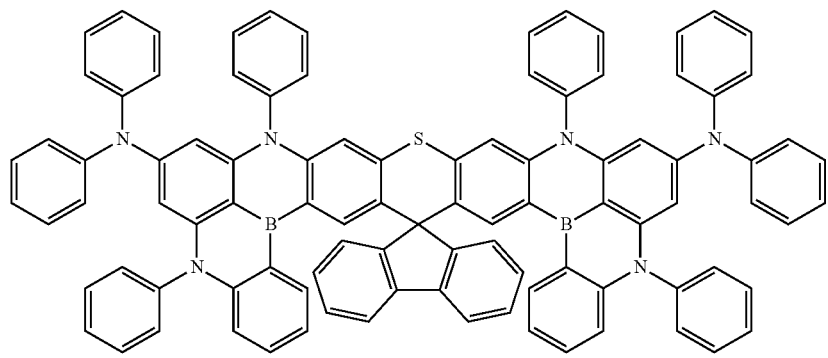
13
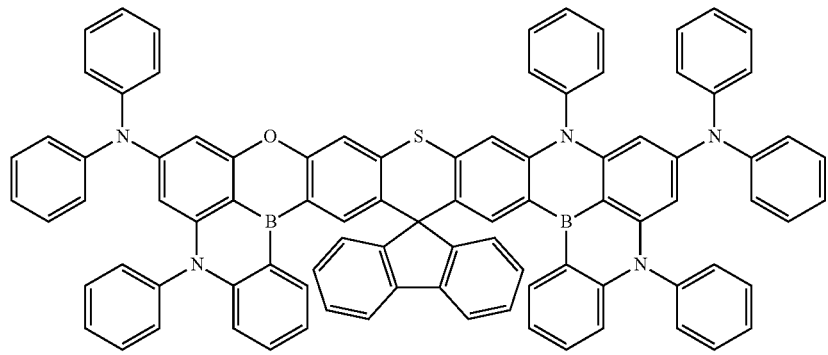
14

-continued
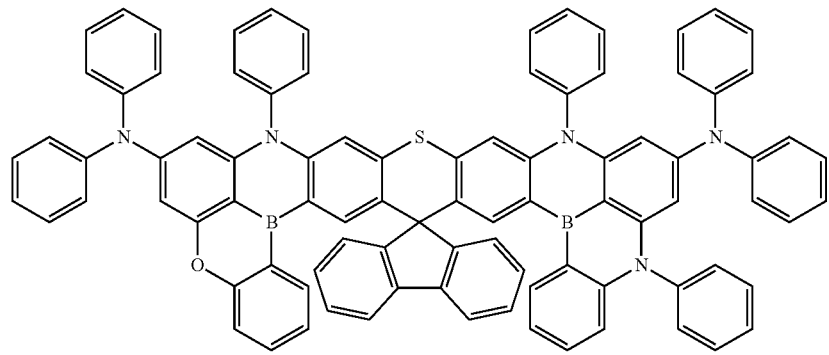
15
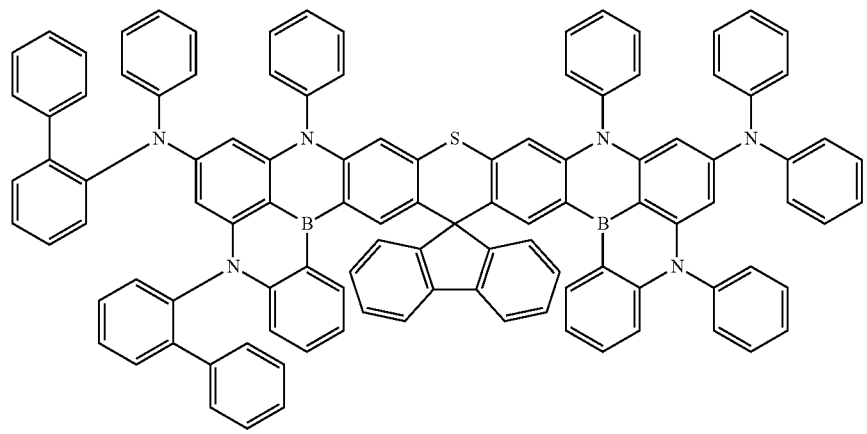
16
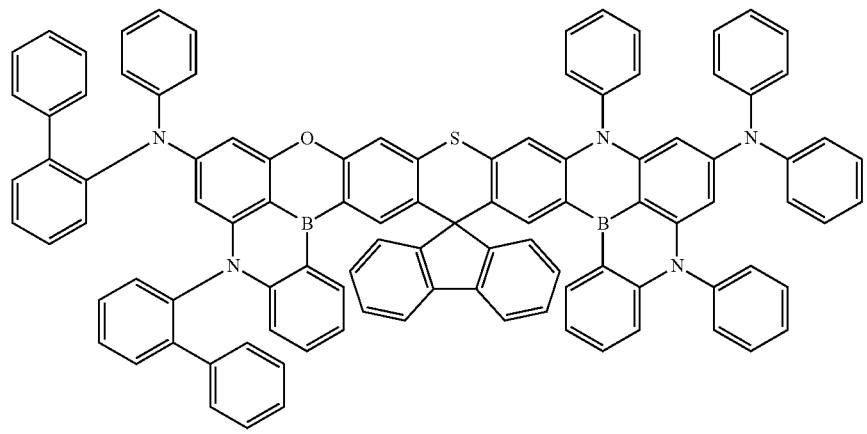
17
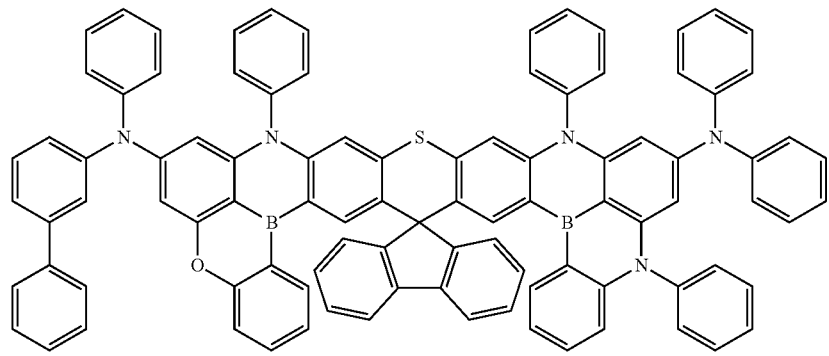
18

-continued
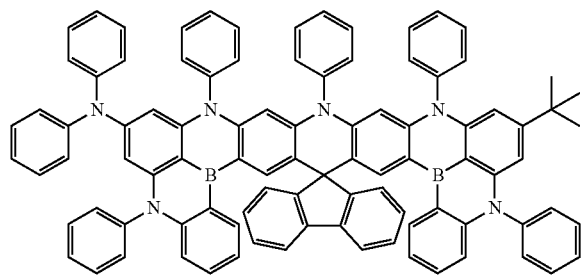
19
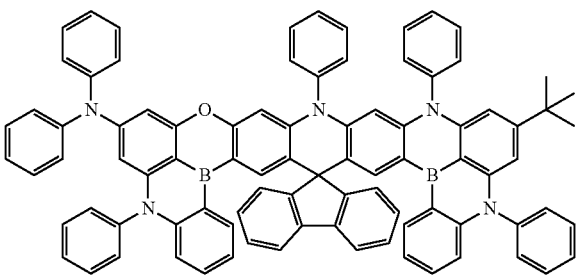
20
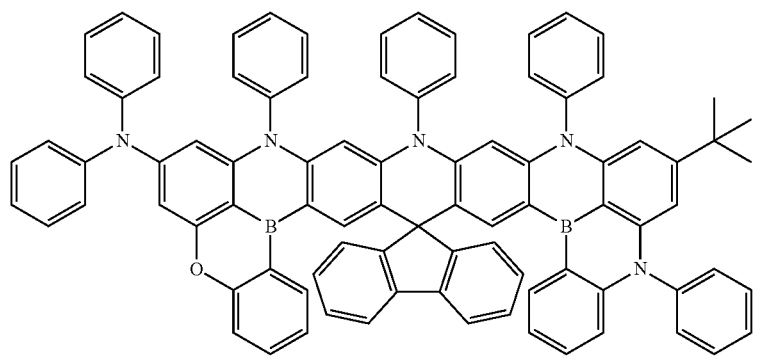
21
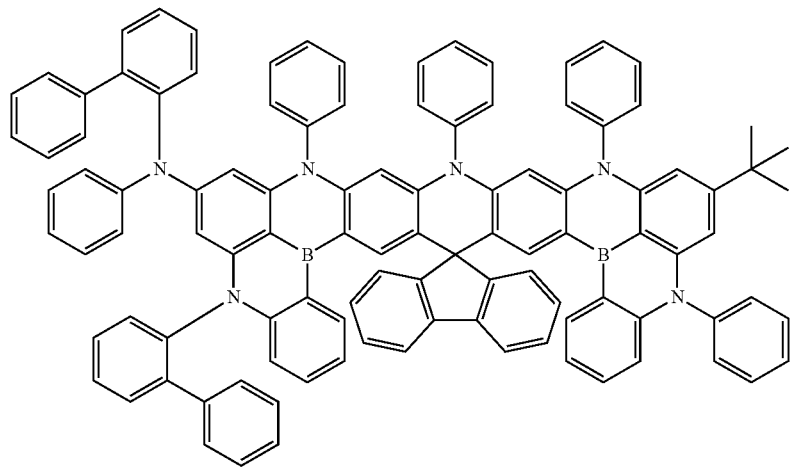
22
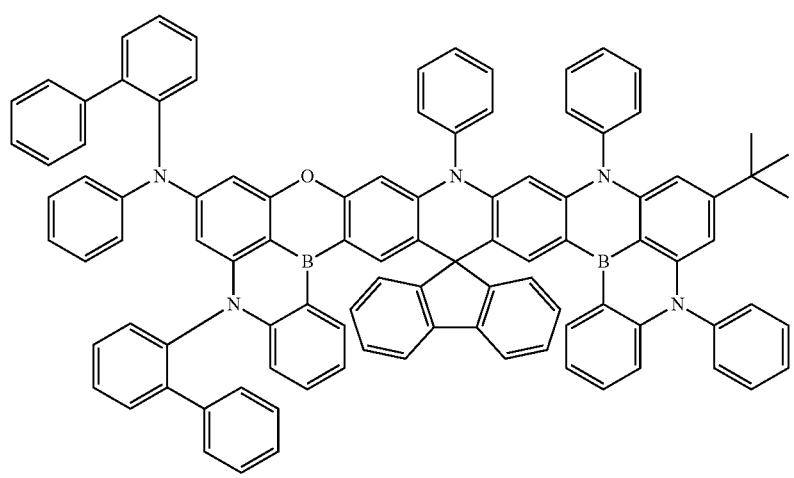
23

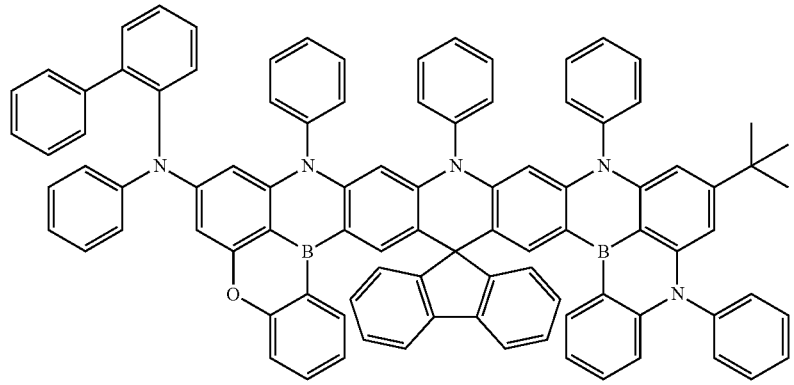
24
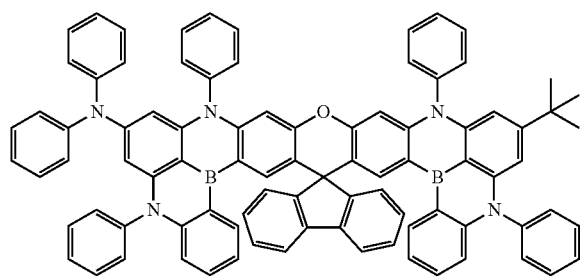
25
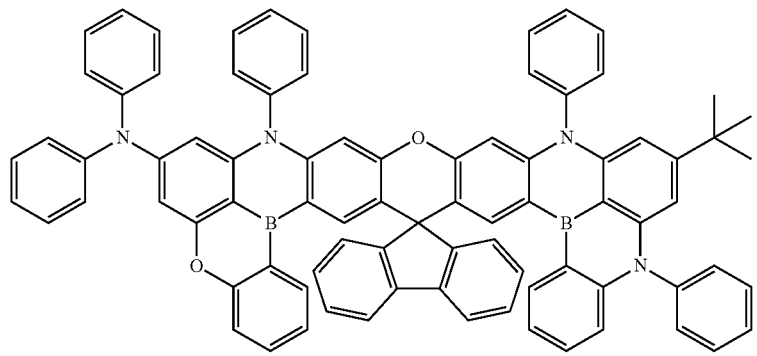
26
27
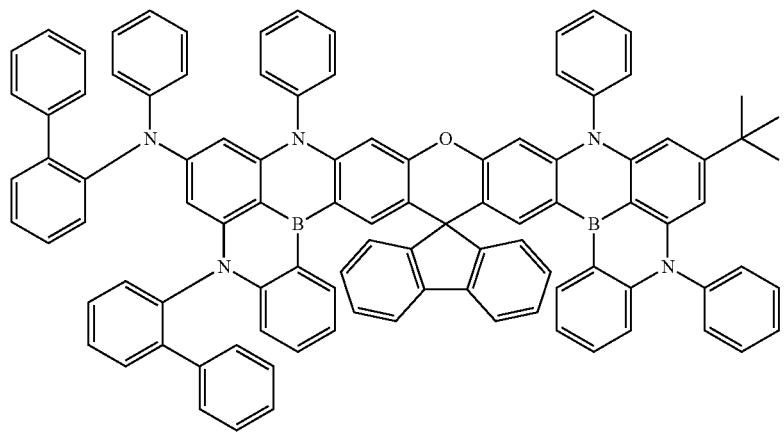
28

-continued
29
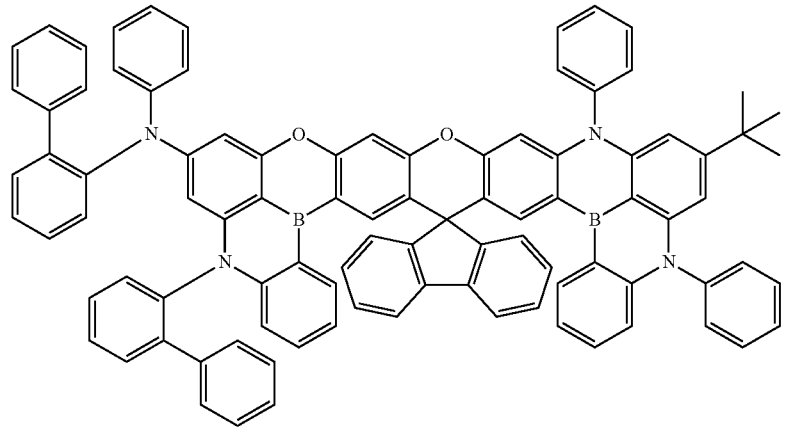
30
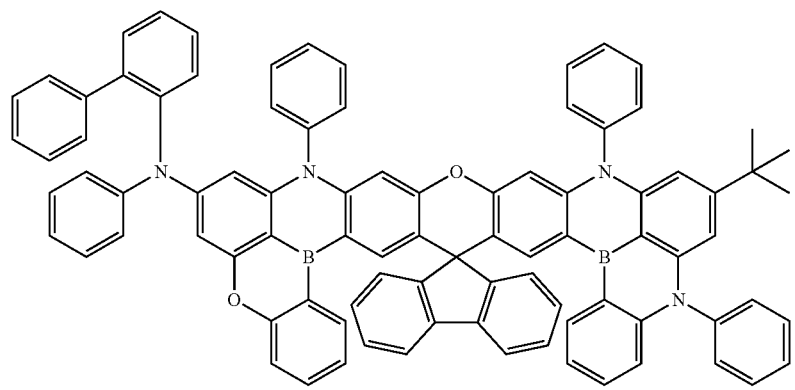
31          32
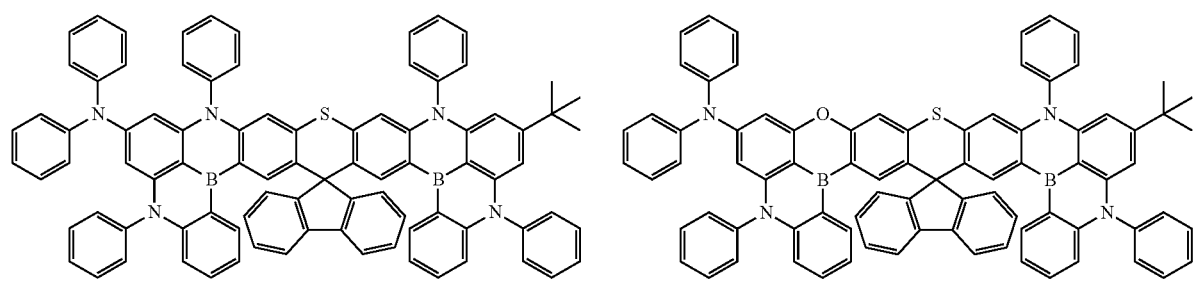
33
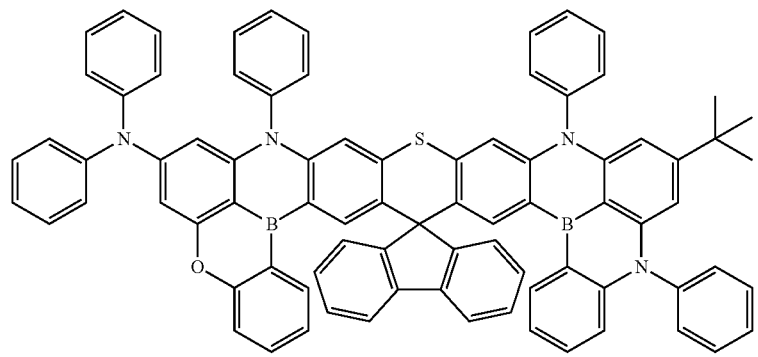

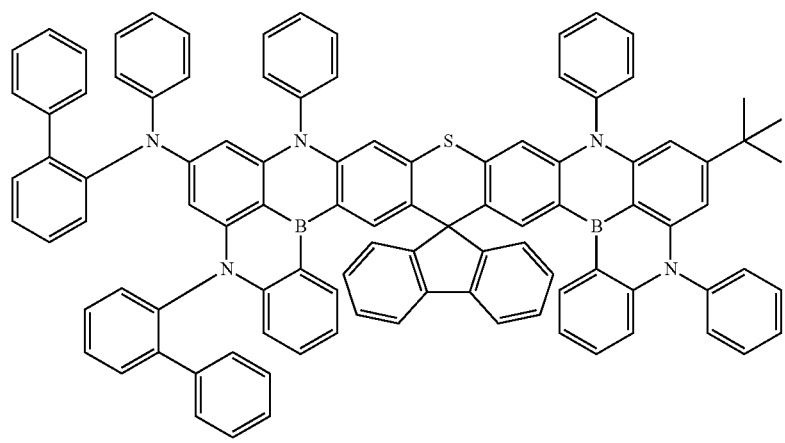
34
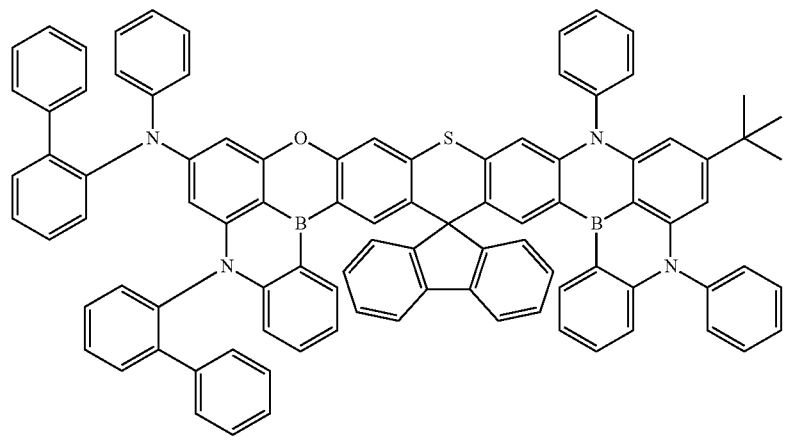
35
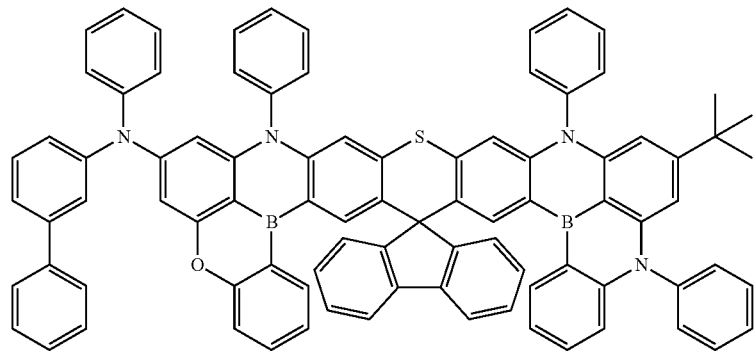
36

-continued
37
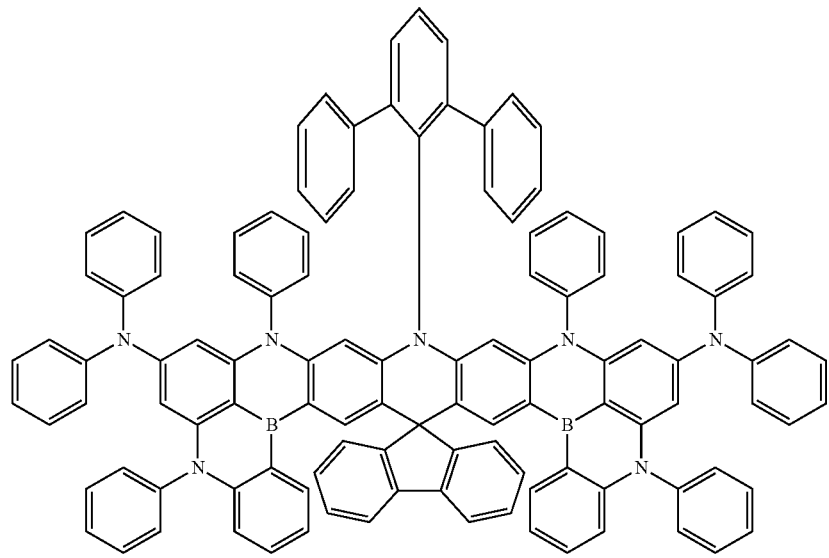
38
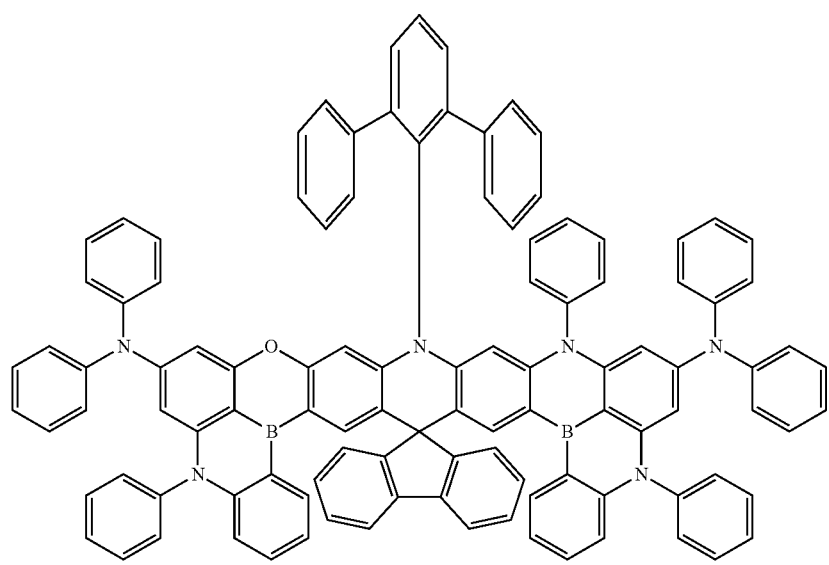
39
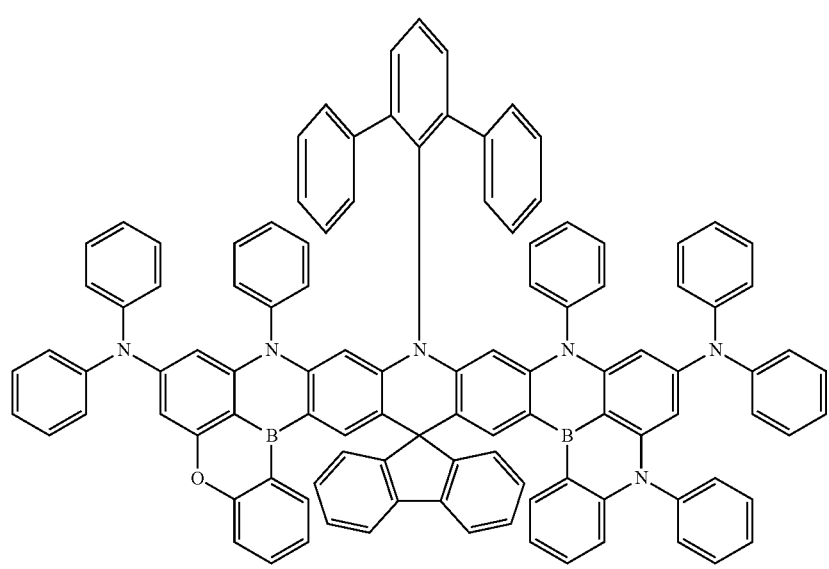

40
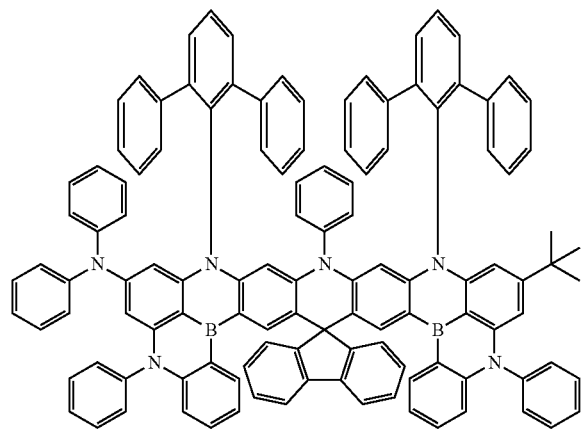
41
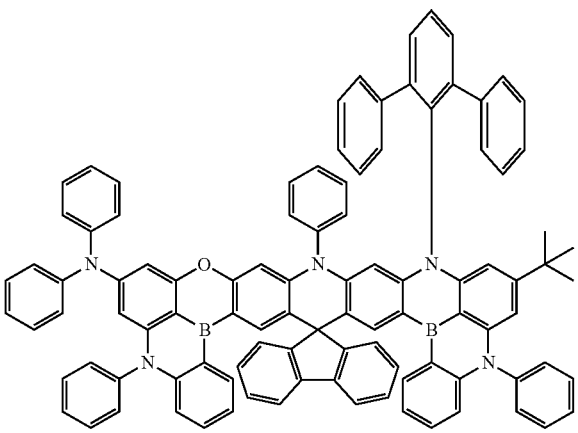
42
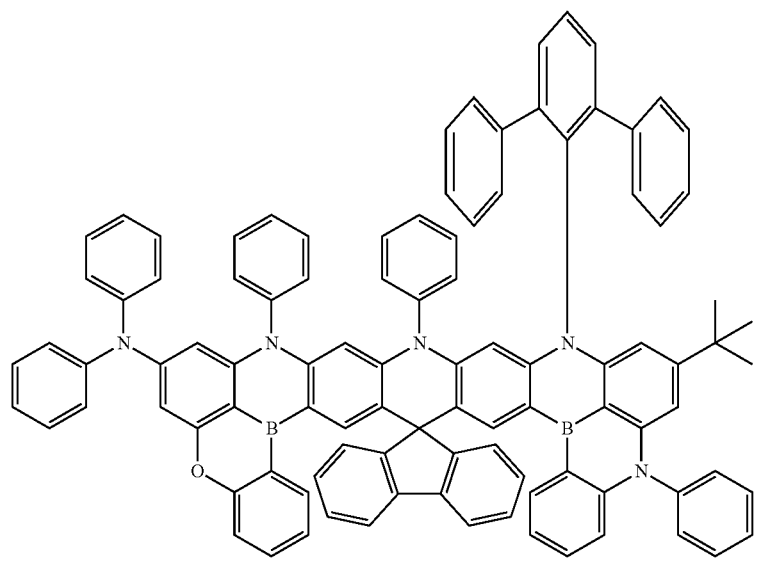
43
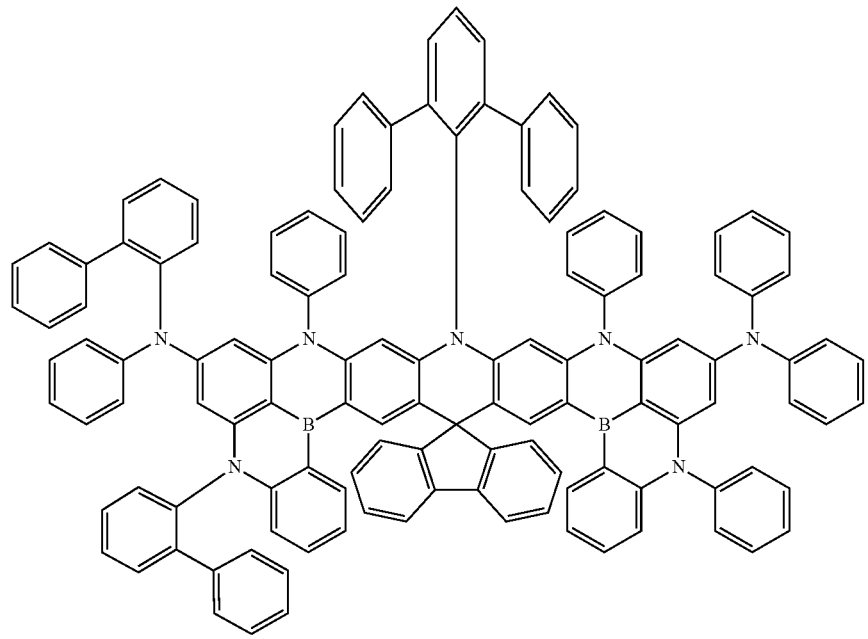

-continued
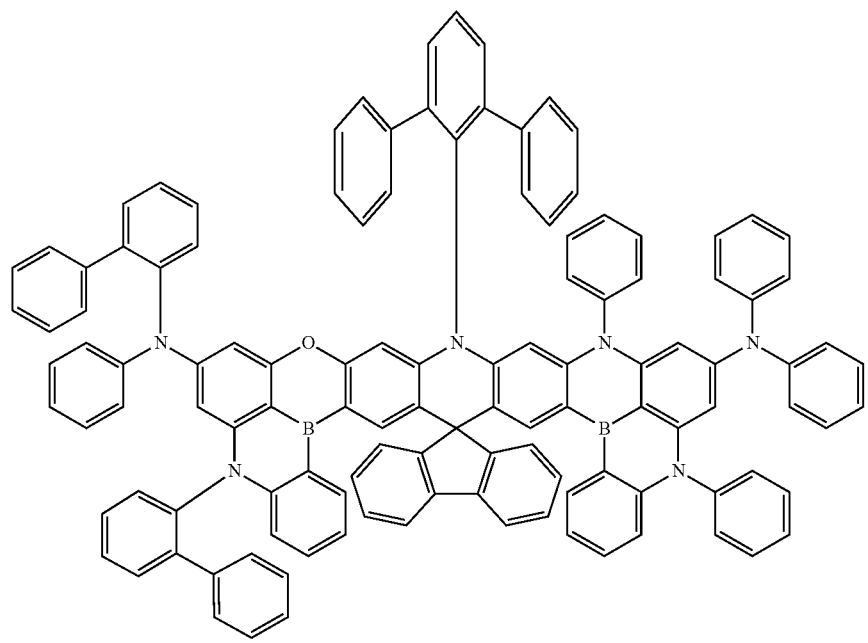
44
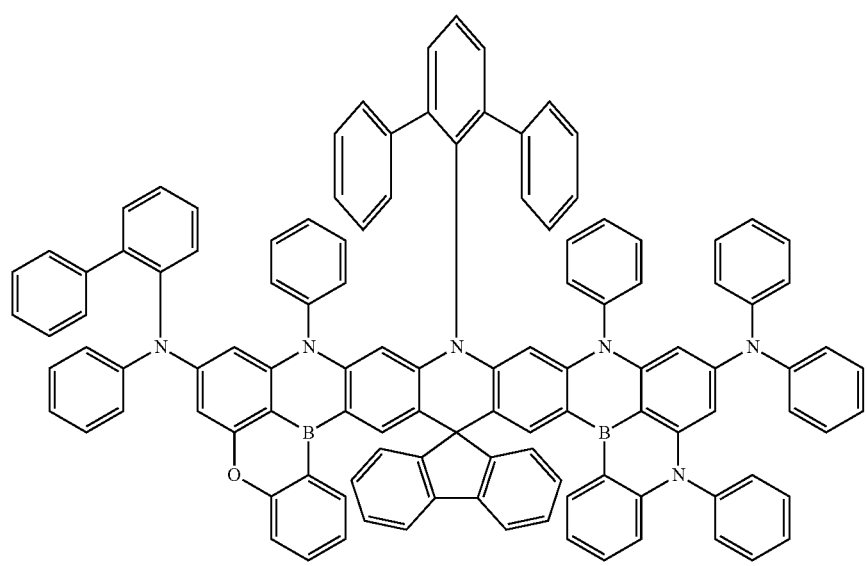
45

-continued
46
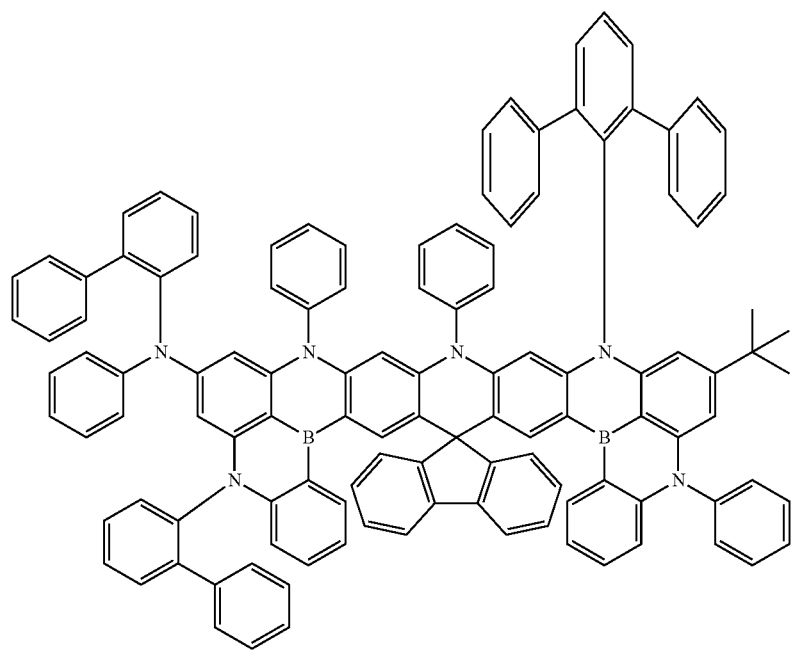
47
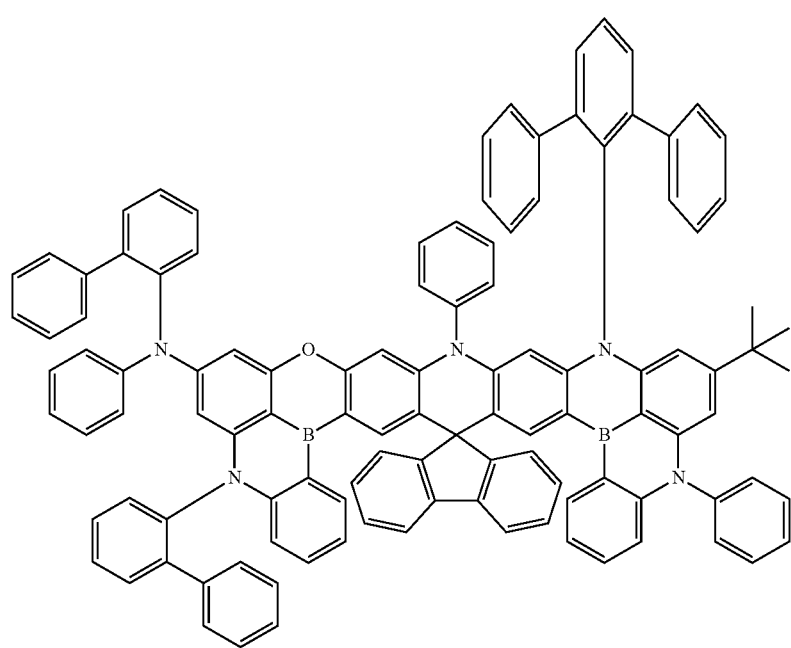

-continued
48
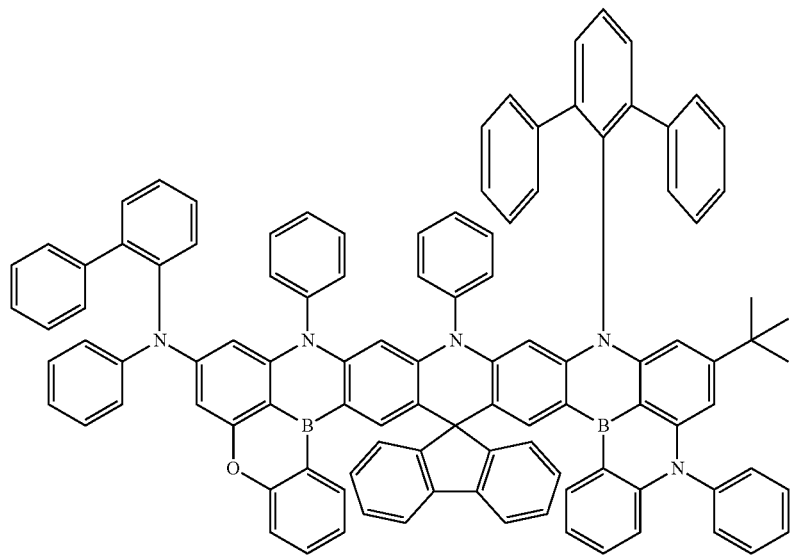
49
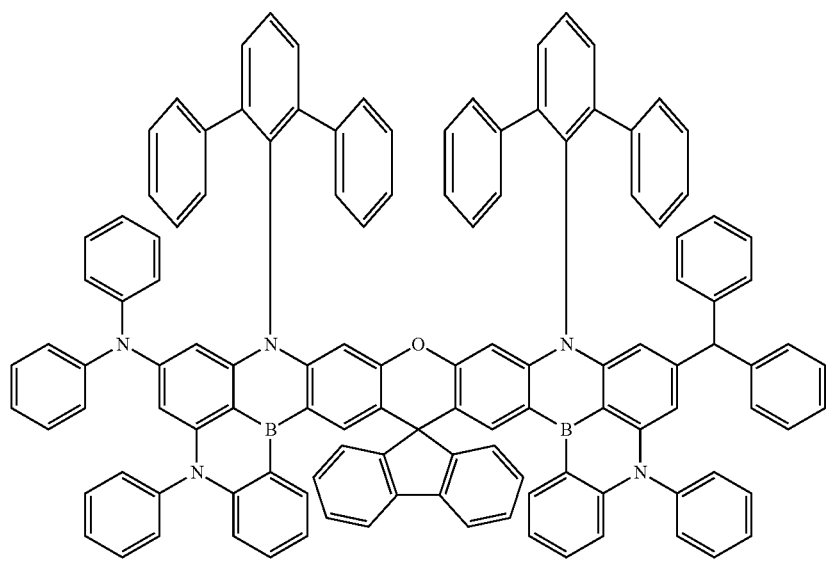
50
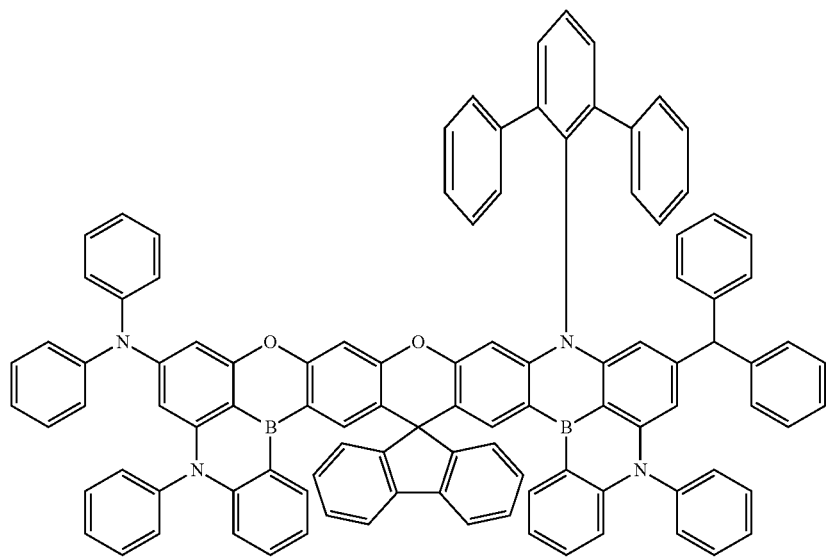

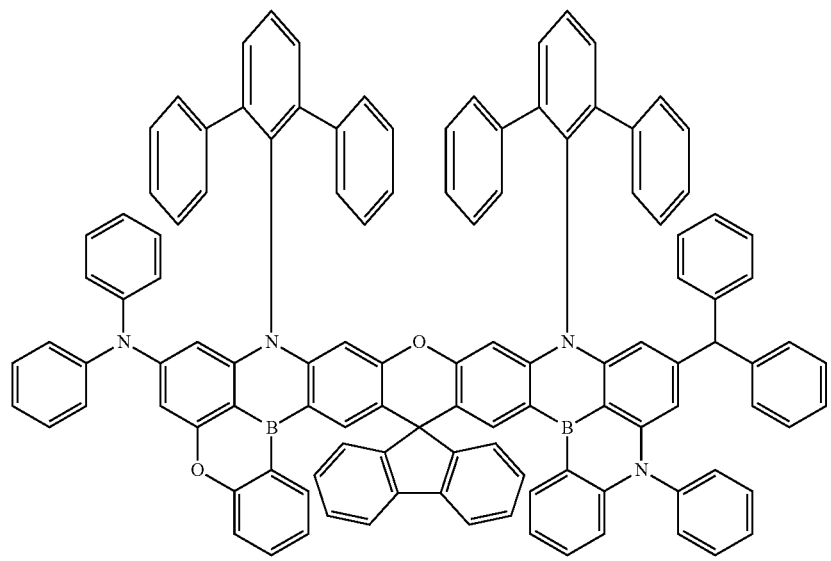
51
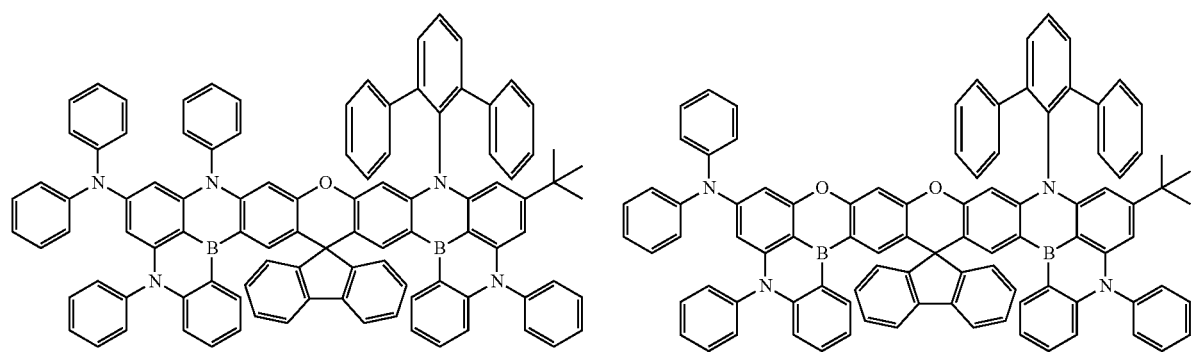
52
53
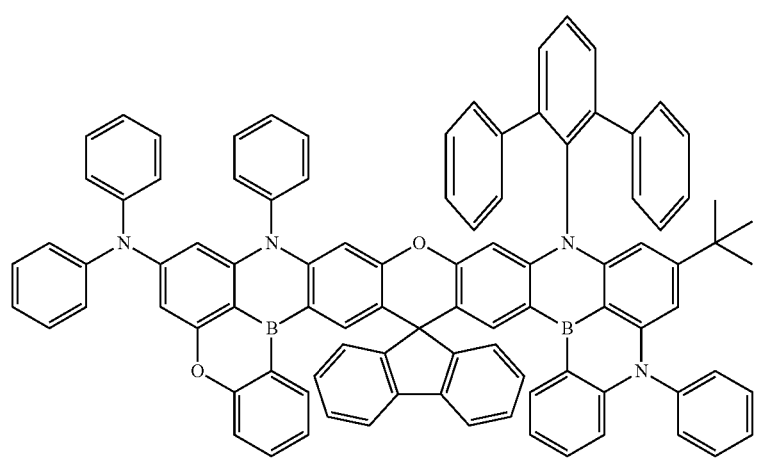
54

-continued
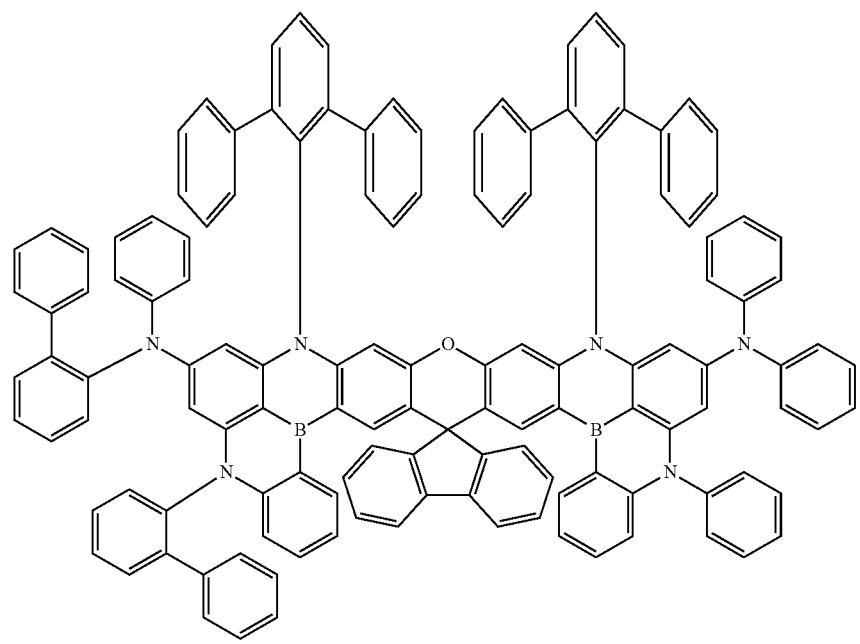
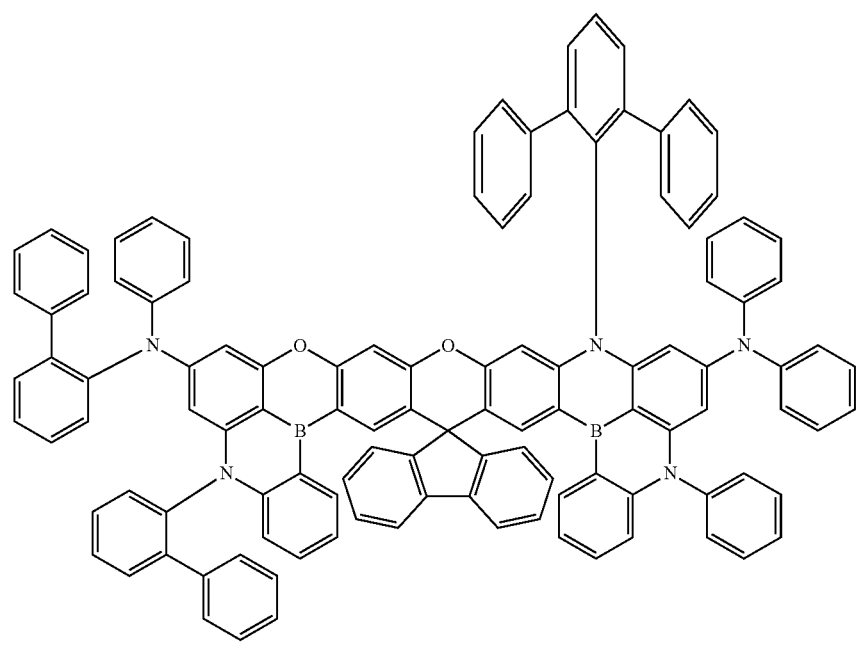

-continued
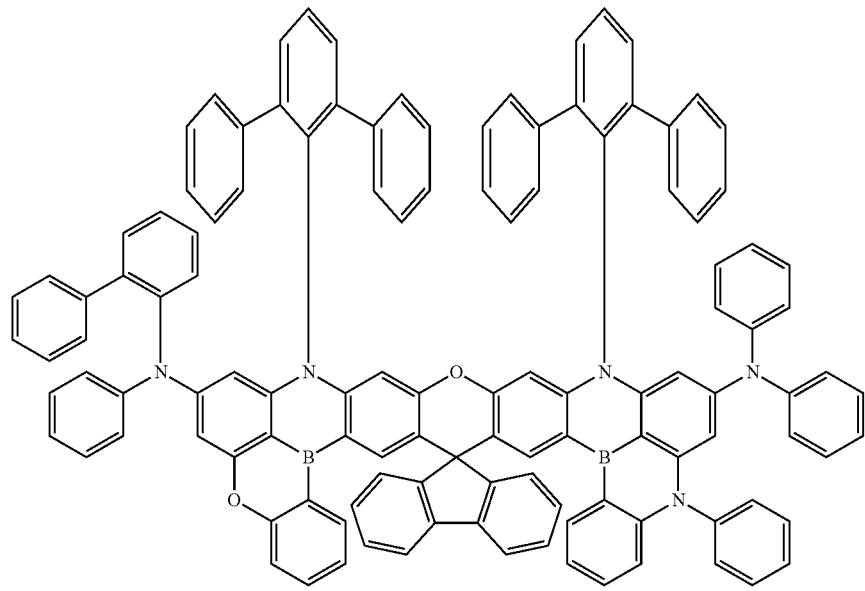
57
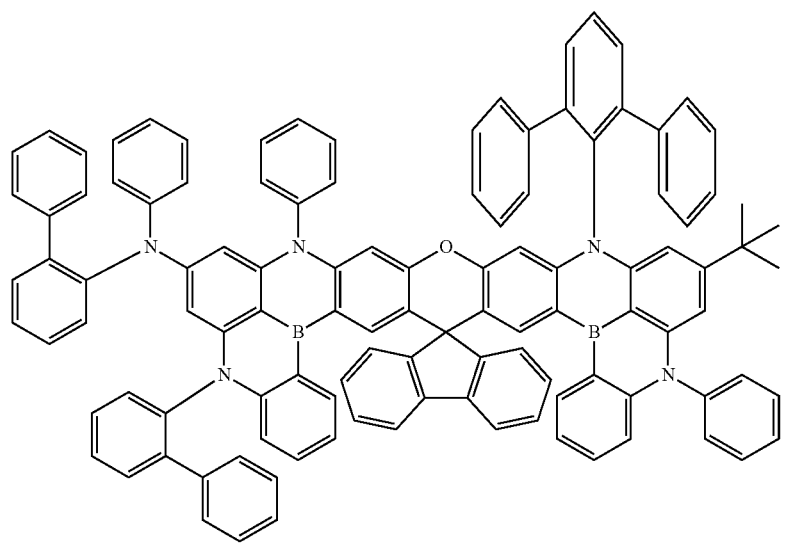
58
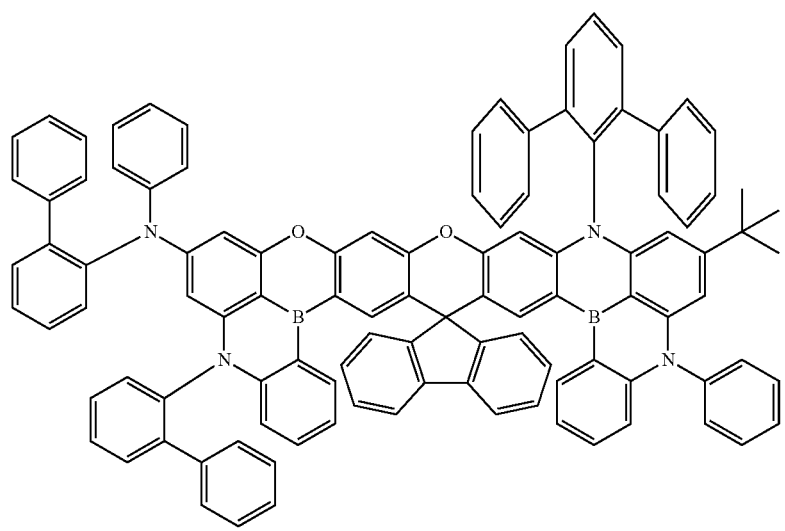
59

-continued
60
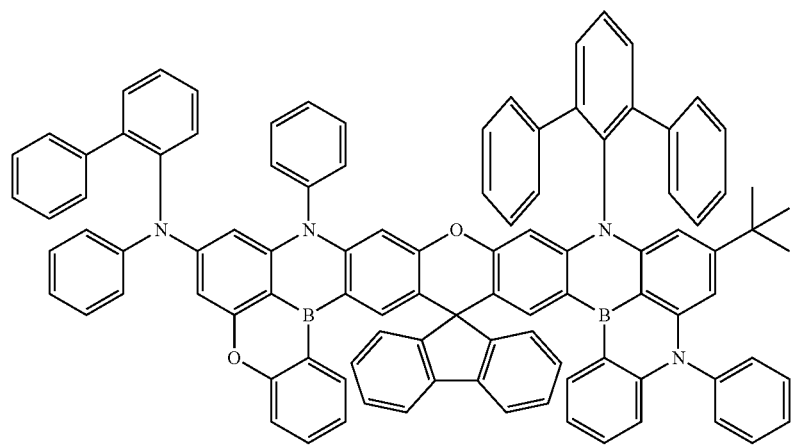
61
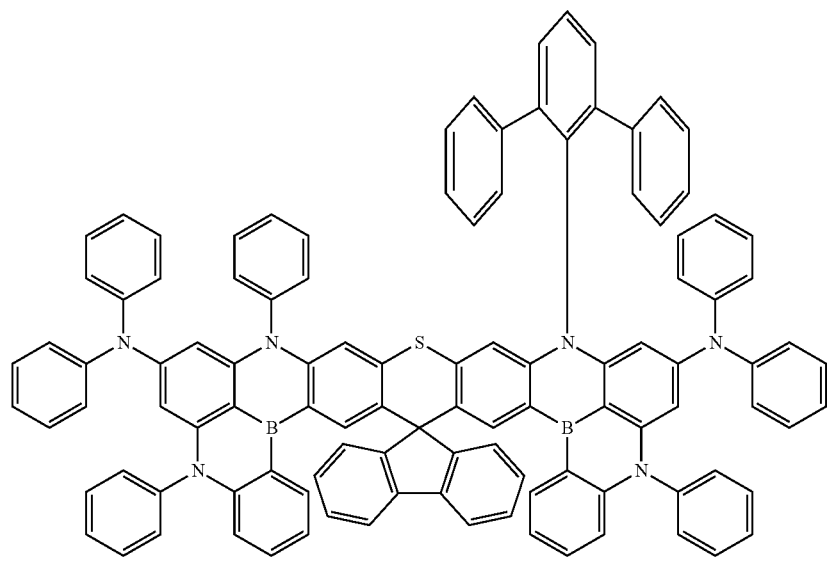
62
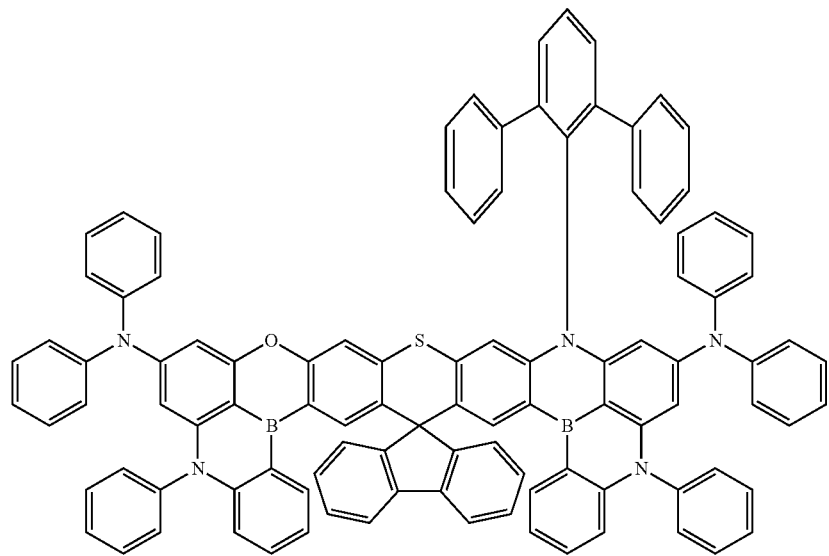

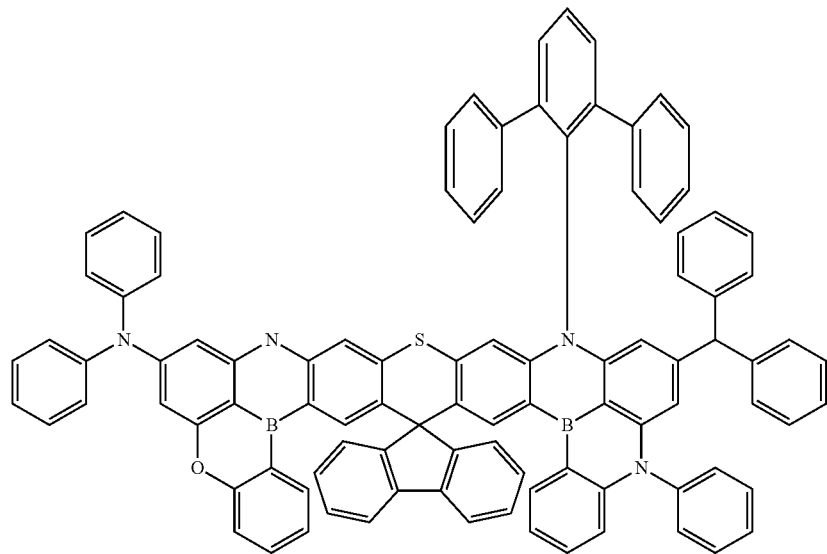
63
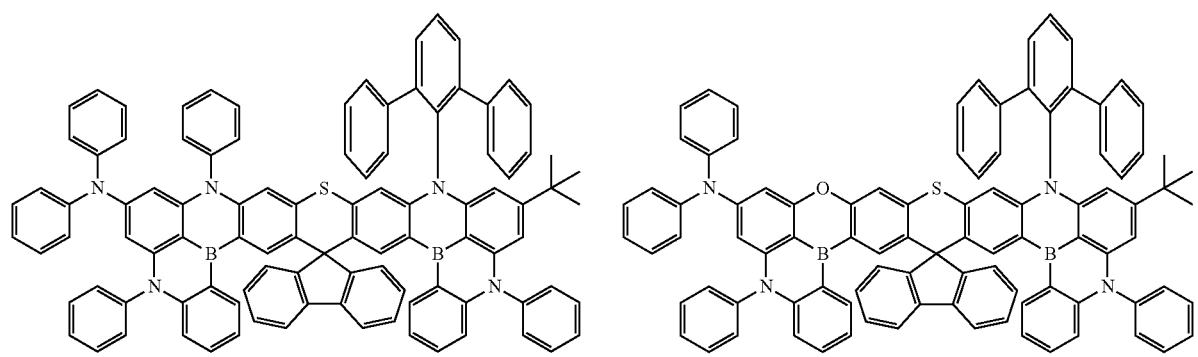
64
65
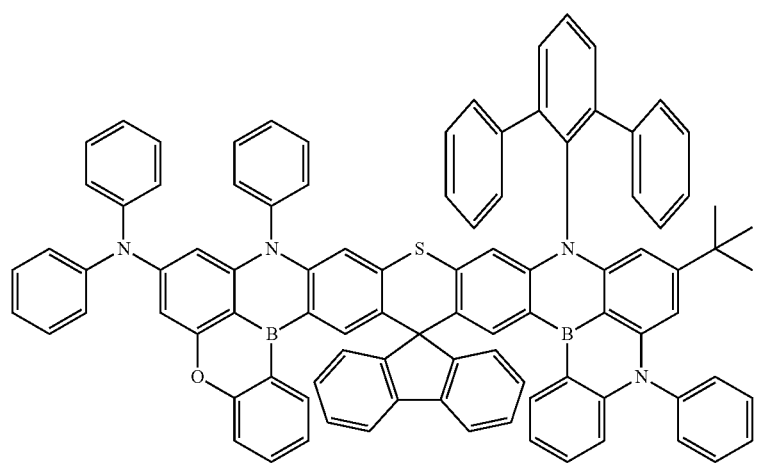
66

-continued
67
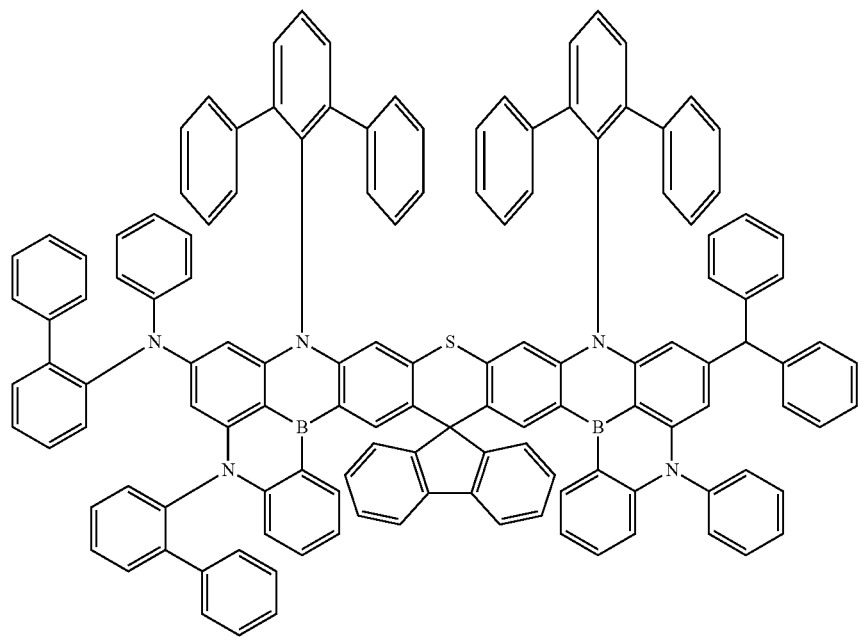
68
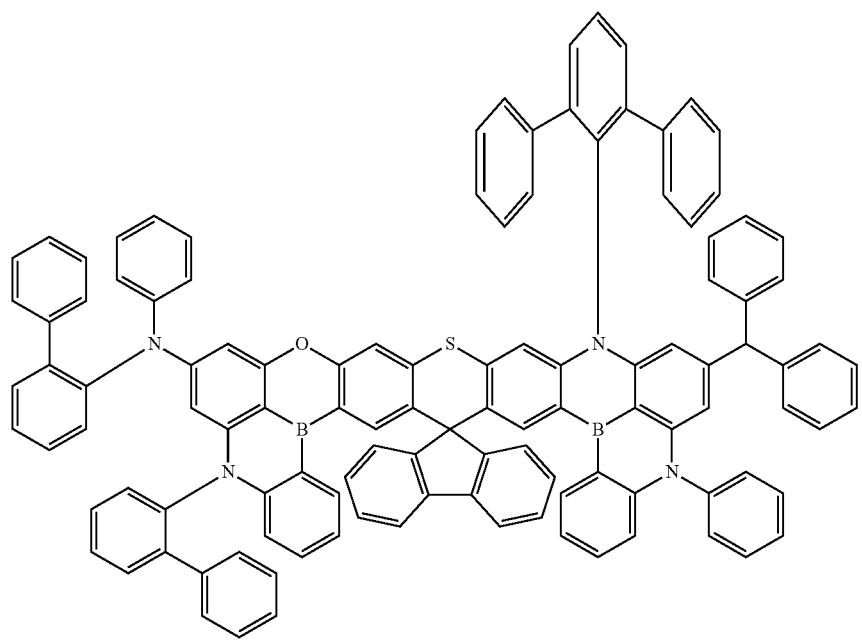

-continued
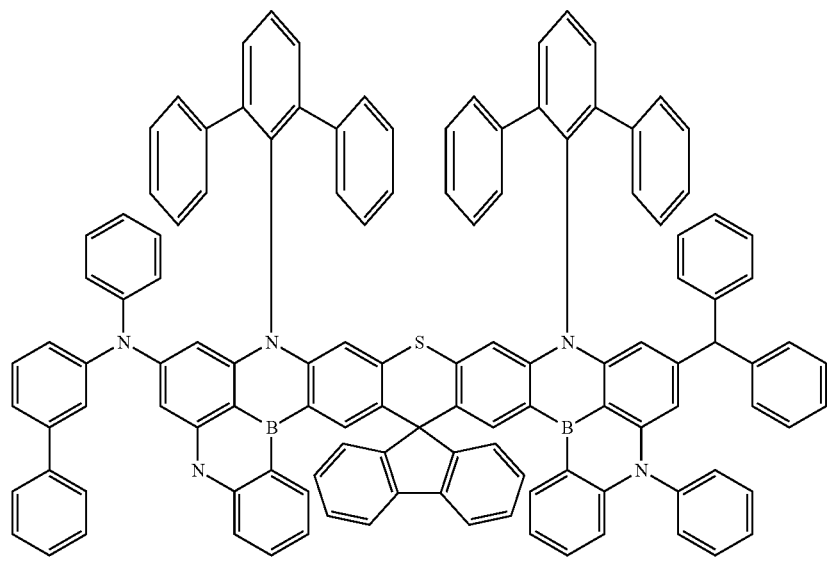
69
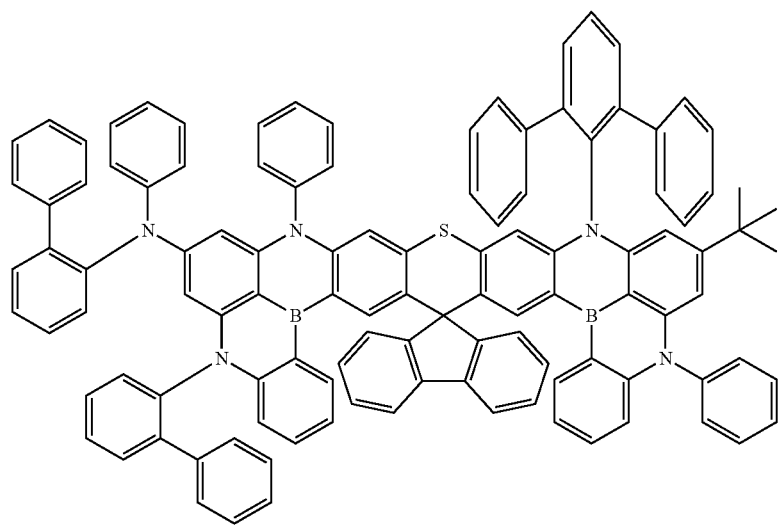
70
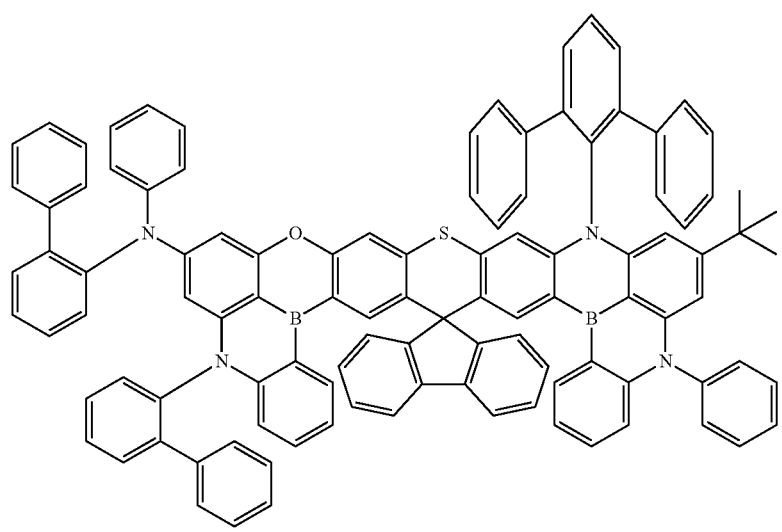
71

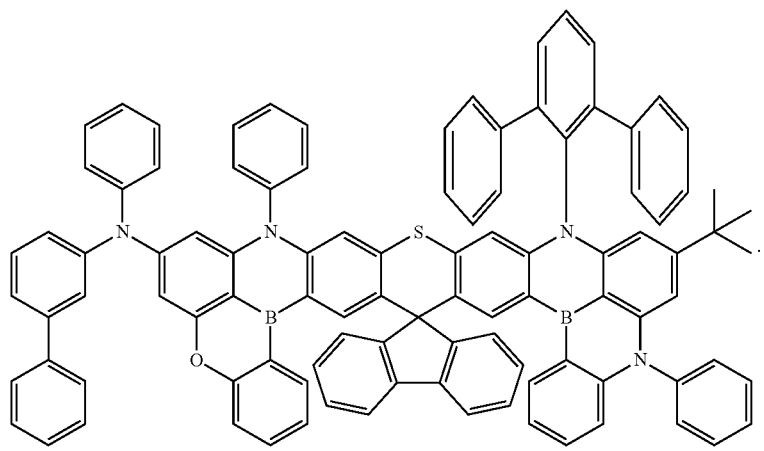

The emission layer EML in the light emitting device ED of an embodiment may emit fluorescence, phosphorescence, and/or delayed fluorescence. For example, the emission layer EML may emit thermally activated delayed fluorescence (TADF).

The emission layer EML in the light emitting device ED of an embodiment may emit blue light. For example, the emission layer EML may emit light having a center wavelength of about 420 nm to about 470 nm.

In the light emitting devices ED of embodiments illustrated in FIGS. 3 to 6, the emission layer EML may include a host and a dopant. The emission layer EML of an embodiment may include the above-described condensed polycyclic compound of an embodiment as a dopant.

In the light emitting device ED of an embodiment, the emission layer EML may include any suitable host material generally used or available in the art. For example, the emission layer EML may include anthracene derivatives, pyrene derivatives, fluoranthene derivatives, chrysene derivatives, dihydrobenzanthracene derivatives, and/or triphenylene derivatives. In one or more embodiments, the emission layer EML may include anthracene derivatives and/or pyrene derivatives.

The emission layer EML may include a compound represented by Formula E-1 below. The compound represented by Formula E-1 below may be used as a fluorescence host material.

Formula E-1

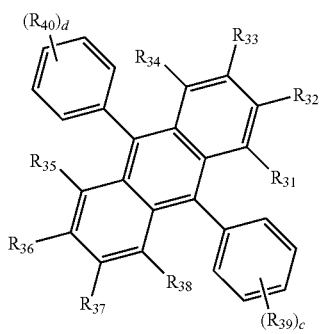

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In one embodiments, $R_{31}$ to $R_{40}$ may be bonded to an adjacent group to form a saturated hydrocarbon ring or an unsaturated hydrocarbon ring.

In Formula E-1, c and d may be each independently an integer of 0 to 5.

Formula E-1 may be represented by any one selected from among Compound E1 to Compound E19 below:

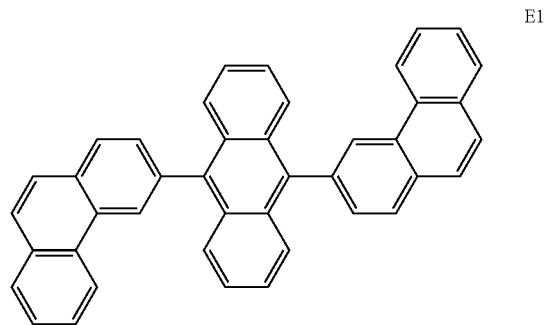

E1

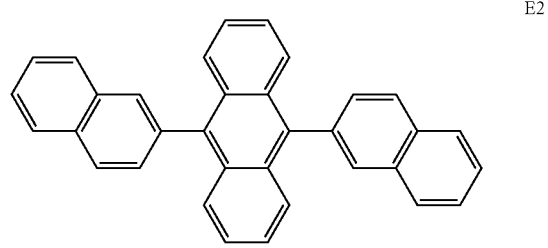

E2

E3
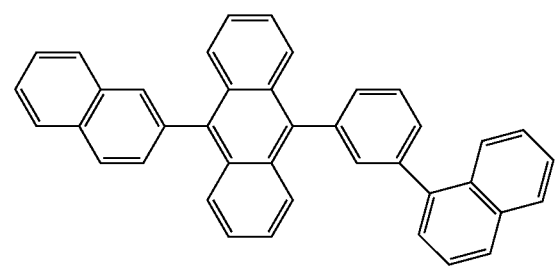
E7
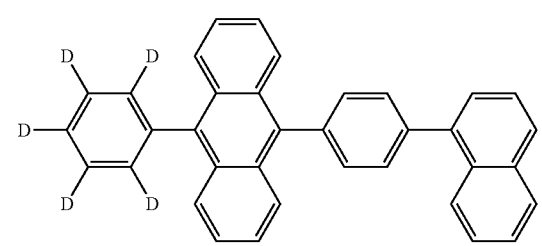
E8
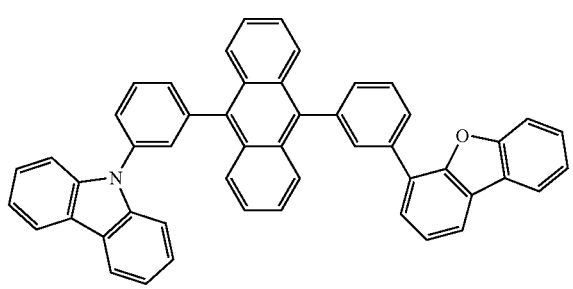
E9
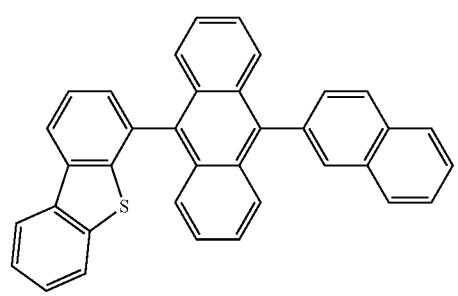
E10
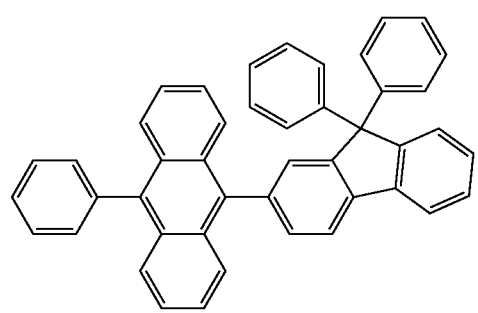
E11
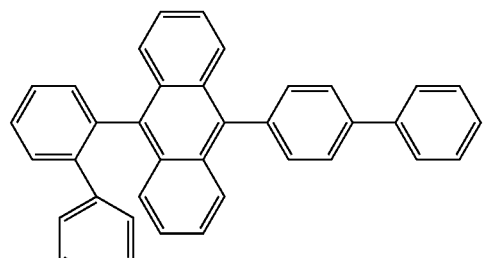
E12
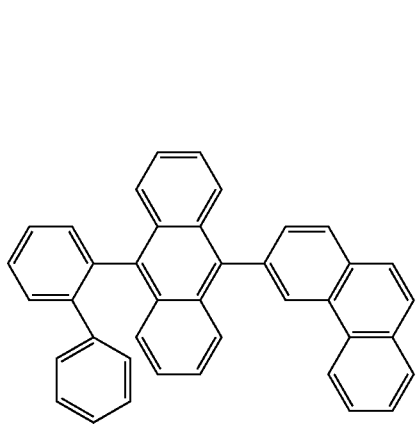
E13
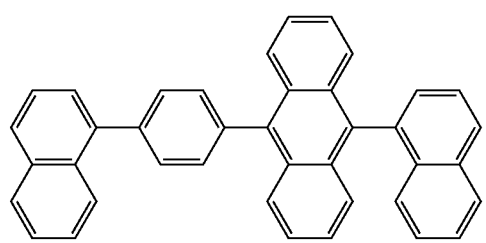
E14
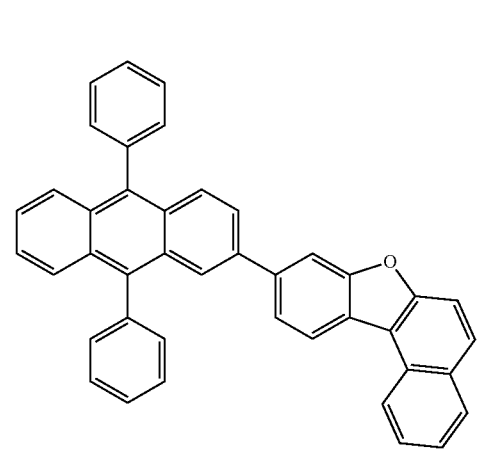

E15

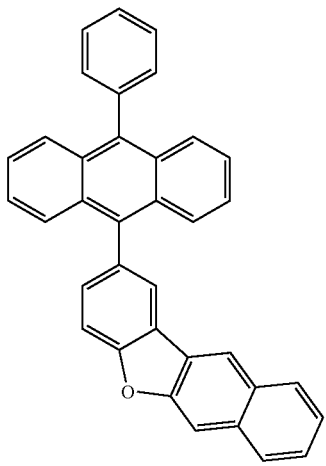

E16

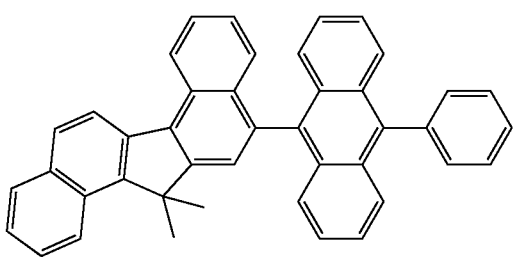

E17

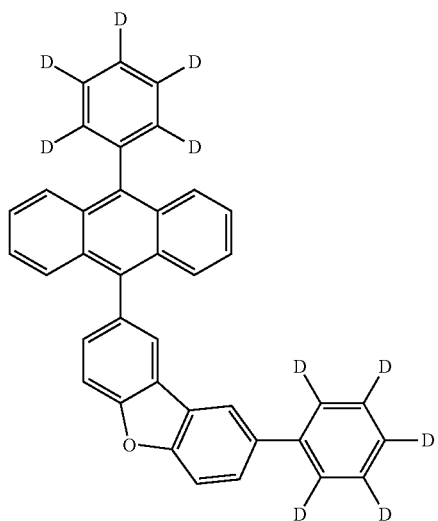

E18

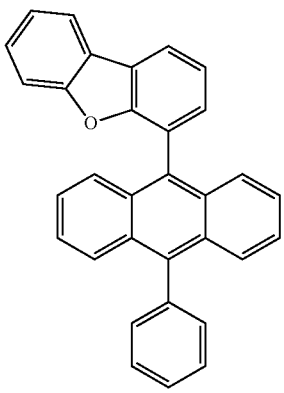

E19

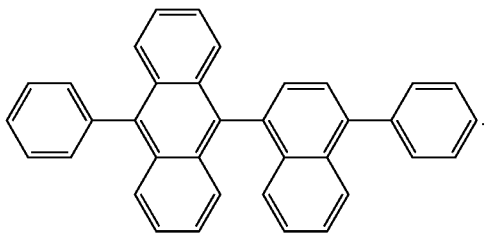

In an embodiment, the emission layer EML may include a compound represented by Formula E-2a or Formula E-2b below. The compound represented by Formula E-2a or Formula E-2b below may be used as a phosphorescence host material.

Formula E-2a

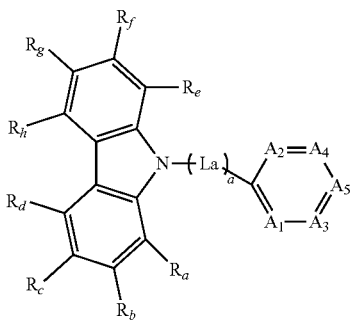

In Formula E-2a, and a may be an integer of 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or greater, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or CR. $R_a$ to $R_j$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_j$ may be bonded to an adjacent group to form a hydrocarbon ring or a heterocycle containing N, O, S, etc. as a ring-forming atom.

In one or more embodiments, in Formula E-2a, two or three selected from among $A_1$ to $A_5$ may be N, and the rest may be CR.

Formula E-2b (Cbz1)―(L_b)_b―(Cbz2)

In Formula E-2b, Cbz1 and Cbz2 may be each independently an unsubstituted carbazole group, or a carbazole group substituted with an aryl group having 6 to 30 ring-forming carbon atoms. $L_b$ is a direct linkage (e.g., a single covalent bond), a substituted or unsubstituted arylene group having 6 to 30 ring-forming carbon atoms, or a substituted or unsubstituted heteroarylene group having 2 to 30 ring-forming carbon atoms. In one or more embodiments, b is an integer of 0 to 10, and when b is an integer of 2 or more, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2 below. However, the compounds listed in Compound Group E-2 below are examples, the compound represented by Formula E-2a or Formula E-2b is not limited to those represented by Compound Group E-2 below.

Compound Group E-2

E-2-1

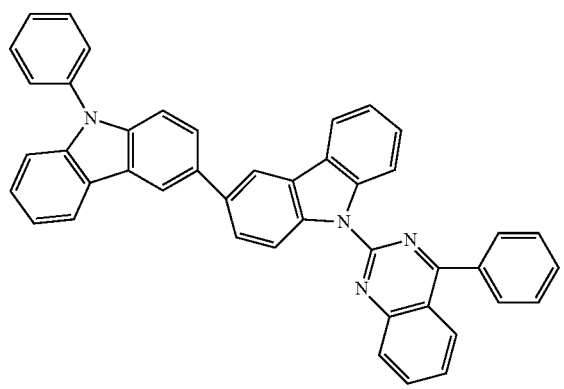

E-2-2

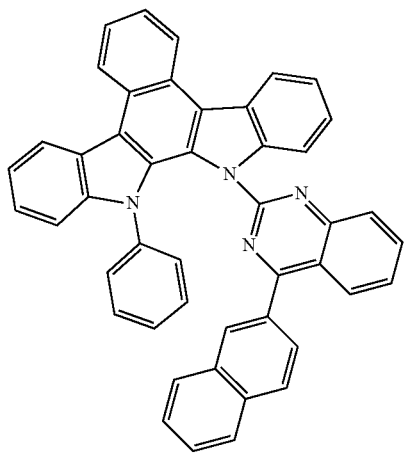

E-2-3

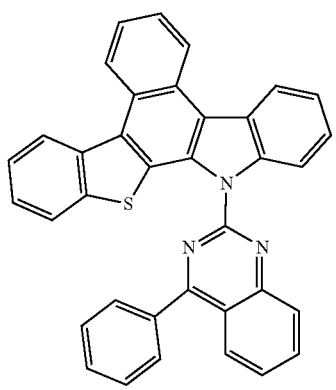

E-2-4

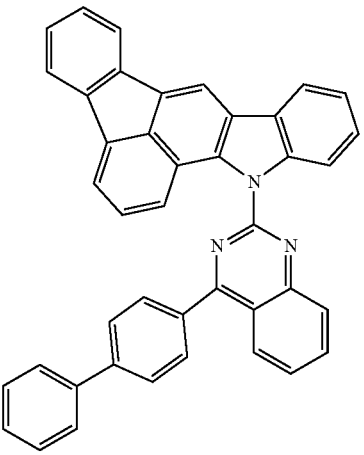

E-2-5

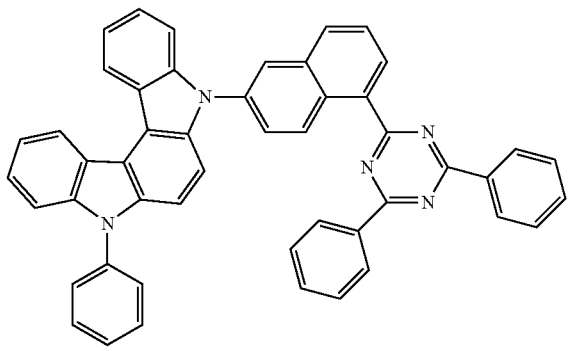

-continued
E-2-6
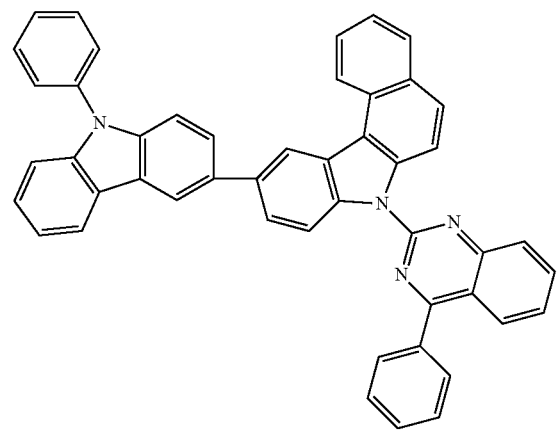
E-2-7
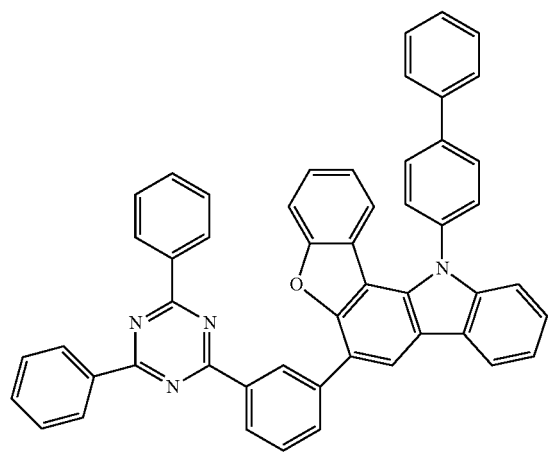
E-2-8
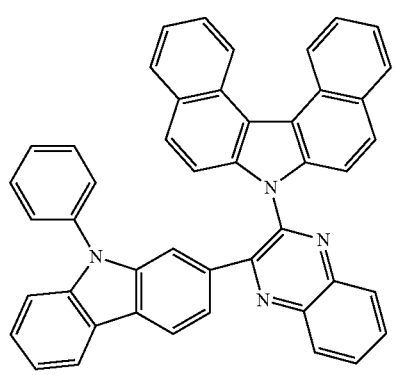
-continued
E-2-9
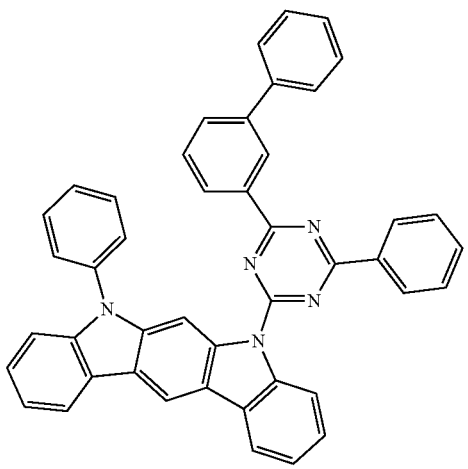
E-2-10
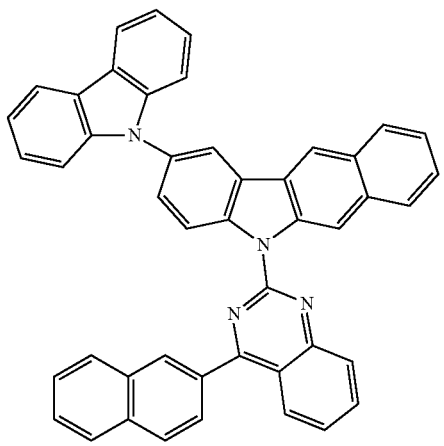
E-2-11
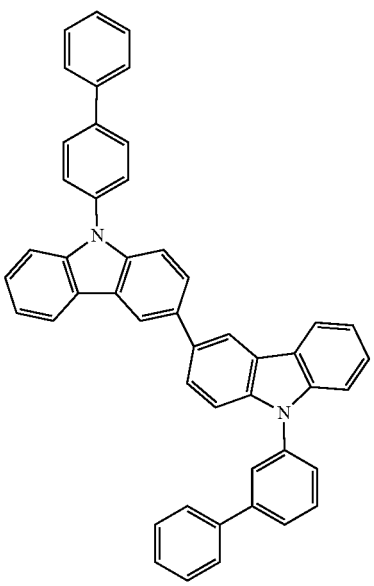

E-2-12
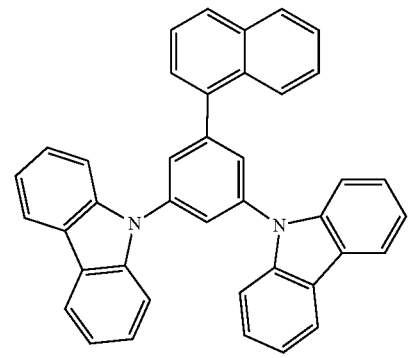
E-2-15
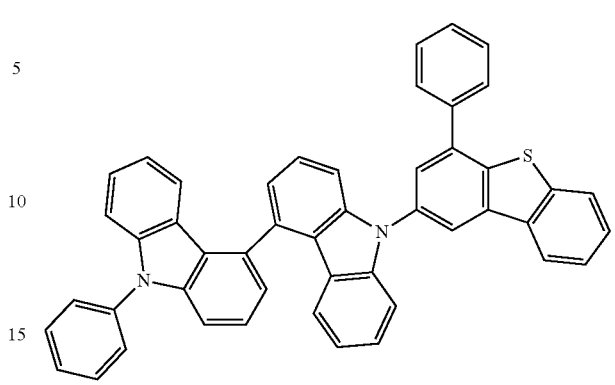
E-2-13
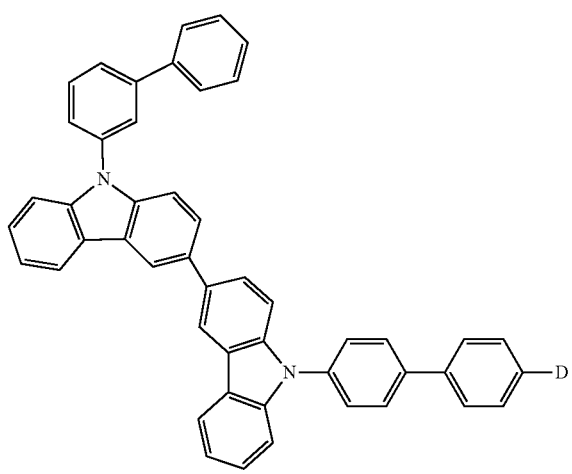
E-2-16
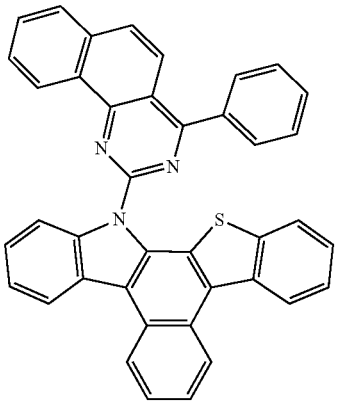
E-2-17
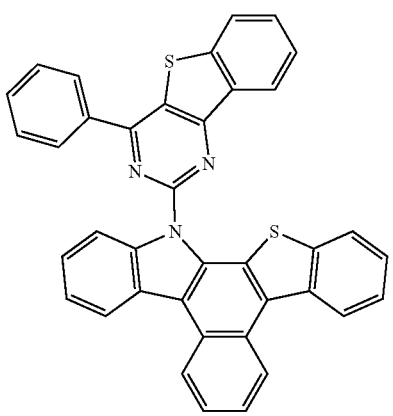
E-2-14
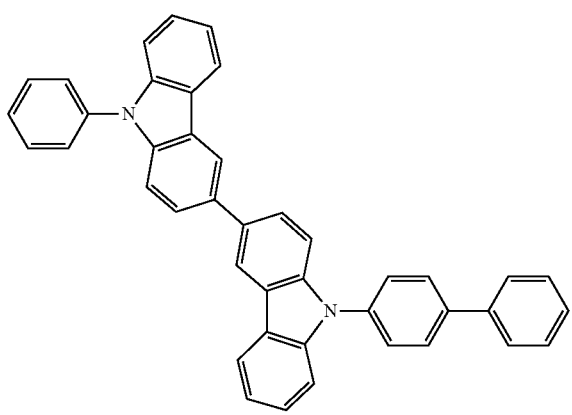
E-2-18
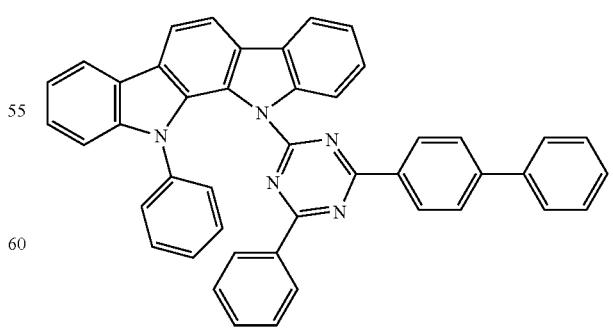

E-2-19
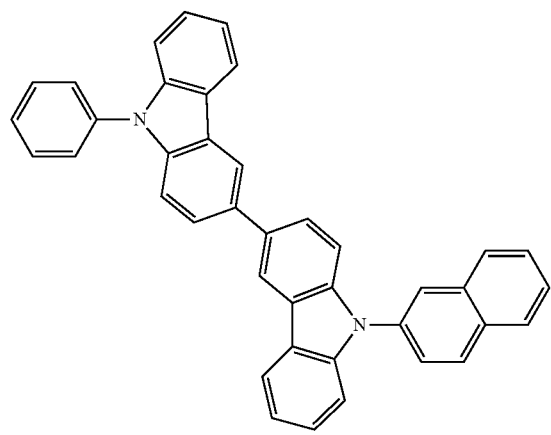

E-2-20
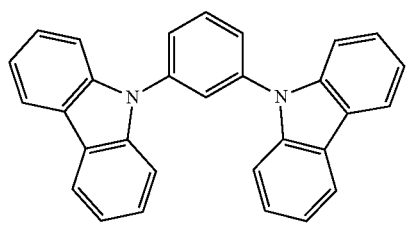

E-2-21
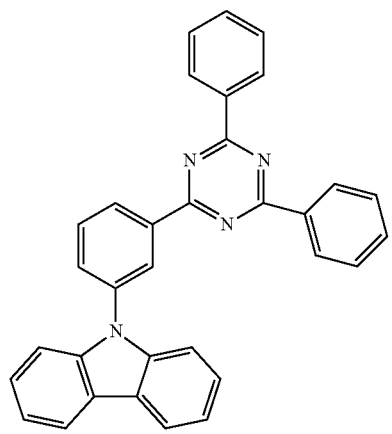

E-2-22
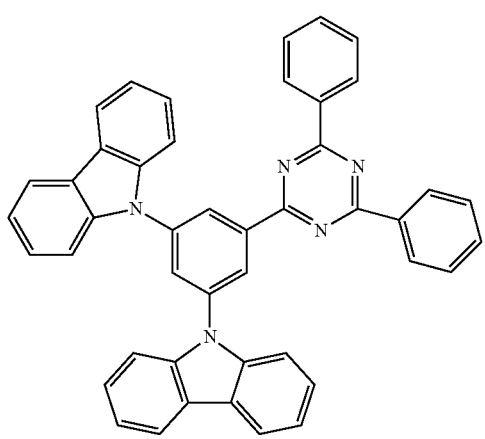

E-2-23
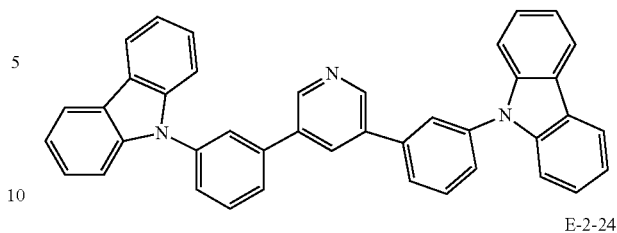

E-2-24
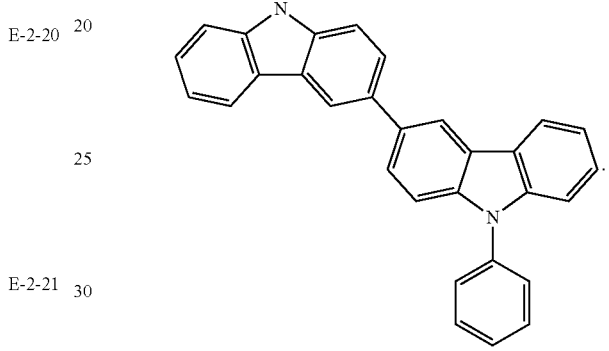

The emission layer EML may further include any suitable material generally used or available in the art as a host material. For example, the emission layer EML may include, as a host material, at least one selected from bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, the present disclosure is not limited thereto, and for example, tris(8-hydroxyquinolino)aluminum (Alq$_3$), 4,4'-bis(N-carbazolyl)-1,1'-biphenyl (CBP), poly(N-vinylcarbazole) (PVK), 9,10-di(naphthalene-2-yl) anthracene (ADN), 4,4',4"-tris(carbazol-9-yl)-triphenylamine (TCTA), 1,3,5-tris(N-phenylbenzim idazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc. may be used as a host material.

The emission layer EML may further include any suitable dopant material generally used or available in the art.

For example, the emission layer EML may include a compound represented by Formula M-a or Formula M-b below. The compound represented by Formula M-a or Formula M-b below may be used as a phosphorescence dopant material.

Formula M-a

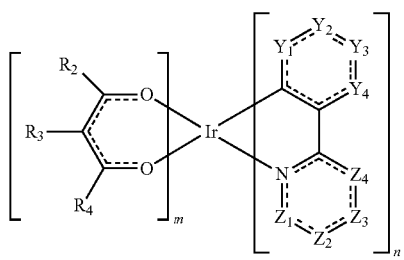

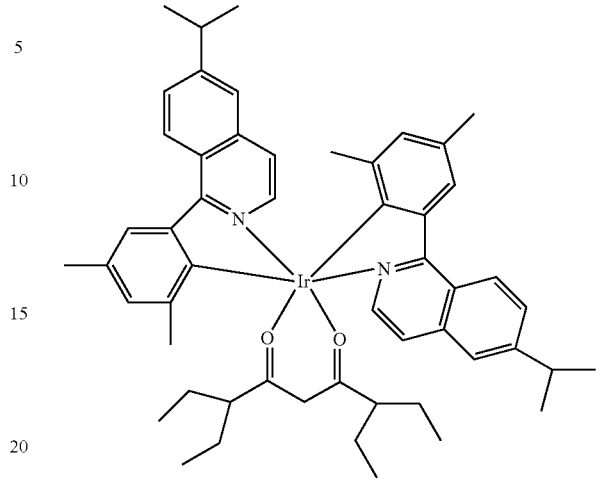
M-a2

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be used as a red phosphorescence dopant or a green phosphorescence dopant.

The compound represented by Formula M-a may be represented by any one selected from among Compound M-a1 to Compound M-a19 below. However, Compounds M-a1 to M-a19 below are examples, and the compound represented by Formula M-a is not limited to those represented by Compounds M-a1 to M-a19 below.

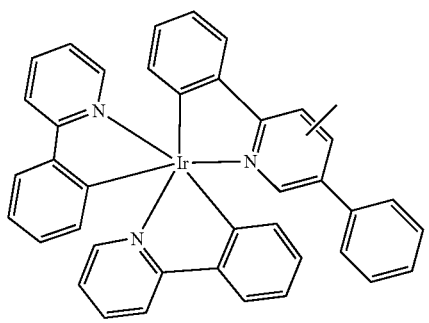
M-a3

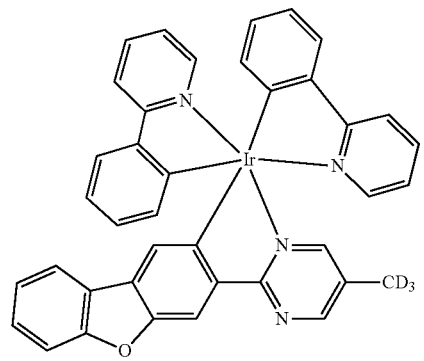
M-a4

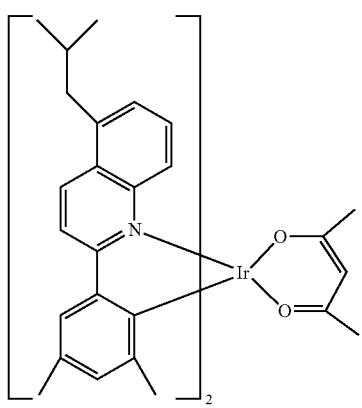
M-a1

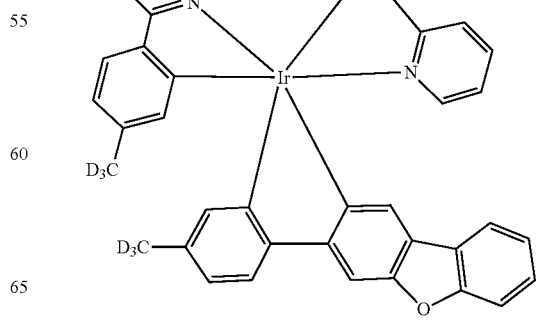
M-a5

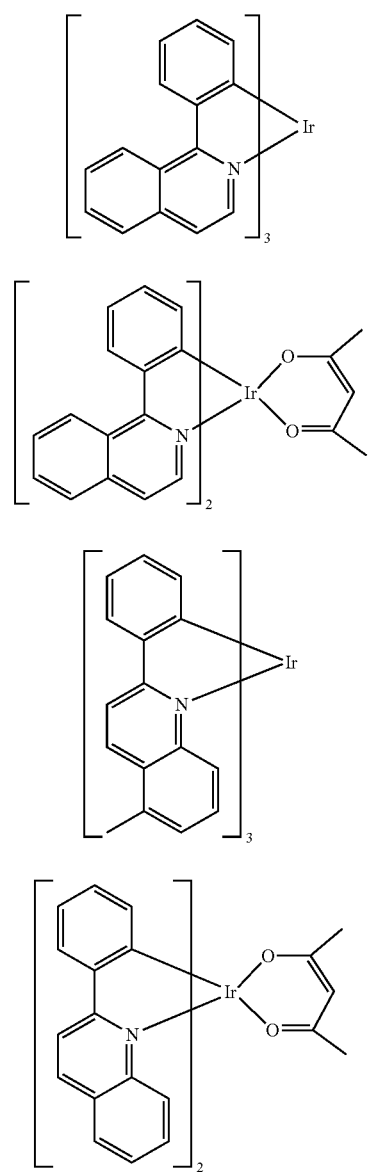
M-a6
M-a7
M-a8
M-a9
M-a10
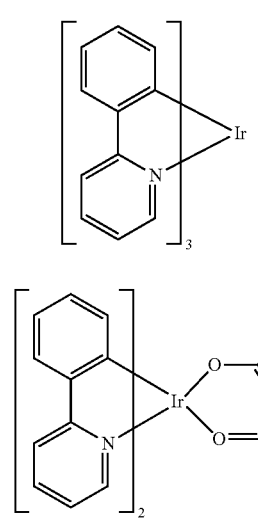
M-a11
M-a12
M-a13
M-a14
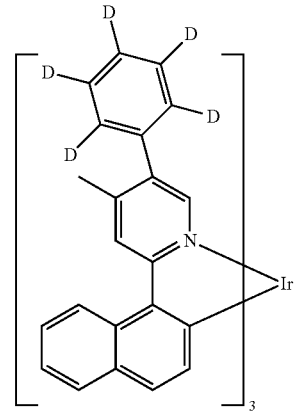
M-a15
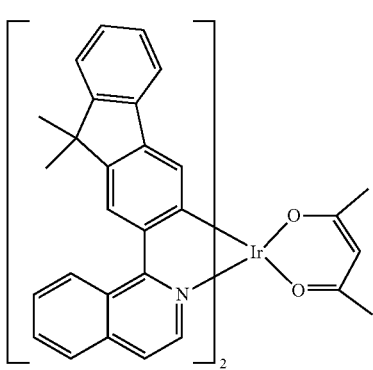

-continued

M-a16

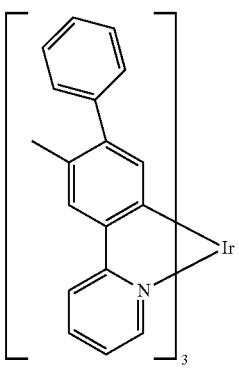

M-a17

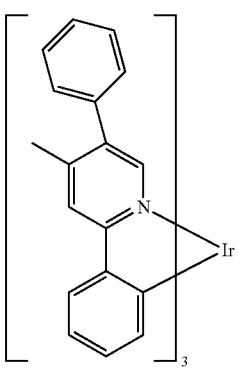

M-a18

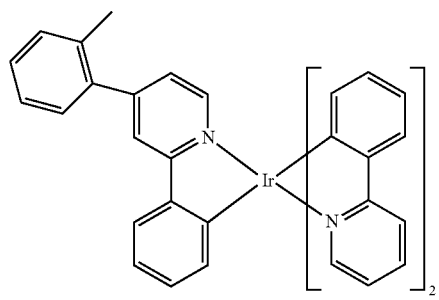

M-a19

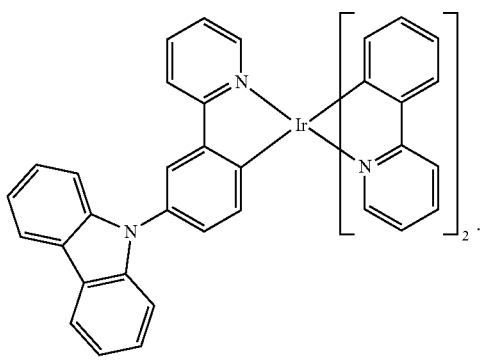

Compound M-a1 and Compound M-a2 may be used as a red dopant material, and Compound M-a3 and Compound M-a4 may be used as a green dopant material.

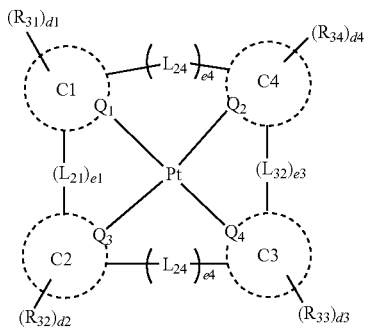

Formula M-b

In Formula M-b, $Q_1$ to $Q_4$ are each independently C or N, and $C_1$ to $C_4$ are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage (e.g., a single covalent bond),

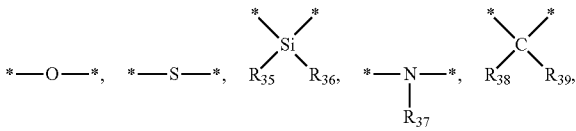

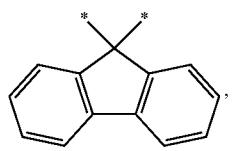

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and d1 to d4 are each independently an integer of 0 to 4.

The compound represented by Formula M-b may be used as a blue phosphorescence dopant or a green phosphorescence dopant.

The compound represented by Formula M-b may be represented by any one selected from among the compounds below. However, the compounds below are examples, and the compound represented by Formula M-b is not limited to those represented by the compounds below.

-continued
M-b-1
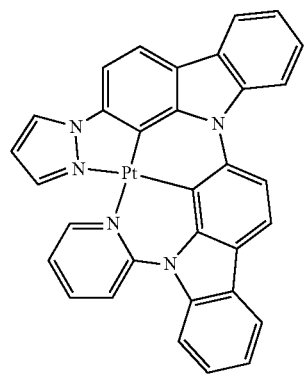
M-b-2
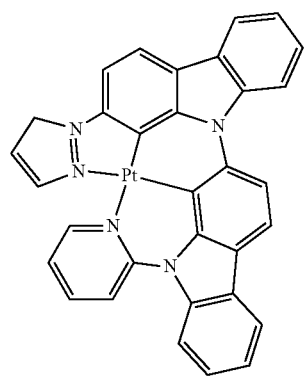
M-b-3
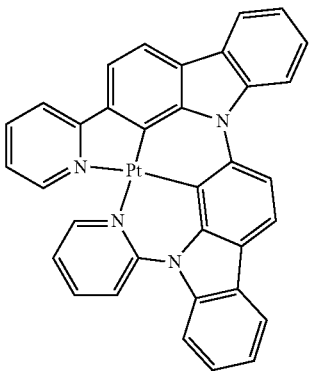
M-b-4
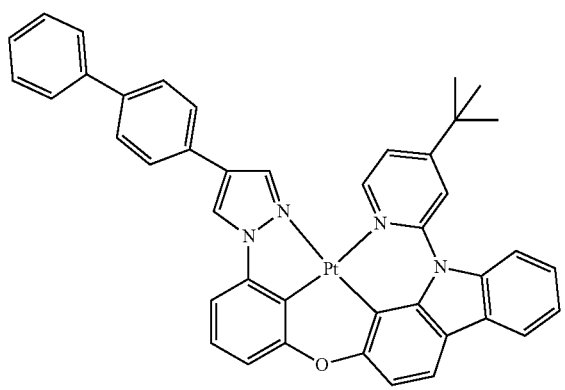
M-b-5
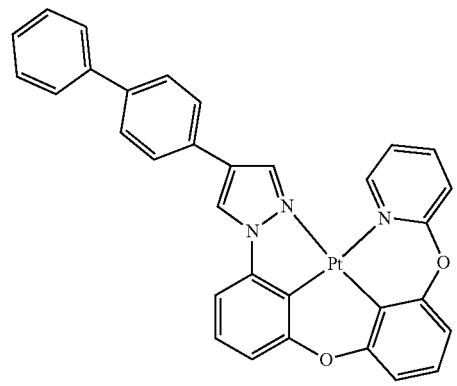
M-b-6
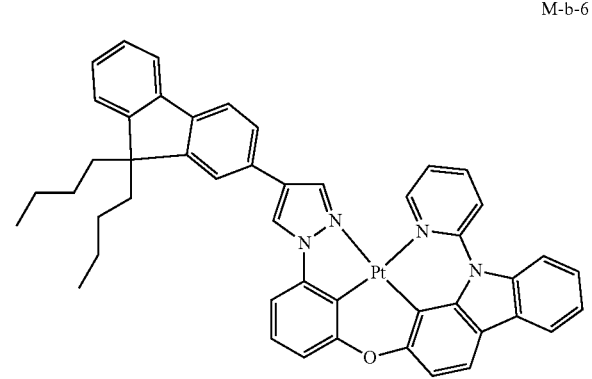
M-b-7
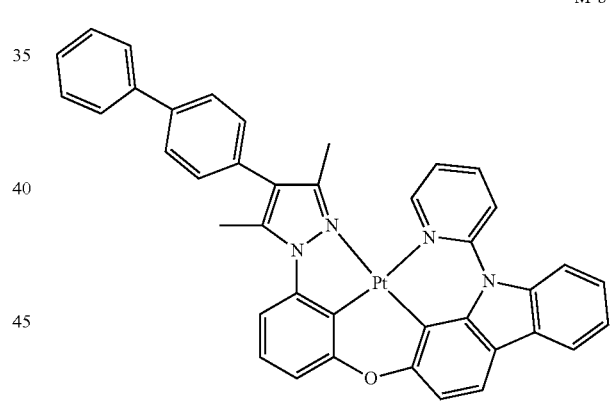
M-b-8
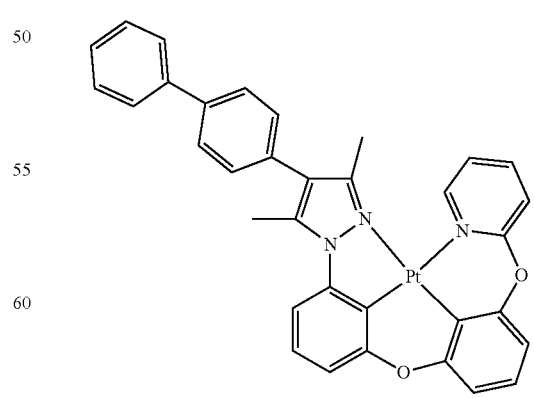

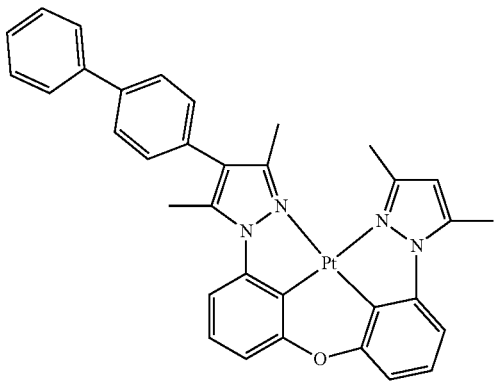
M-b-9

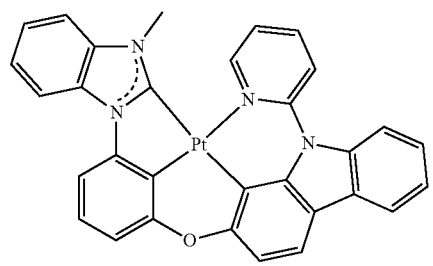
M-b-10

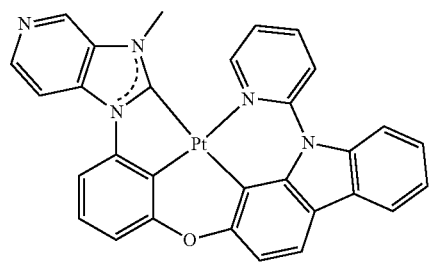
M-b-11

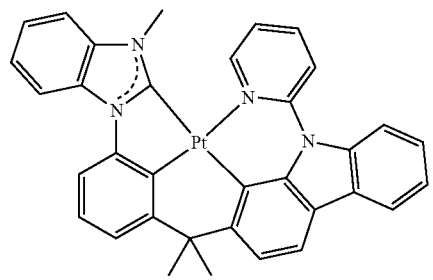
M-b-12

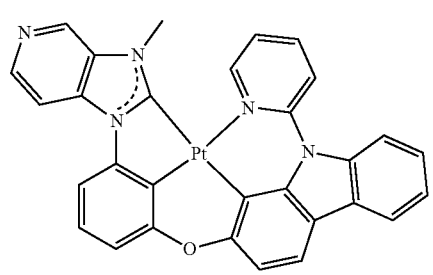
M-b-12

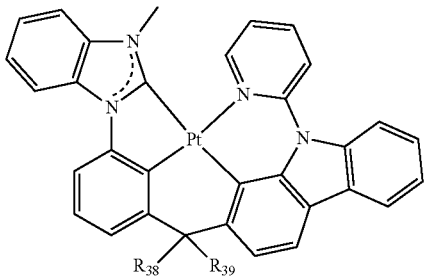
M-b-13

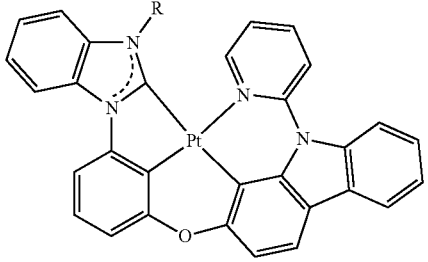
M-b-14

In the compounds, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one selected from among Formula F-a to Formula F-c below. The compound represented by Formula F-a or Formula F-c below may be used as a fluorescence dopant material.

Formula F-a

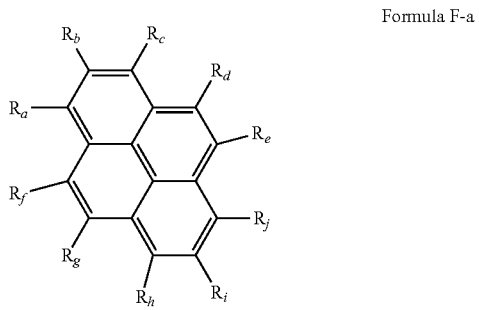

In Formula F-a, two selected from among $R_a$ to $R_j$ may each independently be substituted with *—$NAr_1Ar_2$. The others, which are not substituted with *—$NAr_1Ar_2$, among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms.

For example, at least one selected from $Ar_1$ and $Ar_2$ may be a heteroaryl group containing O or S as a ring-forming atom.

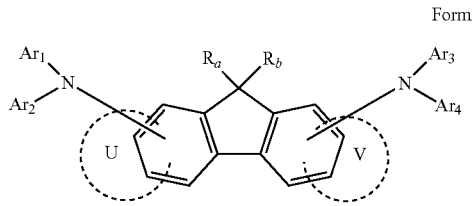

Formula F-b

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, it means that when the number of U or V is 1, one ring forms a condensed ring at a part described as U or V, and when the number of U or V is 0, a ring described as U or V is not present. In one or more embodiments, when the number of U is 0 and the number of V is 1, or when the number of U is 1 and the number of V is 0, the condensed ring having a fluorene core of Formula F-b may be a four-ring cyclic compound. In addition, when each number of U and V is 0, the condensed ring of Formula F-b may be a three-ring cyclic compound. In addition, when each number of U and V is 1, the condensed ring having a fluorene core of Formula F-b may be a five-ring cyclic compound.

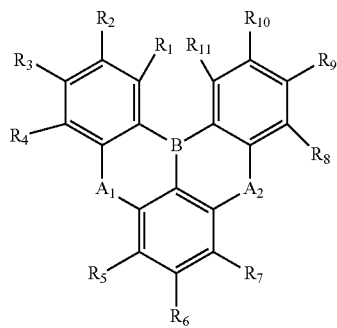

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

In Formula F-c, $A_1$ and $A_2$ may each independently be bonded to substituents of an adjacent ring to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In an embodiment, the emission layer EML may include, any suitable dopant material generally used or available in the art. For example, the emission layer EML may include styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl(DPAVBi), perylene and/or derivatives thereof (e.g., 2,5,8,11-tetra-t-butylperylene (TBP)), pyrene and/or derivatives thereof (e.g., 1,1-dipyrene, 1,4-dipyrenylbenzene, 1,4-bis(N,N-diphenylamino)pyrene), etc.

The emission layer EML may include any suitable phosphorescence dopant material generally used or available in the art. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. In one or more embodiments, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), and/or platinum octaethyl porphyrin (PtOEP) may be used as a phosphorescence dopant. However, the present disclosure is not limited thereto.

The emission layer EML may include a quantum dot material. The core of the quantum dot may be selected from a Group II-VI compound, a Group III-VI compound, a Group compound, a Group III-V compound, a Group III-II-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

A Group compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in particles in a uniform (e.g., substantially uniform) concentration distribution, or may be present in the same particle in a partially different concentration distribution. In addition, the quantum dot may have a core/shell structure in which one quantum dot surrounds another quantum dot. In a core/shell structure, the interface of the shell may have a concentration gradient in which the concentration of an element present in the shell becomes lower along a direction towards the core.

In some embodiments, a quantum dot may have the above-described core-shell structure including a core containing nanocrystals and a shell surrounding the core. The shell of the quantum dot may serve as a protection layer to prevent or reduce the chemical deformation of the core so as to maintain semiconductor properties, and/or a charging layer to impart electrophoresis properties to the quantum dot. The shell may be a single layer or a multilayer. An example of the shell of the quantum dot may include a metal and/or non-metal oxide, a semiconductor compound, or a combination thereof.

For example, the metal and/or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

The quantum dot may have a full width of half maximum (FWHM) of a light emission wavelength spectrum of about 45 nm or less, about 40 nm or less, or, for example, about 30 nm or less, and color purity and/or color reproducibility may be improved in the above range. In addition, light emitted through such a quantum dot is emitted in all directions (e.g., in substantially all directions), and thus a wide viewing angle may be improved.

In addition, the form of the quantum dot is not particularly limited as long as it is a form that is generally used or available in the art. In one or more embodiments, the quantum dot in the form of spherical, pyramidal, multi-arm, or cubic nanoparticles, nanotubes, nanowires, nanofibers, nanoplate particles, etc. may be used.

The quantum dot may control the color of emitted light according to the particle size thereof. Accordingly, the quantum dot may have various suitable light emission colors such as blue, red, and green.

In each light emitting device ED of embodiments illustrated in FIGS. 3 to 6, the electron transport region ETR is provided on the emission layer EML. The electron transport region ETR may include at least one selected from the hole blocking layer HBL, the electron transport layer ETL, and the electron injection layer EIL, but the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but the present disclosure is not limited thereto. The electron transport region ETR may have a thickness, for example, from about 1,000 Å to about 1,500 Å.

The electron transport region ETR may be formed by using various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

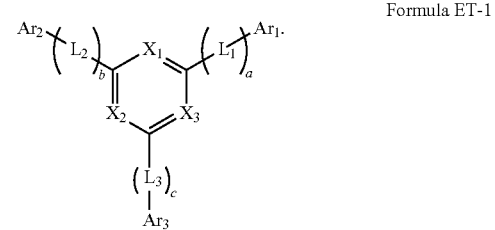

Formula ET-1

In Formula ET-1, at least one among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_a$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage (e.g., a single covalent bond), a substituted or unsubstituted arylene group having 6 to 30 ring-forming carbon atoms, or a substituted or unsubstituted heteroarylene group having 2 to 30 ring-forming carbon atoms. In one or more embodiments, when a to c are an integer of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or a mixture thereof.

In addition, the electron transport regions ETR may include a metal halide such as LiF, NaCl, CsF, RbCI, RbI, CuI, and/or KI, a lanthanide metal such as Yb, and/or a co-deposited material of the metal halide and the lanthanide metal. For example, the electron transport region ETR may include KI:Yb, RbI:Yb, etc. as a co-deposited material. In one or more embodiments, the electron transport region ETR may be formed using a metal oxide such as $Li_2O$ and/or BaO, and/or 8-hydroxyl-lithium quinolate (Liq), etc., but the present disclosure is not limited thereto. The electron transport region ETR may also be formed of a mixture material of an electron transport material and an insulating organometallic salt. The insulating organometallic salt may be a material having an energy band gap of about 4 eV or more. In one or more embodiments, the insulating organometallic salt may include, for example, metal acetates, metal benzoates, metal acetoacetates, metal acetylacetonates, and/or metal stearates.

The electron transport region ETR may further include at least one selected from 2,9-dimethyl-4,7-diphenyl-1,10-phenanthroline (BCP), and 4,7-diphenyl-1,10-phenanthroline (Bphen) in addition to the above-described materials, but the present disclosure is not limited thereto.

The electron transport region ETR may include the above-described compounds of the hole transport region in at least one selected from the electron injection layer EIL, the electron transport layer ETL, and the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the aforementioned range, suitable or satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described range, suitable or satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but the present disclosure is not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/AI, Mo, Ti, Yb, W, a compound thereof, and/or mixture thereof (e.g., AgMg, AgYb, or MgAg). In one or more embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In one or more embodiments, the second electrode EL2 may be coupled with an auxiliary electrode. If the second electrode EL2 is coupled with the auxiliary electrode, the resistance of the second electrode EL2 may decrease.

In one or more embodiments, a capping layer CPL may further be on the second electrode EL2 of the light emitting device ED of an embodiment. The capping layer CPL may include a multilayer or a single layer.

In an embodiment, the capping layer CPL may be an organic layer and/or an inorganic layer. For example, when the capping layer CPL includes an inorganic material, the inorganic material may include an alkaline metal compound such as LiF, an alkaline earth metal compound such as $MgF_2$, SiON, $SiN_x$, SiOy, etc.

For example, when the capping layer CPL includes an organic material, the organic material may include a-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol sol-9-yl)triphenylamine (TCTA), etc., and/or an epoxy resin, and/or an acrylate such as methacrylate. However, the present disclosure is not limited thereto, and the capping layer CPL may include at least one selected from among Compounds P1 to P5 below:

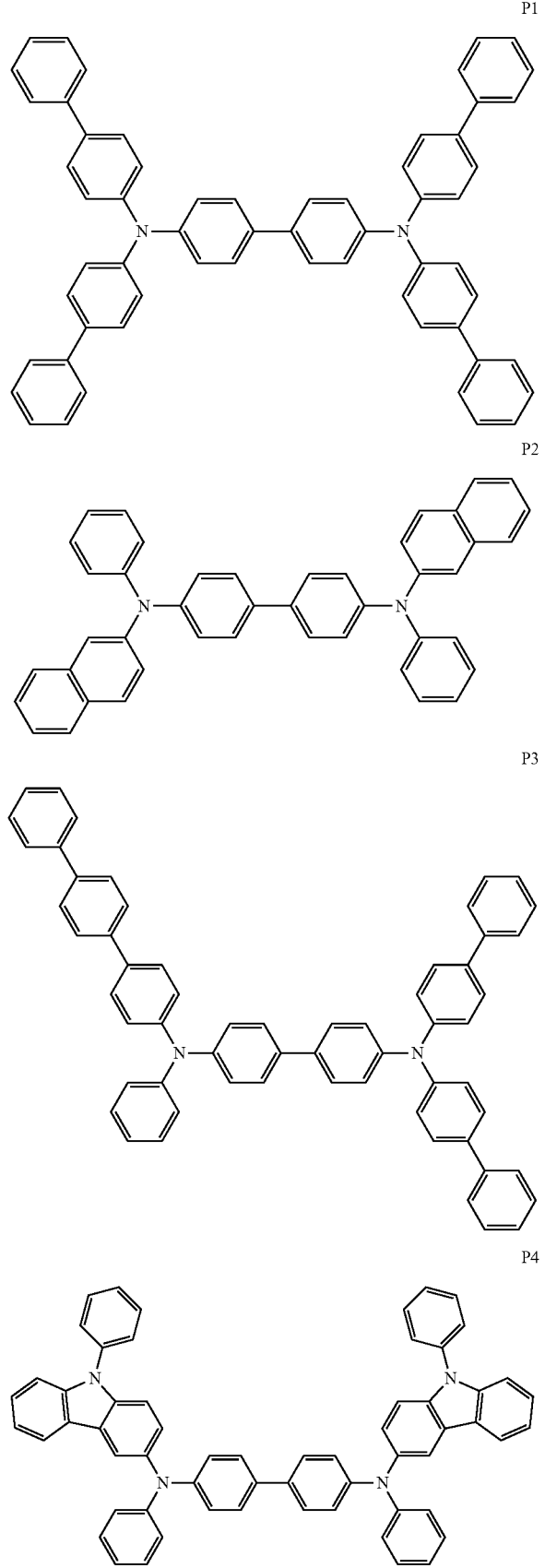

In one or more embodiments, the refractive index of the capping layer CPL may be about 1.6 or more. For example, the refractive index of the capping layer CPL may be about 1.6 or more with respect to light in a wavelength range of about 550 nm to about 660 nm.

Figure 7:
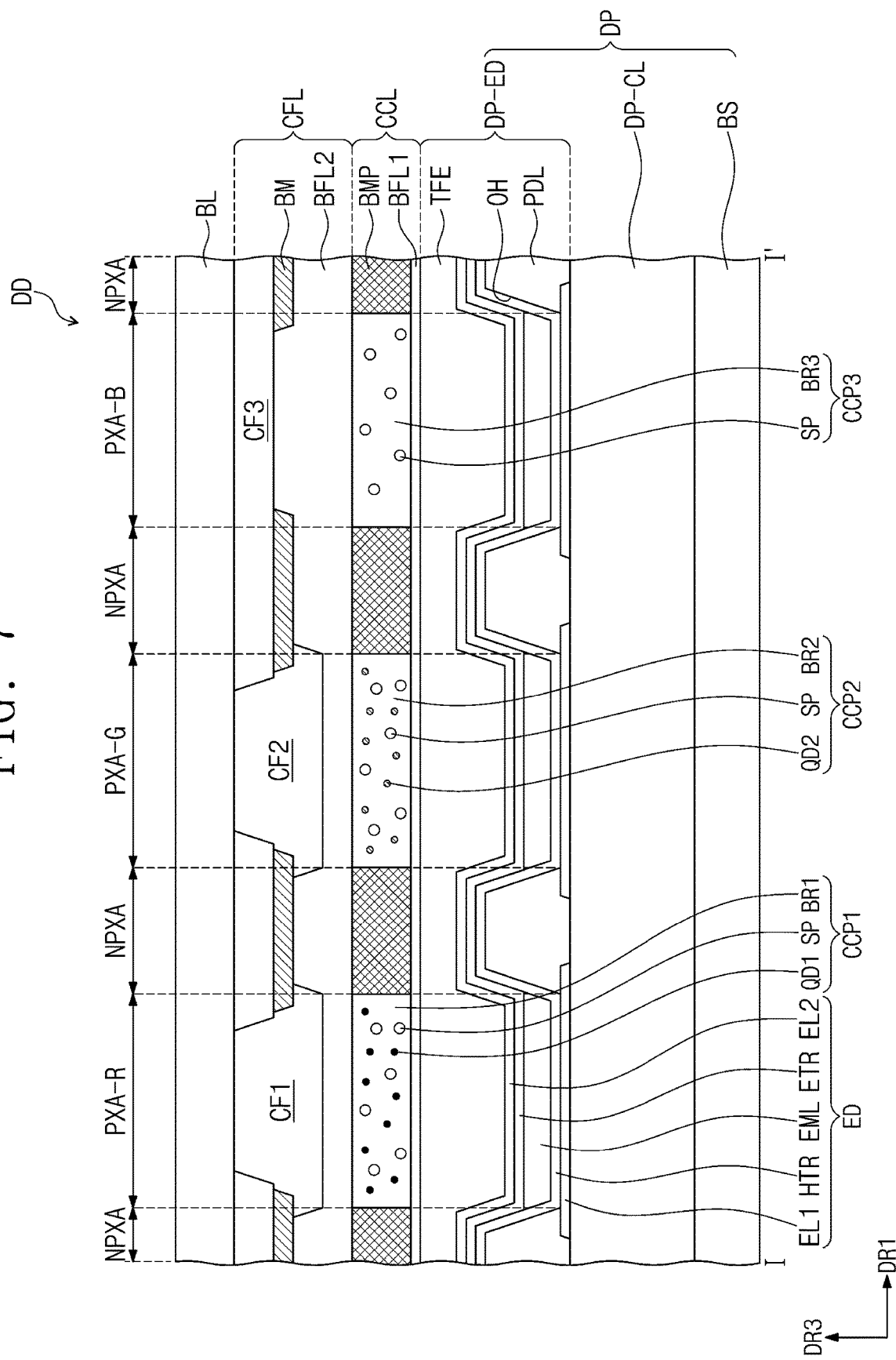
FIGS. 7 and 8 each are a cross-sectional view of a display apparatus according to an embodiment of the present disclosure.
Figure 8:
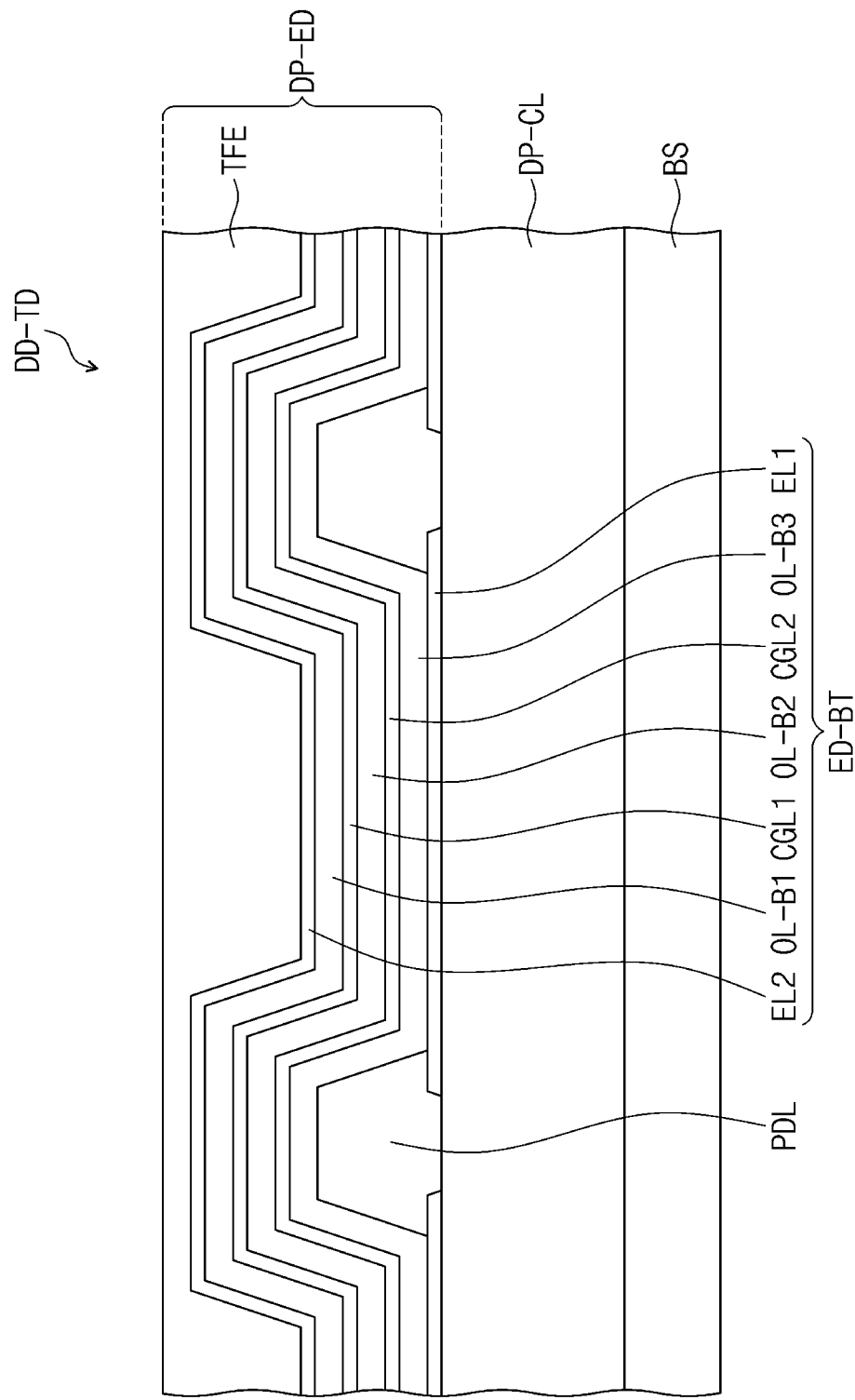

FIGS. 7 and 8 each are a cross-sectional view of a display apparatus according to an embodiment. Hereinafter, in describing the display apparatus of an embodiment with reference to FIGS. 7 and 8, the duplicated features which have been described in FIGS. 1 to 6 are not described again here, but their differences will be mainly described.

Referring to FIG. 7, the display apparatus DD according to an embodiment may include a display panel DP including a display device layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. According to one or more embodiments, the structures of the light emitting devices of FIGS. 3 to 6 as described above may be equally applied to the structure of the light emitting device ED shown in FIG. 7.

Referring to FIG. 7, the emission layer EML may be in an opening OH defined in a pixel defining film PDL. For example, the emission layer EML which is divided by the pixel defining film PDL and provided corresponding to each light emitting regions PXA-R, PXA-G, and PXA-B may emit light in the same wavelength range. In the display apparatus DD of an embodiment, the emission layer EML may emit blue light. In one or more embodiments, the emission layer EML may be provided as a common layer in the entire light emitting regions PXA-R, PXA-G, and PXA-B.

The light control layer CCL may be on the display panel DP. The light control layer CCL may include a light conversion body. The light conversion body may be a quantum dot, a phosphor, and/or the like. The light conversion body may emit provided light by converting the wavelength thereof. For example, the light control layer CCL may include a layer containing the quantum dot and/or a layer containing the phosphor.

The light control layer CCL may include a plurality of light control units CCP1, CCP2 and CCP3. The light control units CCP1, CCP2, and CCP3 may be spaced apart from one another.

Referring to FIG. 7, divided patterns BMP may be between adjacent ones of the light control units CCP1, CCP2 and CCP3 which are spaced apart from each other, but the present disclosure is not limited thereto. FIG. 7 illustrates that the divided patterns BMP do not overlap the light control units CCP1, CCP2 and CCP3, but at least a portion of the edges of the light control units CCP1, CCP2 and CCP3 may overlap the divided patterns BMP.

The light control layer CCL may include a first light control unit CCP1 containing a first quantum dot QD1 which converts a first color light provided from the light emitting device ED into a second color light, a second light control unit CCP2 containing a second quantum dot QD2 which converts the first color light into a third color light, and a third light control unit CCP3 which transmits the first color light.

In an embodiment, the first light control unit CCP1 may provide red light that is the second color light, and the second light control unit CCP2 may provide green light that is the third color light. The third light control unit CCP3 may transmit blue light that is the first color light provided in the light emitting device ED. For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP (e.g., a light scatterer SP). The first light control unit CCP1 may include the first quantum dot QD1 and the scatterer SP, the second light control unit CCP2 may include the second quantum dot QD2 and the scatterer SP, and the third light control unit CCP3 may not include any quantum dot but may include the scatterer SP.

The scatterer SP may be inorganic particles. For example, the scatterer SP may include at least one selected from $TiO_2$, ZnO, $Al_2O_3$, $SiO_2$, and hollow silica. The scatterer SP may include any one selected from $TiO_2$, ZnO, $Al_2O_3$, $SiO_2$, and hollow silica, or may be a mixture of at least two materials selected from among $TiO_2$, ZnO, $Al_2O_3$, $SiO_2$, and hollow silica.

The first light control unit CCP1, the second light control unit CCP2, and the third light control unit CCP3 may respectively include base resins BR1, BR2, and BR3 in which the quantum dots QD1 and QD2 and the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1 and QD2 and the scatterer SP are dispersed, and may be formed of various suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be on the light control units CCP1, CCP2, and CCP3 to block or reduce exposure of the light control units CCP1, CCP2 and CCP3 to moisture/oxygen. In one or more embodiments, the barrier layer BFL1 may cover the light control units CCP1, CCP2, and CCP3. In addition, the barrier layer BFL2 may be provided on the light control layer CCL.

The barrier layers BFL1 and BFL2 may include at least one inorganic layer. In one or more embodiments, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In one or more embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be on the light control layer CCL. For example, the color filter layer CFL may be directly on the light control layer CCL. In this case, the barrier layer BFL2 may be omitted.

The color filter layer CFL may include a light shielding unit BM and filters CF-B, CF-G, and CF-R. The color filter layer CFL may include a first filter CF1 to transmit the second color light, a second filter CF2 to transmit the third color light, and a third filter CF3 to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment and/or dye, the second filter CF2 may include a green pigment and/or dye, and the third filter CF3 may include a blue pigment and/or dye. The present disclosure, however, is not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated but be provided as one filter.

The light shielding unit BM may be a black matrix. The light shielding unit BM may include an organic light shielding material and/or an inorganic light shielding material containing a black pigment and/or dye. The light shielding unit BM may prevent or reduce light leakage, and may separate boundaries between the adjacent filters CF1, CF2, and CF3. In addition, in an embodiment, the light shielding unit BM may be formed of a blue filter.

The first to third filters CF1, CF2, and CF3 may correspond to the red light emitting region PXA-R, the green light emitting region PXA-G, and the blue light emitting region PXA-B, respectively.

A base substrate BL may be on the color filter layer CFL. The base substrate BL may be a member which provides a base surface in which the color filter layer CFL, the light control layer CCL, and the like are located. The base substrate BL may be a glass substrate, a metal substrate, a plastic substrate, etc. However, the present disclosure is not limited thereto, and the base substrate BL may be an inorganic layer, an organic layer, or a composite material layer including an inorganic material and an organic material. In addition, unlike as shown in the drawings, in an embodiment, the base substrate BL may be omitted.

FIG. 8 is a cross-sectional view illustrating a part of a display apparatus according to an embodiment. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR having the emission layer EML (FIG. 7) therebetween.

In one or more embodiments, the light emitting device ED-BT included in the display apparatus DD-TD of an embodiment may be a light emitting device having a tandem structure and including a plurality of emission layers.

In an embodiment illustrated in FIG. 8, all light beams respectively emitted from the light emitting structures OL-B1, OL-B2, and OL-B3 may be blue light.

However, the present disclosure is not limited thereto, and the light beams respectively emitted from the light emitting structures OL-B1, OL-B2, and OL-B3 may have wavelength ranges different from each other. For example, the light emitting device ED-BT including the plurality of light emitting structures OL-B1, OL-B2, and OL-B3 which emit light beams having wavelength ranges different from each other may emit white light.

A charge generation layer CGL1, CGL2 may be between the neighboring light emitting structures OL-B1, OL-B2, and OL-B3. The charge generation layer CGL1, CGL2 may include a p-type charge generation layer and/or an n-type charge generation layer.

The light emitting device ED according to an embodiment of the present disclosure may include the above-described condensed polycyclic compound of an embodiment in the emission layer EML between the first electrode EL1 and the second electrode EL2 to exhibit excellent luminous efficiency. In addition, the condensed polycyclic compound according to an embodiment may be a thermally activated delayed fluorescence dopant, and the emission layer EML may include the condensed polycyclic compound of an embodiment to emit thermally activated delayed fluorescence, thereby exhibiting excellent luminous efficiency characteristics.

The above-described compound of one or more embodiments may be included as a material for the light emitting device ED in an organic layer in addition to the emission layer EML. For example, the light emitting device 10 according to an embodiment of the present disclosure may include the above-described polycyclic compound in at least one functional layer between the first electrode EL1 and the second electrode EL2, and/or in the capping layer CPL on the second electrode EL2.

The above-described condensed polycyclic compound of an embodiment may have a skeleton in which the condensed polycyclic compound containing two boron atoms includes a spiro structure.

The spiro structure included in the condensed polycyclic compound contains a heteroatom such as N, O, S, and Se instead of a carbon atom, and thus an overlap level of HOMO and LUMO in the spiro structure may be improved. In addition, the conjugation in the spiro structure may be expanded, thereby providing the condensed polycyclic compound with a low $\Delta E_{ST}$ value.

Thus, the condensed polycyclic compound of the present disclosure may have a strong bond dissociation energy, exhibit multiple resonance effects, and have a stable molecular structure.

The light emitting device of an embodiment including the condensed polycyclic compound of an embodiment in the emission layer may emit blue light and exhibit high efficiency characteristics.

Hereinafter, with reference to Examples and Comparative Examples, a condensed polycyclic according to an embodiment of the present disclosure and a light emitting device of an embodiment of the present disclosure will be described in more detail. In addition, Examples shown below are illustrated only for the understanding of the subject matter of the present disclosure, and the scope of the present disclosure is not limited thereto.

1. Synthesis of Condensed Polycyclic Compound According to Example

First, a synthetic method of the condensed polycyclic compound according to an embodiment of the present disclosure will be described in more detail by describing synthetic methods of Example Compounds 1, 2, 3, 7, 8, 9, 16, 24, 37 and 56. In addition, in the following descriptions, the synthetic methods of the condensed polycyclic compounds are provided as examples, but the synthetic method of the condensed polycyclic compound of the present disclosure is not limited to the following examples.

(1) Synthesis of Compound 1.

Compound 1 according to an example may be synthesized by Reaction Scheme 1 below:

Reaction Scheme 1

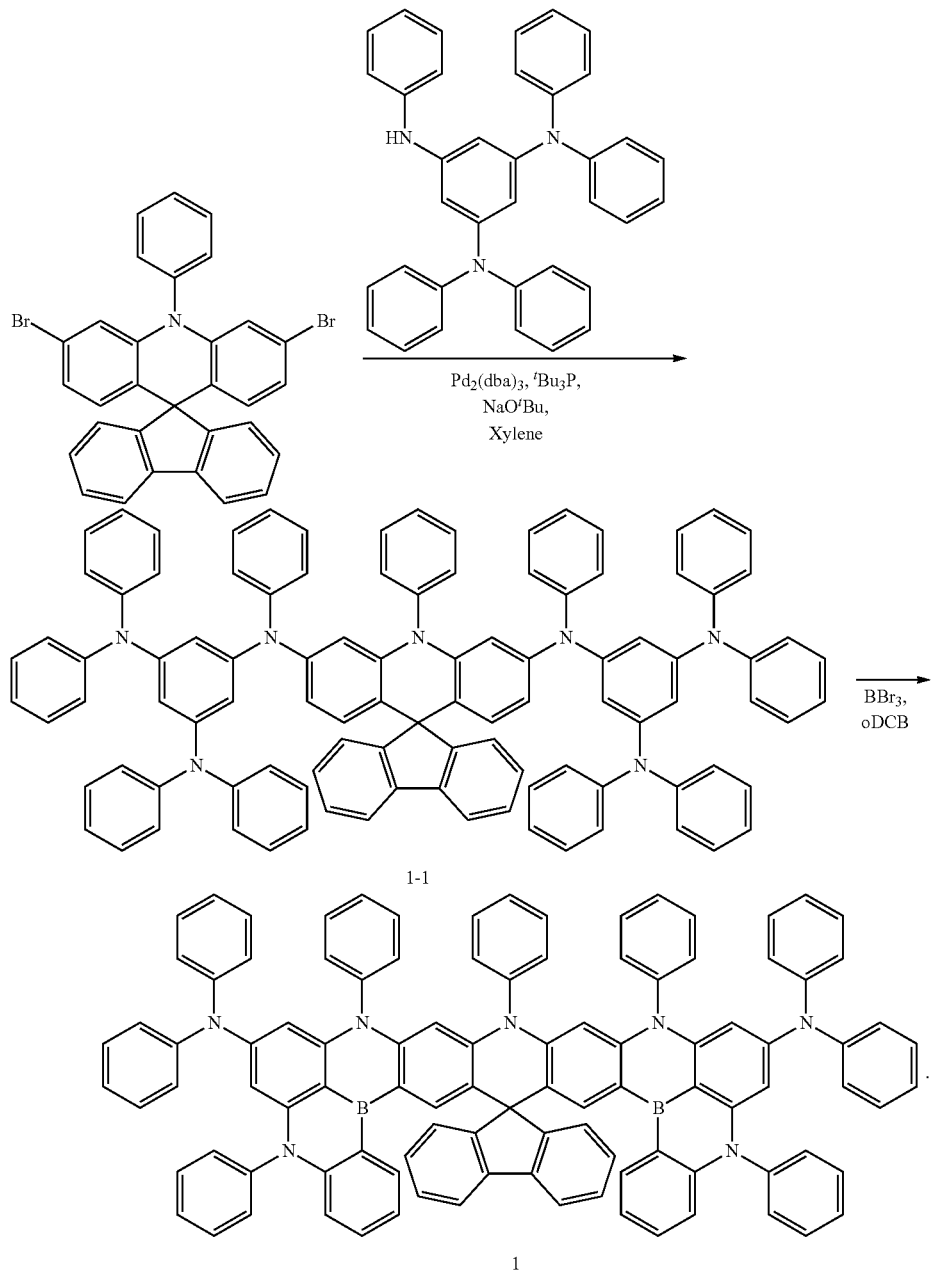

Synthesis of Intermediate 1-1

3,6-dibromo-10-phenyl-10H-spiro[acridine-9,9'-fluorene] (1 eq), N1,N1,N3,N3,N5-pentaphenylbenzene-1,3,5-triamine (2.1 eq), tris(dibenzylideneacetone)dipalladium(0) (0.1 eq), tri-tert-butylphosphine (0.2 eq), and sodium tert-butoxide (4 eq) were dissolved in xylene and then stirred in a nitrogen atmosphere at about 150° C. for about 20 hours. After cooling, the resultant mixture was dried under reduced pressure and the xylene was removed. Then, the resulting product was washed three times with ethyl acetate and water to obtain organic layers. The obtained organic layers were dried over $MgSO_4$, and then dried under reduced pressure. The resulting product was purified and recrystallized by column chromatography (dichloromethane:n-hexane) to obtain Intermediate 1-1. (yield: 53%)

Synthesis of Compound 1

Intermediate 1-1 (1 eq) was dissolved in ortho dichlorobenezene, and a flask was cooled to about 0° C. in a nitrogen atmosphere, and then $BBr_3$ (4 eq) was slowly injected thereto. After dropping was completed, the temperature was elevated to about 190° C., and the mixture was stirred for about 24 hours. After cooling to about 0° C., triethylamine was slowly dropped to the flask until heating stopped to quench the reaction, and then hexane was added to the flask and solids were extracted. The extracted solids were obtained by filtration. The obtained solids were purified with a silica filter, and then purified again through recrystallization in MC/Hex to obtain Compound 1. Then, the resulting product was finally purified by sublimation purification (post sublimation yield: 2.1%).
(2) Synthesis of Compound 2
Compound 2 according to an example may be synthesized by Reaction Scheme 2 below:
Reaction Scheme 2
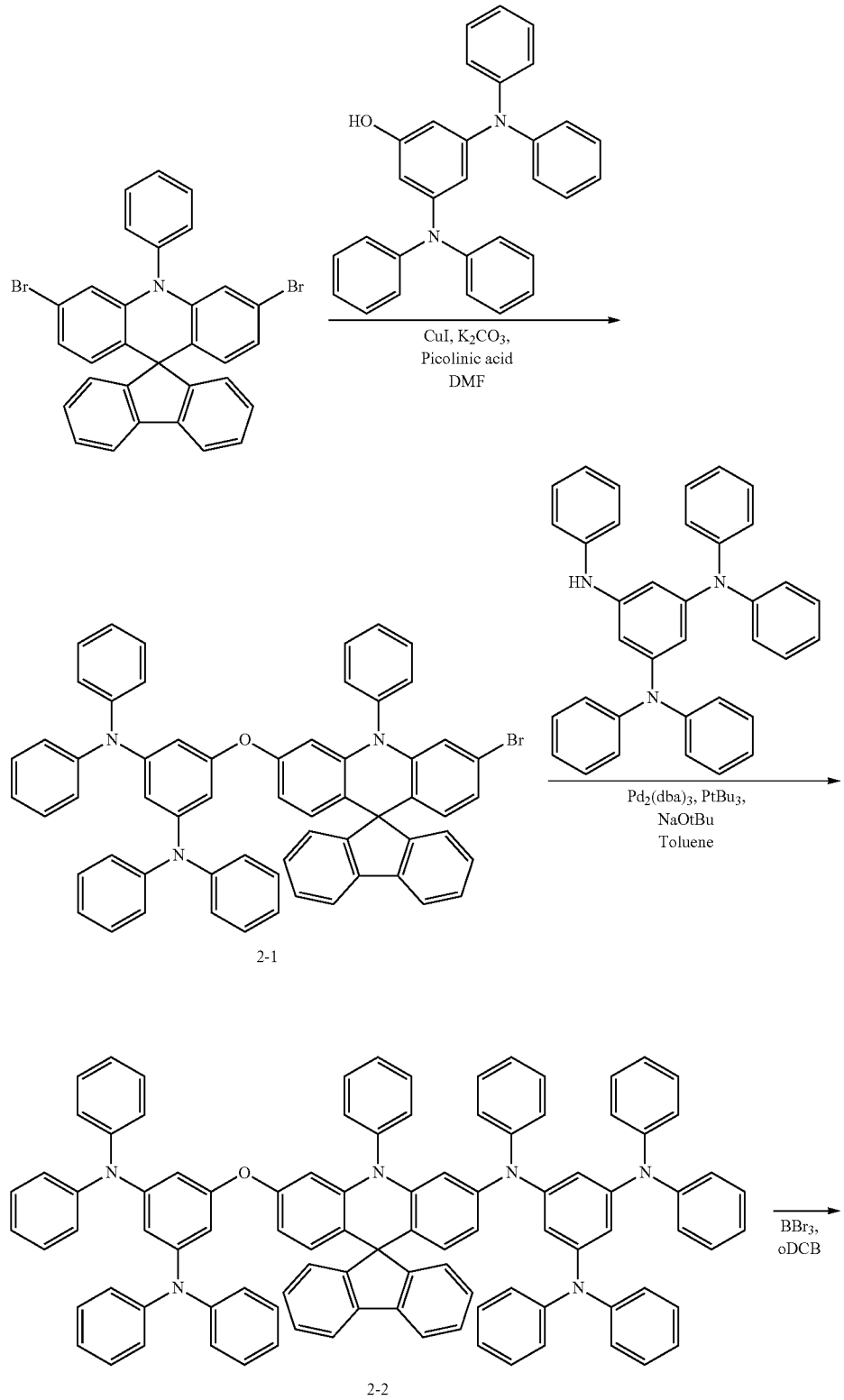

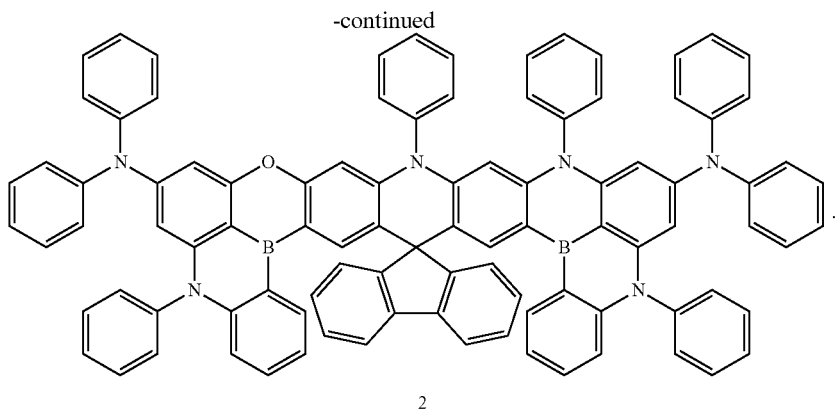

2

Synthesis of Intermediate 2-1

3,6-dibromo-10-phenyl-10H-spiro[acridine-9,9'-fluorene] (1 eq), 3,5-bis(diphenylamino)phenol (1 eq), CuI (0.2 eq), K₂CO₃ (3 eq), and picolinic acid (0.4 eq) were dissolved in DMF and then stirred at about 160° C. for about 20 hours. After cooling, the resultant mixture was dried under reduced pressure and the DMF was removed. Then, the resulting product was washed with ethyl acetate and water to obtain organic layers. The obtained organic layers were dried over MgSO₄, and then dried under reduced pressure. The resulting product was purified and recrystallized by column chromatography (dichloromethane:n-hexane) to obtain Intermediate 2-1. (yield: 72%)

Synthesis of Intermediate 2-2

Intermediate material 2-1 (1 eq), N1,N1,N3,N3,N5-pentaphenylbenzene-1,3,5-triamine (2.1 eq), tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO₄, and then dried under reduced pressure. The resulting product was purified and recrystallized by column chromatography (dichloromethane:n-hexane) to obtain Intermediate 2-2. (yield: 61%)

Synthesis of Compound 2

Compound 2 was obtained in substantially the same manner as the synthesis of Compound 1 except that Intermediate 2-2 was used. (post sublimation yield: 3%)

(3) Synthesis of Compound 3

Compound 3 according to an example may be synthesized by Reaction Scheme 3 below:

Reaction Scheme 3

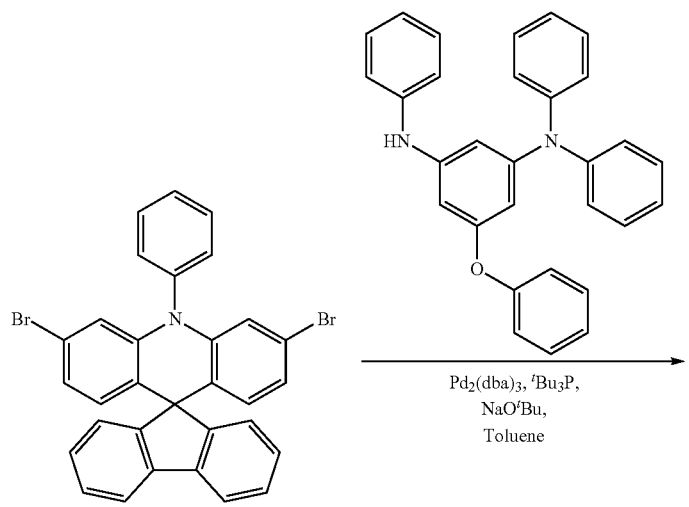

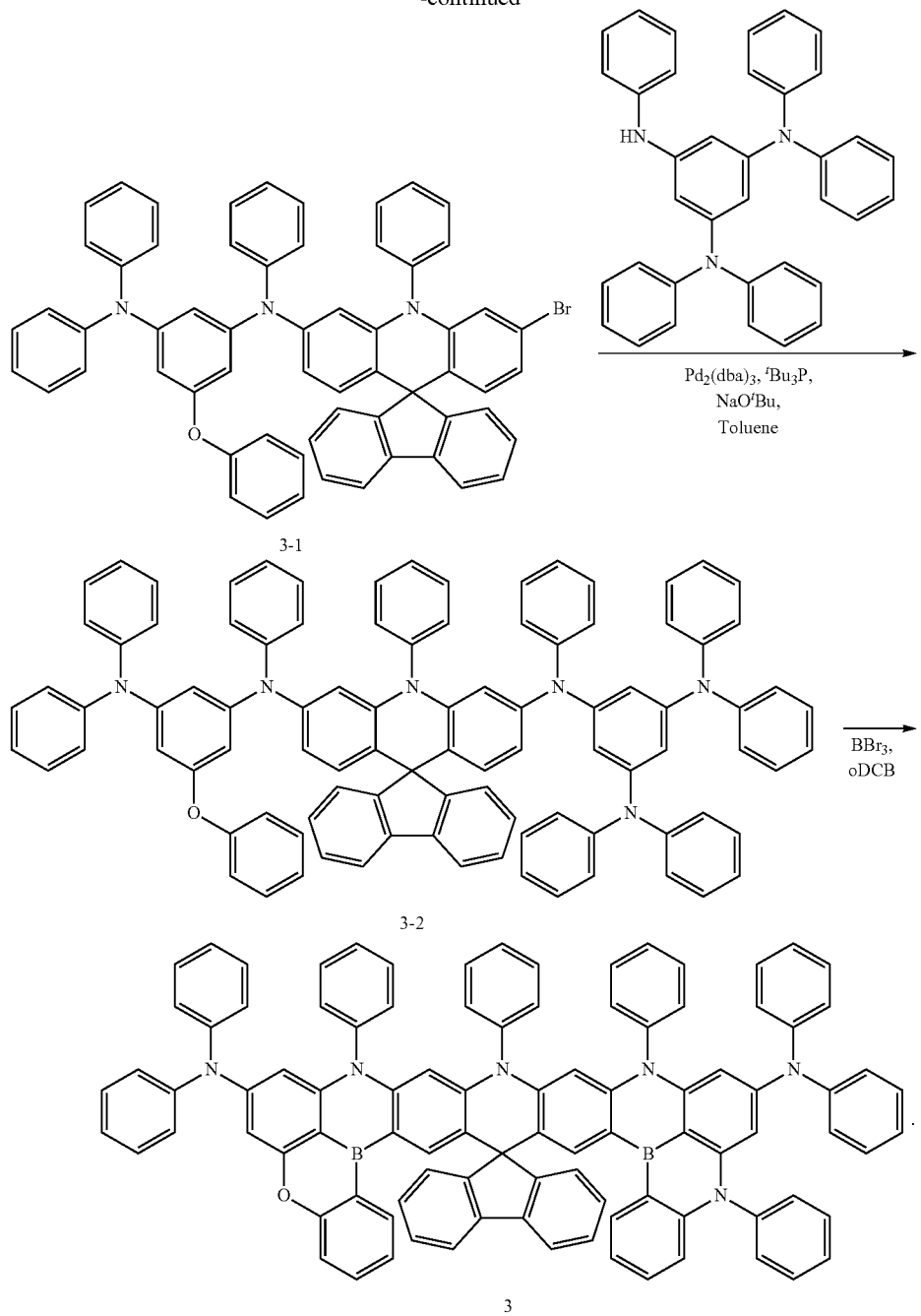

Synthesis of Intermediate 3-1

3,6-dibromo-10-phenyl-10H-spiro[acridine-9,9'-fluorene] (1 eq), 5-phenoxy-N1,N1,N3-triphenylbenzene-1,3-diamine (1 eq), tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO$_4$, and then dried under reduced pressure. The resulting product was purified and recrystallized by column chromatography (dichloromethane:n-hexane) to obtain Intermediate 3-1. (yield: 75%)

Synthesis of Intermediate 3-2

Intermediate 3-1 (1 eq), N1,N1,N3,N3,N5-pentaphenyl-benzene-1,3,5-triamine (1.1 eq), tris(dibenzylideneacetone) dipalladium(0) (0.05 eq), tri-tert-butylphosphine (0.1 eq), sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO$_4$, and then dried under reduced pressure. The resulting product was purified and recrystallized by column chromatography (dichloromethane:n-hexane) to obtain Intermediate 3-2. (yield: 66%)

Synthesis of Compound 3

Compound 3 was obtained in substantially the same manner as the synthesis of Compound 1 except that Intermediate 3-2 was used. (post sublimation yield: 1.5%)

(4) Synthesis of Compound 7

Compound 7 according to an example may be synthesized by Reaction Scheme 4 below:

Synthesis of Intermediate 7-1

3',6'-dibromospiro[fluorene-9,9'-xanthene] (1 eq), N1,N1,N3,N3,N5-pentaphenylbenzene-1,3,5-triamine (2.1 eq), tris(dibenzylideneacetone)dipalladium(0) (0.1 eq), tri-tert-butylphosphine (0.2 eq), and sodium tert-butoxide (4 eq) were dissolved in xylene and then stirred in a nitrogen atmosphere at about 150° C. for about 20 hours. After cooling, the resultant mixture was dried under reduced pressure and the xylene was removed. Then, the resulting product was washed three times with ethyl acetate and water to obtain organic layers. The obtained organic layers were Reaction Scheme 4

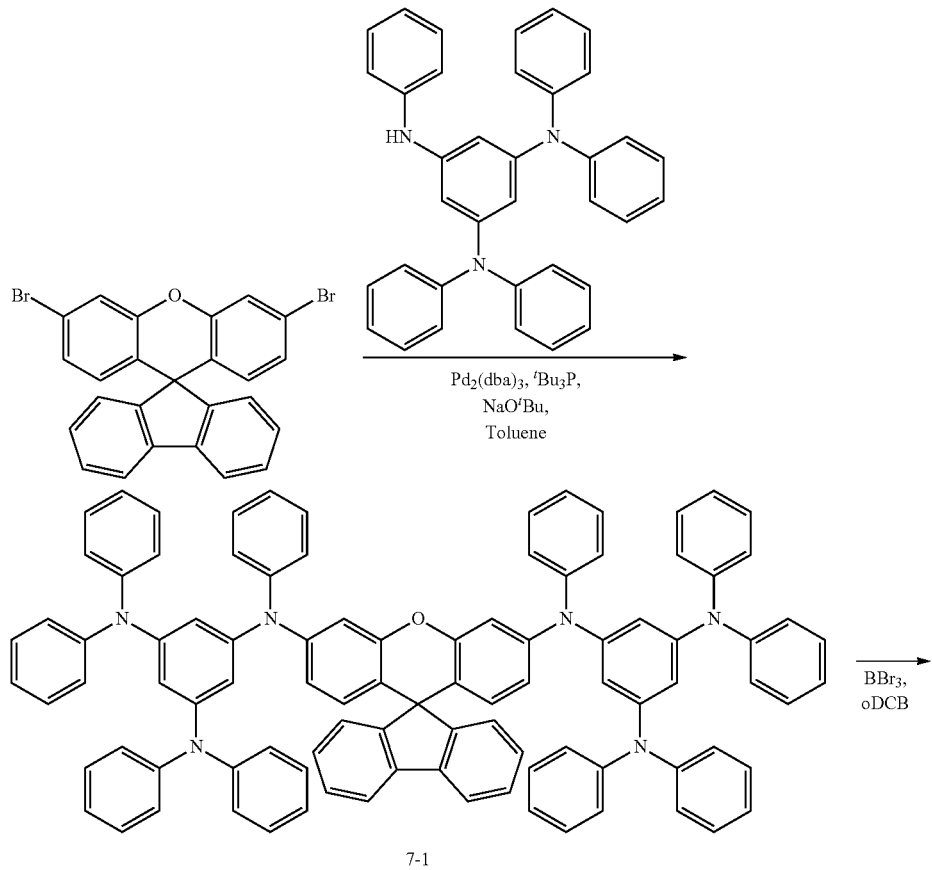

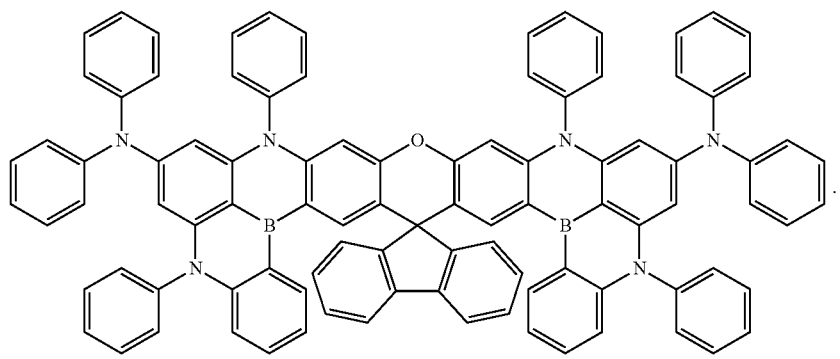

7 dried over MgSO₄, and then dried under reduced pressure. The resulting product was purified and recrystallized by column chromatography (dichloromethane:n-hexane) to obtain Intermediate 7-1. (yield: 62%)

Synthesis of Compound 7

Compound 7 was obtained in substantially the same manner as the synthesis of Compound 1 except that Intermediate 7-1 was used. (post sublimation yield: 3.7%)

(5) Synthesis of Compound 8

Compound 8 according to an example may be synthesized by Reaction Scheme 5 below:

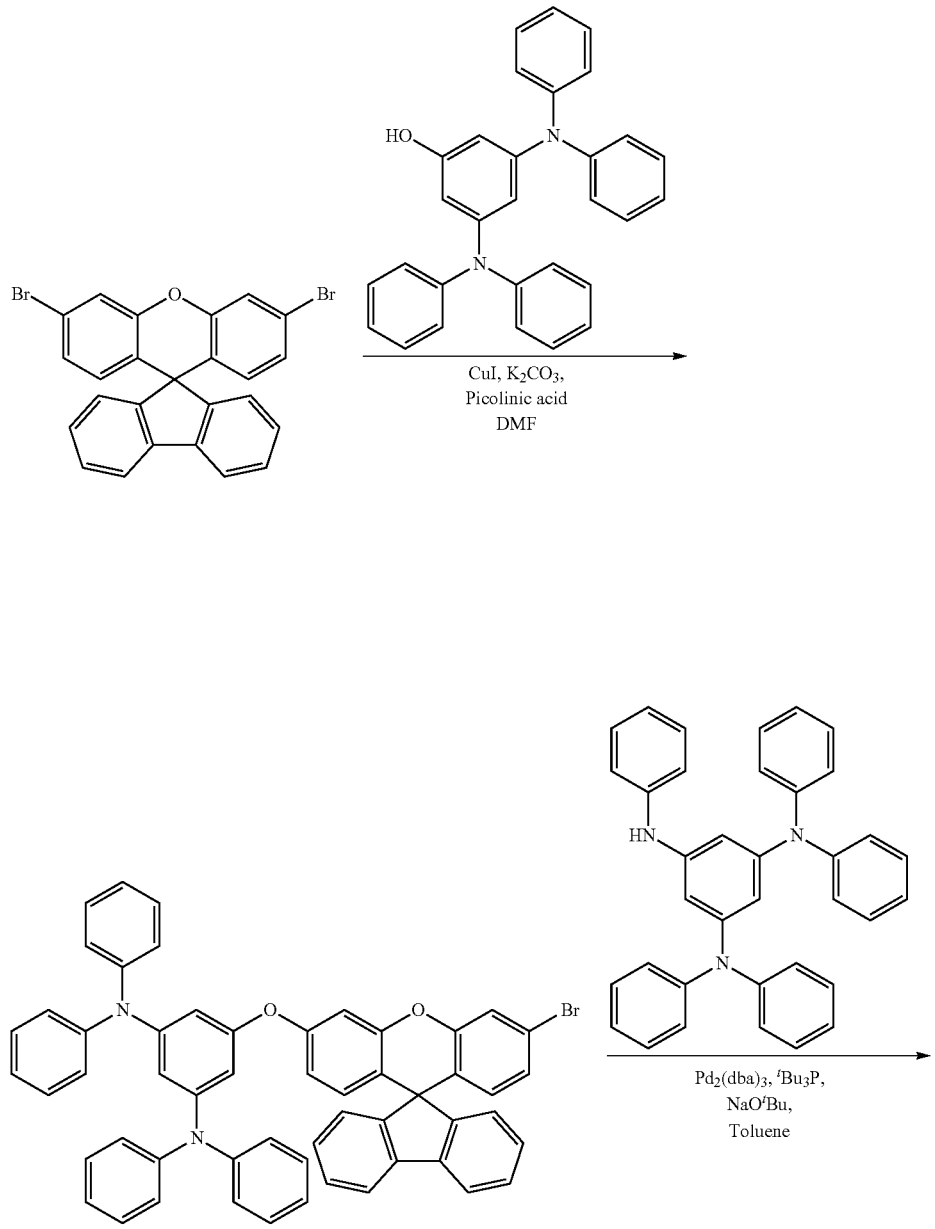

-continued

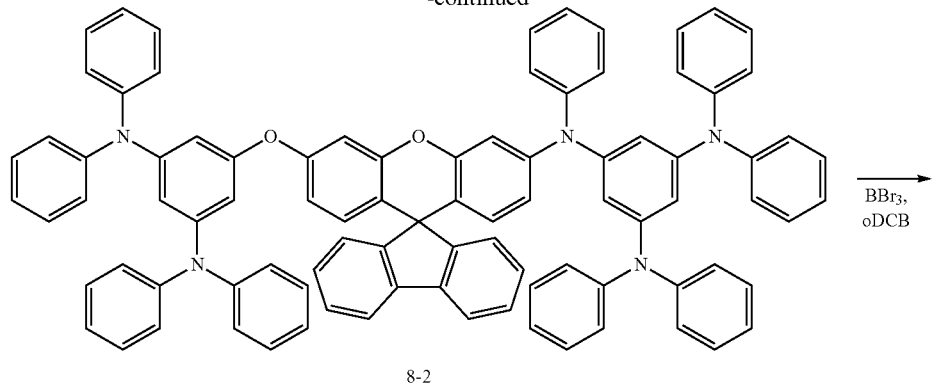

8-2

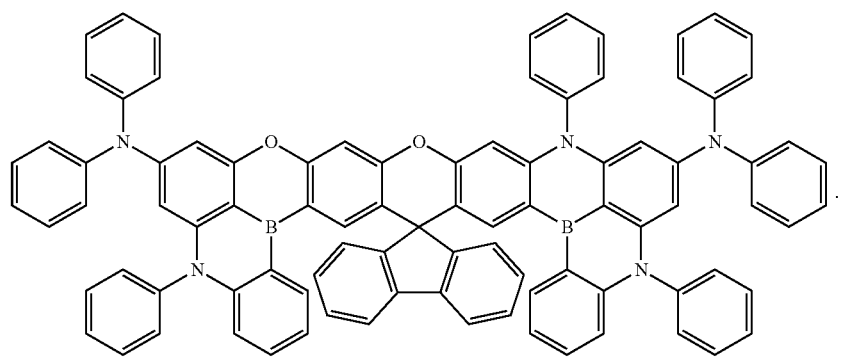

8

Synthesis of Intermediate 8-1

3',6'-dibromospiro[fluorene-9,9'-xanthene] (1 eq), 3,5-bis(diphenylamino)phenol (1 eq), CuI (0.2 eq), $K_2CO_3$ (3 eq), and picolinic acid (0.4 eq) were dissolved in DMF and then stirred at about 160° C. for about 20 hours. After cooling, the resultant mixture was dried under reduced pressure and the DMF was removed. Then, the resulting product was washed with ethyl acetate and water to obtain organic layers. The obtained organic layers were dried over $MgSO_4$, and then dried under reduced pressure. The resulting product was purified and recrystallized by column chromatography (dichloromethane:n-hexane) to obtain Intermediate 8-1. (yield: 63%)

Synthesis of Intermediate 8-2

Intermediate material 8-1 (1 eq), N1,N1,N3,N3,N5-pentaphenylbenzene-1,3,5-triamine (2.1 eq), tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over $MgSO_4$, and then dried under reduced pressure. The resulting product was purified and recrystallized by column chromatography (dichloromethane:n-hexane) to obtain Intermediate 8-2. (yield: 59%)

Synthesis of Compound 8

Compound 8 was obtained in substantially the same manner as the synthesis of Compound 1 except that Intermediate 8-2 was used. (post sublimation yield: 4.2%)

(6) Synthesis of Compound 9

Compound 9 according to an example may be synthesized by Reaction Scheme 6 below:

Reaction Scheme 6
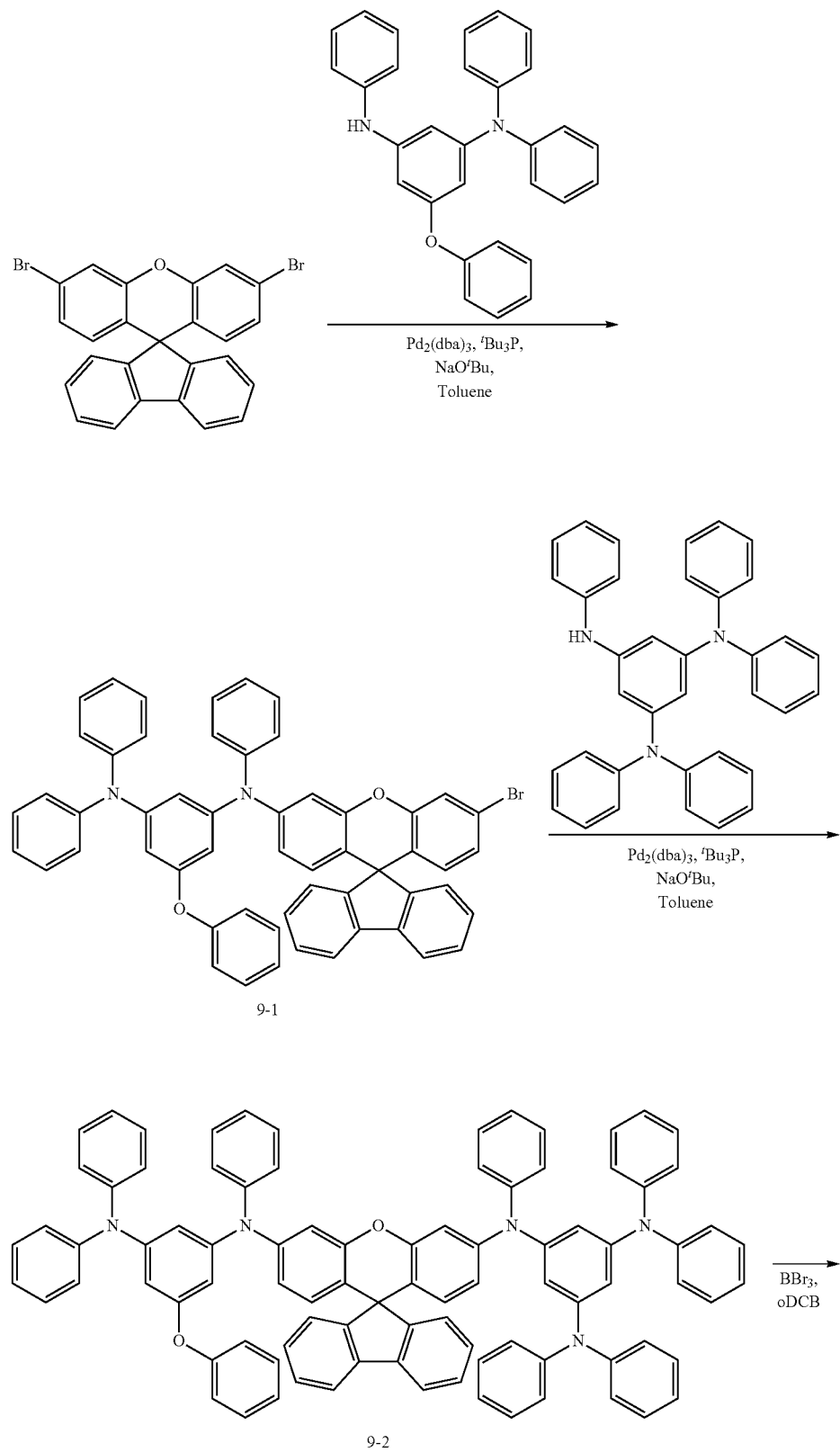

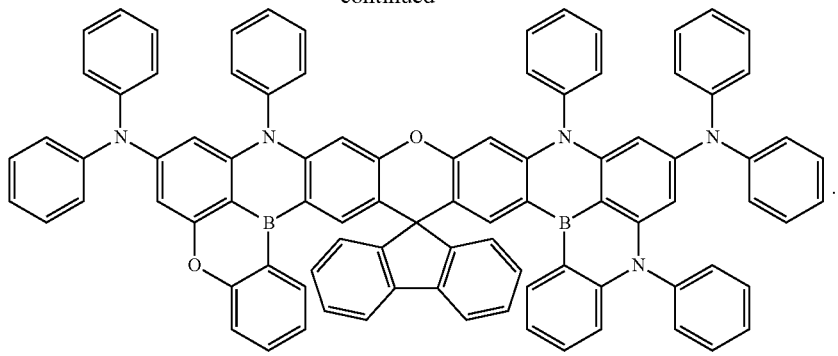

9

Synthesis of Intermediate 9-1

3',6'-dibromospiro[fluorene-9,9'-xanthene] (1 eq), 5-phenoxy-N1,N1,N3-triphenylbenzene-1,3-diamine (1 eq), tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO$_4$, and then dried under reduced pressure. The resulting product was purified and recrystallized by column chromatography (dichloromethane:n-hexane) to obtain Intermediate 9-1. (yield: 79%)

Synthesis of Intermediate 9-2

Intermediate 9-1 (1 eq), N1,N1,N3,N3,N5-pentaphenylbenzene-1,3,5-triamine (1.1 eq), tris(dibenzylideneacetone)dipalladium(0) (0.05 eq), tri-tert-butylphosphine (0.1 eq), sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO$_4$, and then dried under reduced pressure. The resulting product was purified and recrystallized by column chromatography (dichloromethane:n-hexane) to obtain Intermediate 9-2. (yield: 65%)

Synthesis of Compound 9

Compound 9 was obtained in substantially the same manner as the synthesis of Compound 1 except that Intermediate 9-2 was used. (post sublimation yield: 1.7%)

(7) Synthesis of Compound 16

Compound 16 according to an example may be synthesized by, for example, the steps shown in Reaction Scheme 7 below:

Reaction Scheme 7

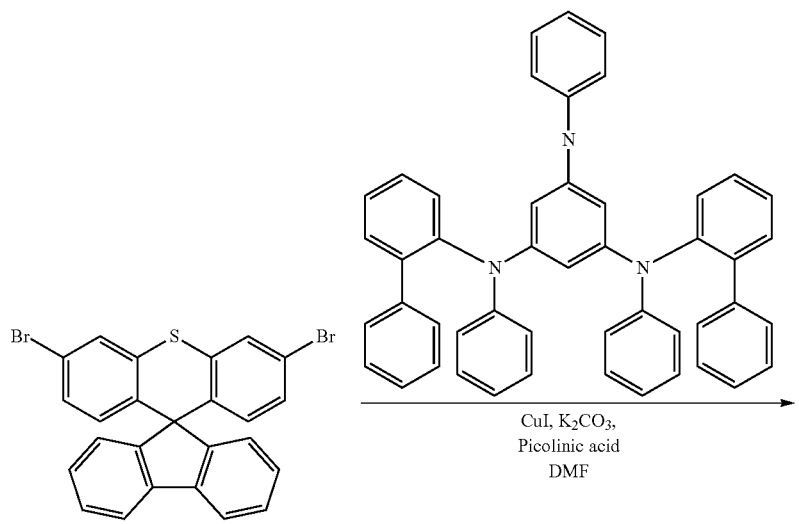

-continued
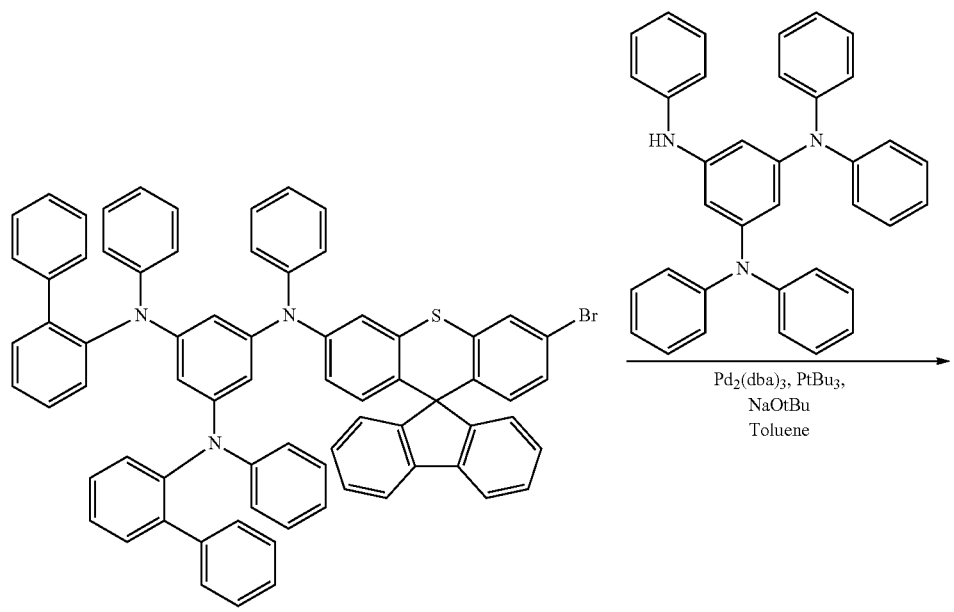
16-1
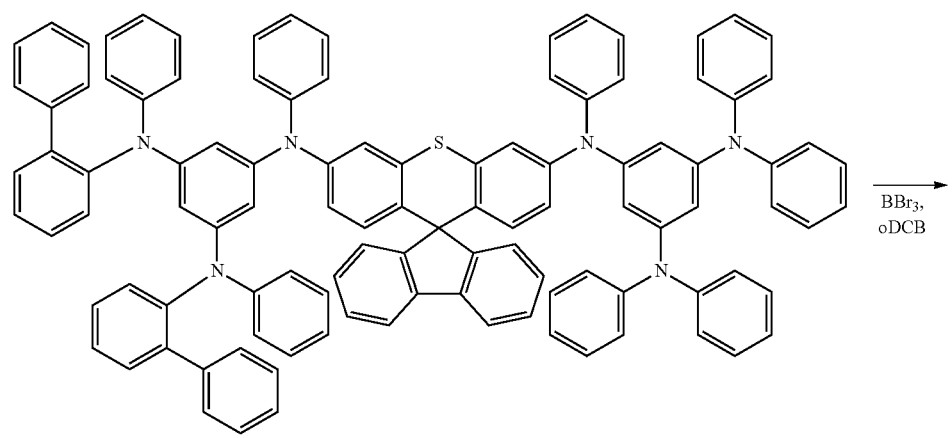
16-2
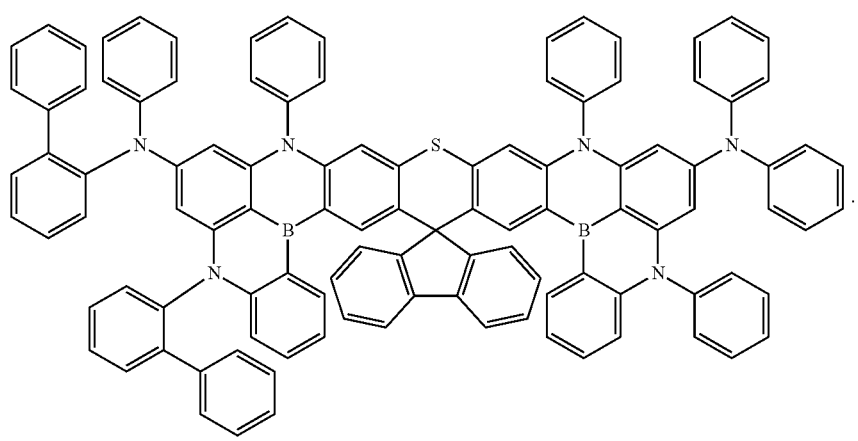
16

Synthesis of Intermediate 16-1

3',6'-dibromospiro[fluorene-9,9'-thioxanthene] (1 eq), (N1,N3-di([1,1'-biphenyl]-2-yl)-N1,N3-diphenyl-5-(phenyl-12-azanyl)benzene-1,3-diamine) (1 eq), CuI (0.2 eq), K2CO3 (3 eq), and picolinic acid (0.4 eq) were dissolved in DMF and then stirred at about 160° C. for about 20 hours. After cooling, the resultant mixture was dried under reduced pressure and the DMF was removed. Then, the resulting product was washed with ethyl acetate and water to obtain organic layers. The obtained organic layers were dried over MgSO4, and then dried under reduced pressure. The resulting product was purified and recrystallized by column chromatography (dichloromethane:n-hexane) to obtain Intermediate 16-1. (yield: 52%)

Synthesis of Intermediate 16-2

N1,N3-di([1,1'-biphenyl]-2-yl)-N5-(3'-bromospiro[fluorene-9,9'-thioxanthen]-6'-yl)-N1,N3,N5-triphenylbenzene-1,3,5-triamine (1 eq), N1,N1,N3,N3,N5-pentaphenylbenzene-1,3,5-triamine (1 eq), tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO4, and then dried under reduced pressure. The resulting product was purified and recrystallized by column chromatography (dichloromethane:n-hexane) to obtain Intermediate 16-2. (yield: 70%)

Synthesis of Compound 16

Compound 16 was obtained in substantially the same manner as the synthesis of Compound 1 except that Intermediate 16-2 was used. (post sublimation yield: 2.7%)

(8) Synthesis of Compound 24

Compound 24 according to an example may be synthesized by, for example, the steps shown in Reaction Formula 8 below:

Reaction Scheme 8

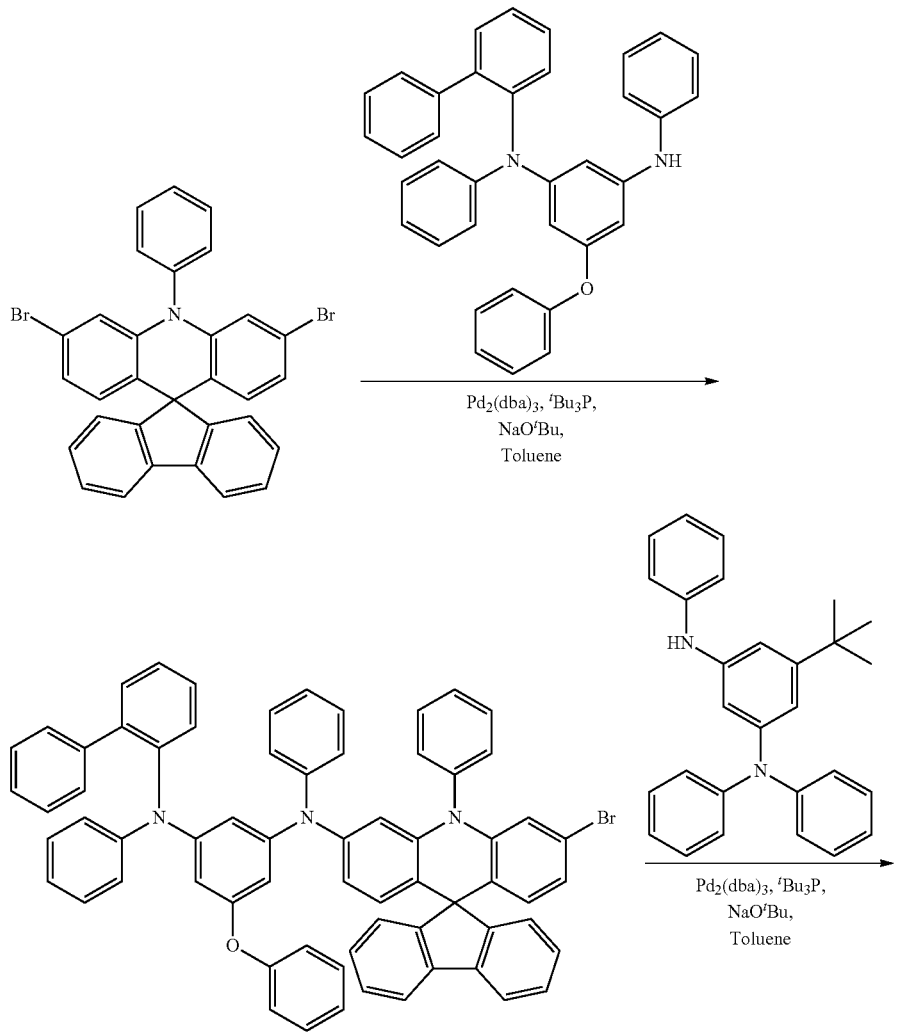

24-1

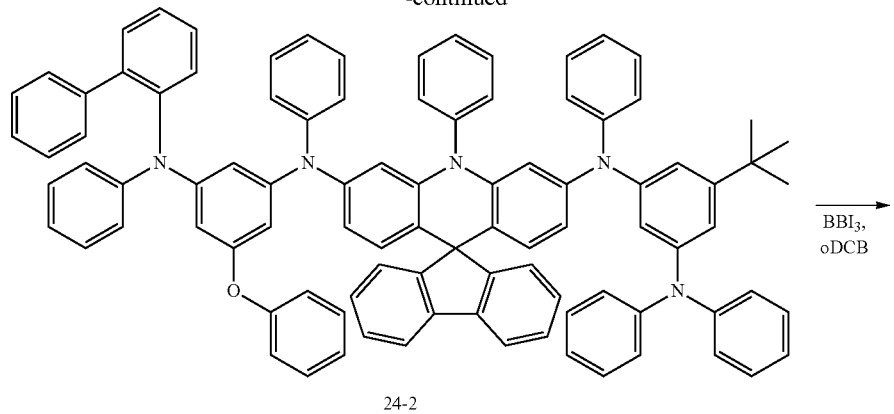

24-2

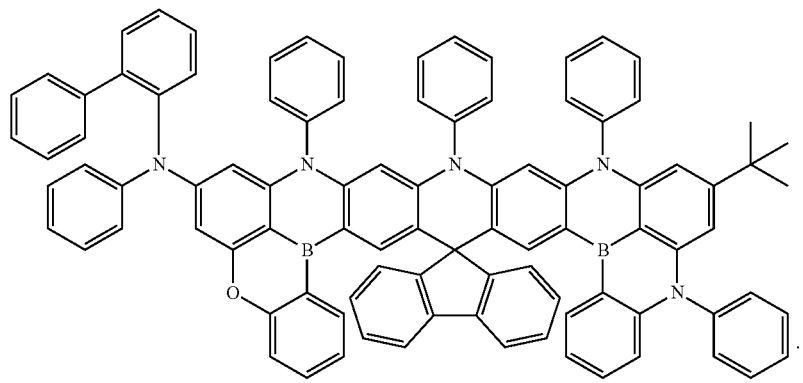

24

Synthesis of Intermediate 24-1

3,6-dibromo-10-phenyl-10H-spiro[acridine-9,9'-fluorene] (1 eq), N1-([1,1'-biphenyl]-2-yl)-5-phenoxy-N1,N3-diphenylbenzene-1,3-diamine (1 eq), tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO$_4$, and then dried under reduced pressure. The resulting product was purified and recrystallized by column chromatography (dichloromethane:n-hexane) to obtain Intermediate 16-2. (yield: 65%)

Synthesis of Intermediate 24-2

N1-([1,1'-biphenyl]-2-yl)-N3-(3-bromo-10-phenyl-10H-spiro[acridine-9,9'-fluoren]-6-yl)-5-phenoxy-N1,N3-diphenylbenzene-1,3-diamine (1 eq), 5-(tert-butyl)-N1,N1,N3-triphenylbenzene-1,3-diamine (1 eq), tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO$_4$, and then dried under reduced pressure. The resulting product was purified by column chromatography (dichloromethane:n-hexane) to obtain Intermediate 16-2. (yield: 55%)

Synthesis of Compound 24

Intermediate 24-2 (1 eq) was dissolved in ortho dichlorobenezene, and a flask was cooled to about 0° C. in a nitrogen atmosphere, and then BBr$_3$ (4 eq) was slowly injected thereto. After the dropwise addition of BBr$_3$ was completed, the temperature was elevated to about 150° C., and the mixture was stirred for about 6 hours. After cooling to 0° C., triethylamine was slowly dropped to the flask until heating stopped to quench the reaction, and then hexane was added to the flask and solids were extracted. The extracted solids were obtained by filtration. The obtained solids were purified with a silica filter, and then purified again through recrystallization in MC/Hex to obtain Compound 24. Then, the resulting product was finally purified by sublimation purification. (post sublimation yield: 1.1%)

(9) Synthesis of Compound 37

Compound 37 according to an example may be synthesized by, for example, the steps shown in Reaction Scheme 9 below:

Reaction Scheme 9
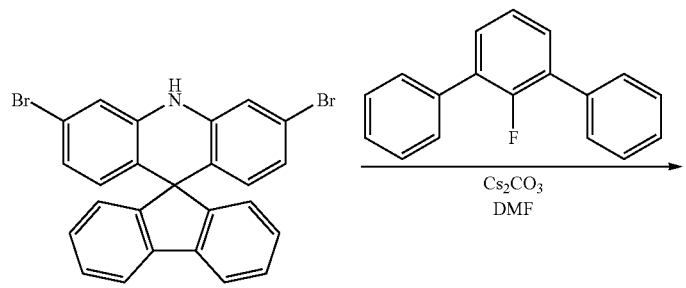
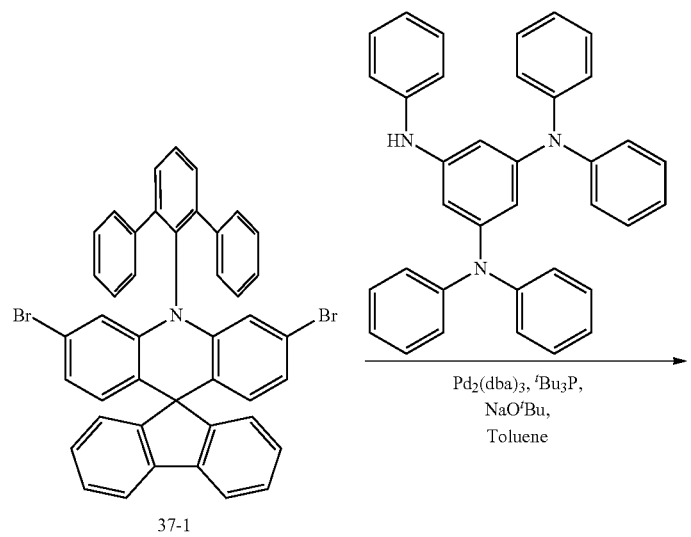
37-1
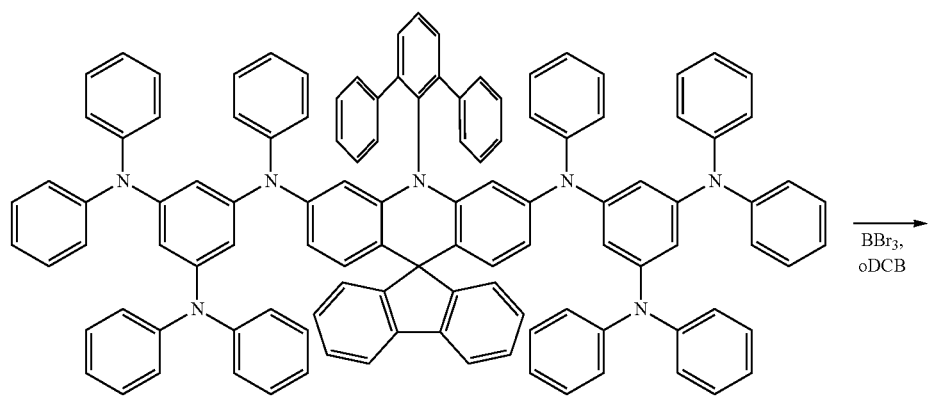
37-2

-continued

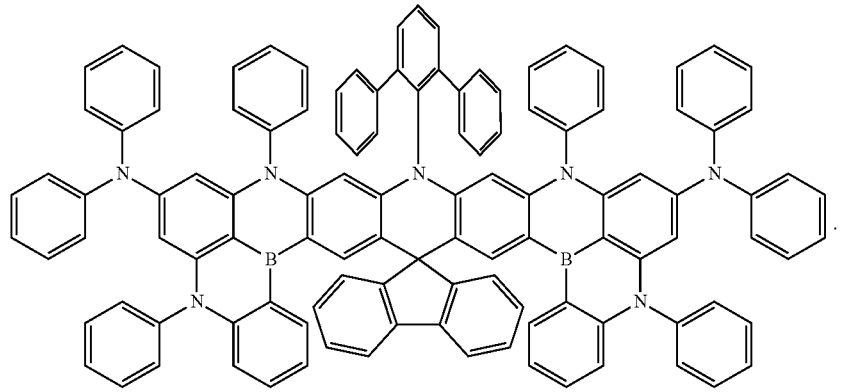

37

Synthesis of Intermediate 37-1

3,6-dibromo-10H-spiro[acridine-9,9'-fluorene] (1 eq), 2'-fluoro-1,1': 3',1"-terphenyl (1.3 eq), and Cs₂CO₃ (3 eq) were dissolved in DMF and then stirred in a high pressure reactor at about 150° C. for about 20 hours. After cooling, the resultant mixture was dried under reduced pressure and the DMF was removed. Then, the resulting product was washed three times with ethyl acetate and water to obtain organic layers. The obtained organic layers were dried over MgSO₄, and then dried under reduced pressure. The resulting product was purified by column chromatography (dichloromethane:n-hexane) to obtain Intermediate 37-1. (yield: 42%)

Synthesis of Intermediate 37-2

10-([1,1': 3',1"-terphenyl]-2'-yl)-3,6-dibromo-10H-spiro[acridine-9,9'-fluorene] (1 eq), N1,N1,N3,N3,N5-pentaphenylbenzene-1,3,5-triamine (2.1 eq), Tris(dibenzylideneacetone)dipalladium(0) (0.05 eq), tri-tert-butylphosphine (0.1 eq), and sodium tert-butoxide (3 eq) were dissolved in toluene and then stirred in a nitrogen atmosphere at about 110° C. for about 20 hours. After cooling, the resultant mixture was dried under reduced pressure and the toluene was removed. Then, the resulting product was washed three times with ethyl acetate and water to obtain organic layers. The obtained organic layers were dried over MgSO₄, and then dried under reduced pressure. The resulting product was purified and recrystallized by column chromatography (dichloromethane:n-hexane) to obtain Intermediate 37-2. (yield: 61%)

Synthesis of Compound 37

Compound 37 was obtained in substantially the same manner as the synthesis of Compound 1 except that Intermediate 37-2 was used. (post sublimation yield: 1.4%)

(10) Synthesis of Compound 56

Compound 56 according to an example may be synthesized by, for example, the steps shown in Reaction Scheme 10 below:

Reaction Scheme 10

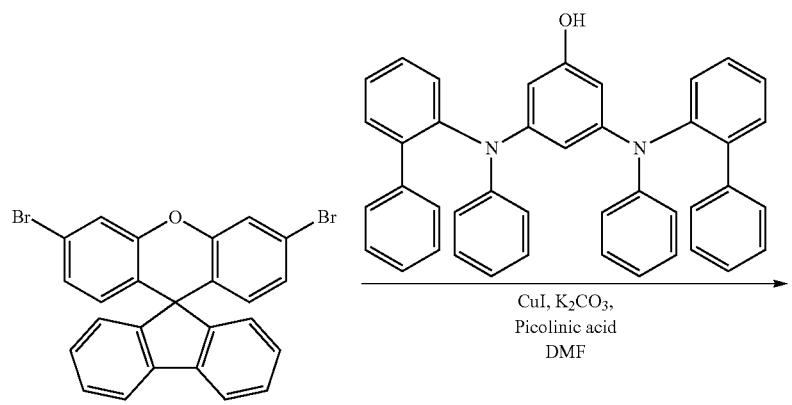

-continued
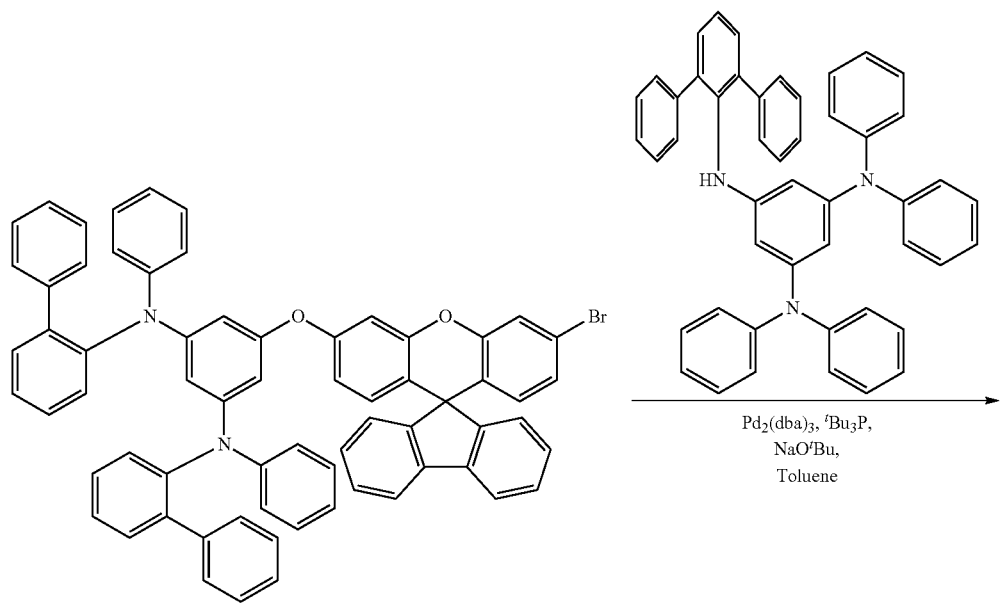
56-1
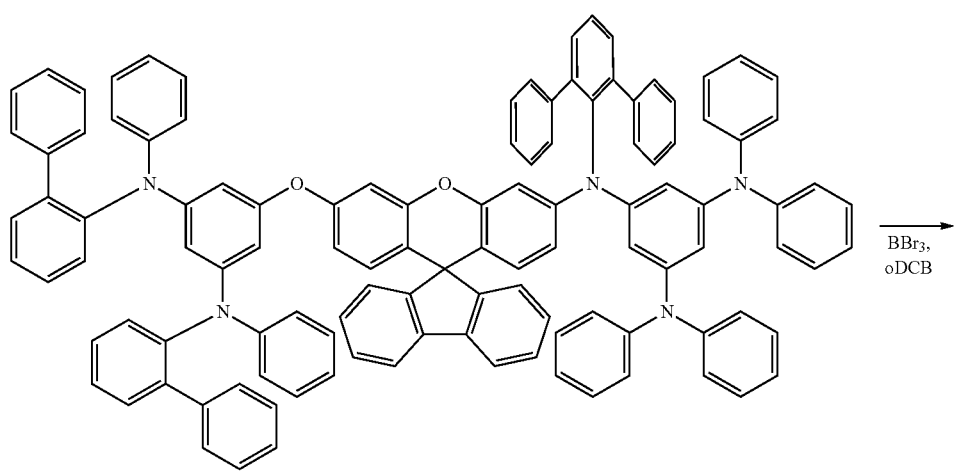
56-2
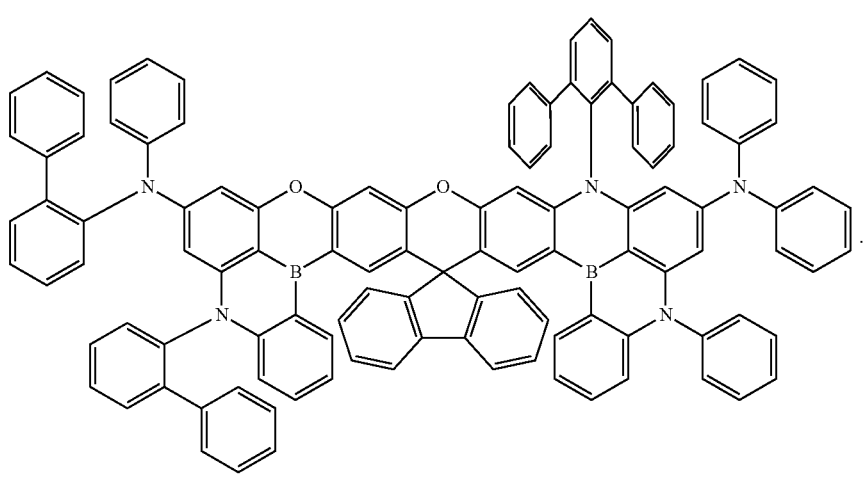
56

Synthesis of Intermediate 56-1

3',6'-dibromospiro[fluorene-9,9'-xanthene] (1 eq), 3,5-bis([1,1'-biphenyl]-2-yl(phenyl)amino)phenol (1 eq), CuI (0.2 eq), $K_2CO_3$ (3 eq), and picolinic acid (0.4 eq) were dissolved in DMF and then stirred at about 160° C. for about 20 hours. After cooling, the resultant mixture was dried under reduced pressure and the DMF was removed. Then, the resulting product was washed with ethyl acetate and water to obtain organic layers. The obtained organic layers were dried over $MgSO_4$, and then dried under reduced pressure. The resulting product was purified and recrystallized by column chromatography (dichloromethane:n-hexane) to obtain Intermediate 53-1. (yield: 59%)

Synthesis of Intermediate 56-2

N1,N3-di([1,1'-biphenyl]-2-yl)-5-((3'-bromospiro[fluorene-9,9'-xanthen]-6'-yl)oxy)-N1,N3-diphenylbenzene-1,3-diamine (1 eq), N1-([1,1':3',1''-terphenyl]-2'-yl)-N3,N3,N5,N5-tetraphenylbenzene-1,3,5-triamine (1.2 eq), tris(dibenzylideneacetone)dipalladium(0) (0.05 eq), tri-tert-butylphosphine (0.1 eq), and sodium tert-butoxide (3 eq) were dissolved in xylene and then stirred in a high pressure reactor at about 150° C. for about 20 hours. After cooling, the resultant mixture was dried under reduced pressure and the xylene was removed. Then, the resulting product was washed three times with ethyl acetate and water to obtain organic layers. The obtained organic layers were dried over $MgSO_4$, and then dried under reduced pressure. The resulting product was purified and recrystallized by column chromatography (dichloromethane:n-hexane) to obtain Intermediate 56-2. (yield: 36%)

Synthesis of Compound 56

Compound 56 was obtained in substantially the same manner as the synthesis of Compound 1 except that Intermediate 56-2 was used. (post sublimation yield: 1.2%)

The molecular weight and NMR analysis results of Compounds 1, 2, 3, 7, 8, 9, 16, 24, 37, and 56 as synthesized above are shown in Table 1 below.

TABLE 1

| Compound | H NMR (δ) | Calc | Found |
|---|---|---|---|
| 1 | 8.93 (2H, d), 8.71 (2H, s), 7.90 (2H, d), 7.62-7.56 (10H, m), 7.55-7.12 (31H, m), 7.12-6.90 (18H, m), 6.84 (2H, d), 5.75 (2H, d) | 1426.35 | 1426.50 |
| 2 | 8.89 (1H, d), 8.73 (1H, d), 8.61 (1H, s), 8.51 (1H, S), 7.88 (2H, d), 7.59-7.05 (28H, m), 7.01-6.60 (26H, d), 6.42 (1H, s), 5.91 (1H, s) 5.65 (2H, d) | 1351.24 | 1351.31 |
| 3 | 8.86 (1H, d), 8.74 (1H, d), 8.61 (1H, S) 8.55 (1H, s), 7.79 (2H, d), 7.61-7.15 (28H, m), 7.11-6.72 (26H, m), 6.23 (1H, s), 5.82 (1H, s) 5.73 (2H, d) | 1351.24 | 1351.42 |
| 7 | 8.79 (2H, d), 8.65 (2H, s), 7.85 (2H, d), 7.59-7.10 (29H, m), 7.05-6.72 (25H, m), 6.73 (2H, d), 5.54 (2H, m) | 1351.24 | 1351.35 |
| 8 | 8.92 (1H, d), 8.77 (1H, d), 8.61 (1H, s), 8.57 (1H, S) 7.76 (2H, d), 7.62-7.18 (27H, m), 7.12-6.70 (22H, m), 6.25 (1H, s), 5.74 (1H, s) 5.57 (2H, d) | 1276.13 | 1276.26 |
| 9 | 8.85 (1H, d), 8.76 (1H, d), 8.60 (1H, s), 8.53 (1H, s), 7.85 (2H, d), 7.72-7.28 (24H, m), 7.16-6.75 (25H, m), 6.37 (1H, s), 5.87 (1H, s) 5.61 (2H, d) | 1276.13 | 1276.30 |
| 16 | 8.95 (1H, d), 8.87 (1H, d), 8.50 (1H, s), 8.45 (1H, s), 7.96 (2H, d), 7.65-7.18 (32H, m), 7.15-6.85 (30H, m), 6.45 (1H, s), 5.97 (1H, s) 5.71 (2H, m) | 1519.50 | 1519.72 |
| 24 | 8.85 (1H, d), 8.77 (1H, d), 8.45 (1H, s), 8.37 (1H, s), 7.83 (2H, d), 7.77-7.26 (26H, m), 7.17-6.75 (22H, m), 6.21 (1H, s), 5.86 (1H, s) 5.61 (2H, m), 1.43 (s, 9H) | 1316.24 | 1316.53 |

TABLE 1-continued

| Compound | H NMR (δ) | Calc | Found |
|---|---|---|---|
| 37 | 8.86 (2H, d), 8.68 (2H, s), 7.78 (2H, d), 7.52- 7.16 (31H, m), 7.05-6.62 (36H, m), 6.44 (2H, d), 5.85 (2H, d) | 1578.55 | 1578.76 |
| 56 | 8.87 (1H, d), 8.74 (1H, d), 8.59 (1H, s), 8.47 (1H, s), 7.91 (2H, d), 7.64-7.26 (35H, m), 7.11-6.65 (30H, m), 6.15 (1H, s), 5.76 (1H, s) 5.41 (2H, m) | 1580.52 | 1580.84 |

2. Manufacture of Light Emitting Device

An ITO glass substrate of about 15 $\Omega/cm^2$ (about 1,200 Å) made by Corning Co. was cut to a size of 50 mm×50 mm×0.7 mm, cleansed by ultrasonic waves using isopropyl alcohol and pure water for about 5 minutes, and then irradiated with ultraviolet rays for about 30 minutes and exposed to ozone and cleansed. The glass substrate was then installed on a vacuum deposition apparatus.

NPB was deposited in vacuum on the upper portion of the ITO anode formed on the glass substrate to form a 300 Å-thick hole injection layer, and then TCTA was deposited in vacuum on the upper portion of the hole injection layer to form a 200 Å-thick hole transport layer.

CzSi as a hole transport compound was deposited in vacuum on the upper portion of the hole transport layer to form a 100 Å-thick emission-auxiliary layer.

Next, when an emission layer was formed, mCP was used as a host material, and a condensed polycyclic compound of an example or Comparative Example Compound was used as a dopant material. The host and the dopant were co-deposited at a weight ratio of about 99:1 to form a 200 Å-thick emission layer. That is, the emission layer formed by co-depositing was deposited by mixing mCBP with each of Example Compounds 1, 2, 3, 7, 8, 9, 16, 24, 37, and 56 in Examples 1 to 10, respectively, and was deposited by mixing an mCP with each of Comparative Example Compounds C1 to C4 in Comparative Examples 1 to 4, respectively.

Thereafter, TSPO1 was deposited on the upper portion of the emission layer to form a 200 Å-thick electron transport layer, and then TPBi as a buffer electron transport compound was deposited on the upper portion of the electron transport layer to form a 300 Å-thick buffer layer.

LiF as a halogenated alkali metal was deposited on the upper portion of the buffer layer to form a 10 Å-thick electron injection layer, and Al was deposited in vacuum to form a 3000 Å-thick LiF/Al electrode, thereby manufacturing a light emitting device.

Some of the materials used in the above-described light emitting device may be represented by the formulae below:

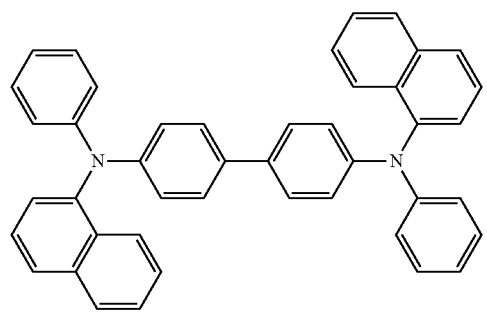

NPB

-continued
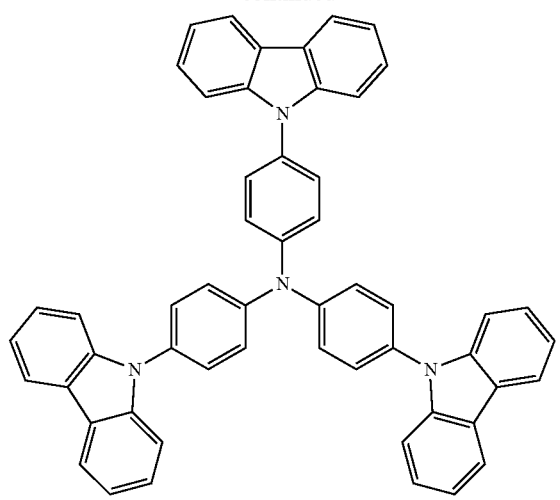
TCTA
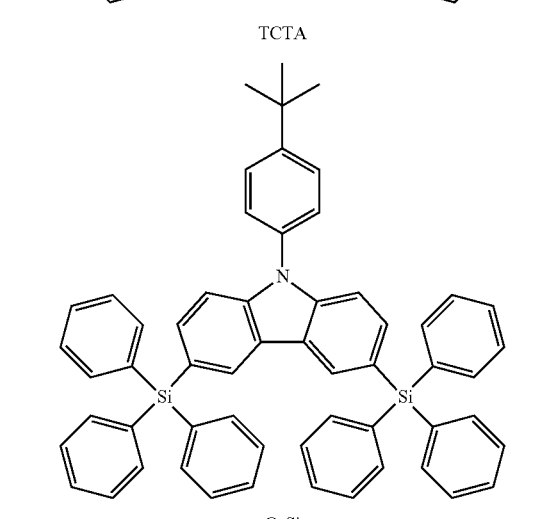
CzSi
-continued
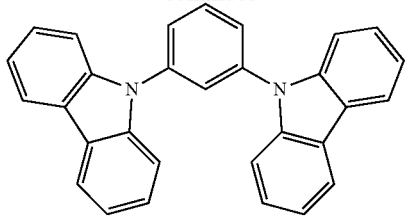
mCP
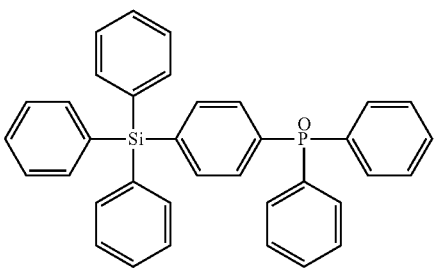
TSPO1
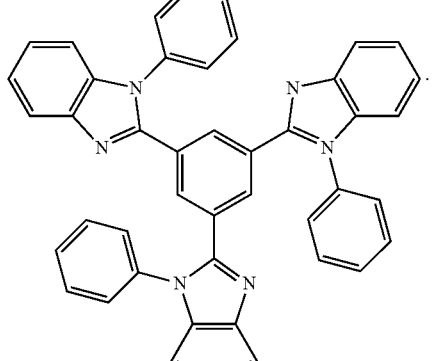
TPBI
The compounds used in Examples 1 to 10 and Comparative Examples 1 to 4 are listed in Table 2.
TABLE 2
| Compound 1 | 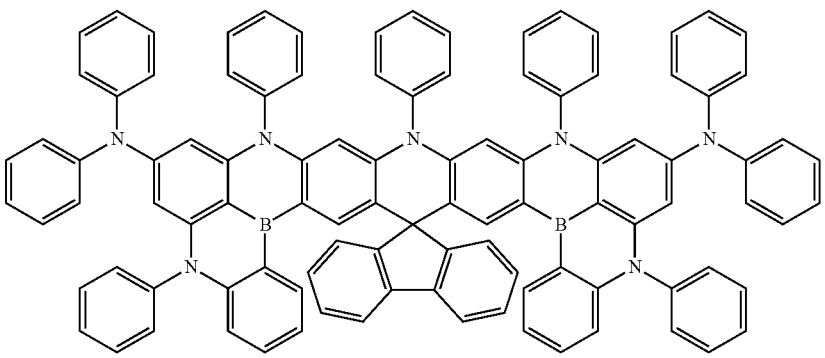 |
| --- | --- |

TABLE 2-continued
Compound 2
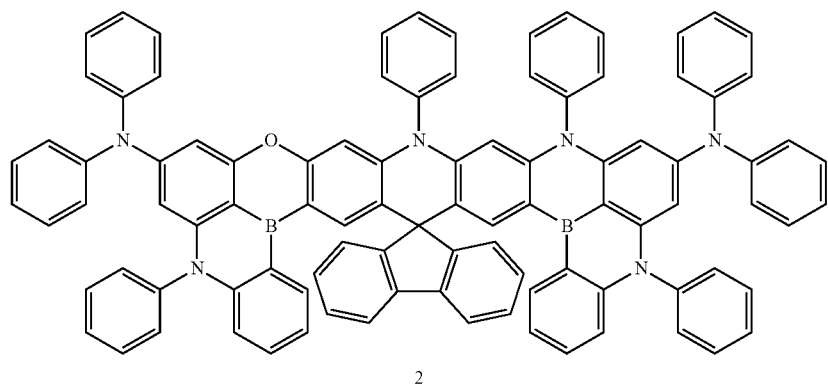 [SMILES: c1ccc(N(c2ccccc2)c2cc3c4c(c2)N(c2ccccc2)c2ccccc2B4c2cc4c(cc2O3)N(c2ccccc2)c2cc3c(cc2C42c4ccccc4-c4ccccc42)B2c4ccccc4N(c4ccccc4)c4cc(N(c5ccccc5)c5ccccc5)cc(c42)N3c2ccccc2)cc1]
2
Compound 3
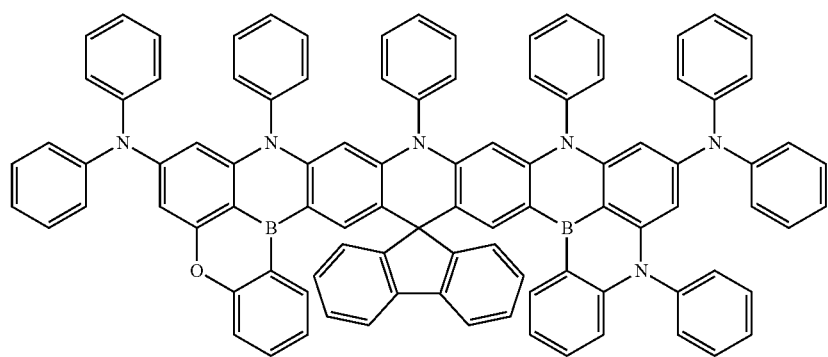
3
Compound 7
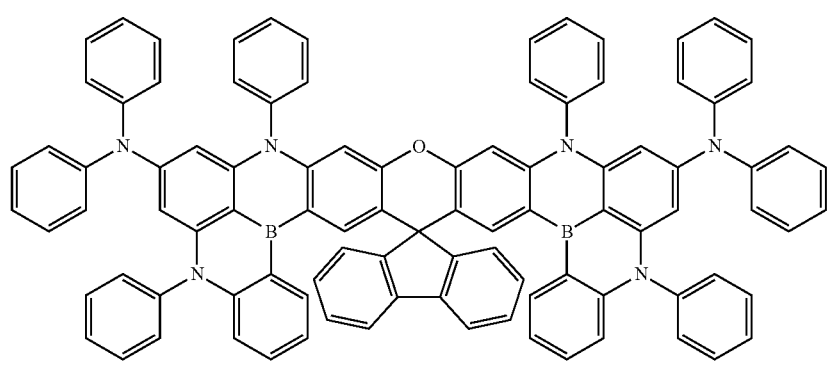
7
Compound 8
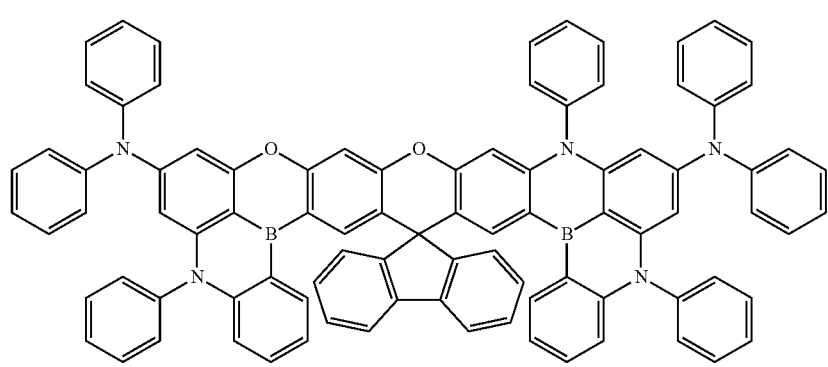
8

TABLE 2-continued
Compound 9
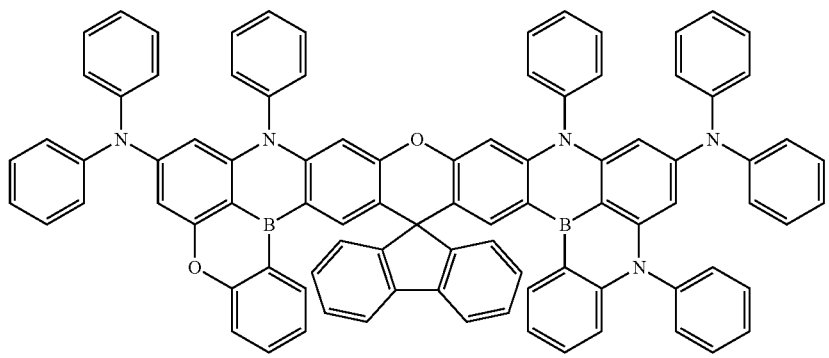
9
Compound 16
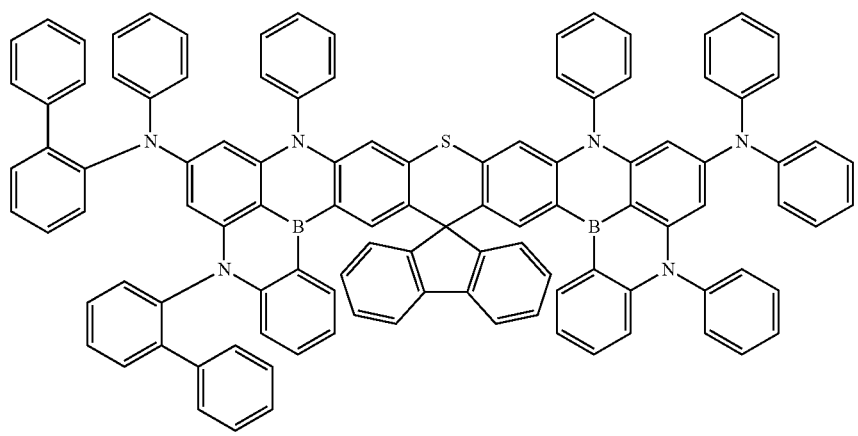
16
Compound 24
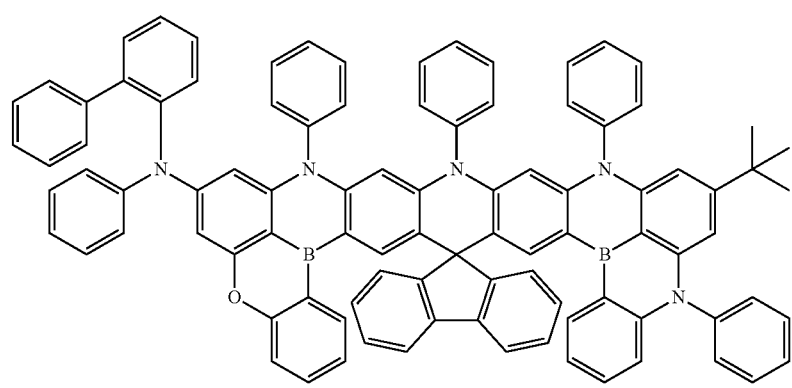
24

TABLE 2-continued
Compound 37
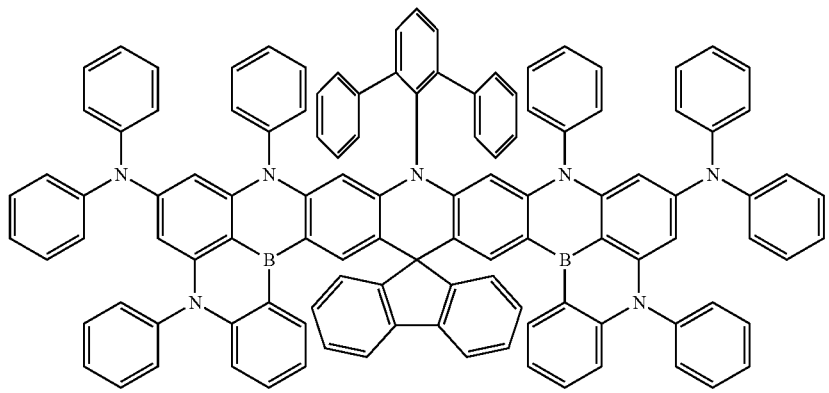
37
Compound 56
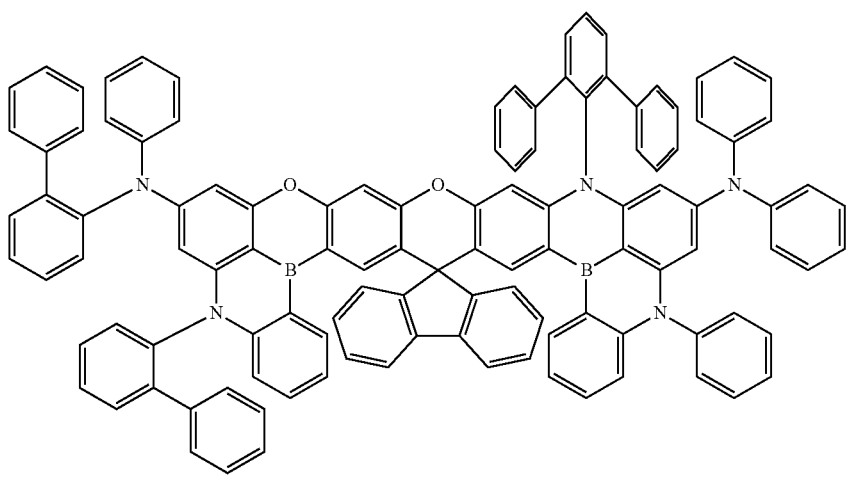
56
Comparative Example Compound C1
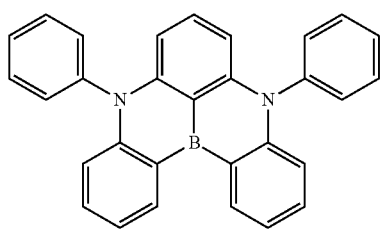
C1
Comparative Example Compound C2
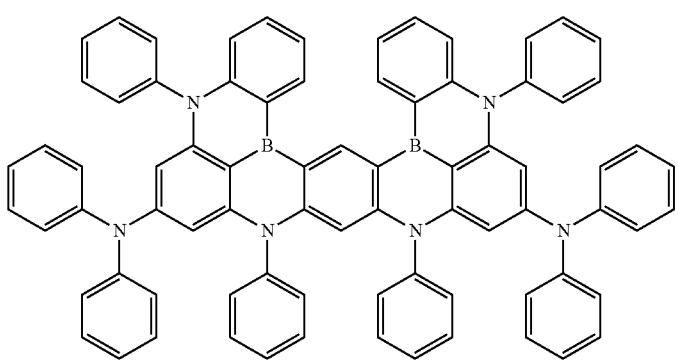
C2

TABLE 2-continued

| | |
|---|---|
| Comparative Example Compound C3 | 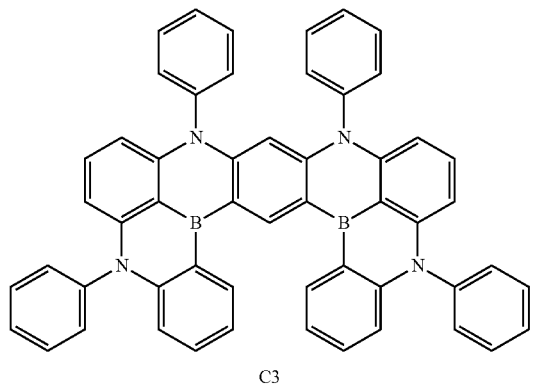<br>C3 |
| Comparative Example Compound C4 | 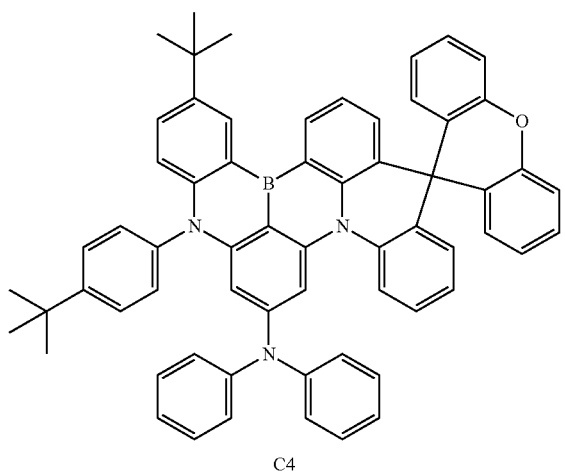<br>C4 |

3. Evaluation of Energy Level of Compounds

Table 3 shows a lowest triplet excitation energy level (hereinafter, $T_1$ energy level), a lowest singlet excitation energy level (hereinafter, $S_1$ energy level), and an energy difference between $S_1$ and $T_1$ ($S_1$-$T_1$, hereinafter, $\Delta E_{ST}$) with respect to the compounds of Examples 1 to 10 and Comparative Examples 1 to 4 below:

TABLE 3

| Division | Dopant Material | $T_1$ energy level | $S_1$ energy level | $\Delta E_{ST}$ |
|---|---|---|---|---|
| Example 1 | Example Compound 1 | 2.63 | 2.77 | 0.14 |
| Example 2 | Example Compound 2 | 2.66 | 2.79 | 0.13 |
| Example 3 | Example Compound 3 | 2.65 | 2.80 | 0.15 |
| Example 4 | Example Compound 7 | 2.65 | 2.80 | 0.15 |
| Example 5 | Example Compound 8 | 2.64 | 2.79 | 0.15 |
| Example 6 | Example Compound 9 | 2.61 | 2.78 | 0.15 |
| Example 7 | Example Compound 16 | 2.66 | 2.79 | 0.13 |
| Example 8 | Example Compound 24 | 2.64 | 2.78 | 0.14 |
| Example 9 | Example Compound 37 | 2.67 | 2.83 | 0.15 |
| Example 10 | Example Compound 56 | 2.69 | 2.82 | 0.13 |

TABLE 3-continued

| Division | Dopant Material | $T_1$ energy level | $S_1$ energy level | $\Delta E_{ST}$ |
|---|---|---|---|---|
| Comparative Example 1 | Comparative Example Compound C1 | 2.59 | 2.74 | 0.15 |
| Comparative Example 2 | Comparative Example Compound C2 | 2.52 | 2.66 | 0.14 |
| Comparative Example 3 | Comparative Example Compound C3 | 2.51 | 2.65 | 0.14 |
| Comparative Example 4 | Comparative Example Compound C4 | 2.57 | 2.74 | 0.17 |

Referring to the results of Table 3, $T_1$ energy levels of the compounds of Examples 1 to 10 are 2.60 eV or more, and $T_1$ energy levels of the compounds of Comparative Examples 1 to 4 are 2.59 eV or less. Therefore, the compounds of Examples 1 to 10 have higher $T_1$ levels than those of the compounds of Comparative Examples 1 to 4.

$S_1$ energy levels of the compounds of Examples 1 to 10 are 2.77 eV or more, and $S_1$ energy levels of the compounds of Comparative Examples 1 to 4 are 2.74 eV or less. Therefore, the compounds of Examples 1 to 10 have higher $S_1$ levels than those of the compounds of Comparative Examples 1 to 4.

The compounds of Examples 1 to 10 have a $\Delta E_{ST}$ average value of 0.142 eV, and the compounds of Comparative Examples 1 to 4 have a $\Delta E_{ST}$ average value of 0.15 eV.

Although the present disclosure is not limited by any particular mechanism or theory, it is believed that Comparative Example Compounds C1 to C3 do not include a spiro structure which can increase multiple resonance effects, and thus have lower $T_1$ energy levels and larger $\Delta E_{ST}$ values compared to embodiments of the present disclosure. Further, it is believed that Comparative Example Compound C4 includes a spiro structure, but includes only one boron atom, and thus has a lower $T_1$ energy level and a larger $\Delta E_{ST}$ value compared to embodiments of the present disclosure that includes a spiro structure and two boron atoms.

The compounds of Examples 1 to 10 include a condensed structure containing a spiro structure and two boron atoms, and thus the conjugation in the molecule (the condensed polycyclic compound) may be expanded and the multiple resonance effects may increase. Accordingly, the compounds of Examples 1 to 10 have high $T_1$ energy levels and low $\Delta E_{ST}$ average values, and may exhibit high luminous efficiencies when applied to a light emitting device.

4. Evaluation of Light Emitting Device Property

The evaluation of emission characteristics of the condensed polycyclic compounds of examples and the light emitting devices of examples including the condensed polycyclic compounds of examples in the emission layers was conducted as follows. The method for manufacturing the light emitting device for the evaluation of the device is described below.

Condensed polycyclic compounds of Example Compounds 1, 2, 3, 7, 8, 9, 16, 24, 37 and 56 were used as dopant materials of the emission layers to manufacture the light emitting devices of Examples 1 to 10, respectively.

Comparative Example Compounds C1, C2, C3, and C4 were used as dopant materials of the emission layers to manufacture the light emitting devices of Comparative Examples 1 to Comparative 4, respectively.

Evaluation results of the light emitting devices of Examples 1 to 10 and Comparative Examples 1 to 4 are listed in Table 4. Driving voltage (V), luminous efficiency (Cd/A), maximum quantum efficiency (%), and luminous color of the manufactured light emitting devices in an emission wavelength region are listed in comparison in Table 4.

Materials used for the hole transport layer in Table 4 are the same as follows.

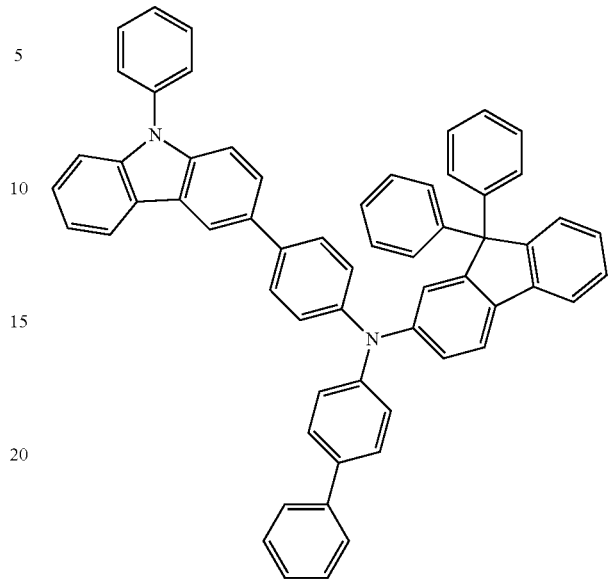

HT6

TABLE 4

| Division | Hole transport layer material | Dopant Material | Driving voltage (V) | Luminous efficiency (Cd/A) | Maximum quantum efficiency (%) | Luminous color |
|---|---|---|---|---|---|---|
| Example 1 | HT6 | Compound 1 | 4.2 | 27.2 | 23.2 | Blue |
| Example 2 | HT6 | Compound 2 | 4.5 | 26.3 | 21.8 | Blue |
| Example 3 | HT6 | Compound 3 | 4.3 | 27.5 | 22.5 | Blue |
| Example 4 | HT6 | Compound 7 | 4.3 | 25.8 | 20.7 | Blue |
| Example 5 | HT6 | Compound 8 | 4.4 | 28.2 | 23.8 | Blue |
| Example 6 | HT6 | Compound 9 | 4.3 | 27.6 | 24.1 | Blue |
| Example 7 | HT6 | Compound 16 | 4.6 | 28.7 | 24.5 | Blue |
| Example 8 | HT6 | Compound 24 | 4.7 | 26.3 | 22.4 | Blue |
| Example 9 | HT6 | Compound 37 | 4.5 | 27.2 | 23.6 | Blue |
| Example 10 | HT6 | Compound 56 | 4.4 | 27.9 | 23.9 | Blue |
| Comparative Example 1 | HT6 | Comparative Example Compound C1 | 5.2 | 15.4 | 16.2 | Blue |
| Comparative Example 2 | HT6 | Comparative Example Compound C2 | 4.6 | 24.2 | 20.3 | Blue |
| Comparative Example 3 | HT6 | Comparative Example Compound C3 | 5.3 | 17.8 | 17.4 | Blue |

Referring to the results of Table 4, it can be seen that the light emitting devices of Examples 1 to 10 have lower average values of driving voltage, higher luminous efficiencies, and higher maximum quantum efficiencies compared to the light emitting devices of Comparative Examples 1 to 3. Comparative Example Compounds C1, C2, and C3 each have a condensed polycyclic structure including a boron atom but do not include a separate spiro structure. Thus, Comparative Example Compounds C1, C2, and C3 may exhibit lower multiple resonance effects and molecular stabilizing effects compared to embodiments of the present disclosure including a spiro structure.

Compared to Example Compounds including two boron atoms, Comparative Example Compound C1 includes one boron atom, and thus may have multiple resonance effects in the molecule and stabilizing effects lower than those of embodiments of the present disclosure, and it can be seen in Table 4 that Comparative Example Compound C1 has driving voltage, luminous efficiency, and maximum quantum efficiency lower than those of embodiments of the present disclosure.

The condensed polycyclic compound included in the light emitting device of embodiments of the present disclosure includes two boron atoms, heteroatoms such as N, O, S, and Se, and a spiro structure to reduce intramolecular interaction and increase bond dissociation energy, and thereby molecular stability may be increased and device characteristics such as luminous efficiency and maximum quantum efficiency may be improved.

The light emitting device of an example may include the condensed polycyclic of an example in the emission layer to exhibit high luminous efficiency in a blue emission wavelength region.

The light emitting device according to an embodiment of the present disclosure may have low driving voltage, excellent luminous efficiency, and improved maximum quantum efficiency.

Although the subject matter of the present disclosure has been described with reference to example embodiments of the present disclosure, it will be understood that the present disclosure should not be limited to the example embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. A light emitting device comprising:
a first electrode;
a second electrode facing the first electrode; and
a plurality of organic layers between the first electrode and the second electrode,
wherein at least one organic layer selected from among the plurality of organic layers comprises a condensed polycyclic compound represented by Formula 1, and
the first electrode and the second electrode each independently comprises at least one selected from among Ag, Mg, Cu, Al, Pt, Pd, Au, Ni, Nd, Ir, Cr, Li, Ca, LiF/Ca, LiF/Al, Mo, Ti, In, Sn, Zn, Yb, W, a compound of two or more thereof, a mixture of two or more thereof, and an oxide thereof:

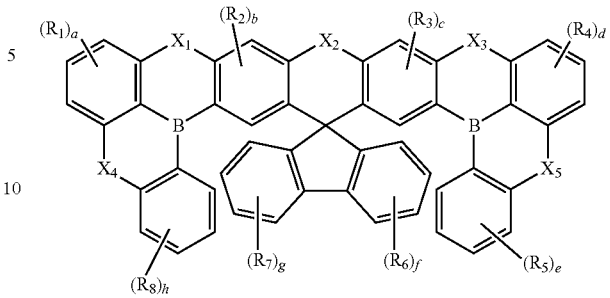

Formula 1 wherein, in Formula 1, $X_1$ to $X_5$ are each independently $NR_9$, O, S, or Se, $R_1$ to $R_9$ are each independently a hydrogen atom, a deuterium atom, a halogen atom, a cyano group, a substituted or unsubstituted silyl group, a substituted or unsubstituted alkyl group having 1 to 30 carbon atoms, a substituted or unsubstituted amine group, a substituted or unsubstituted aryl group having 6 to 30 ring-forming carbon atoms, or a substituted or unsubstituted heteroaryl group having 2 to 60 ring-forming carbon atoms, or are bonded to an adjacent group to form a ring, a is an integer of 0 to 3, b and c are each independently an integer of 0 to 2, d is an integer of 0 to 3, and e, f, g, and h are each independently an integer of 0 to 4.

2. The light emitting device of claim 1, wherein the plurality of organic layers comprise a hole transport region, an emission layer, and an electron transport region, and
the emission layer comprises the condensed polycyclic compound.

3. The light emitting device of claim 2, wherein the emission layer emits thermally activated delayed fluorescence.

4. The light emitting device of claim 2, wherein the emission layer emits light having a center wavelength of about 420 nm to about 470 nm.

5. The light emitting device of claim 2, wherein the emission layer comprises a host and a dopant, and
the dopant comprises the condensed polycyclic compound.

6. The light emitting device of claim 1, wherein the lowest triplet excitation energy level ($T_1$ energy level) of the condensed polycyclic compound is about 2.60 eV or more.

7. The light emitting device of claim 1, wherein each of $R_2$ and $R_3$ is a hydrogen atom.

8. The light emitting device of claim 1, wherein each of $R_6$ and $R_7$ is a hydrogen atom.

9. The light emitting device of claim 1, wherein each of $R_5$ and $R_8$ is a hydrogen atom.

10. The light emitting device of claim 1, wherein at least one selected from $R_1$ and $R_4$ is a substituted or unsubstituted aryl group having 6 to 30 ring-forming carbon atoms.

11. The light emitting device of claim 1, wherein at least one selected from $R_1$ and $R_4$ is a substituted or unsubstituted alkyl group having 1 to 30 carbon atoms.

12. The light emitting device of claim 1, wherein the condensed polycyclic compound represented by Formula 1 is represented by Formula 1-1a or Formula 1-1b:

Formula 1-1a

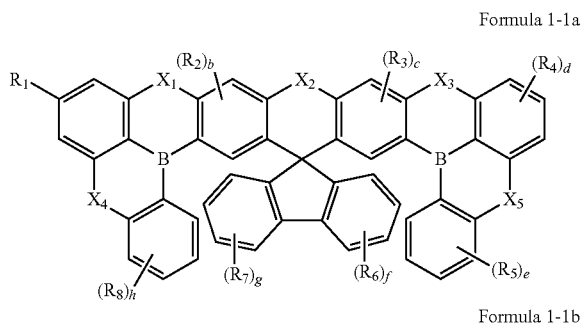

Formula 1-2b

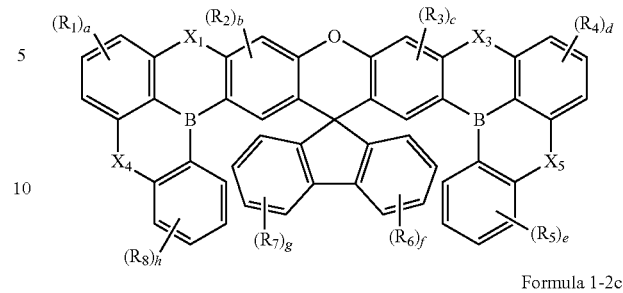

Formula 1-1b

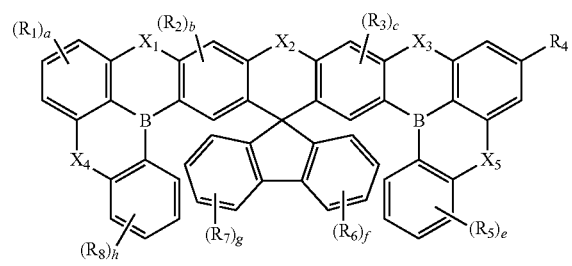

Formula 1-2c

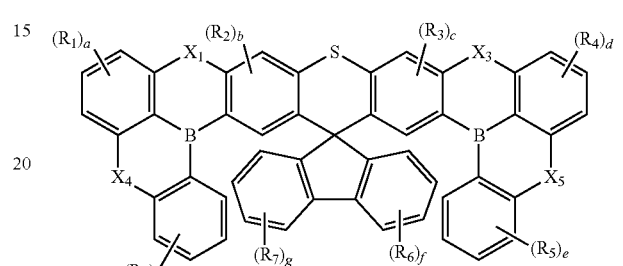

wherein, in Formula 1-1a and Formula 1-1b,
X$_1$ to X$_5$, R$_1$ to R$_8$, and a to h are the same as defined with respect to Formula 1.

13. The light emitting device of claim 1, wherein the condensed polycyclic compound represented by Formula 1 is represented by any one selected from among Formulae 1-2a to 1-2d:

Formula 1-2a

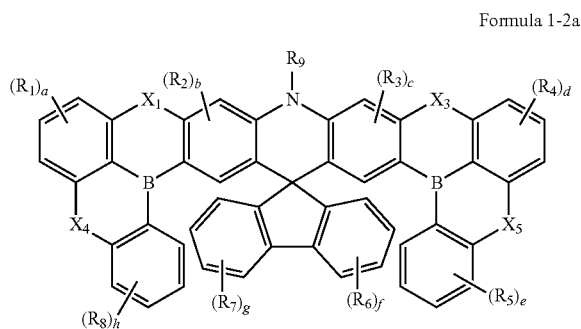

Formula 1-2d

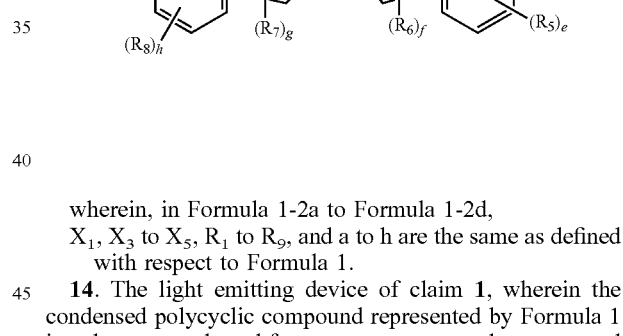

wherein, in Formula 1-2a to Formula 1-2d,
X$_1$, X$_3$ to X$_5$, R$_1$ to R$_9$, and a to h are the same as defined with respect to Formula 1.

14. The light emitting device of claim 1, wherein the condensed polycyclic compound represented by Formula 1 is at least one selected from among compounds represented by Compound Group 1:

Compound Group 1

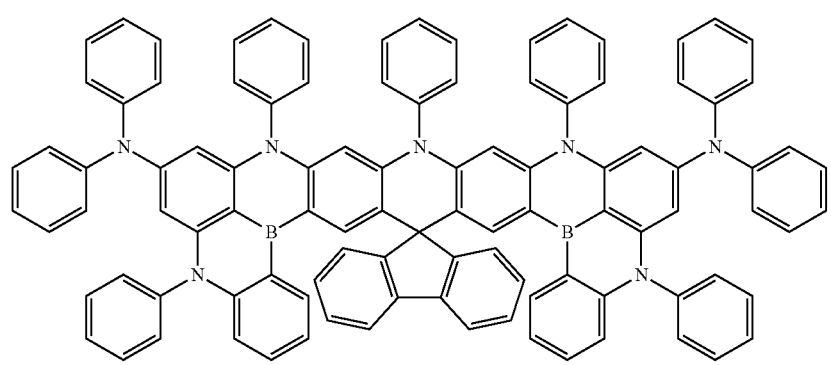

1

-continued
2
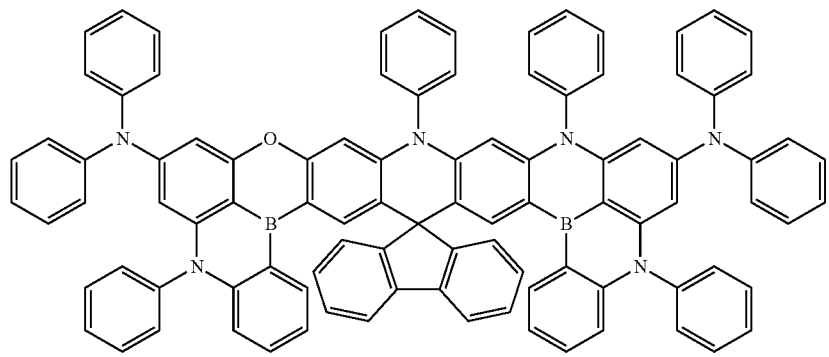
3
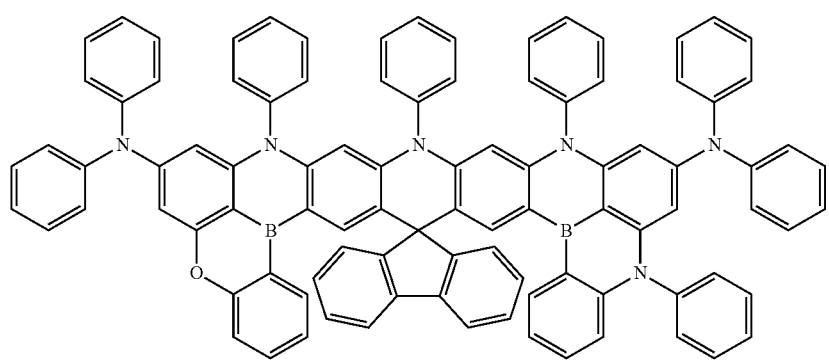
4
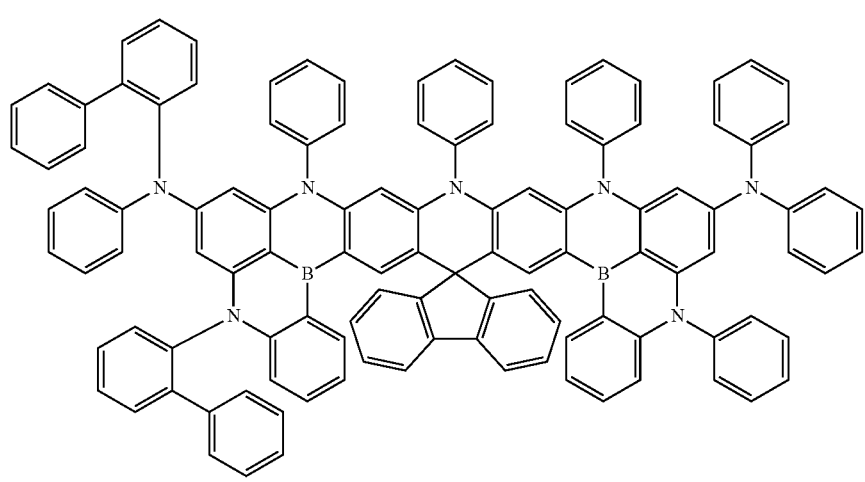
5
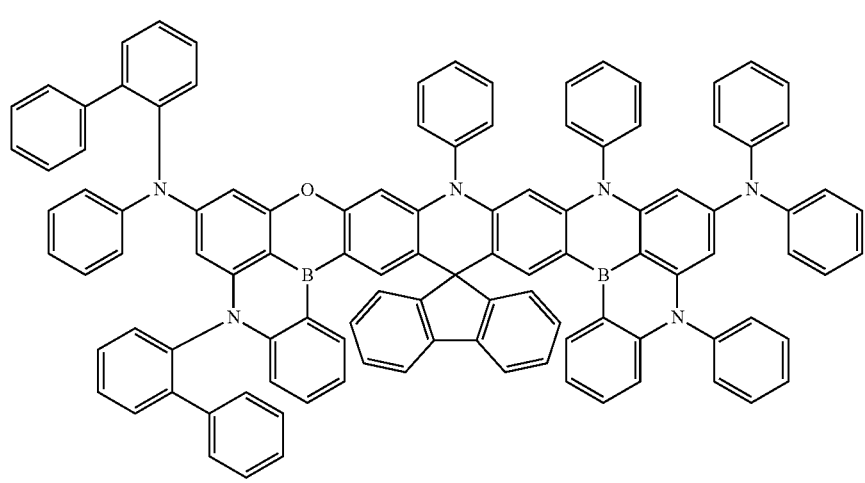

6
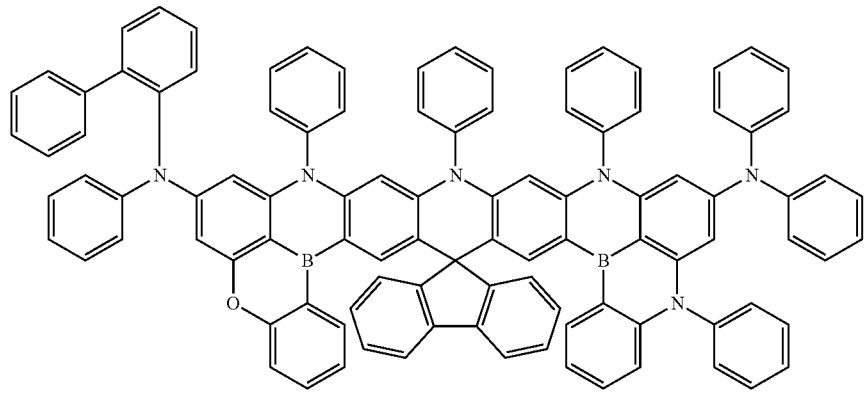
7
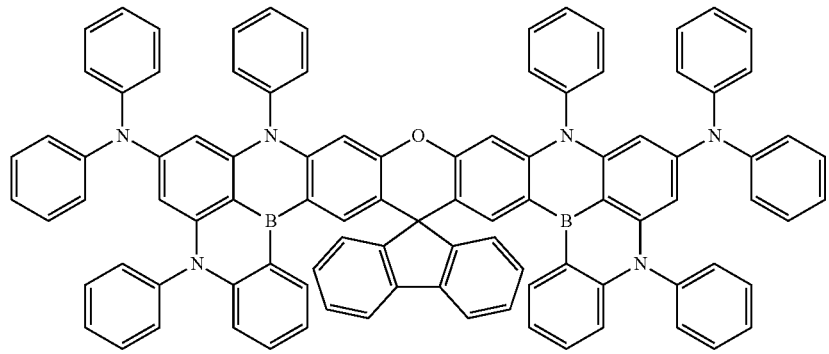
8
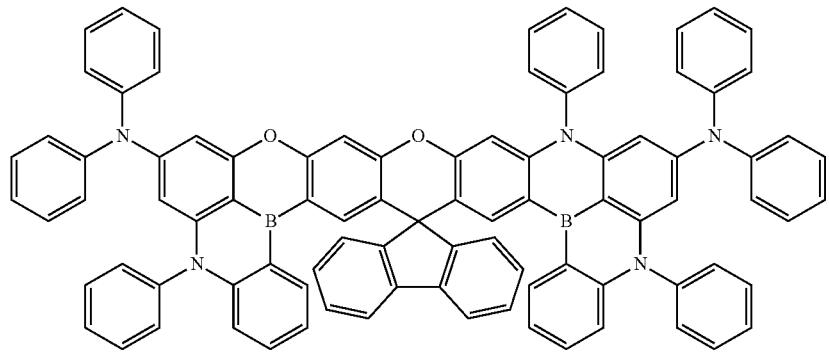
9
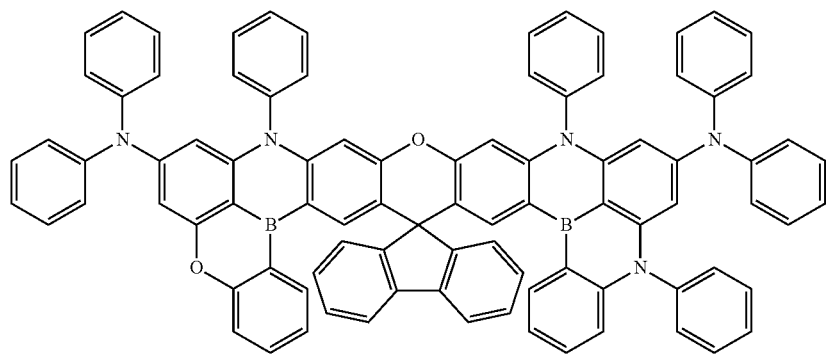

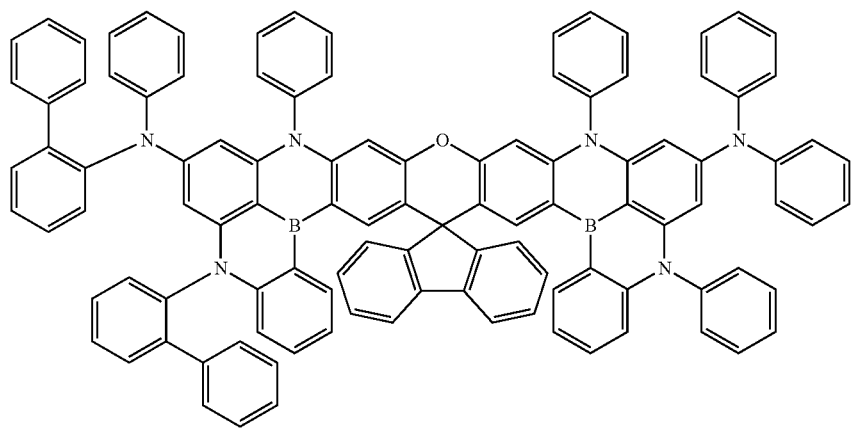
10
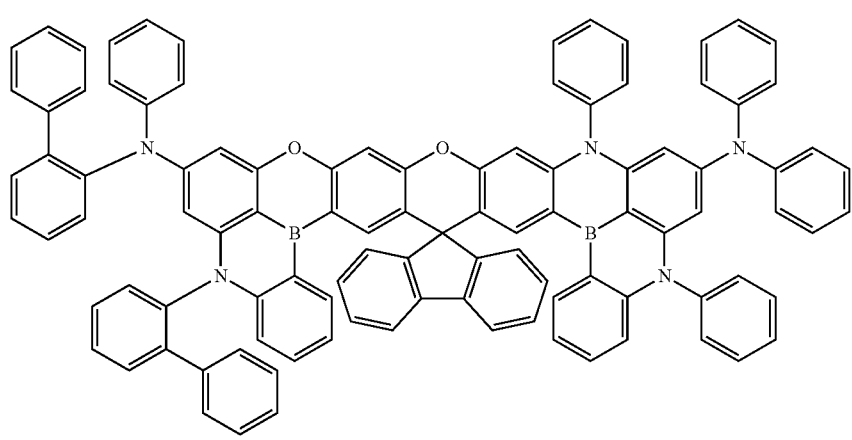
11
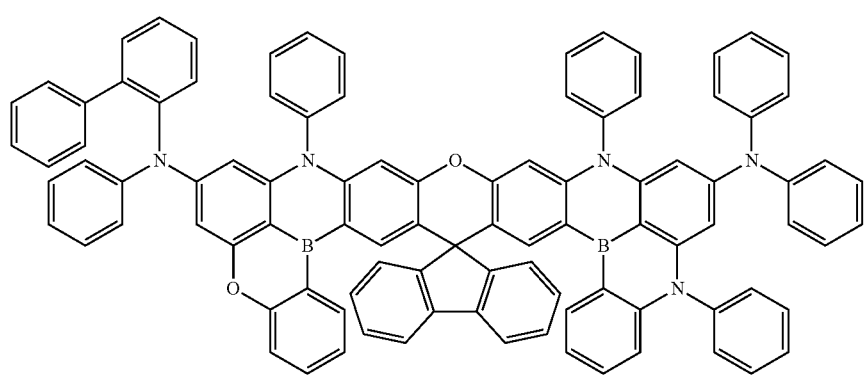
12
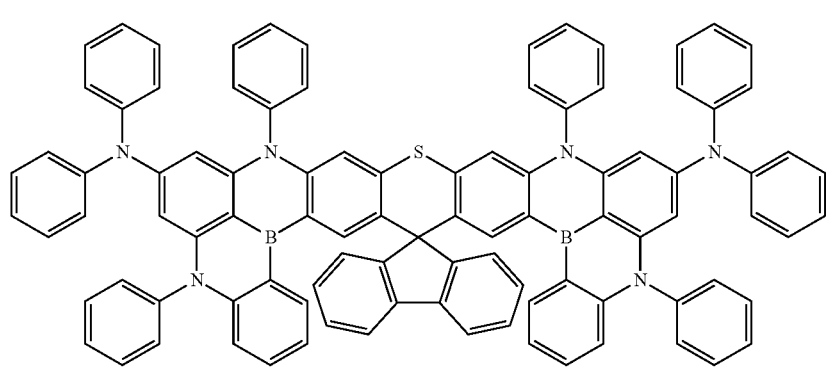
13

-continued
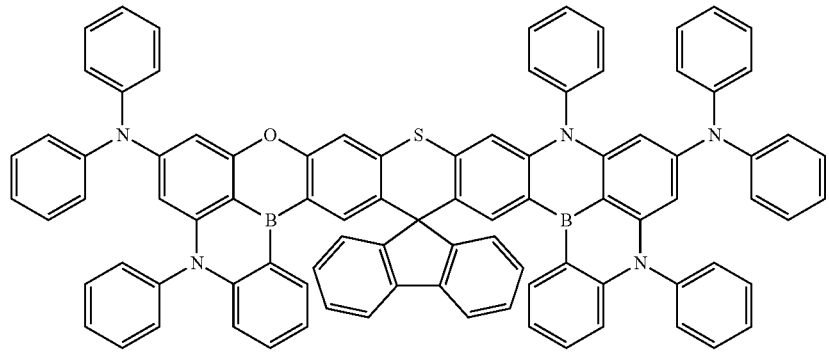
14
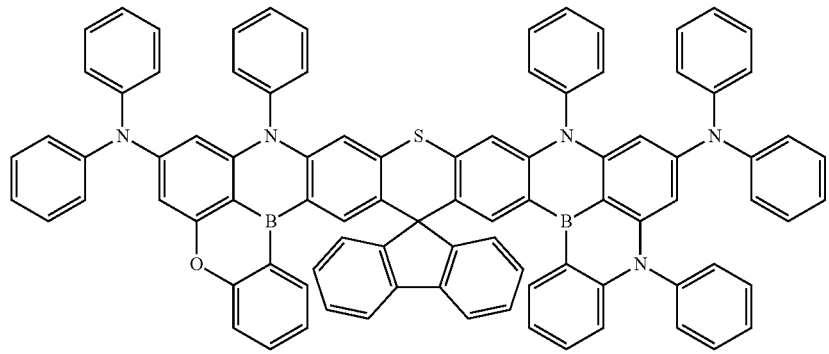
15
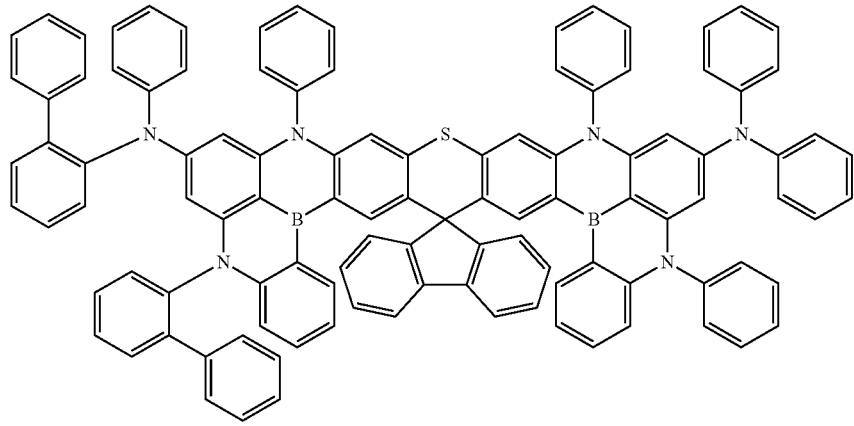
16
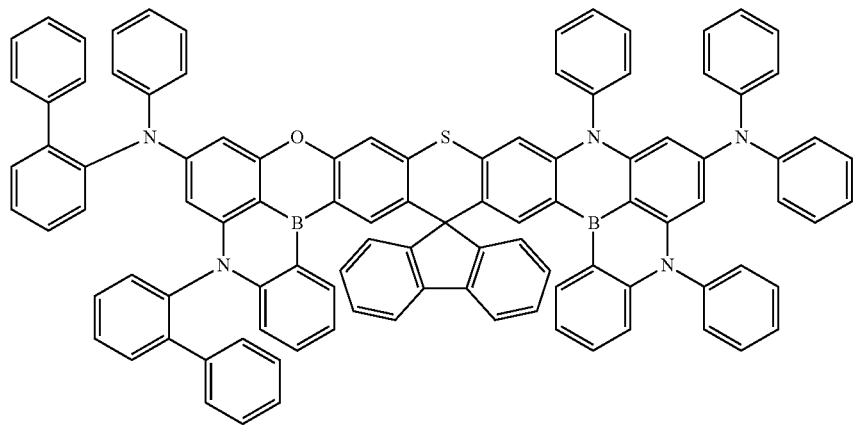
17

-continued
18
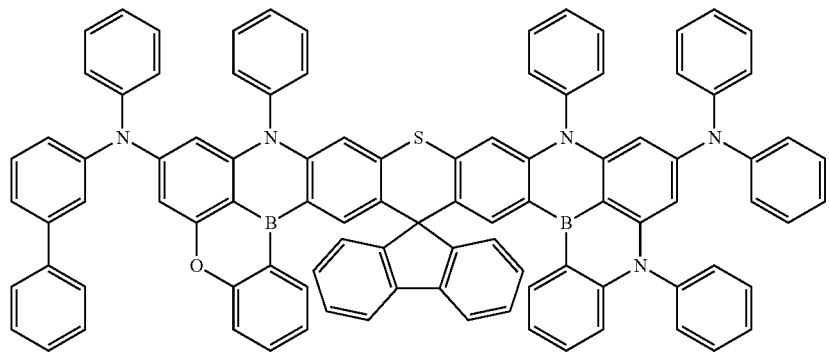
19
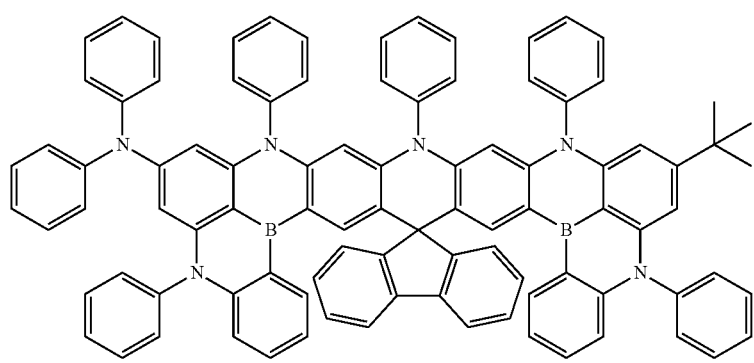
20
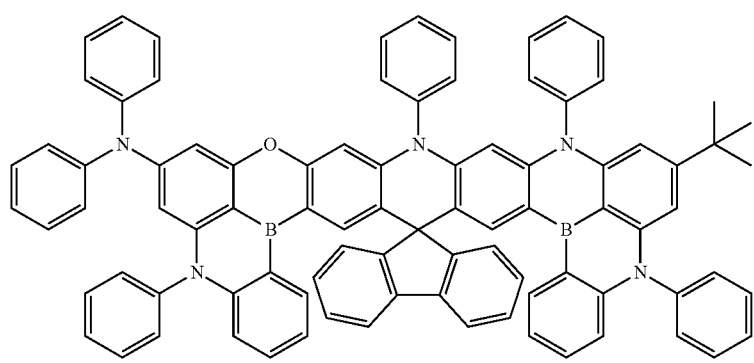
21
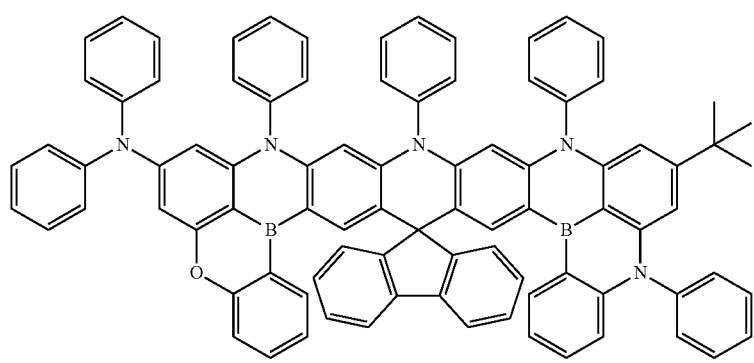

-continued
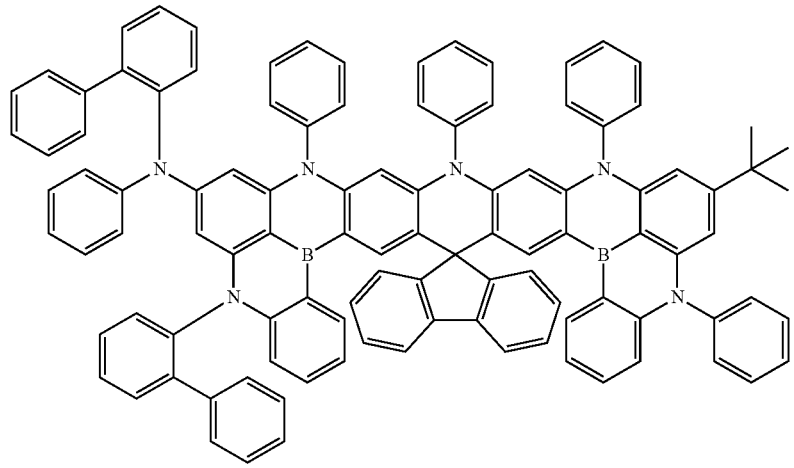
22
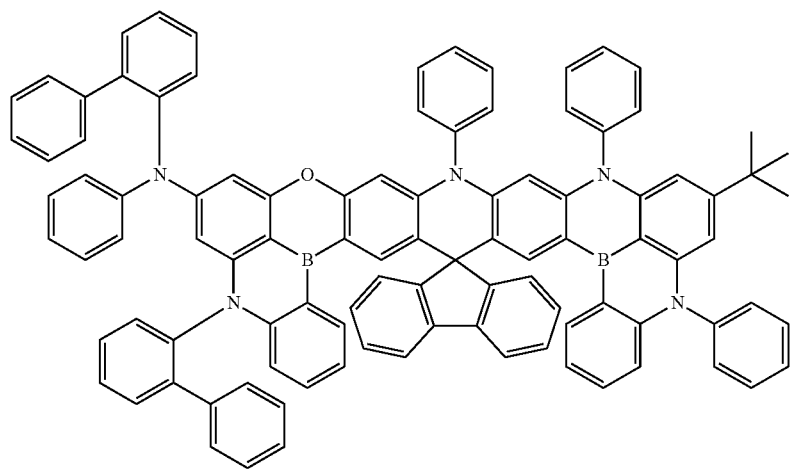
23
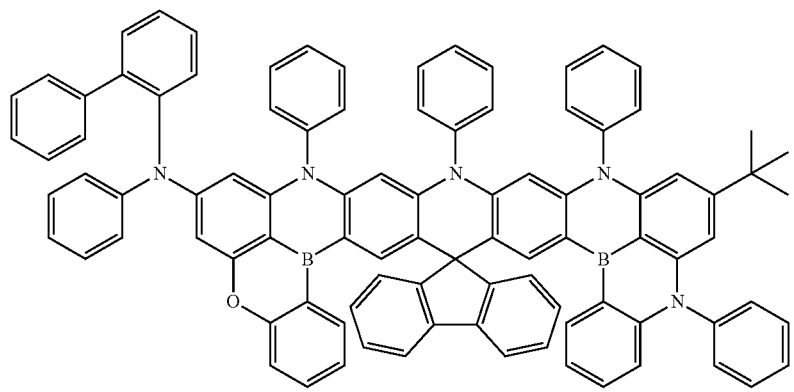
24

25
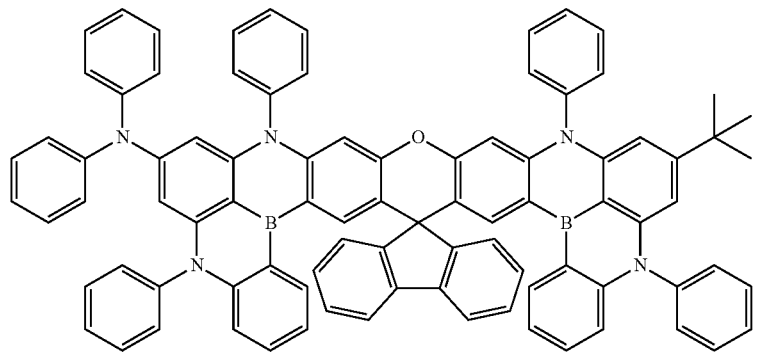
26
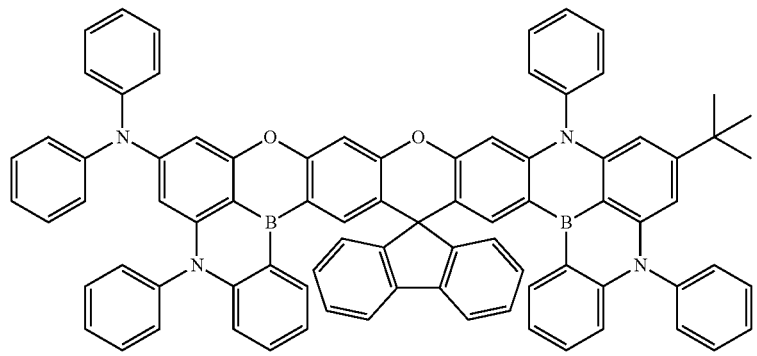
27
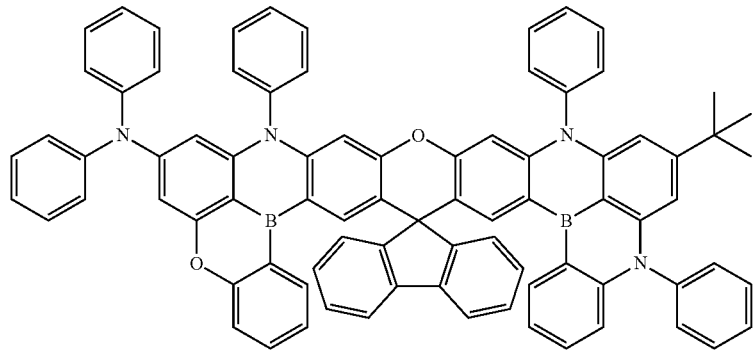
28
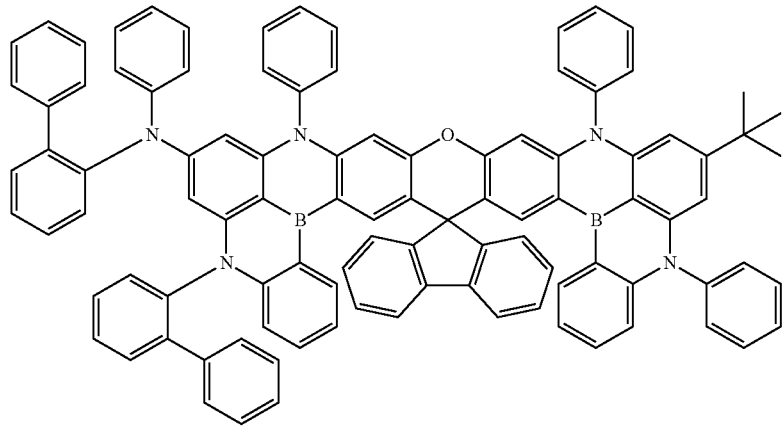

-continued
29
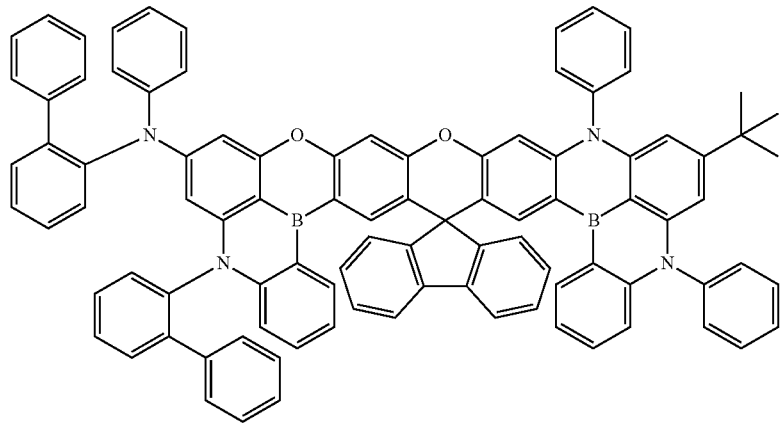
30
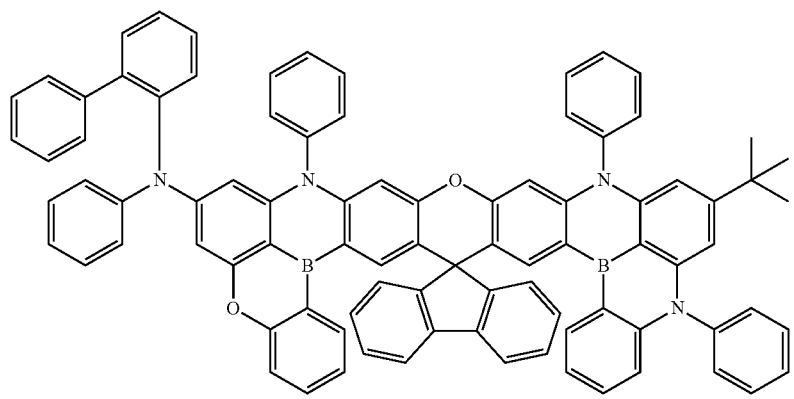
31
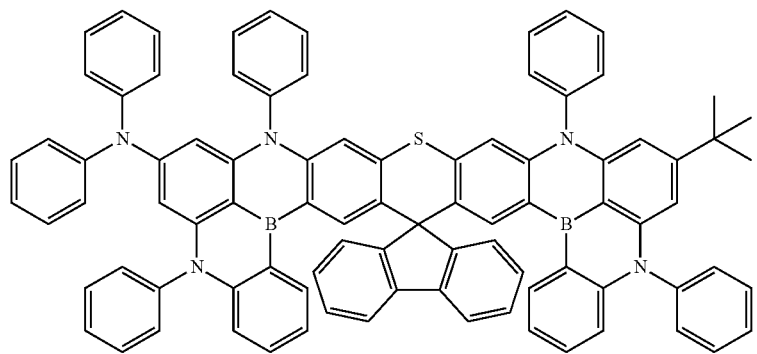
32
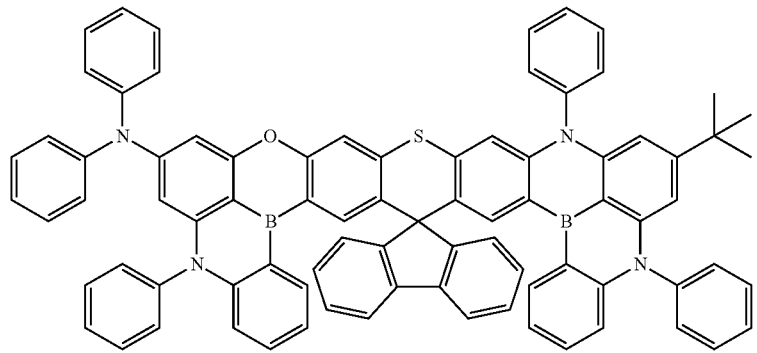

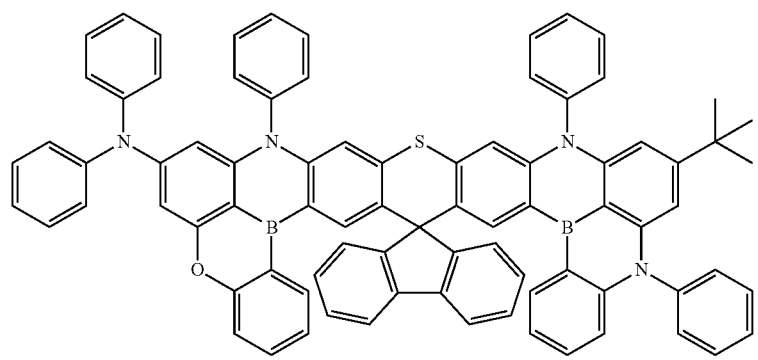
33
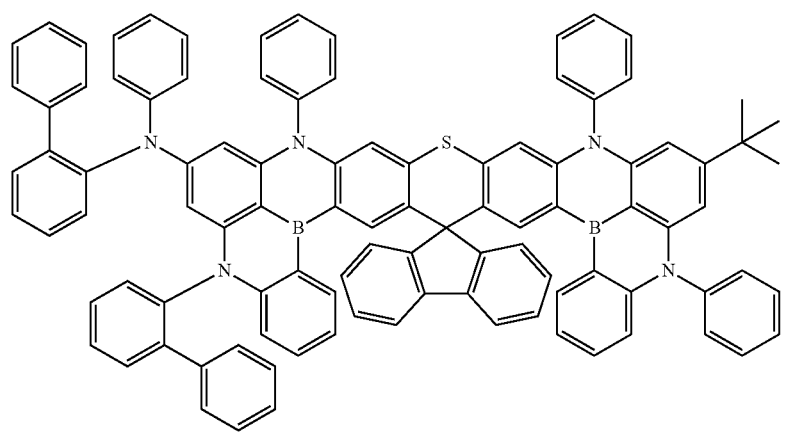
34
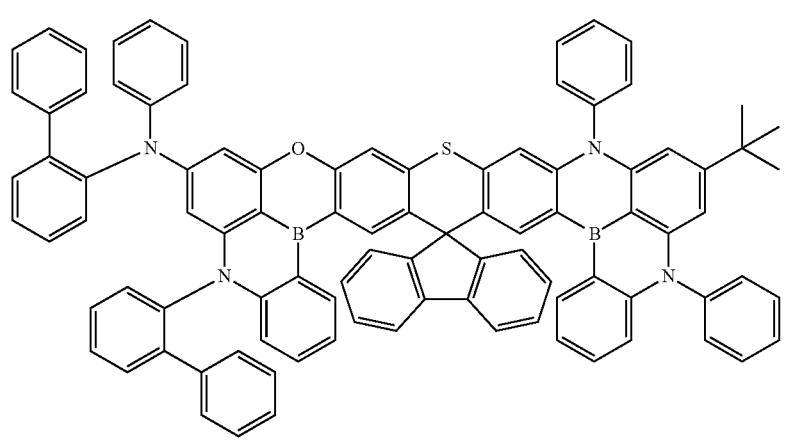
35
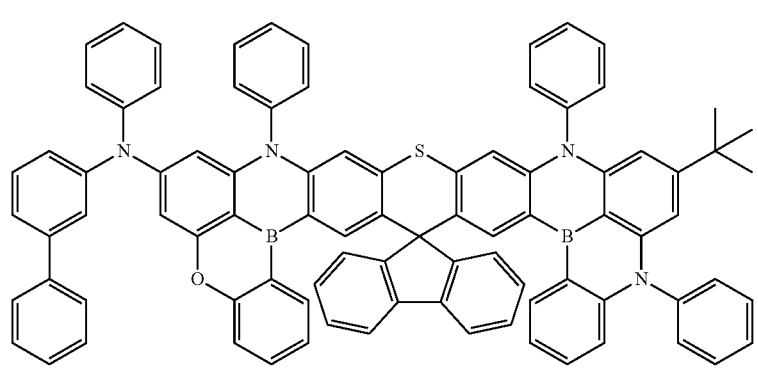
36

-continued
37
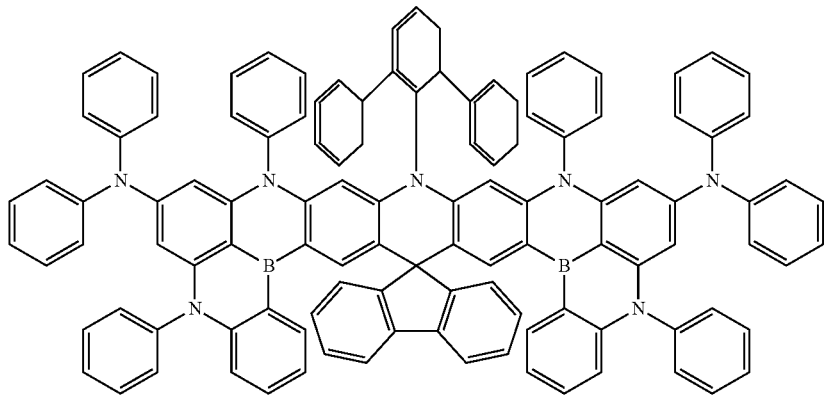
38
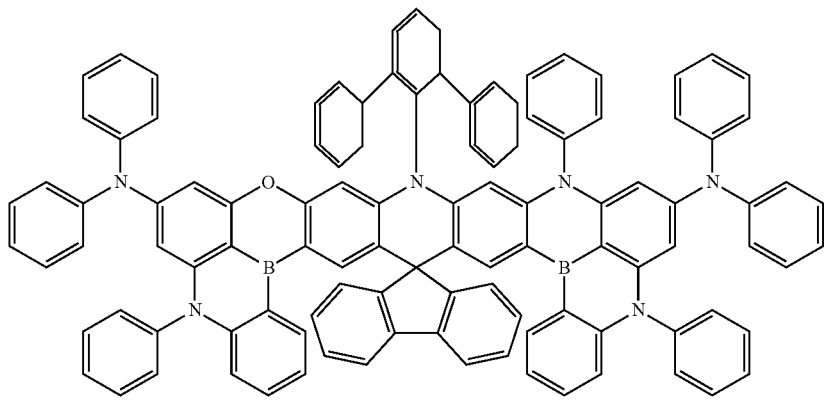
39
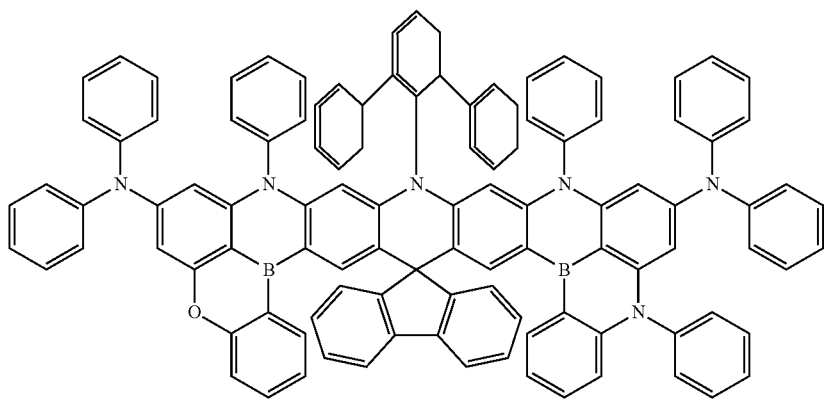
40
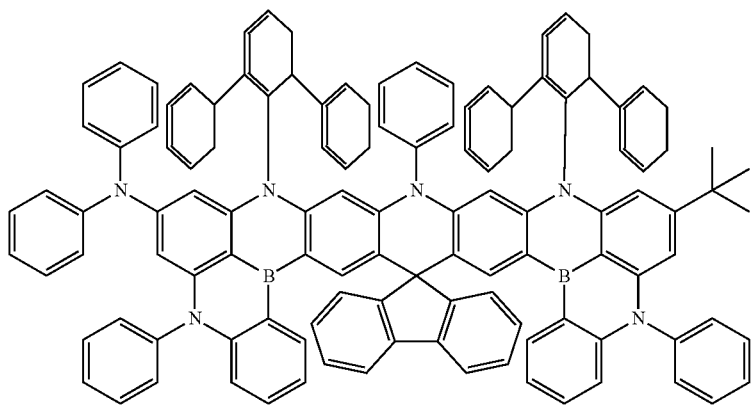

41
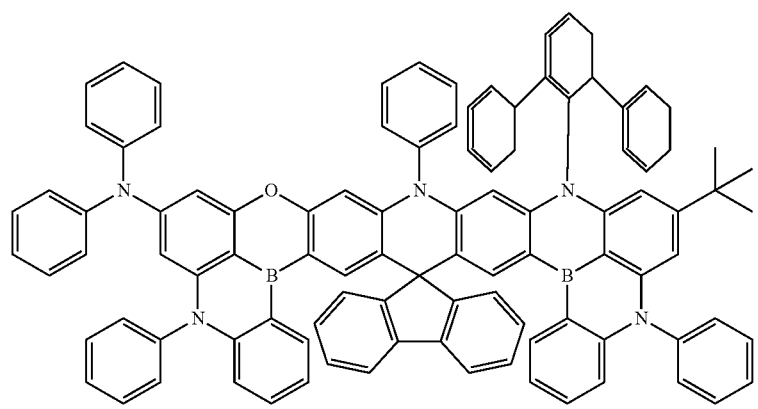
42
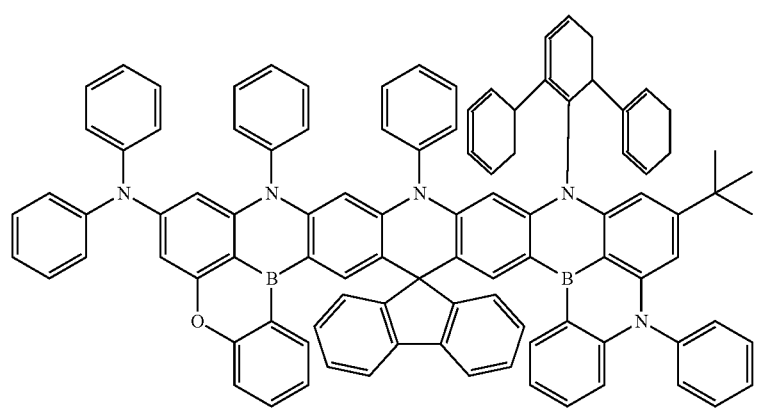
43
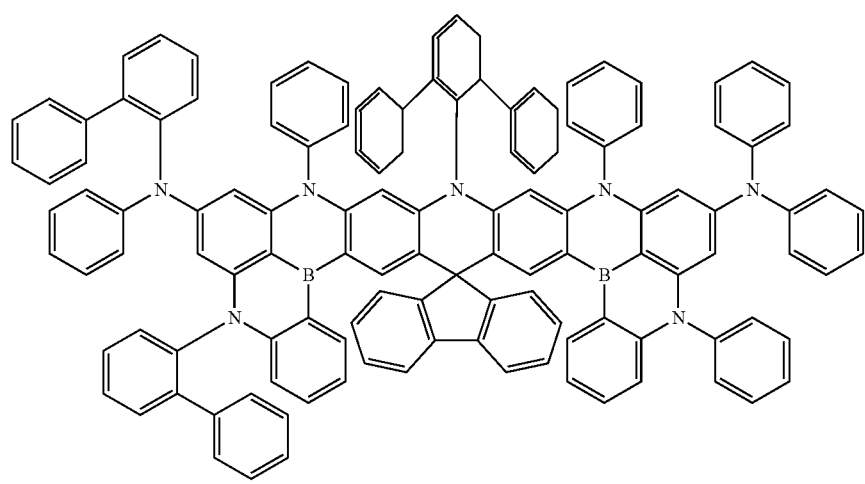

-continued
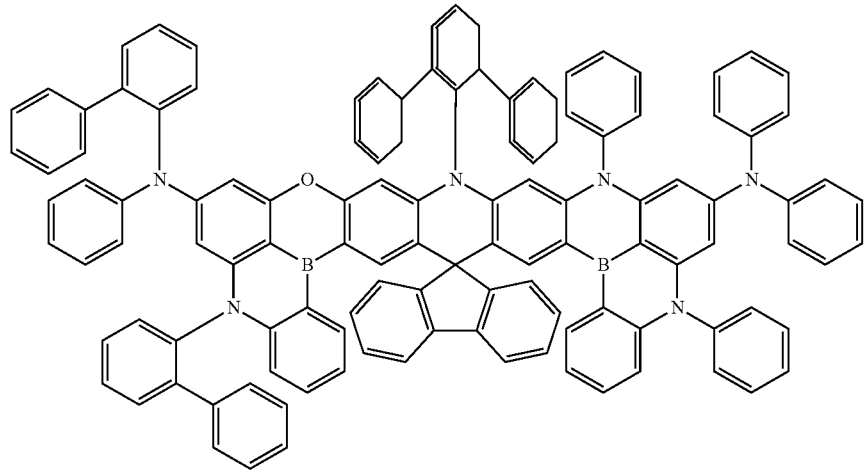
44
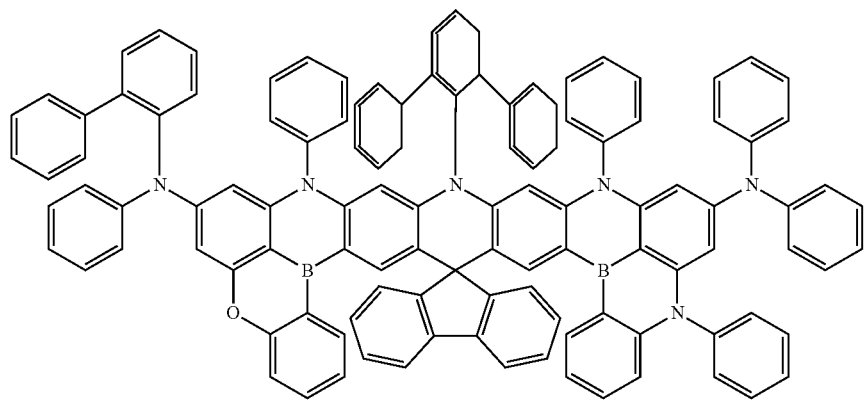
45
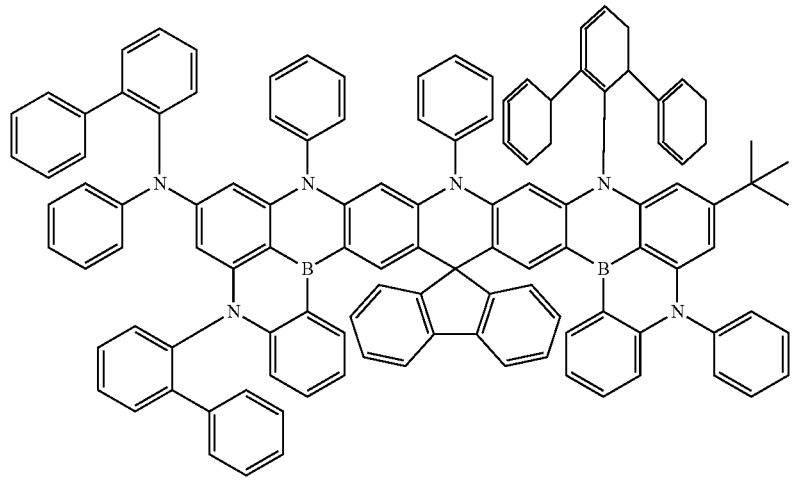
46

-continued
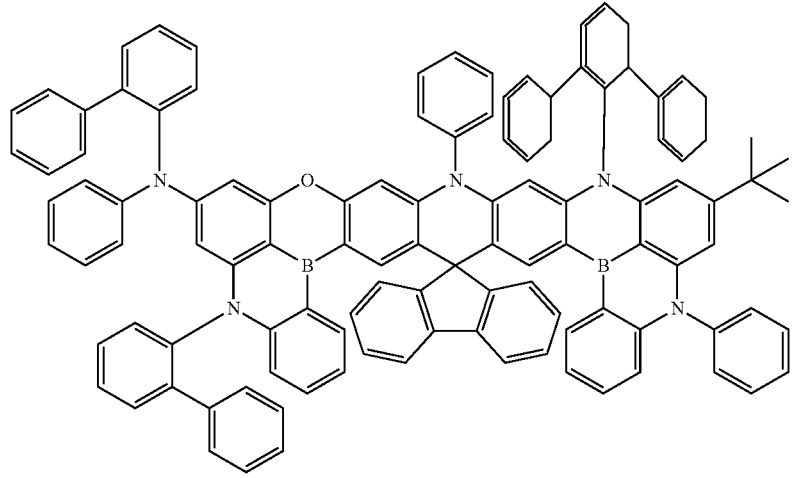
47
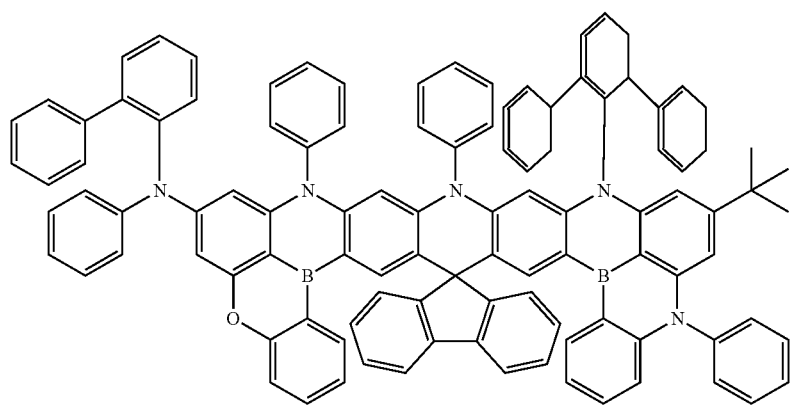
48
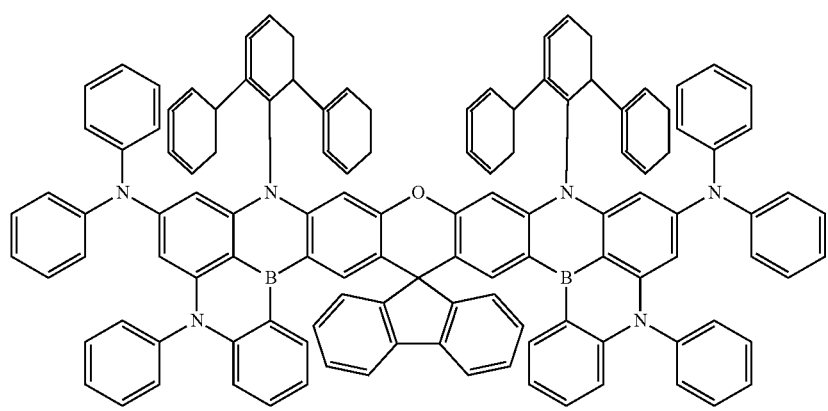
49

-continued
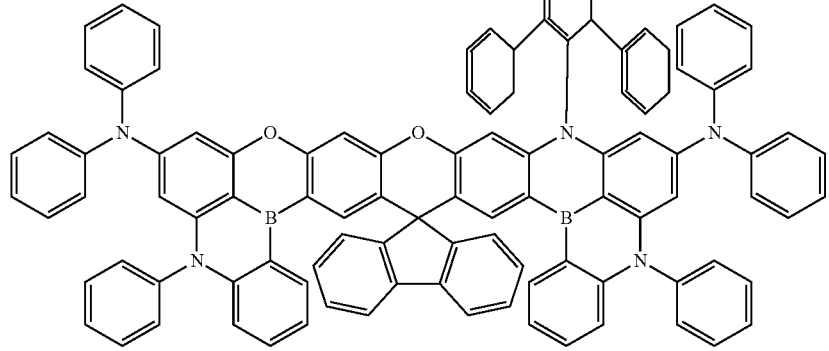
50
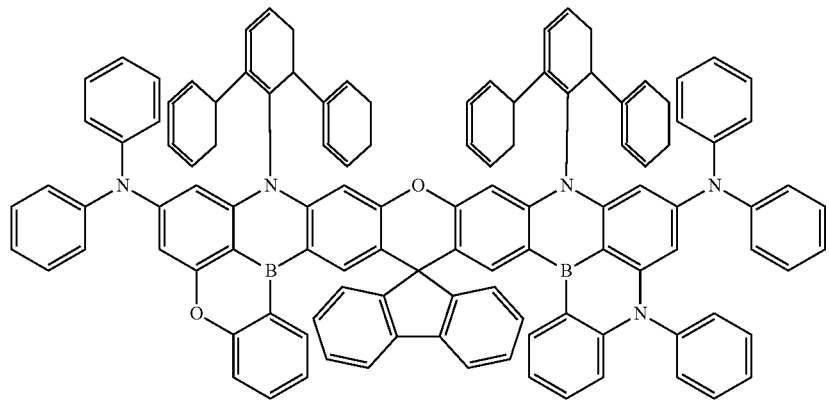
51
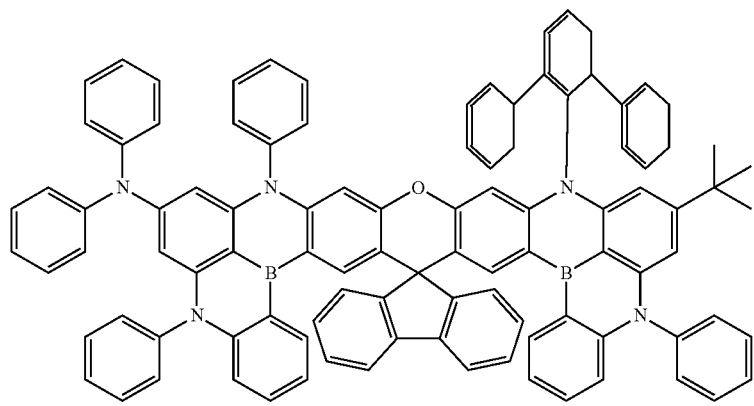
52
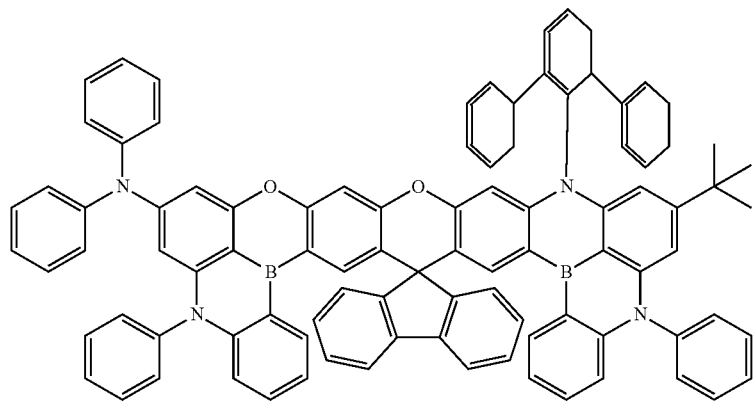
53

-continued
54
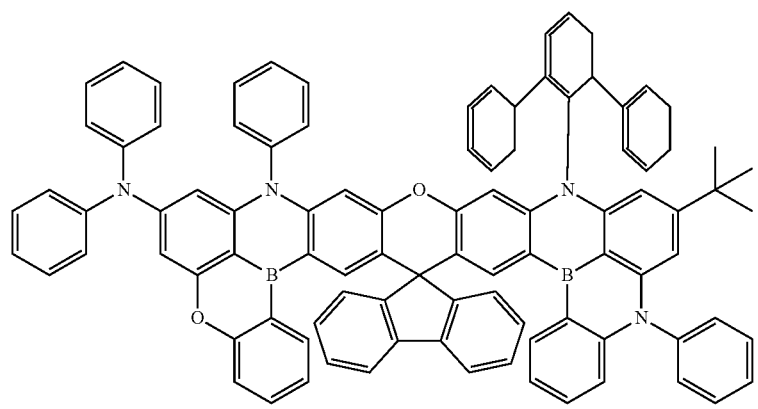
55
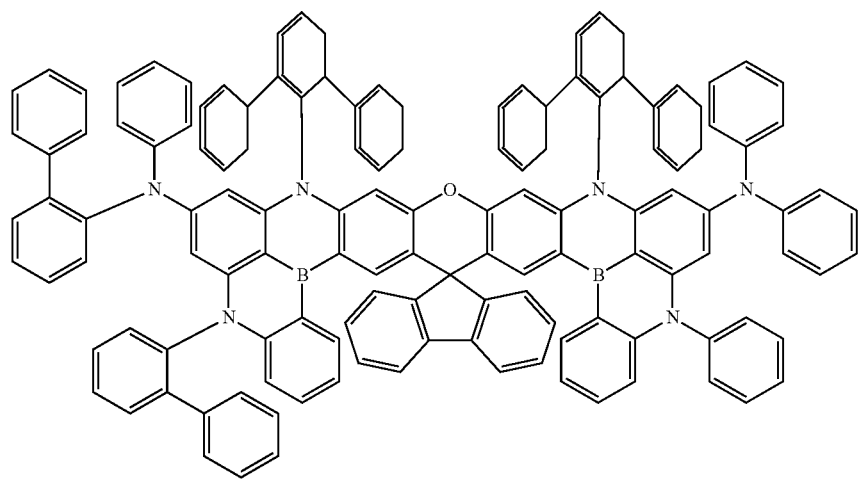
56
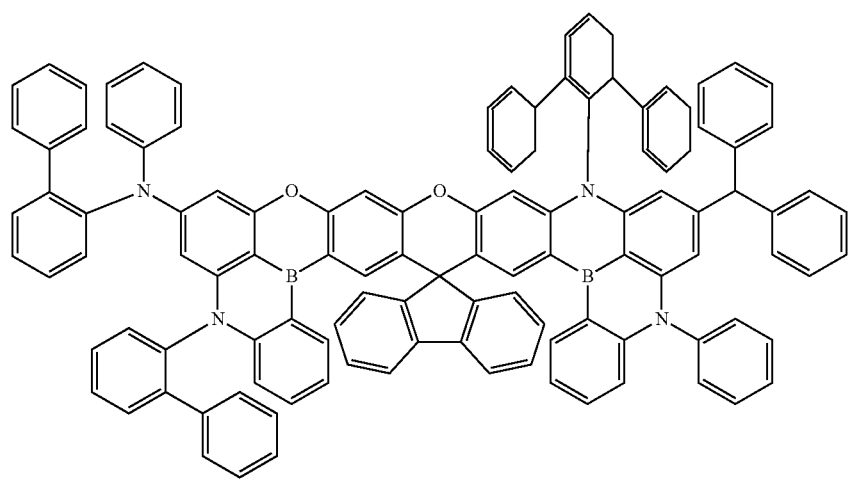

-continued
57
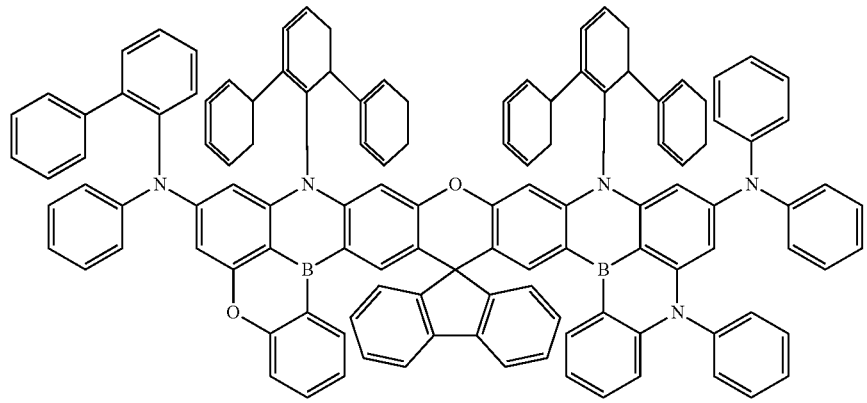
58
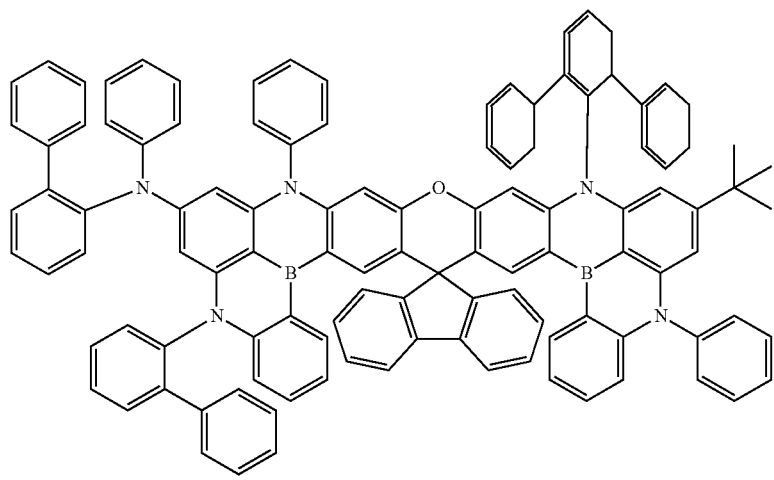
59
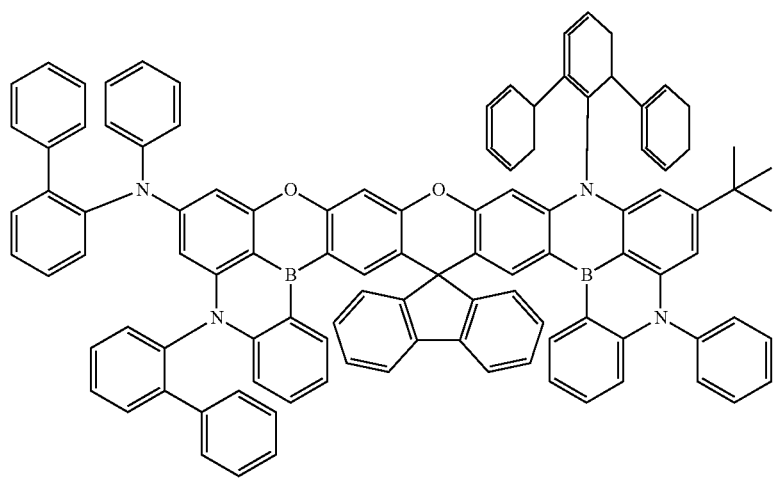

-continued
60
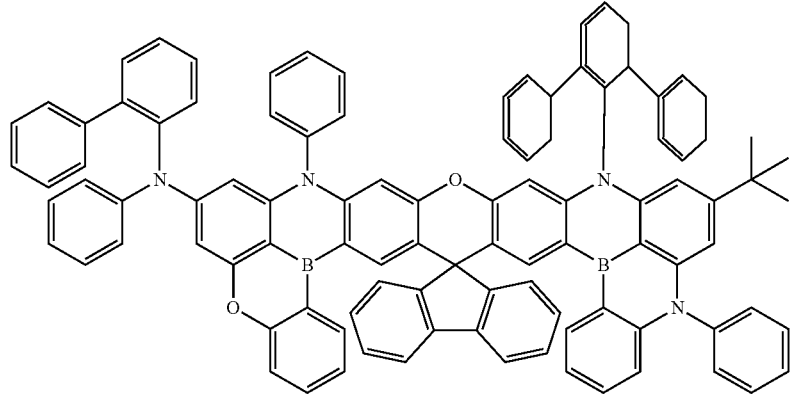
61
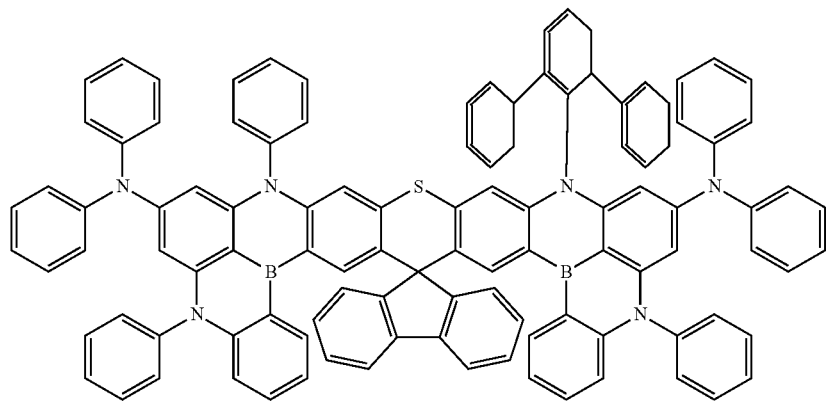
62
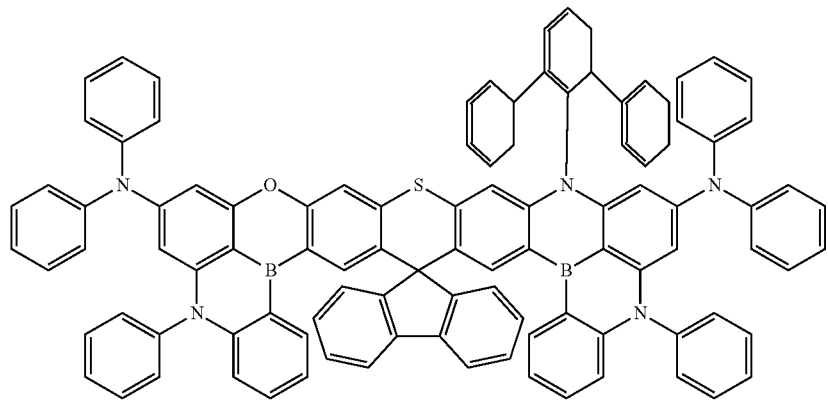
63
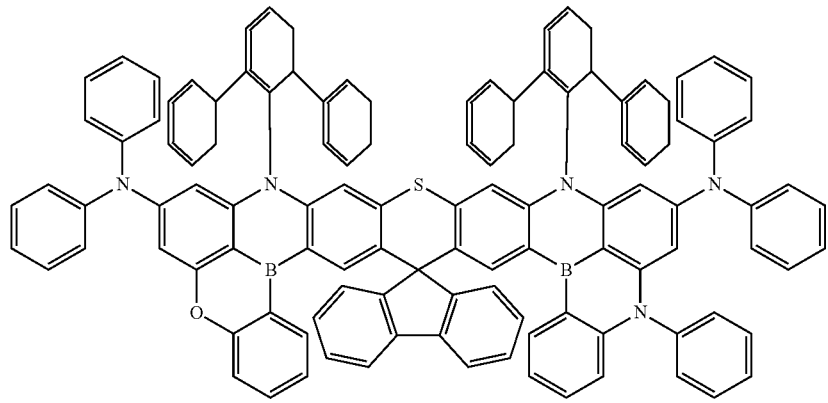

64
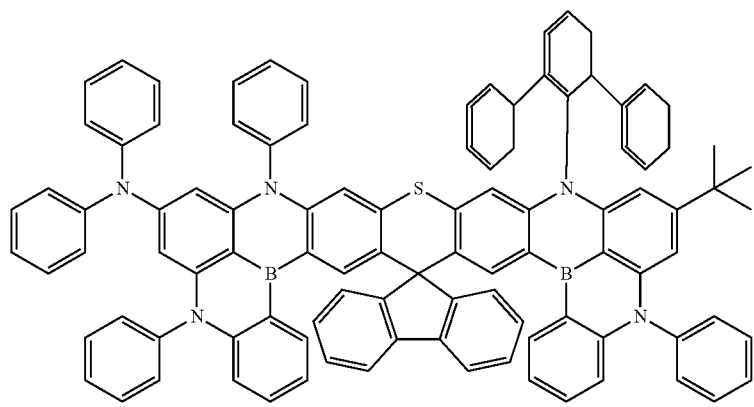
65
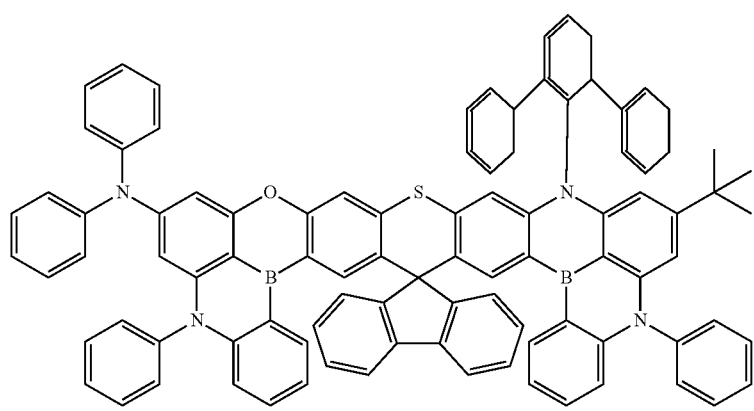
66
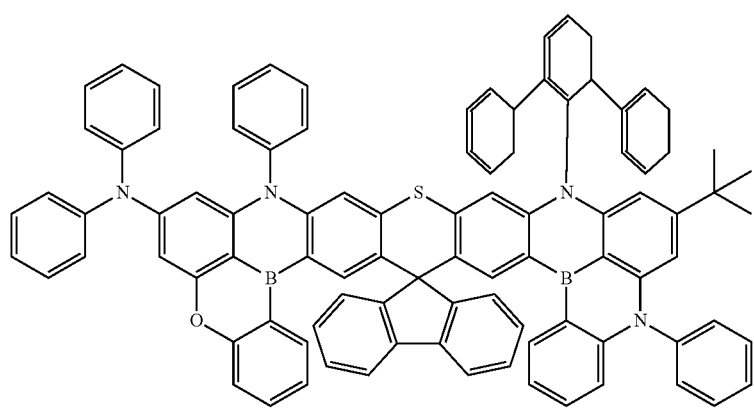

-continued
67
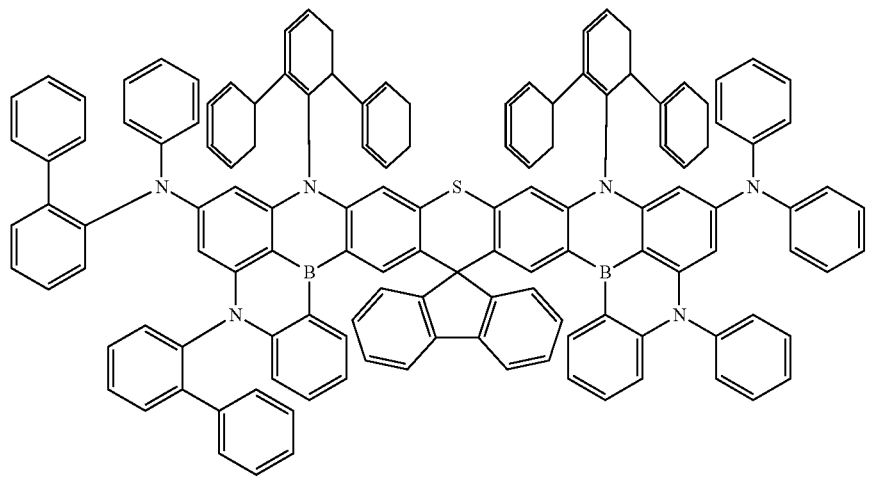
68
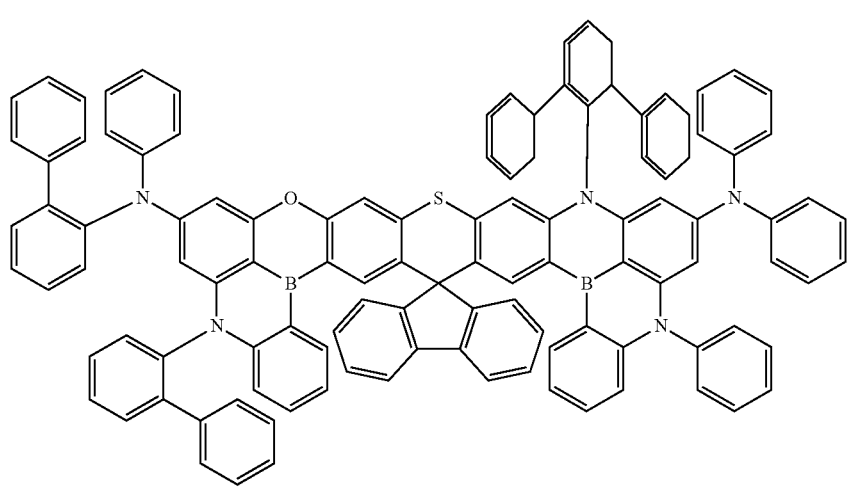
69
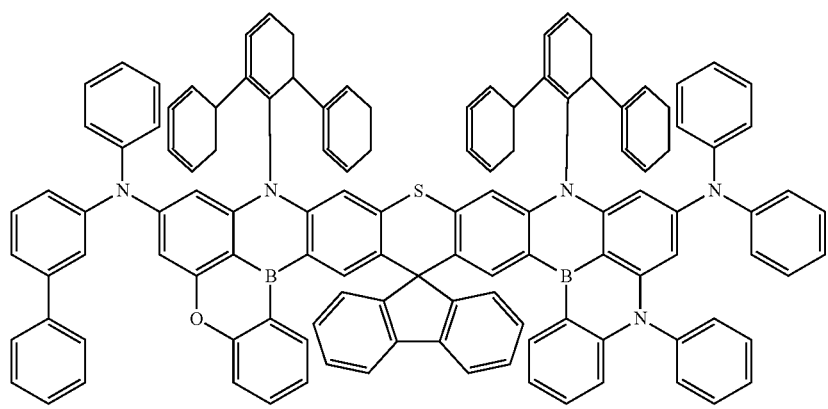

70
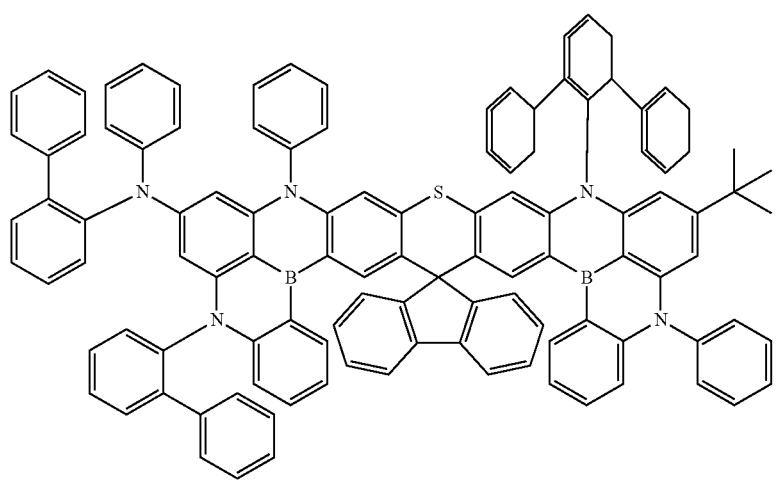
71
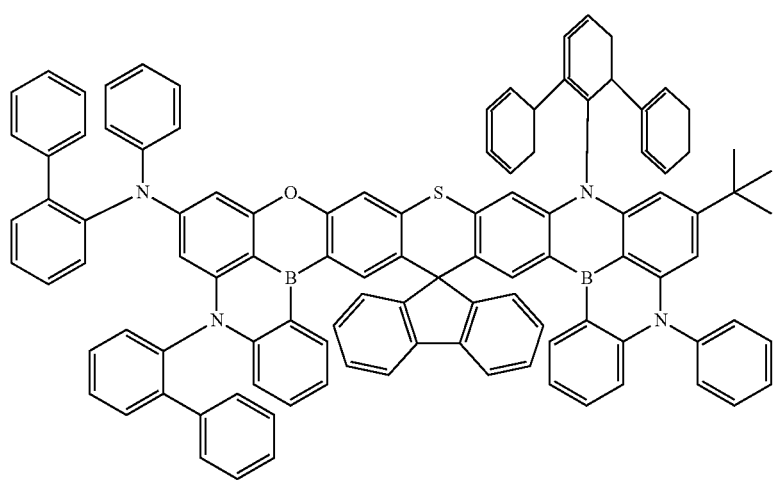
72
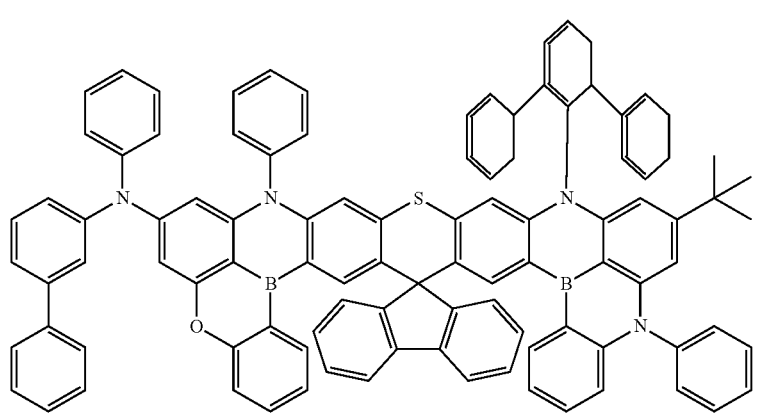

15. A condensed polycyclic compound represented by Formula 1:

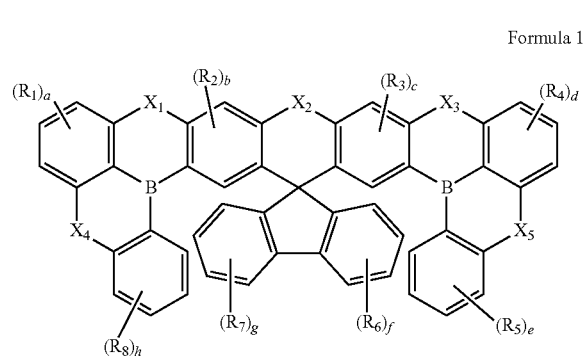

Formula 1 wherein, in Formula 1, $X_1$ to $X_5$ are each independently $NR_9$, O, S, or Se, $R_1$ to $R_9$ are each independently a hydrogen atom, a deuterium atom, a halogen atom, a cyano group, a substituted or unsubstituted silyl group, a substituted or unsubstituted alkyl group having 1 to 30 carbon atoms, a substituted or unsubstituted amine group, a substituted or unsubstituted aryl group having 6 to 30 ring-forming carbon atoms, or a substituted or unsubstituted heteroaryl group having 2 to 60 ring-forming carbon atoms, or are bonded to an adjacent group to form a ring, a is an integer of 0 to 3, b and c are each independently an integer of 0 to 2, d is an integer of 0 to 3, and e, f, g, and h are each independently an integer of 0 to 4.

16. The condensed polycyclic compound of claim 15, wherein the condensed polycyclic compound represented by Formula 1 is represented by Formula 1-3:

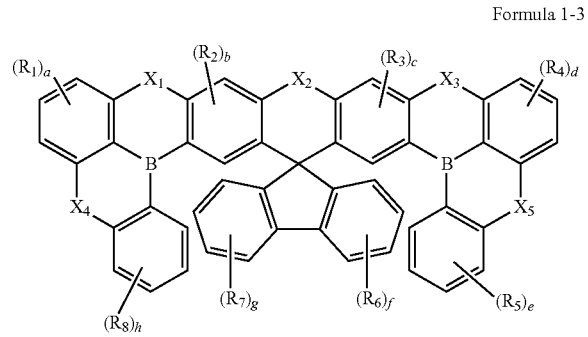

Formula 1-3 wherein, in Formula 1-3, $X_1$ to $X_5$, $R_1$, $R_4$ to $R_8$, a, and d to h are the same as defined with respect to Formula 1.

17. The condensed polycyclic compound of claim 15, wherein the condensed polycyclic compound represented by Formula 1 is represented by Formula 1-4:

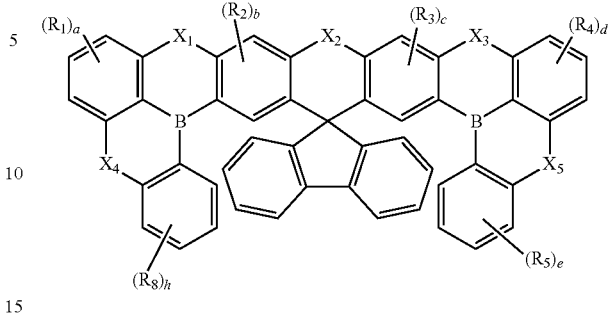

Formula 1-4 wherein, in Formula 1-4, $X_1$ to $X_5$, $R_1$ to $R_5$, $R_8$, a to e, and h are the same as defined in Formula 1.

18. The condensed polycyclic compound of claim 15, wherein the condensed polycyclic compound represented by Formula 1 is represented by Formula 1-5:

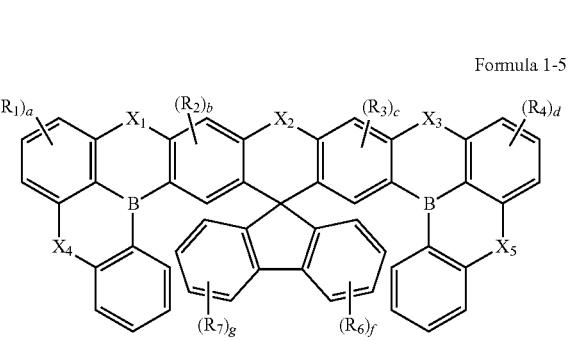

Formula 1-5 wherein, in Formula 1-5, $X_1$ to $X_5$, $R_1$ to $R_4$, $R_6$, $R_7$, a to d, f and g are the same as defined with respect to Formula 1.

19. The condensed polycyclic compound of claim 15, wherein the condensed polycyclic compound represented by Formula 1 is represented by Formula 1-6:

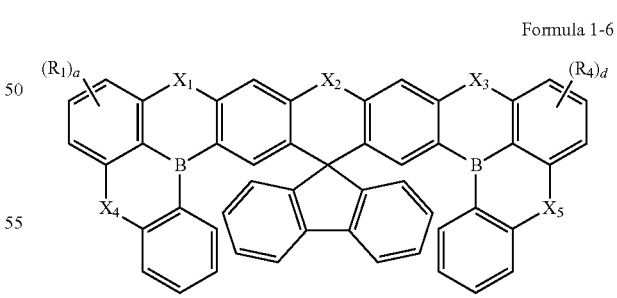

Formula 1-6 wherein, in Formula 1-6, $X_1$ to $X_5$, $R_1$, $R_4$, a, and d are the same as defined with respect to Formula 1.

20. The condensed polycyclic compound of claim 15, wherein the condensed polycyclic compound represented by Formula 1 comprises at least one selected from among compounds represented by Compound Group 1:

Compound Group 1
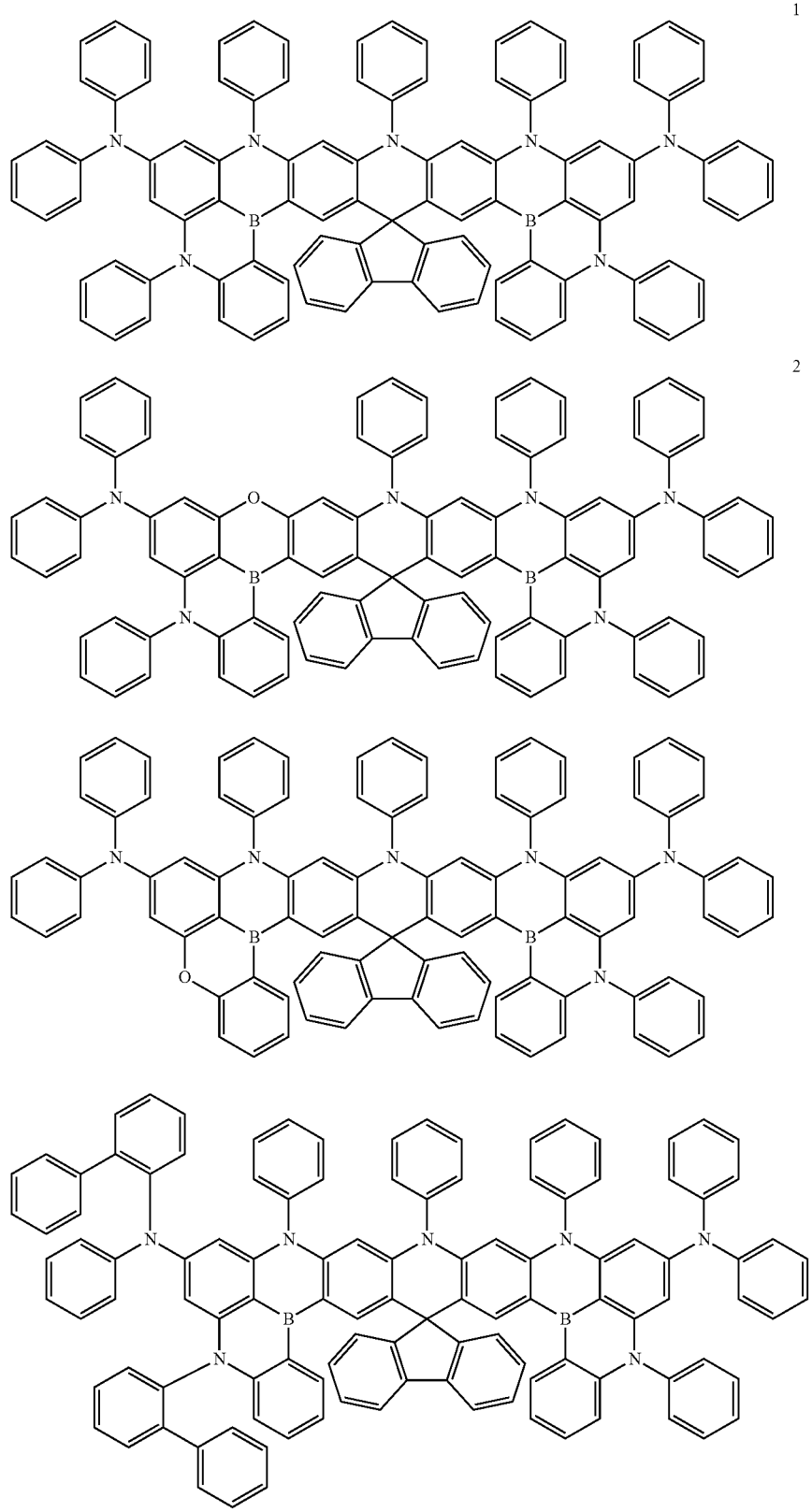

-continued
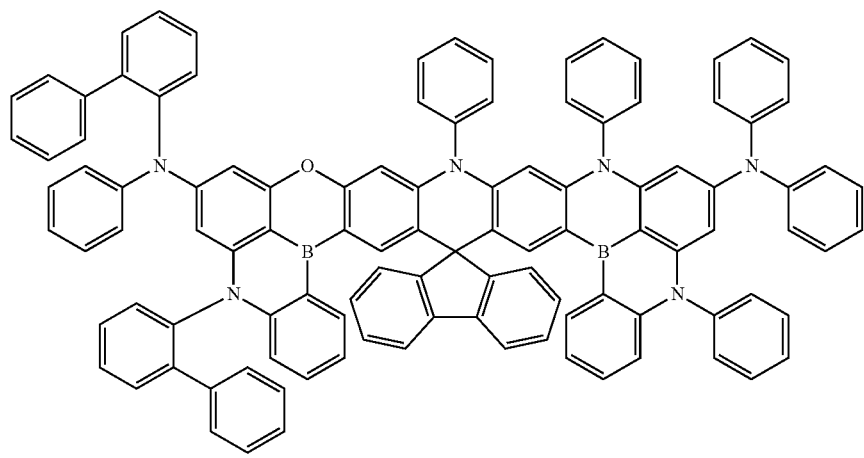
5
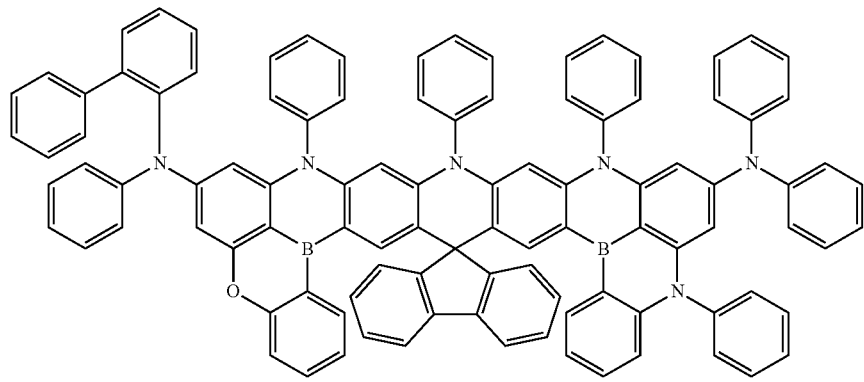
6
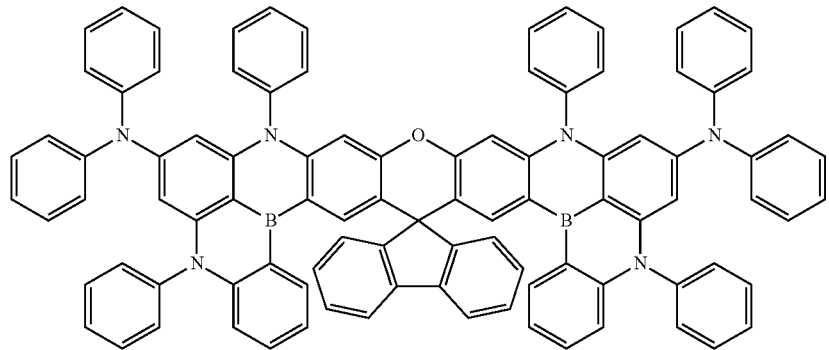
7
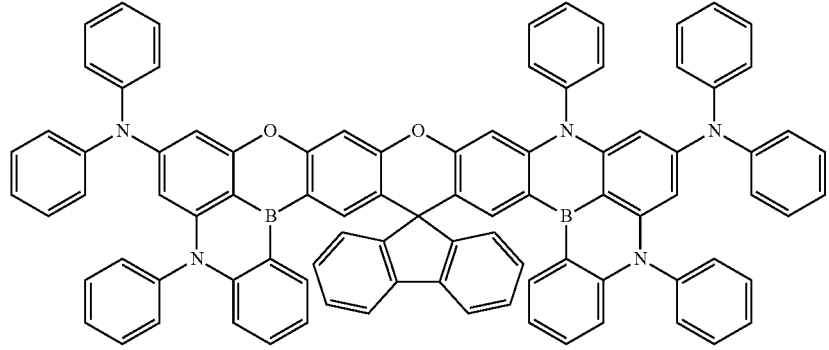
8

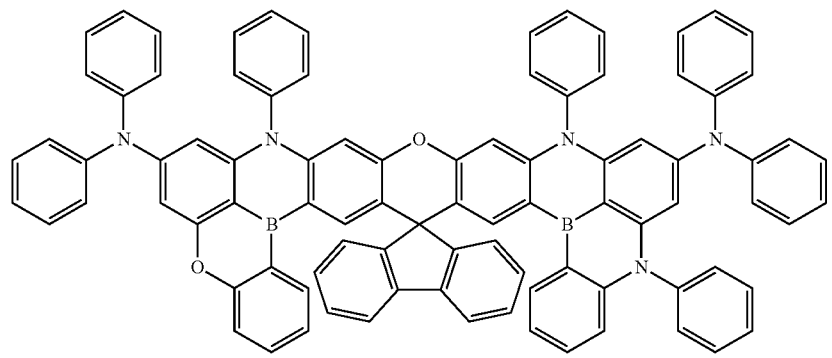
9
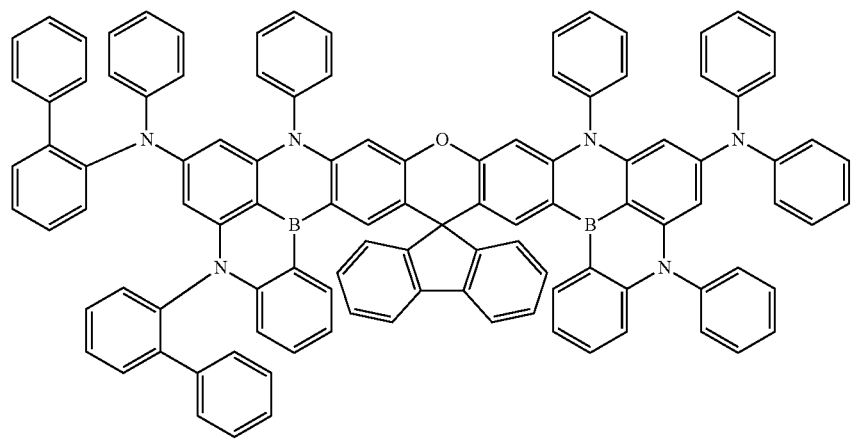
10
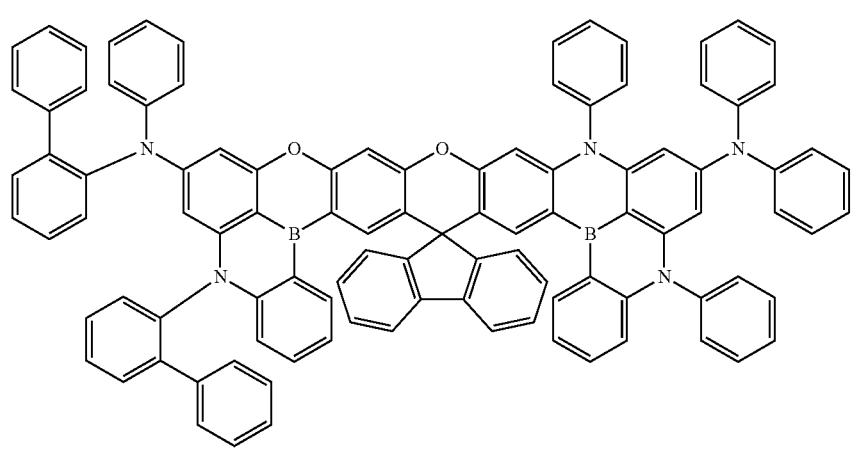
11
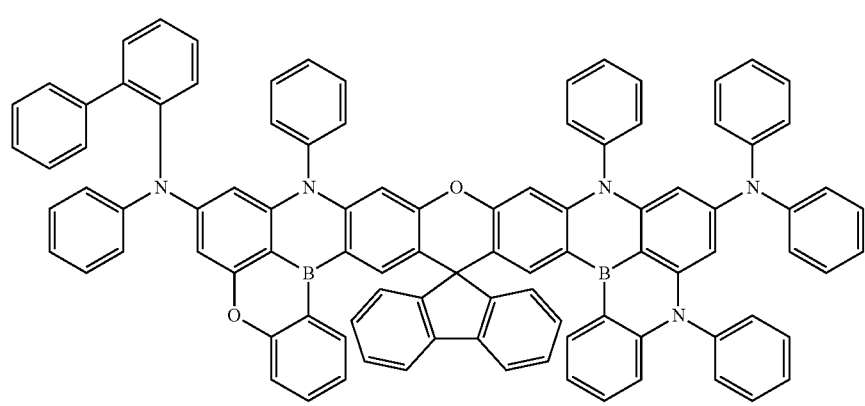
12

13
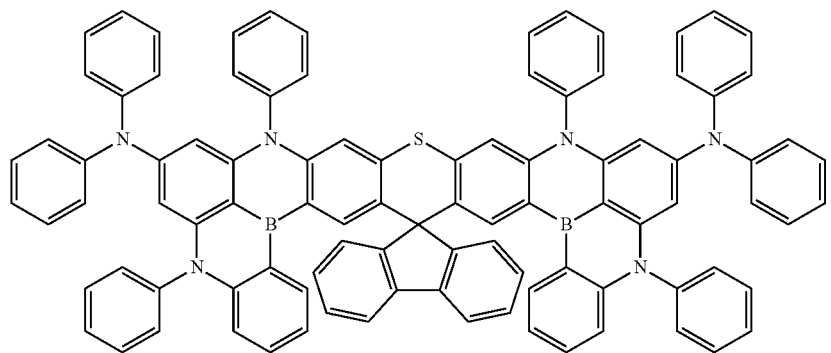
14
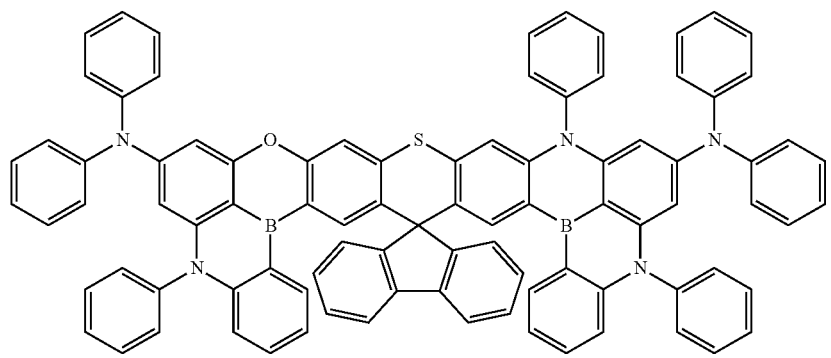
15
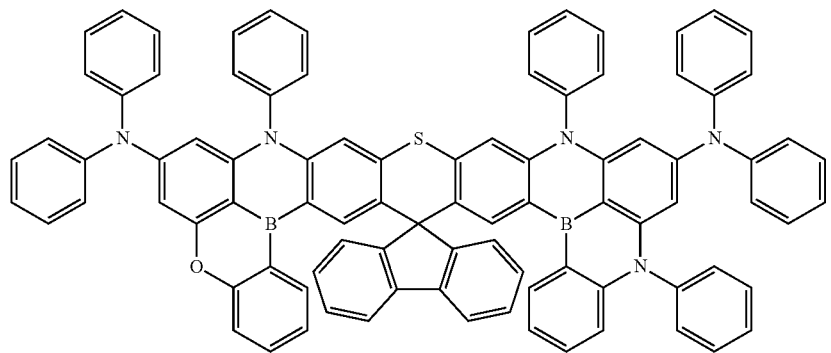
16
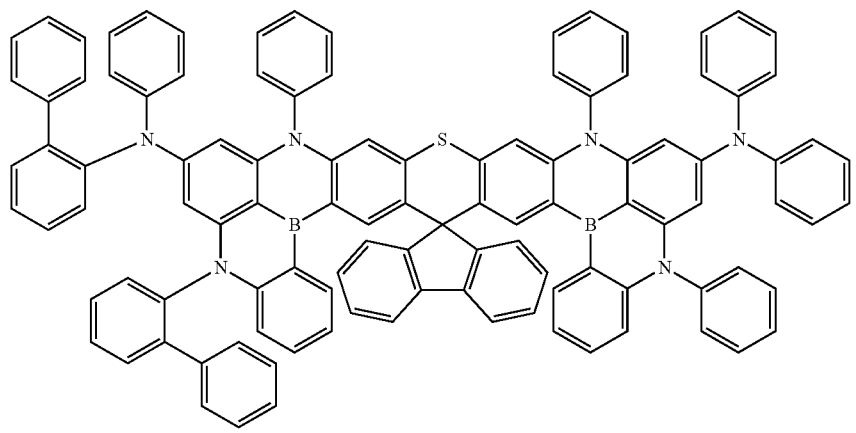

-continued
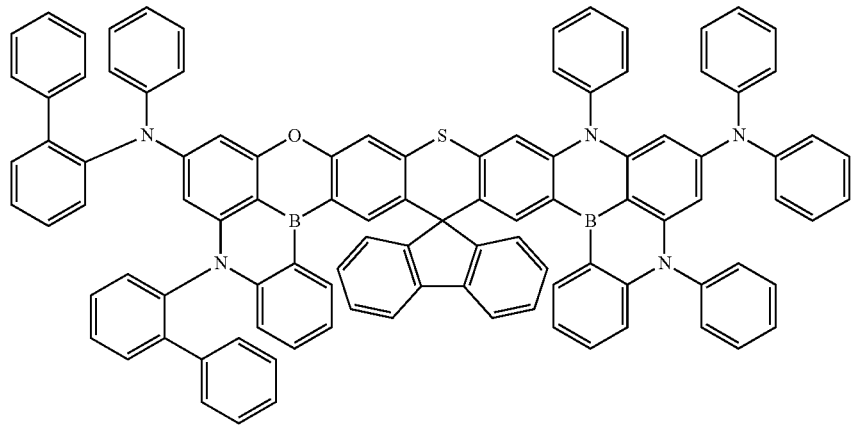
17
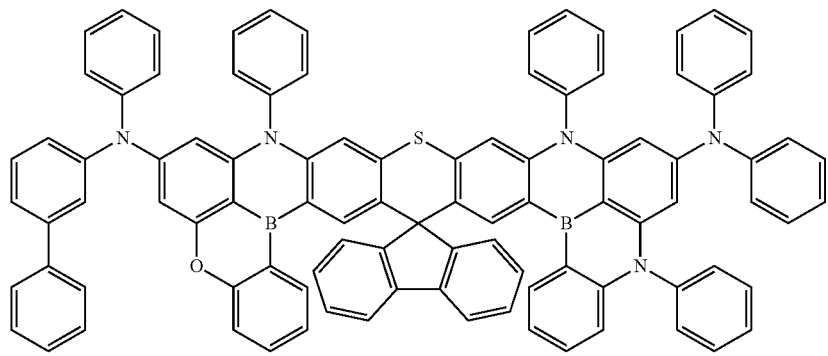
18
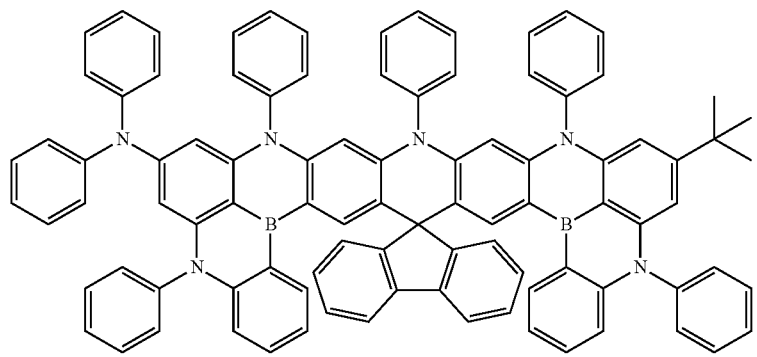
19
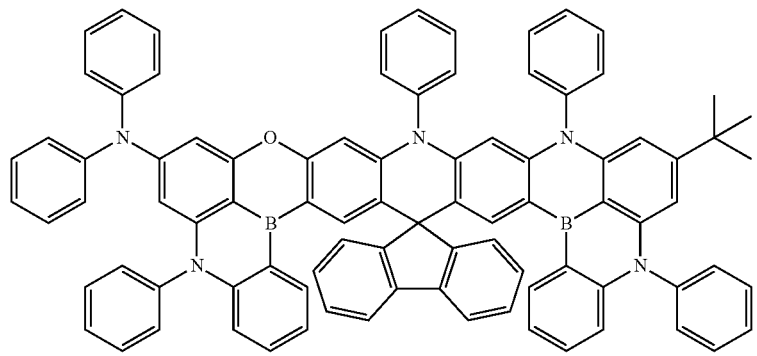
20

21
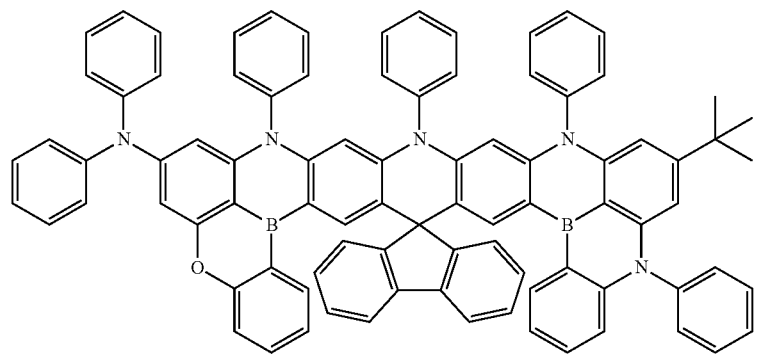
22
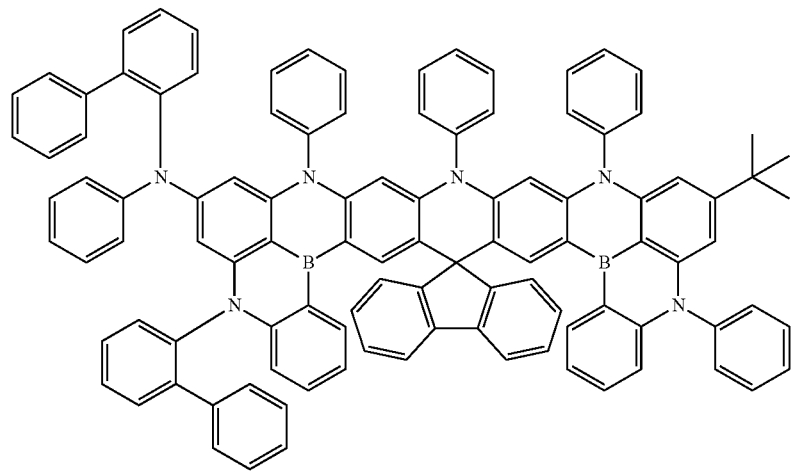
23
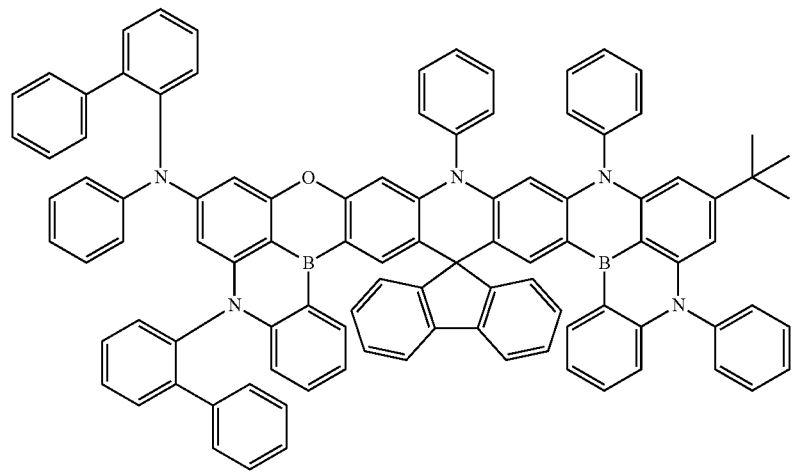

-continued
24
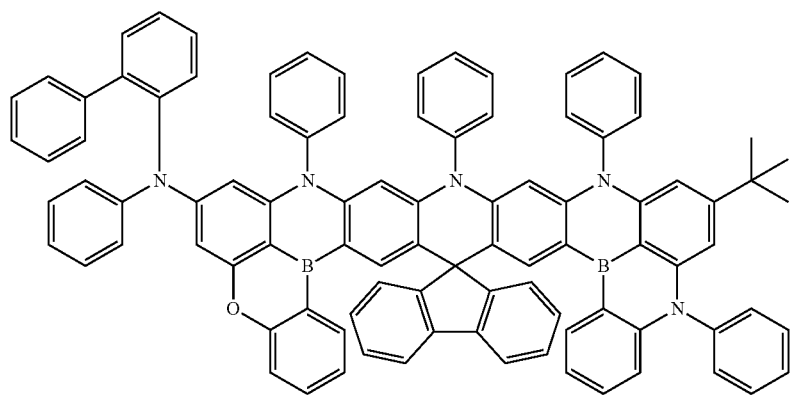
25
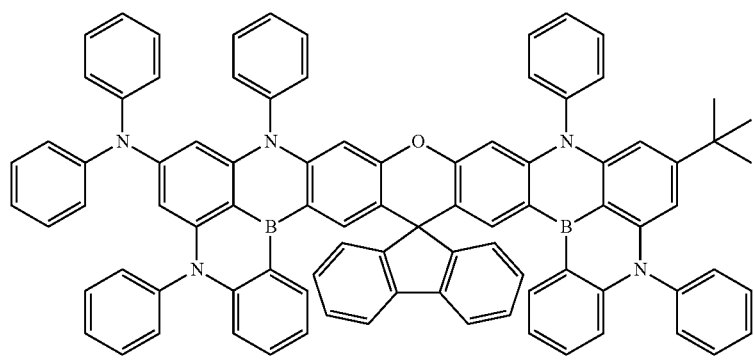
26
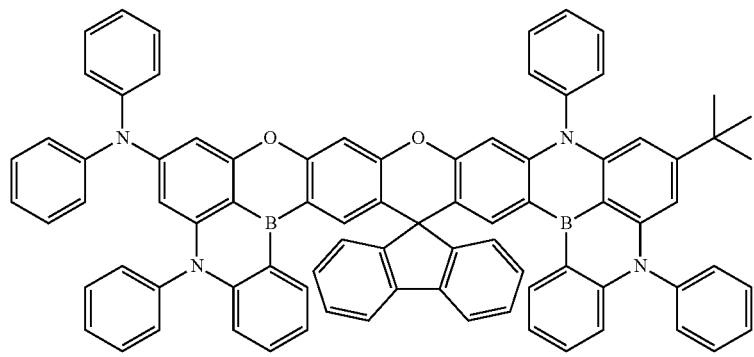
27
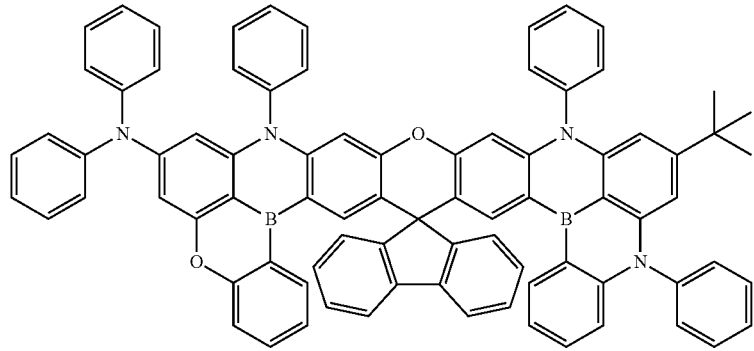

-continued
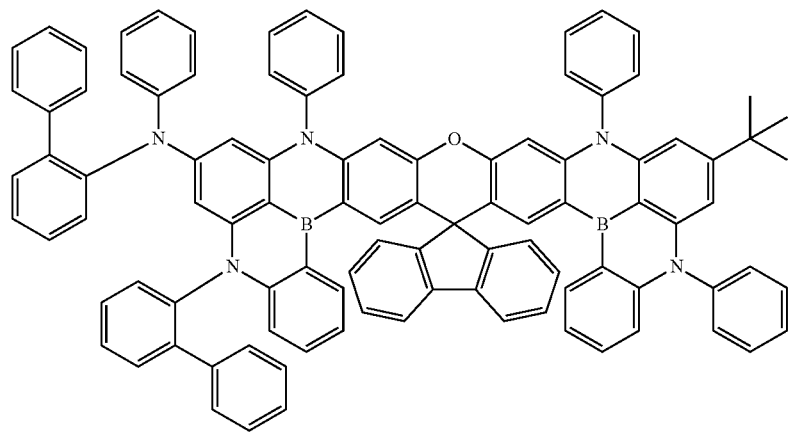
28
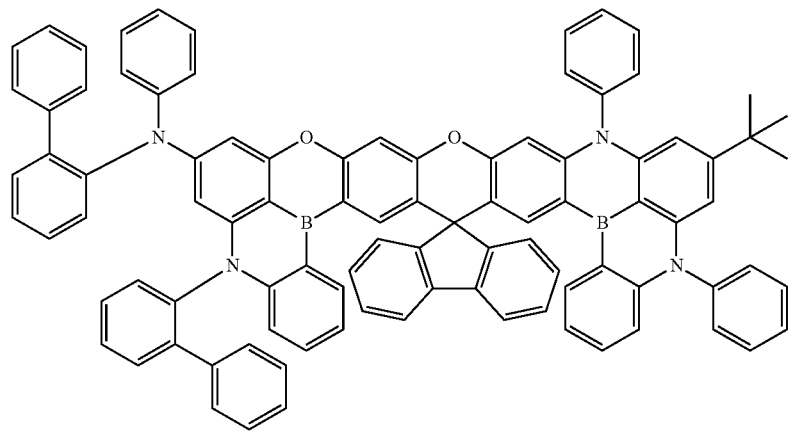
29
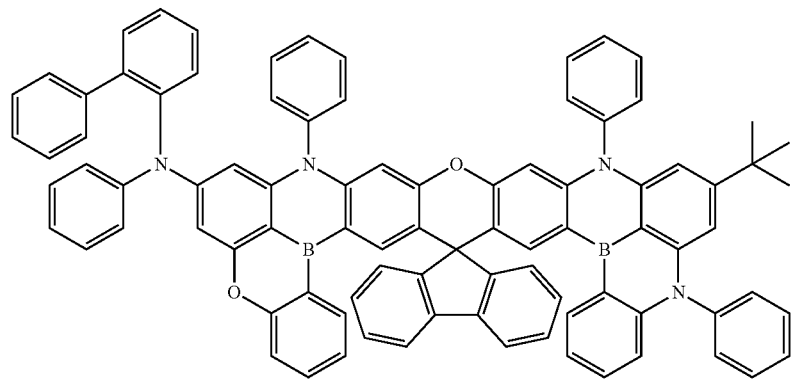
30
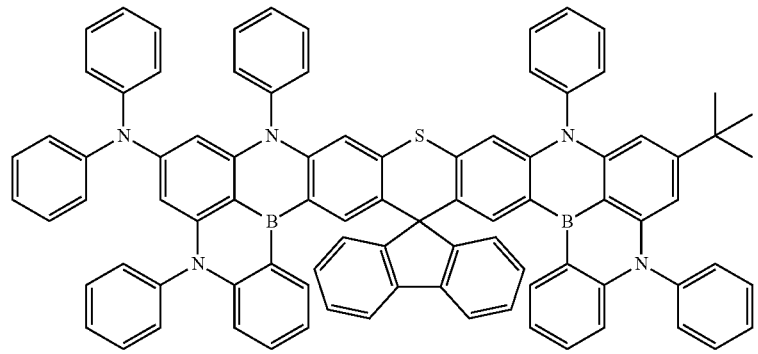
31

-continued
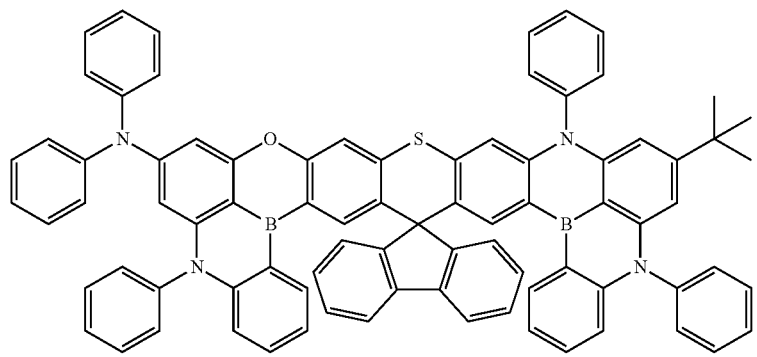
32
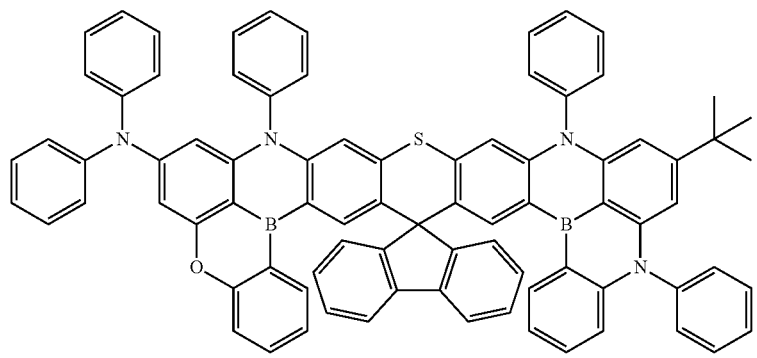
33
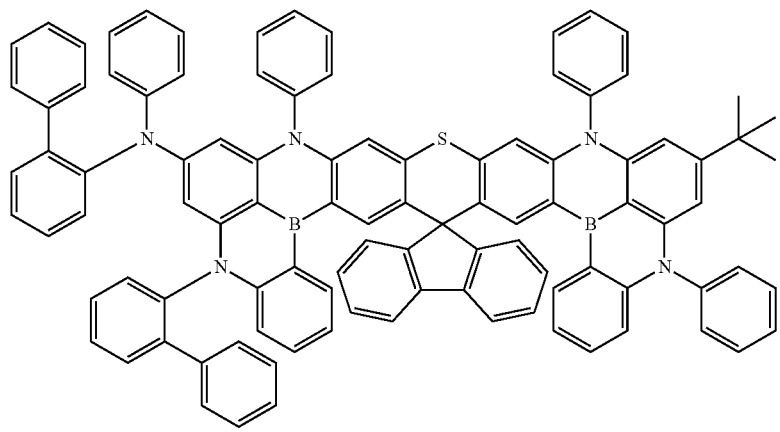
34
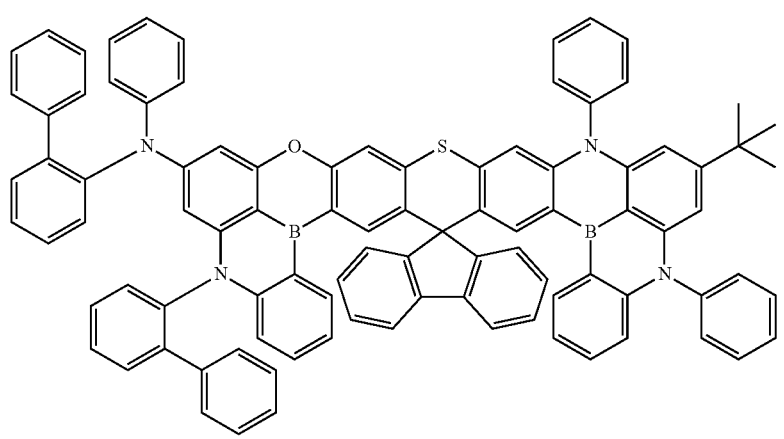
35

-continued
36
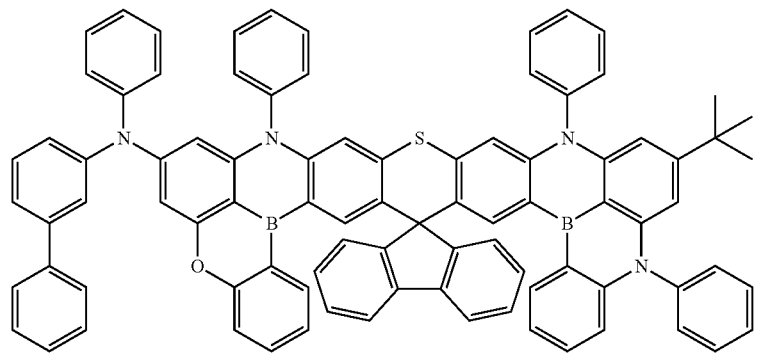
37
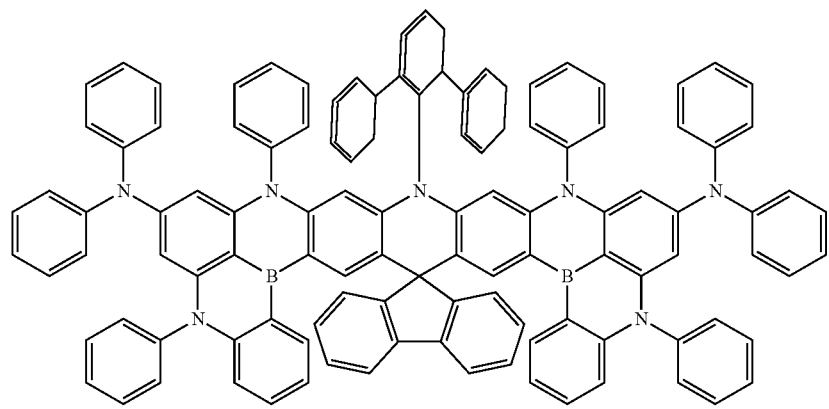
38
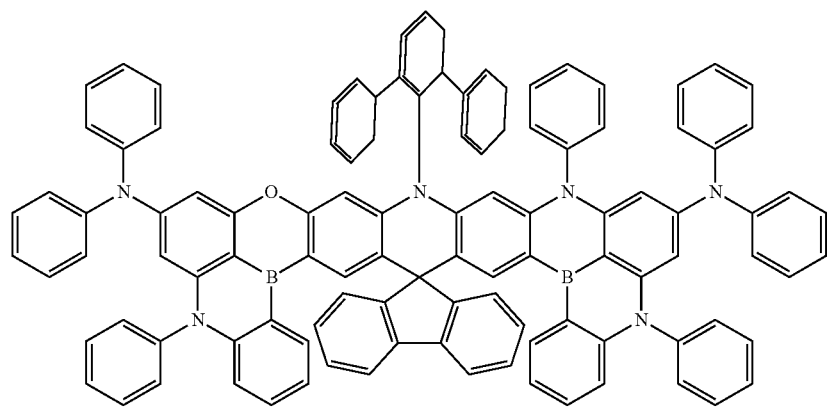
39
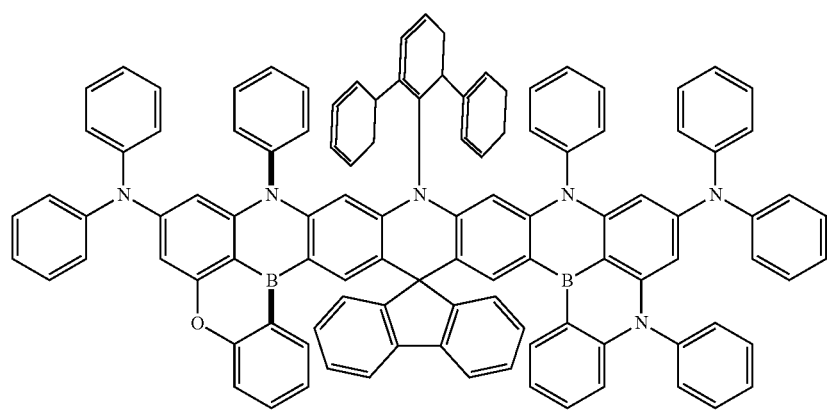

-continued
40
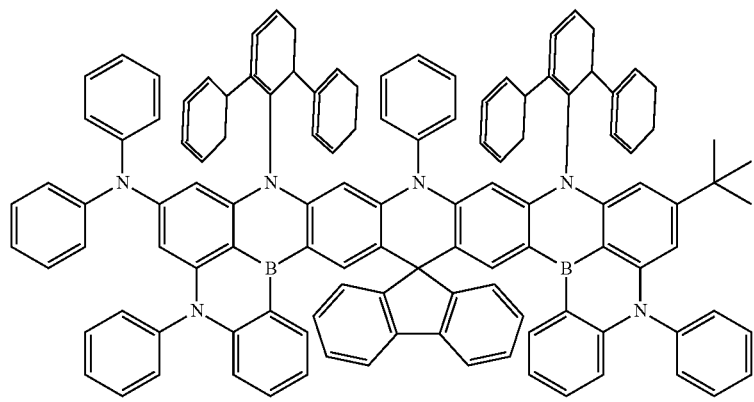
41
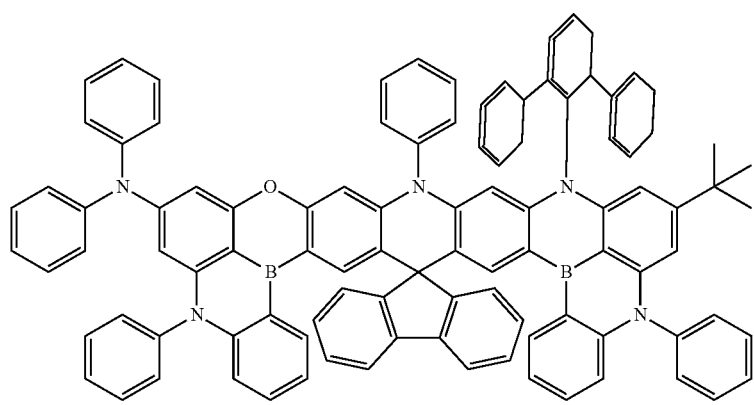
42
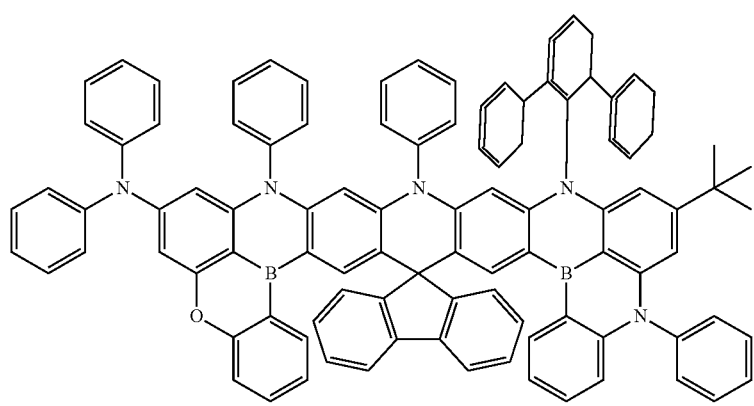

-continued
43
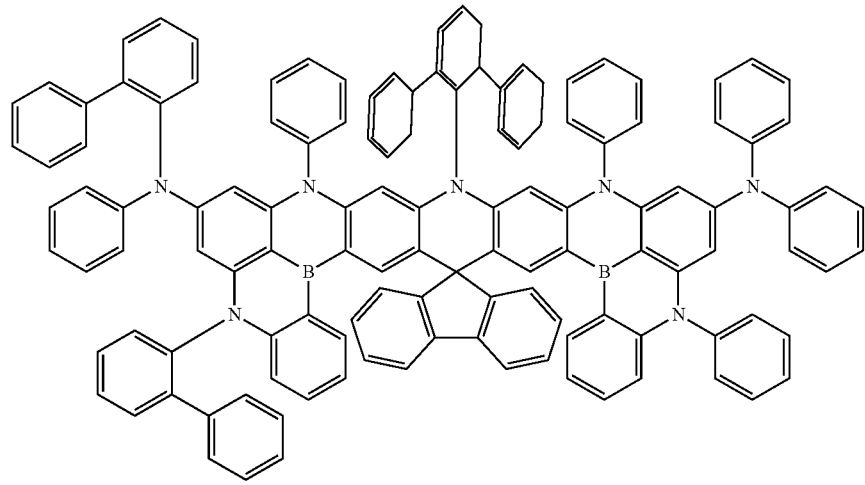
44
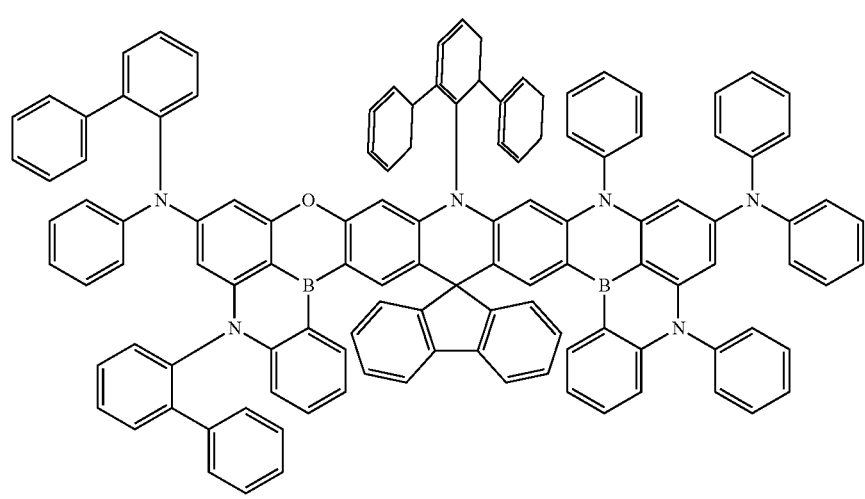
45
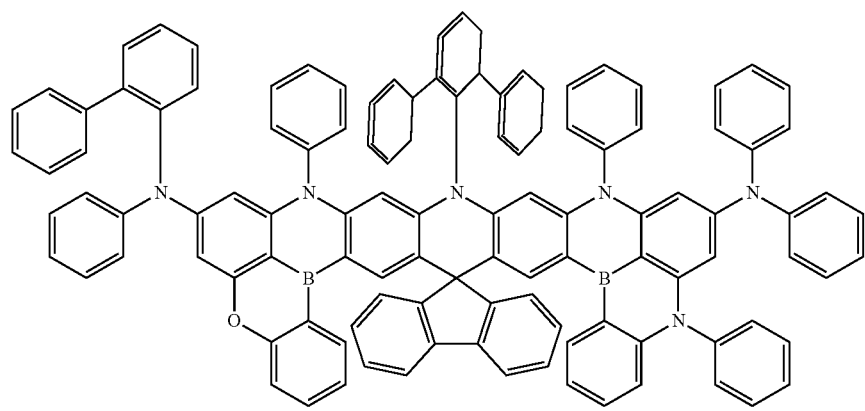

-continued
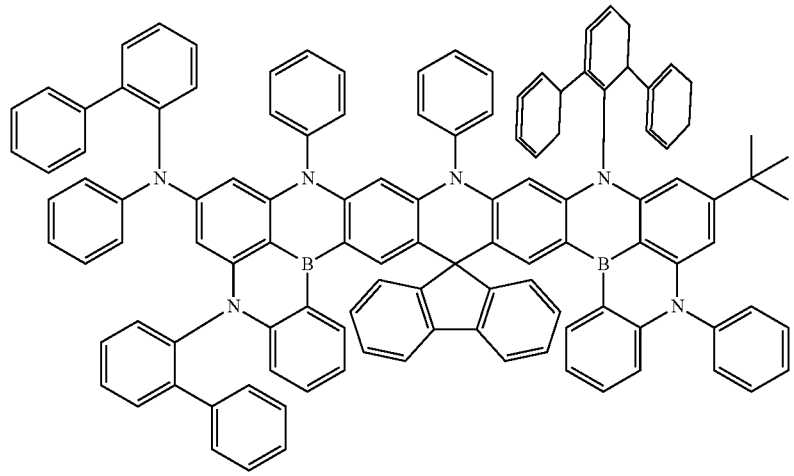
46
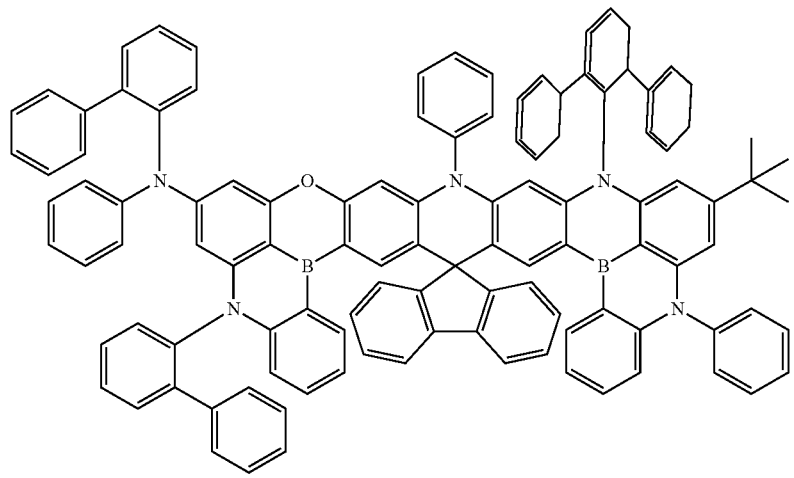
47
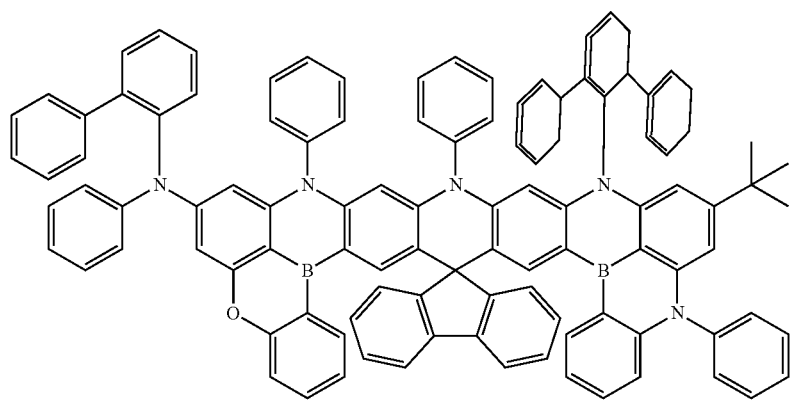
48

-continued
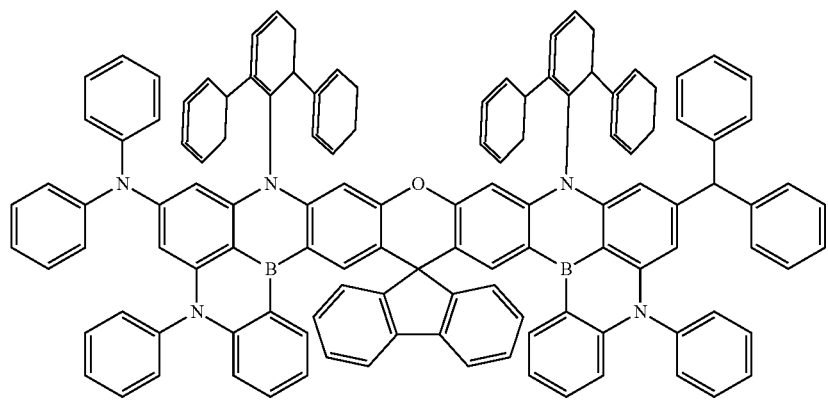
49
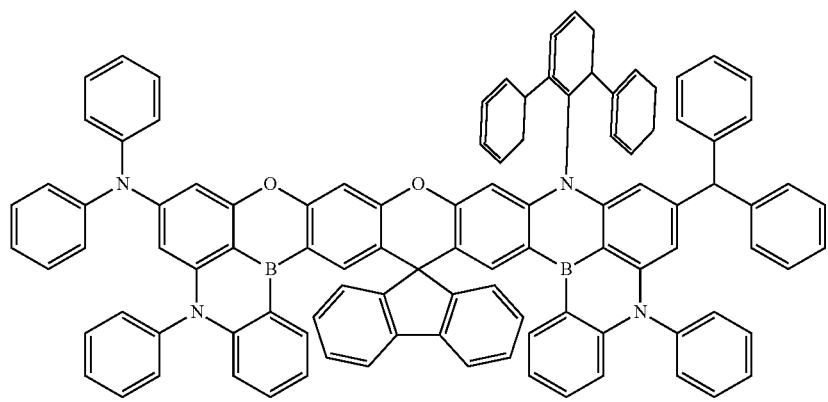
50
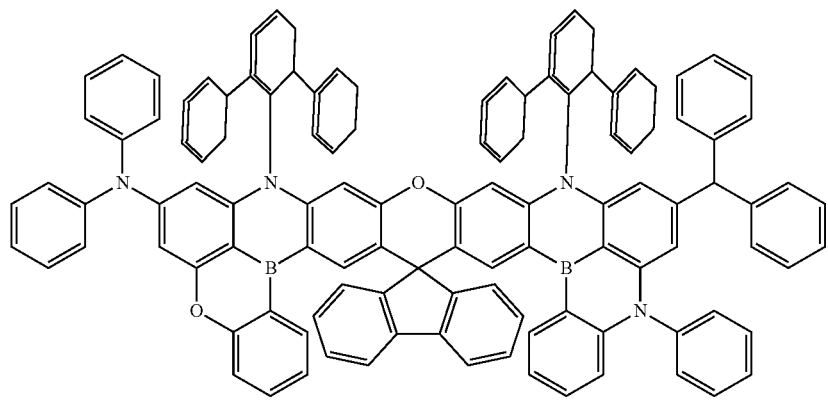
51
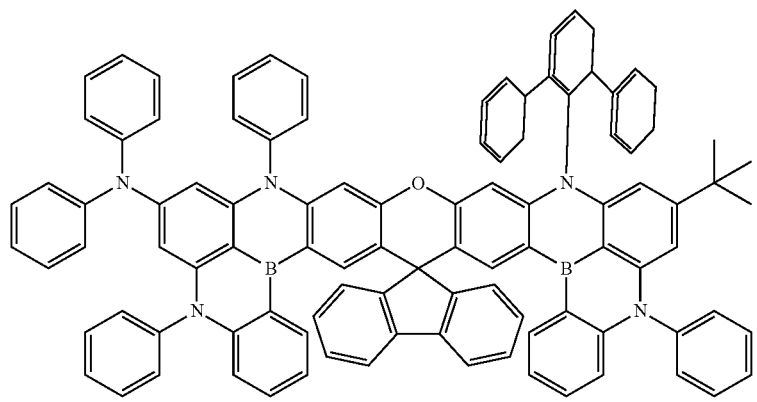
52

-continued
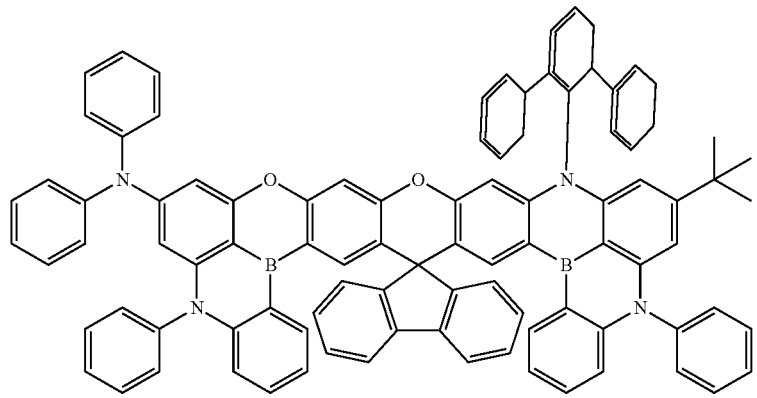
53
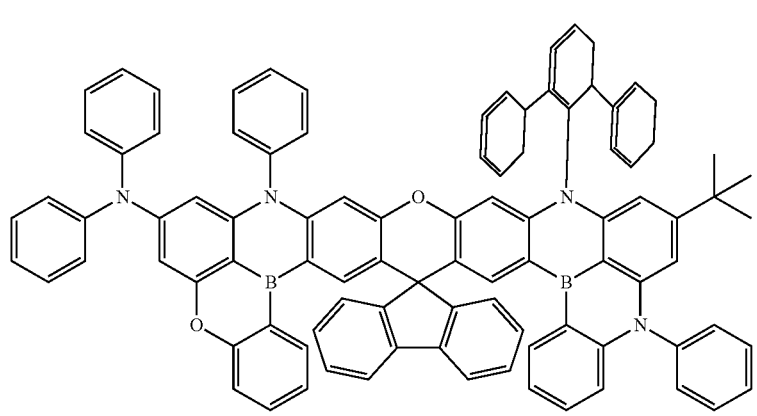
54
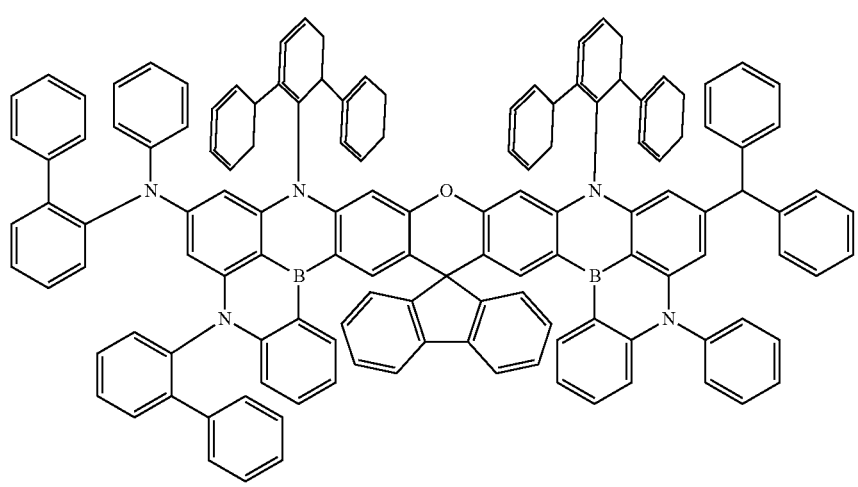
55

56
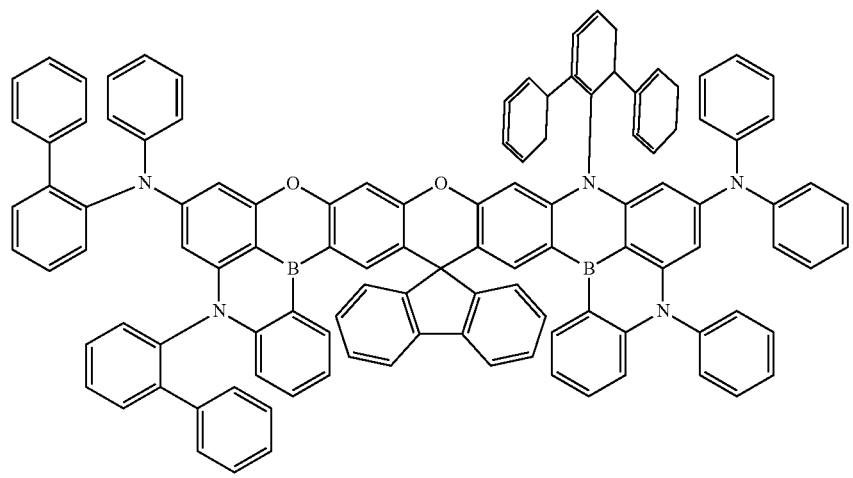
57
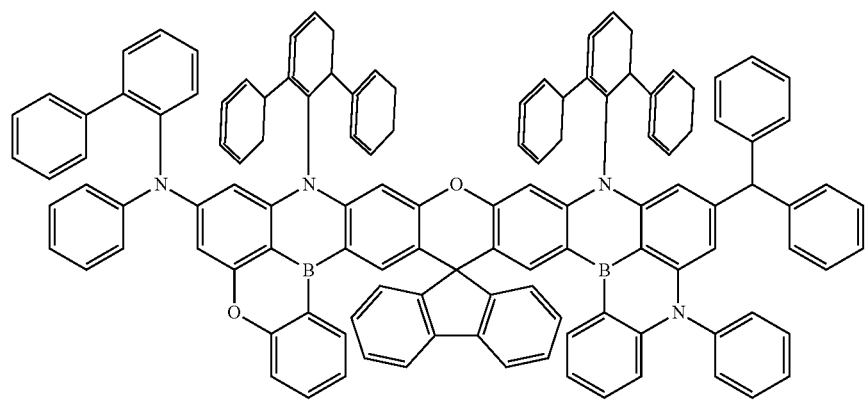
58
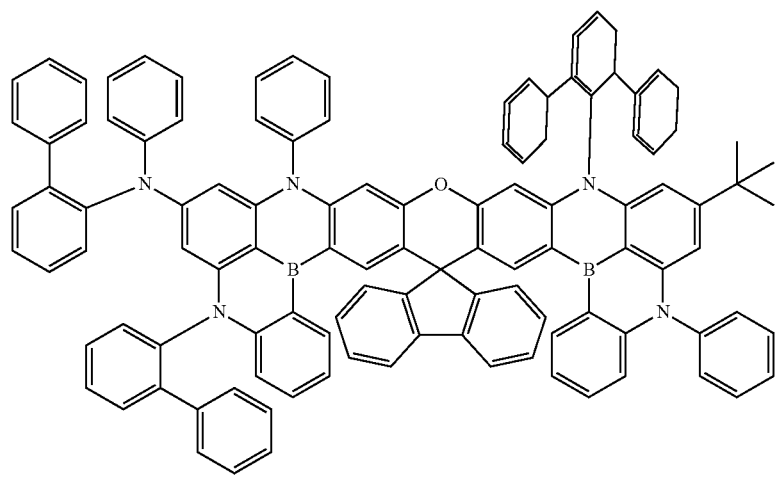

59
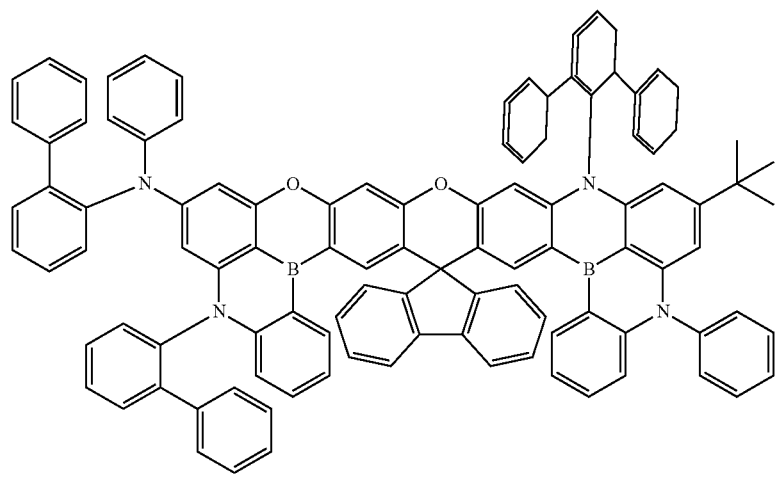
60
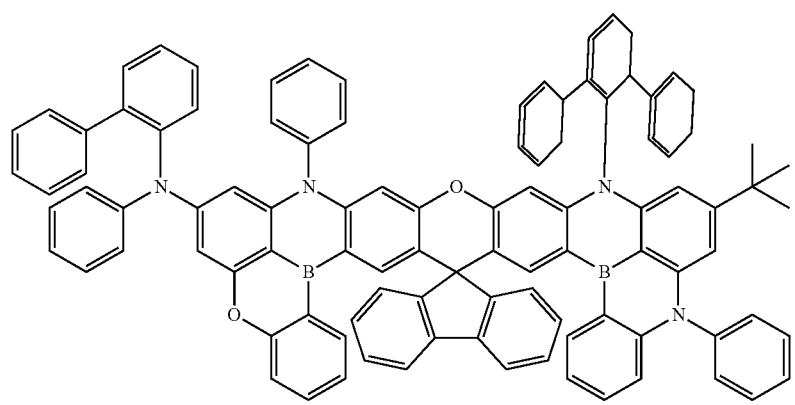
61
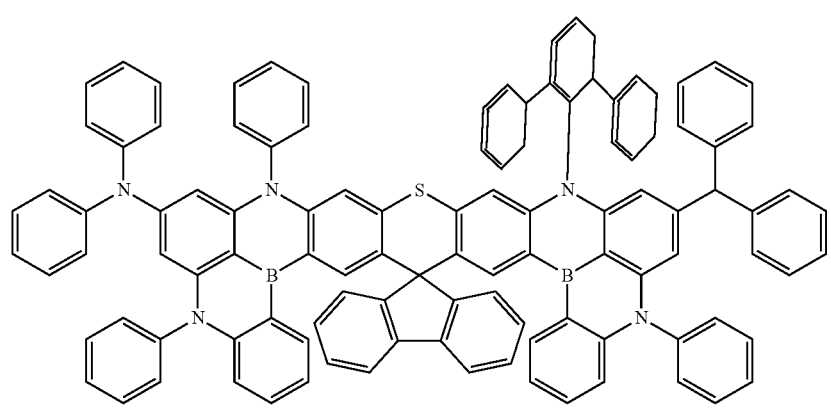

-continued
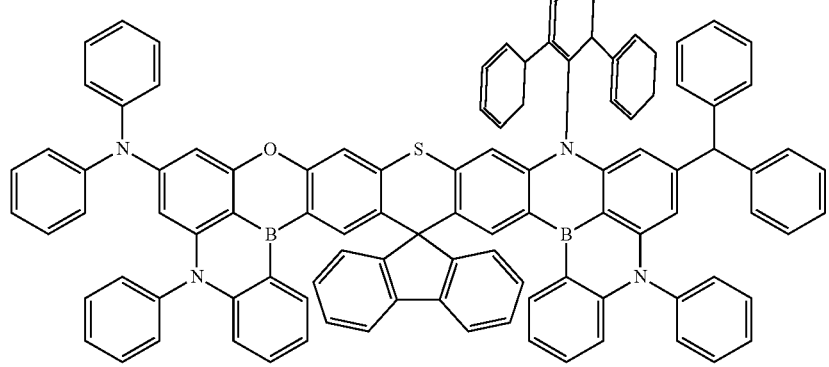
62
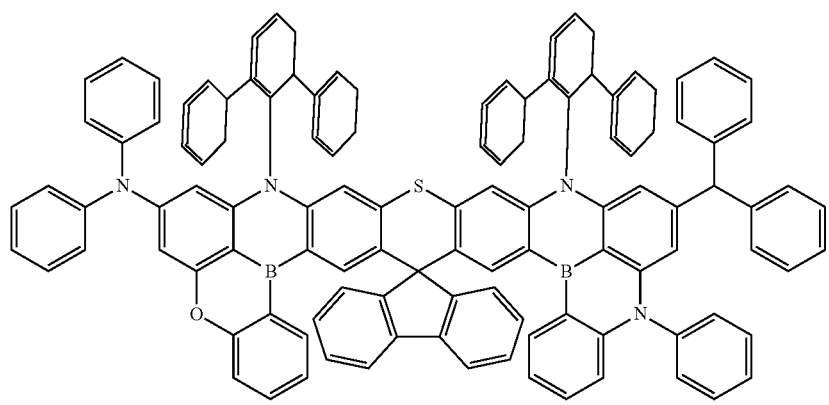
63
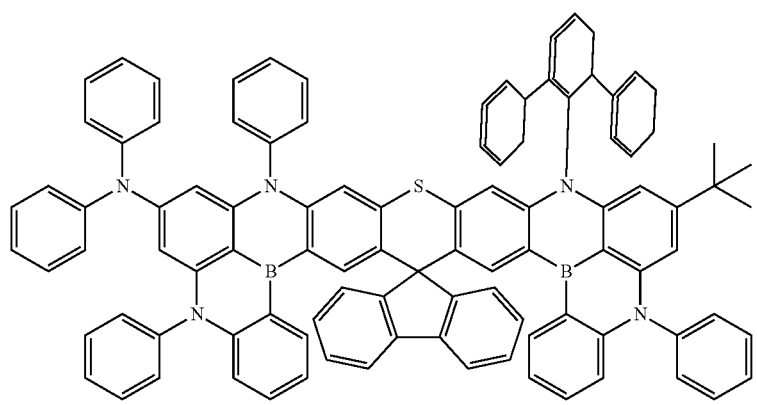
64
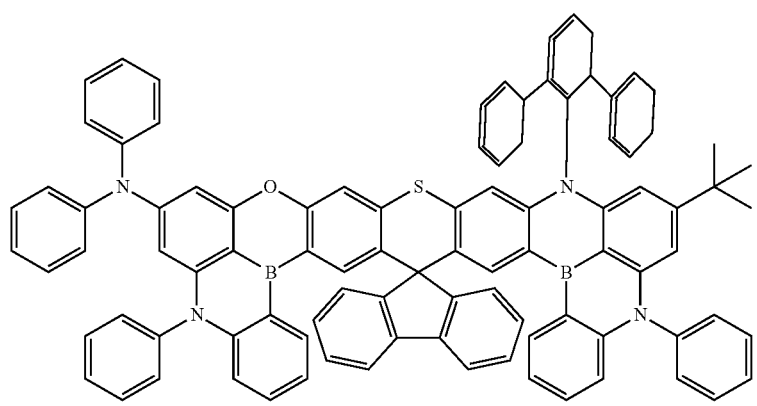
65

-continued
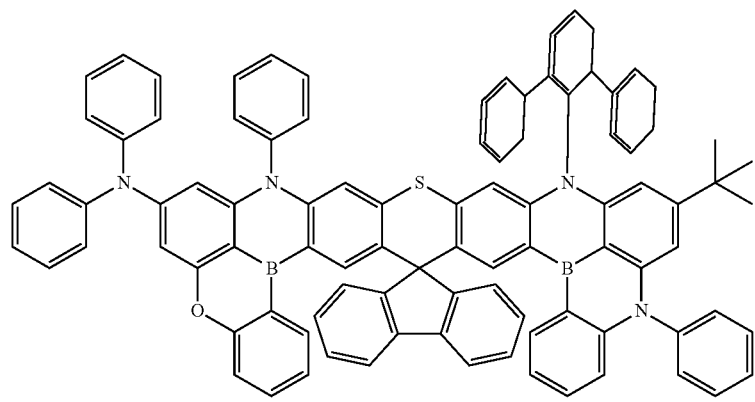
66
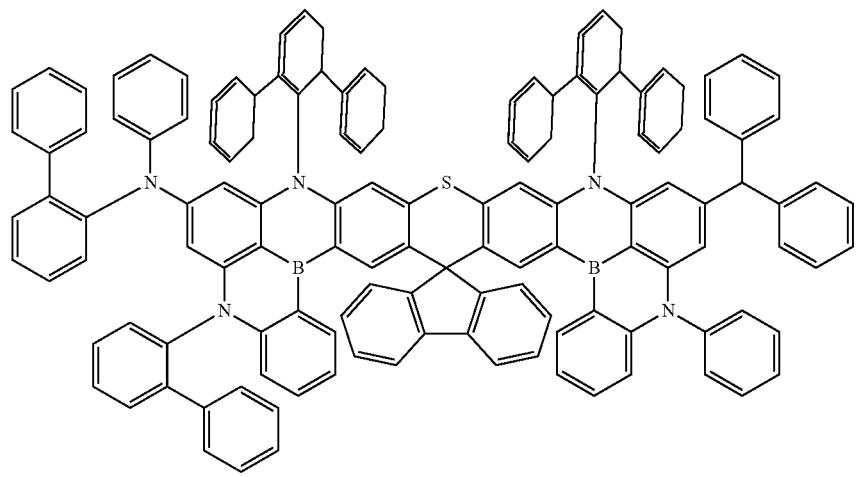
67
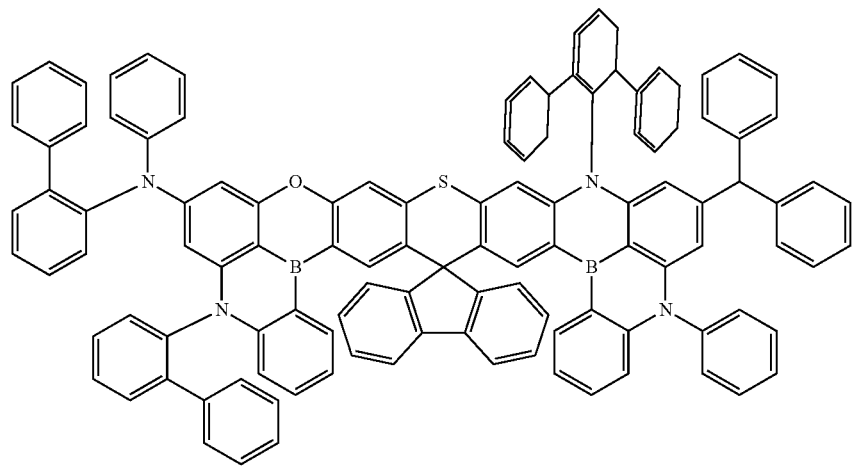
68

69
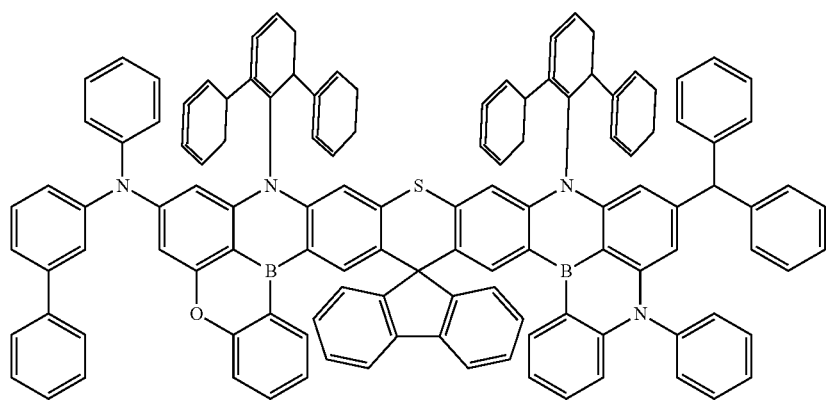
70
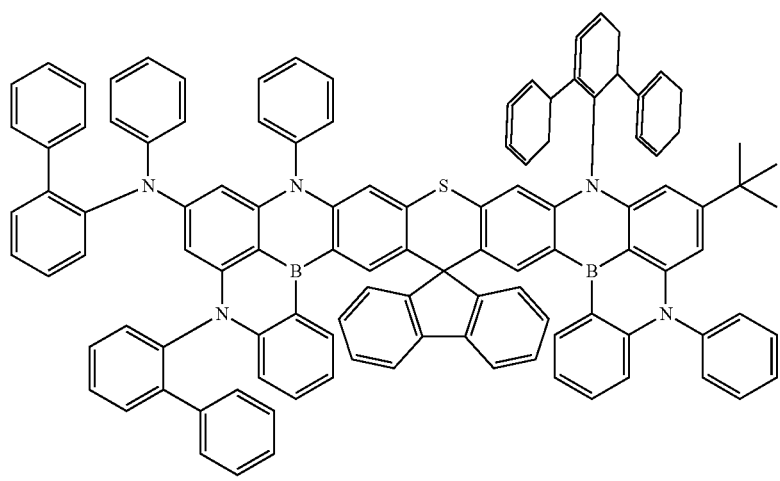
71
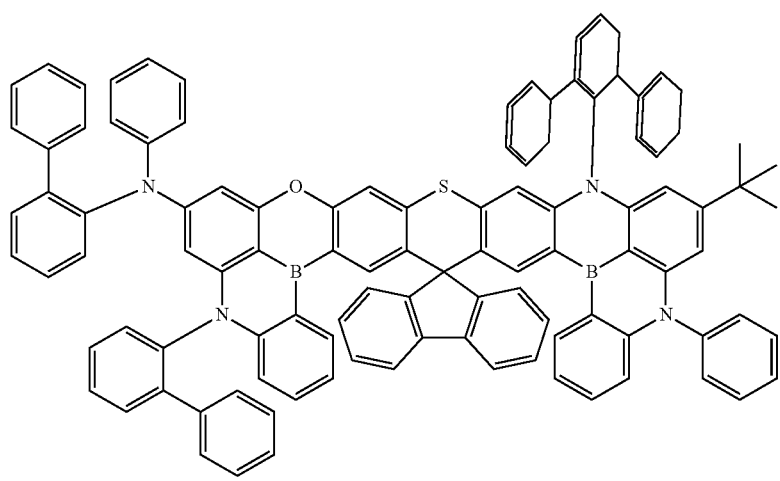

-continued
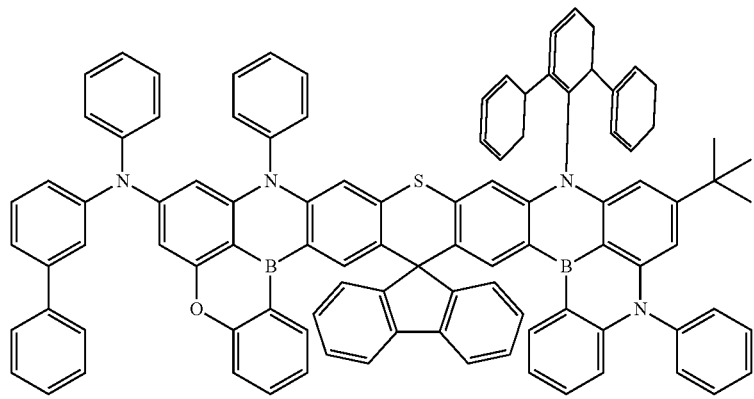
72
* * * * *